United States Patent
Gray et al.

(10) Patent No.: US 12,158,509 B2
(45) Date of Patent: *Dec. 3, 2024

(54) SINGLE LINE HALL EFFECT SENSOR DRIVE AND SENSE

(71) Applicant: SIGMASENSE, LLC., Wilmington, DE (US)

(72) Inventors: Patrick Troy Gray, Cedar Park, TX (US); Gerald Dale Morrison, Redmond, WA (US); Daniel Keith Van Ostrand, Leander, TX (US); Richard Stuart Seger, Jr., Belton, TX (US)

(73) Assignee: SIGMASENSE, LLC., Austin, TX (US)

( * ) Notice: Subject to any disclaimer, the term of this patent is extended or adjusted under 35 U.S.C. 154(b) by 376 days.

This patent is subject to a terminal disclaimer.

(21) Appl. No.: 17/361,571

(22) Filed: Jun. 29, 2021

(65) Prior Publication Data

US 2021/0325485 A1    Oct. 21, 2021

Related U.S. Application Data

(63) Continuation of application No. 16/355,967, filed on Mar. 18, 2019, now Pat. No. 11,061,082.

(51) Int. Cl.
*G01R 33/07*    (2006.01)
*G01D 5/14*    (2006.01)

(52) U.S. Cl.
CPC .............. *G01R 33/07* (2013.01); *G01D 5/145* (2013.01)

(58) Field of Classification Search
CPC ...... G01R 33/07; G01R 15/202; G01D 5/145; G01D 5/142
See application file for complete search history.

(56) References Cited

U.S. PATENT DOCUMENTS 5,437,178 A    8/1995    Esin et al.
6,218,972 B1    4/2001    Groshong
(Continued)

FOREIGN PATENT DOCUMENTS

CN    104536627 A    4/2015
CN    107771273 A    3/2018
EP    2284637 A1    2/2011

OTHER PUBLICATIONS

Baker; How delta-sigma ADCs work, Part 1; Analog Applications Journal; Oct. 1, 2011; 6 pgs.
(Continued)

*Primary Examiner* — Reena Aurora
(74) *Attorney, Agent, or Firm* — Garlick & Markison; Timothy W. Markison; Shayne X. Short

(57) ABSTRACT

A Hall effect sensor system includes a Hall effect sensor and a drive-sense circuit (DSC). The Hall effect sensor includes an input port to receive a DC (direct current) current signal and generates a Hall voltage based on exposure to a magnetic field. The DSC generates the DC current signal based on a reference signal and drives it via a single line that operably couples the DSC to the Hall effect sensor and simultaneously to sense the DC current signal via the single line. The DSC detects an effect on the DC current signal corresponding to the Hall voltage that is generated across the Hall effect sensor based on exposure of the Hall effect sensor to the magnetic field and generates a digital signal representative of the Hall voltage.

20 Claims, 88 Drawing Sheets

(56) References Cited

U.S. PATENT DOCUMENTS

| | | |
|---|---|---|
| 6,665,013 B1 | 12/2003 | Fossum et al. |
| 7,476,233 B1 | 1/2009 | Wiener et al. |
| 7,528,755 B2 | 5/2009 | Hammerschmidt |
| 8,031,094 B2 | 10/2011 | Hotelling |
| 8,089,289 B1 | 1/2012 | Kremin et al. |
| 8,279,180 B2 | 10/2012 | Hotelling et al. |
| 8,547,114 B2 | 10/2013 | Kremin |
| 8,625,726 B2 | 1/2014 | Kuan |
| 9,201,547 B2 | 12/2015 | Elias |
| 10,671,034 B1 | 6/2020 | Gray |
| 11,061,082 B2* | 7/2021 | Gray ................. G01R 33/0023 |
| 2003/0052657 A1 | 3/2003 | Koernle et al. |
| 2005/0235758 A1 | 10/2005 | Kowal et al. |
| 2008/0109198 A1* | 5/2008 | Knopp .................... A61C 7/00 703/11 |
| 2011/0063154 A1 | 3/2011 | Hotelling et al. |
| 2011/0285368 A1 | 11/2011 | Carter |
| 2011/0298745 A1 | 12/2011 | Souchkov |
| 2013/0278447 A1 | 10/2013 | Kremin |
| 2016/0188049 A1 | 6/2016 | Yang et al. |
| 2017/0090619 A1* | 3/2017 | Yousefpor ............. G06F 3/0418 |
| 2018/0157354 A1 | 6/2018 | Blondin et al. |
| 2018/0275824 A1 | 9/2018 | Li |
| 2021/0356535 A1* | 11/2021 | Gray ...................... G01D 5/145 |
| 2022/0179016 A1* | 6/2022 | Gray ...................... G01R 33/072 |
| 2022/0221532 A1* | 7/2022 | Gray ...................... G01D 5/145 |

OTHER PUBLICATIONS

Brian Pisani, "Digital Filter Types in Delta-Sigma ADCs", Application Report SBAA230, May 2017, pp. 1-8, Texas Instruments Incorporated, Dallas, Texas.

European Patent Office; Extended European Search Report; Application No. 19853507.2; Jun. 13, 2023; 7 pgs.

* cited by examiner computing device 14 computing device 18

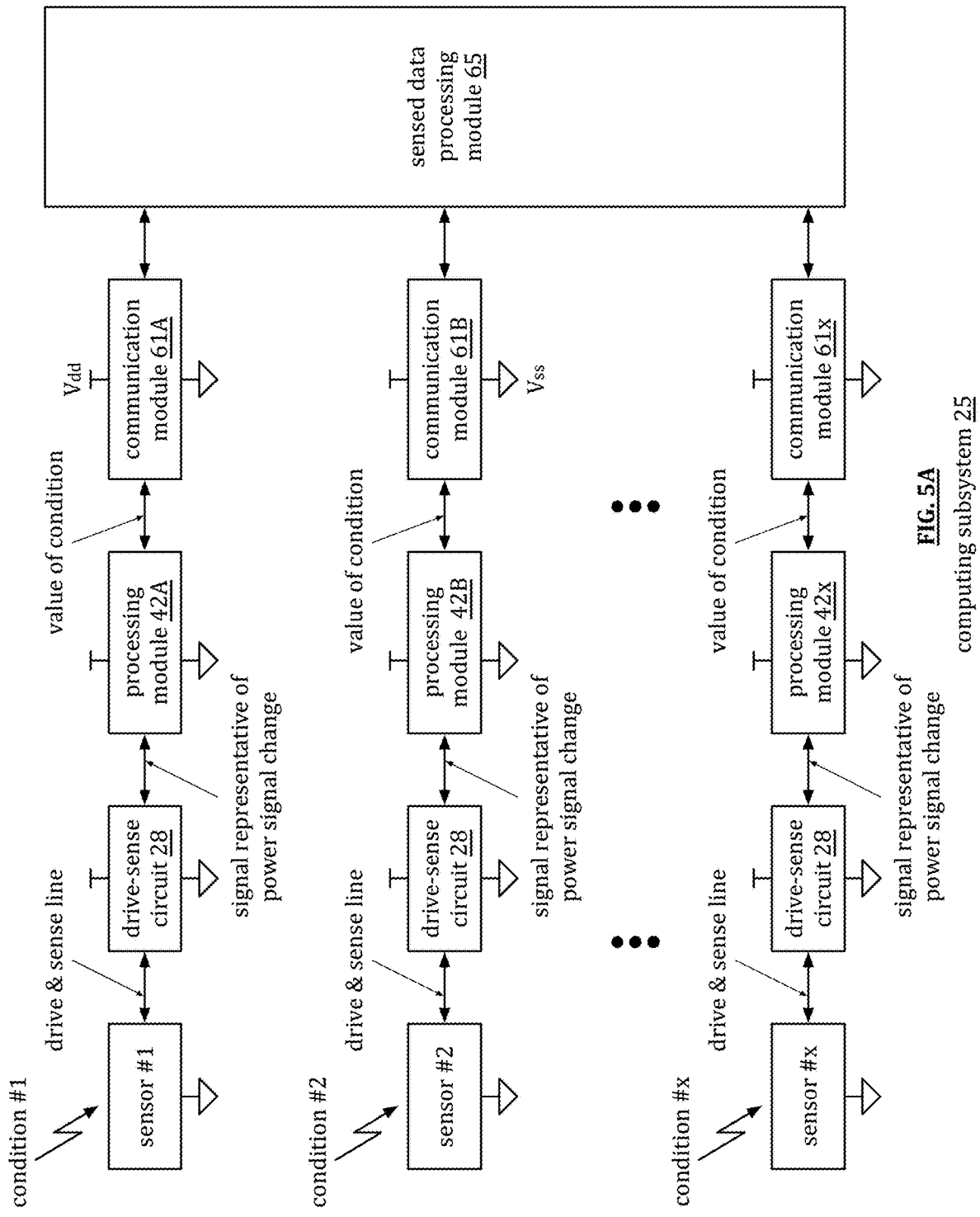

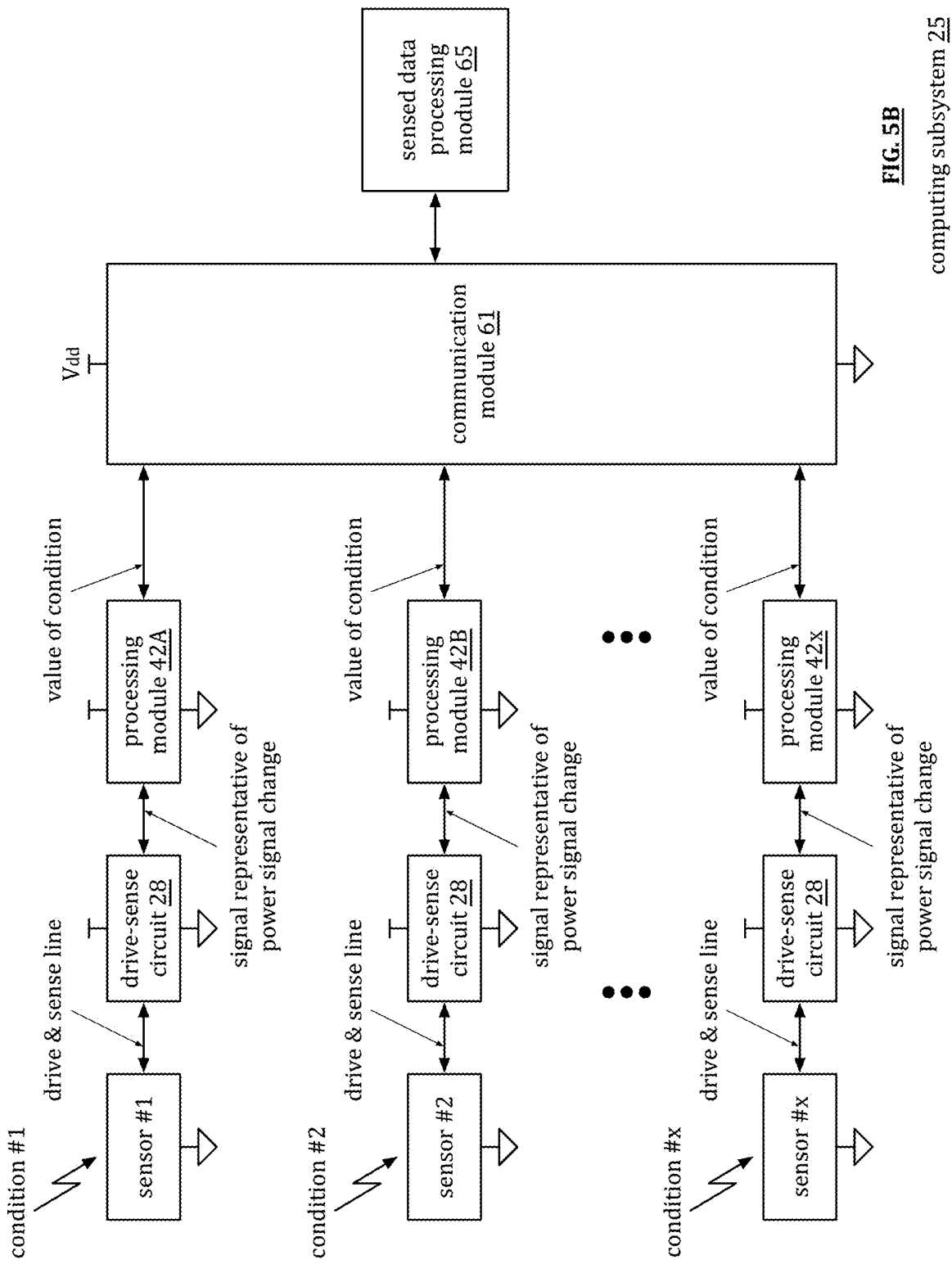

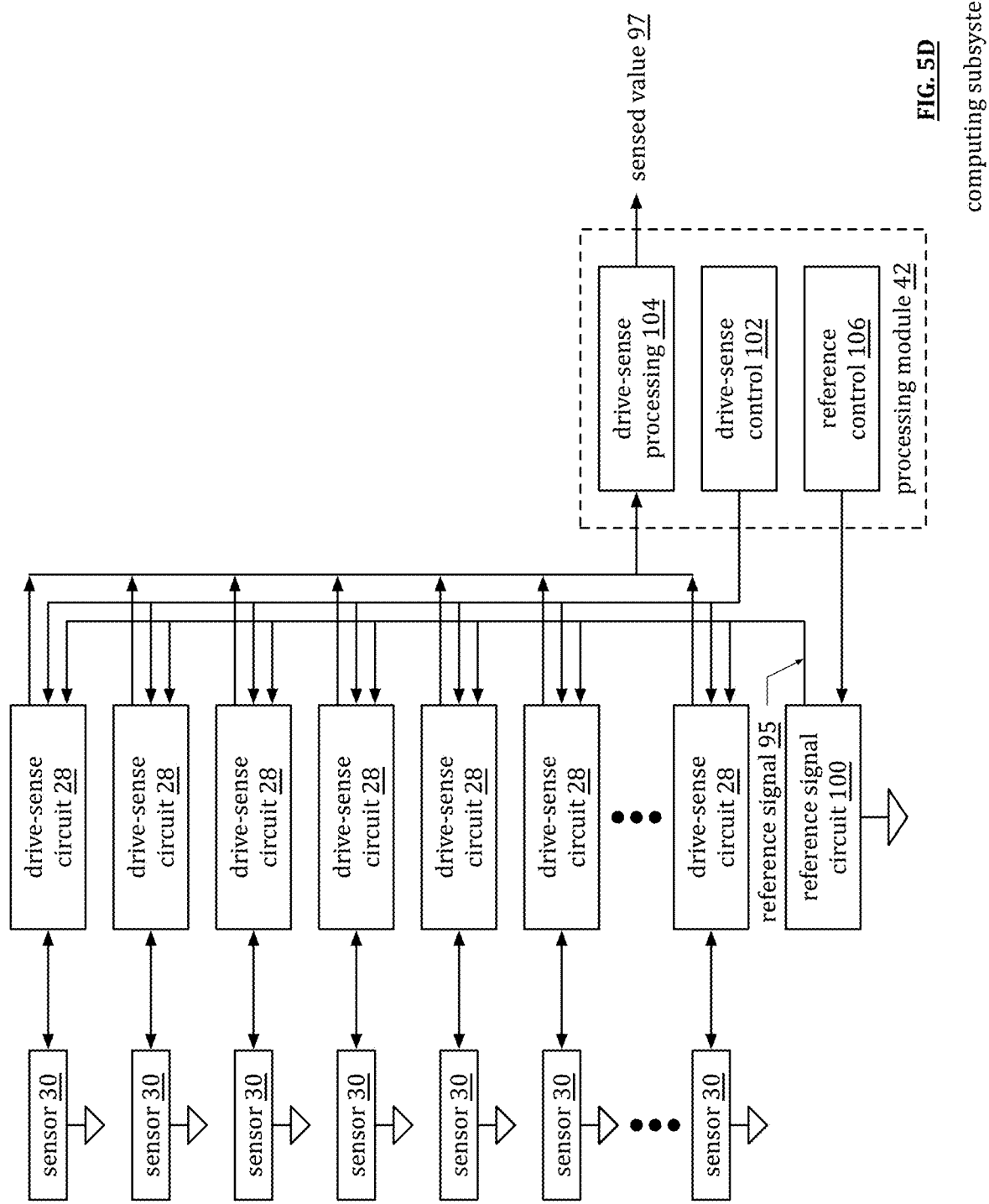

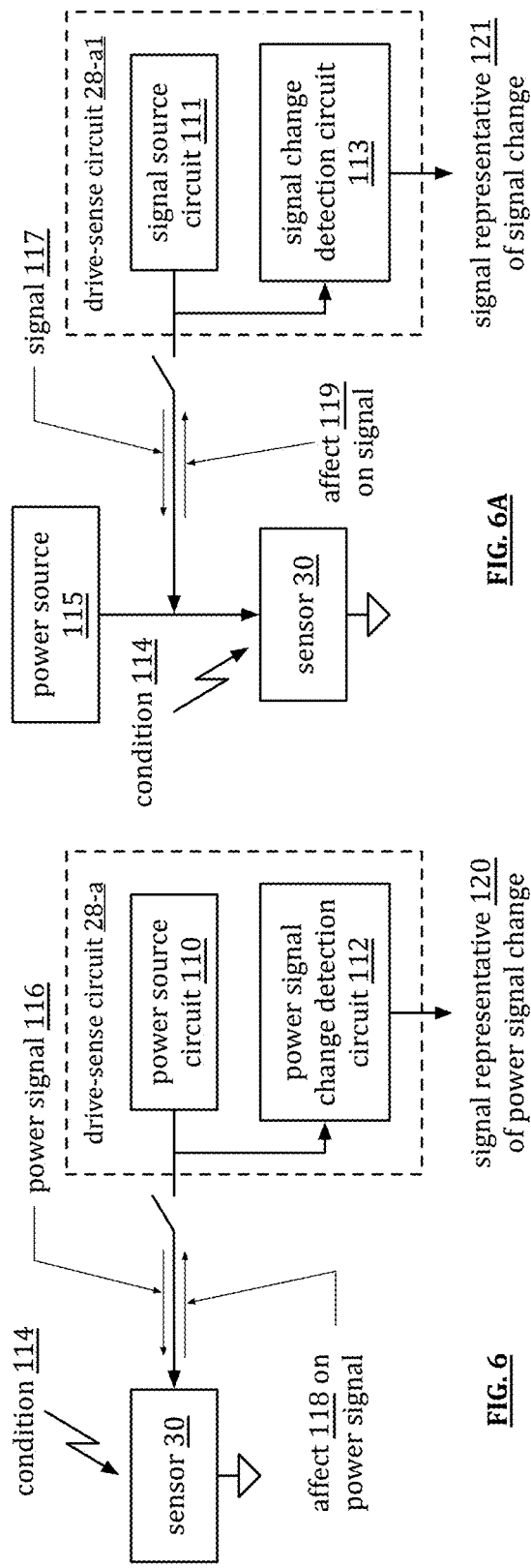
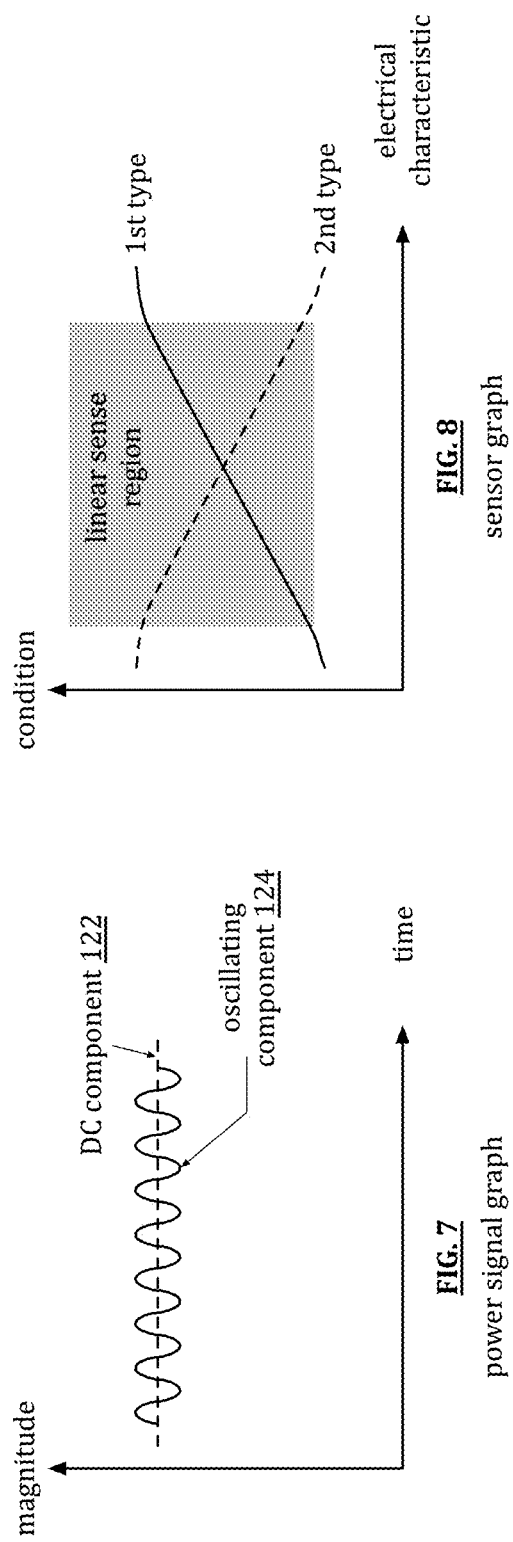

power signal graph power signal graph power signal graph power signal graph

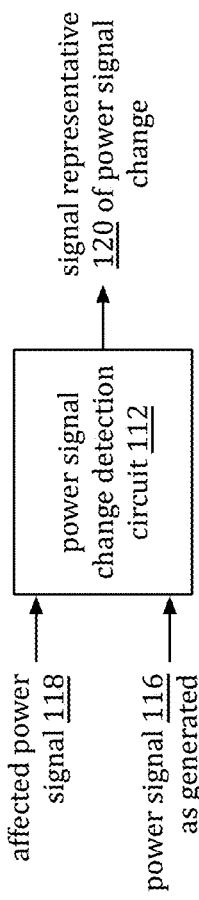
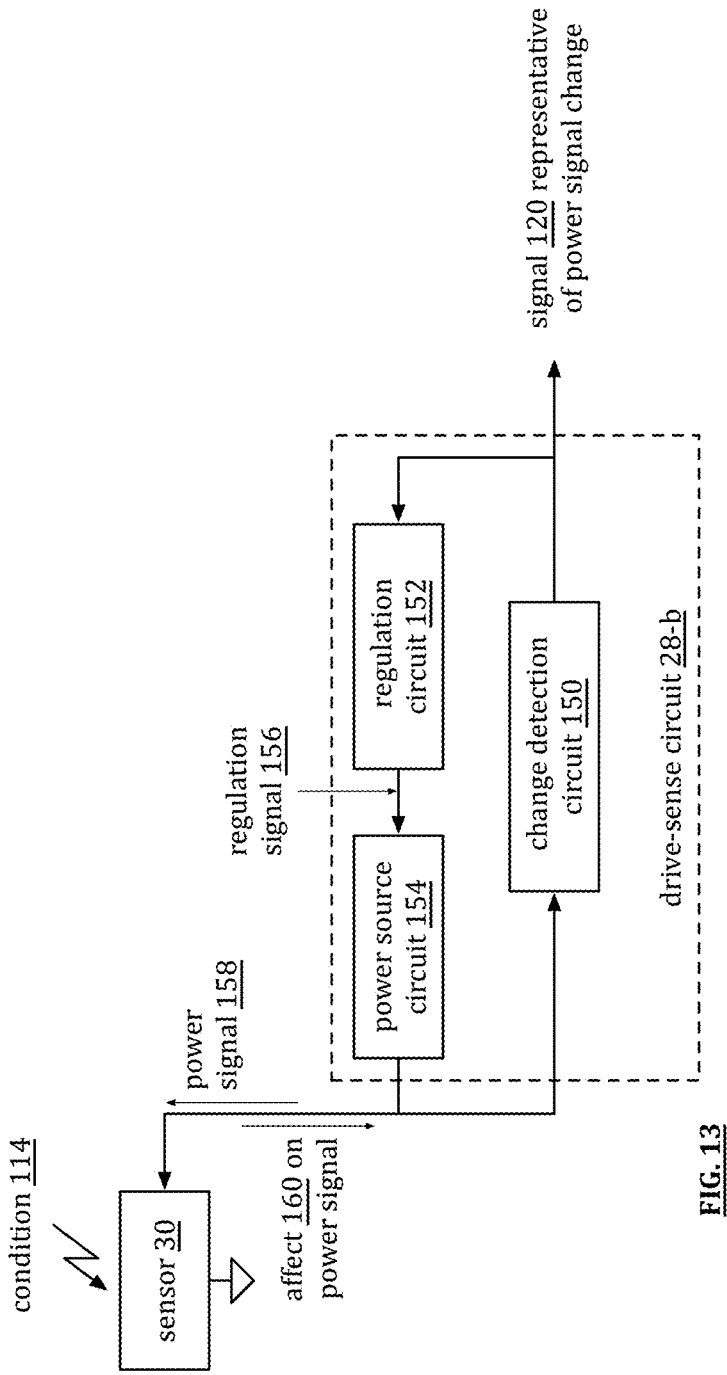

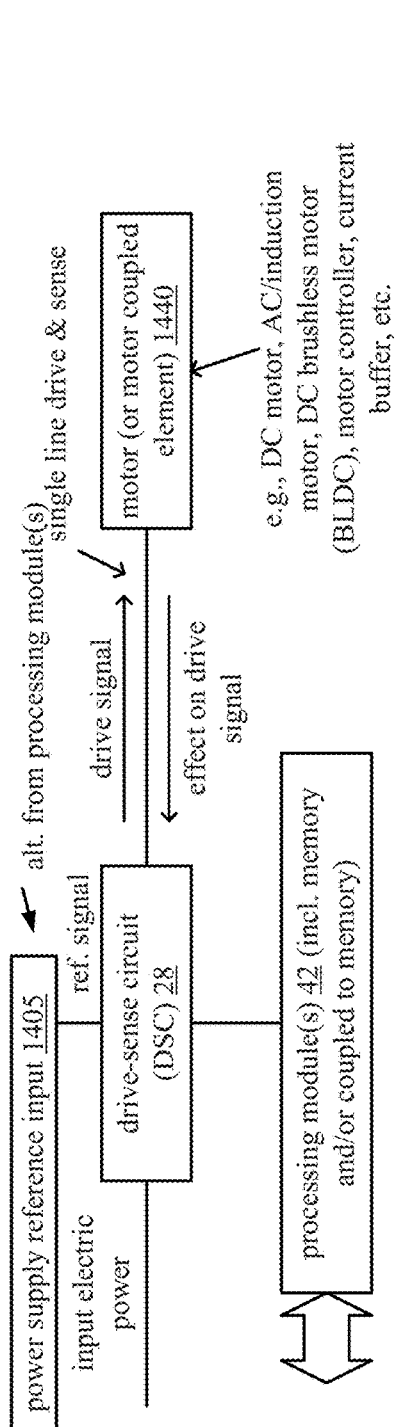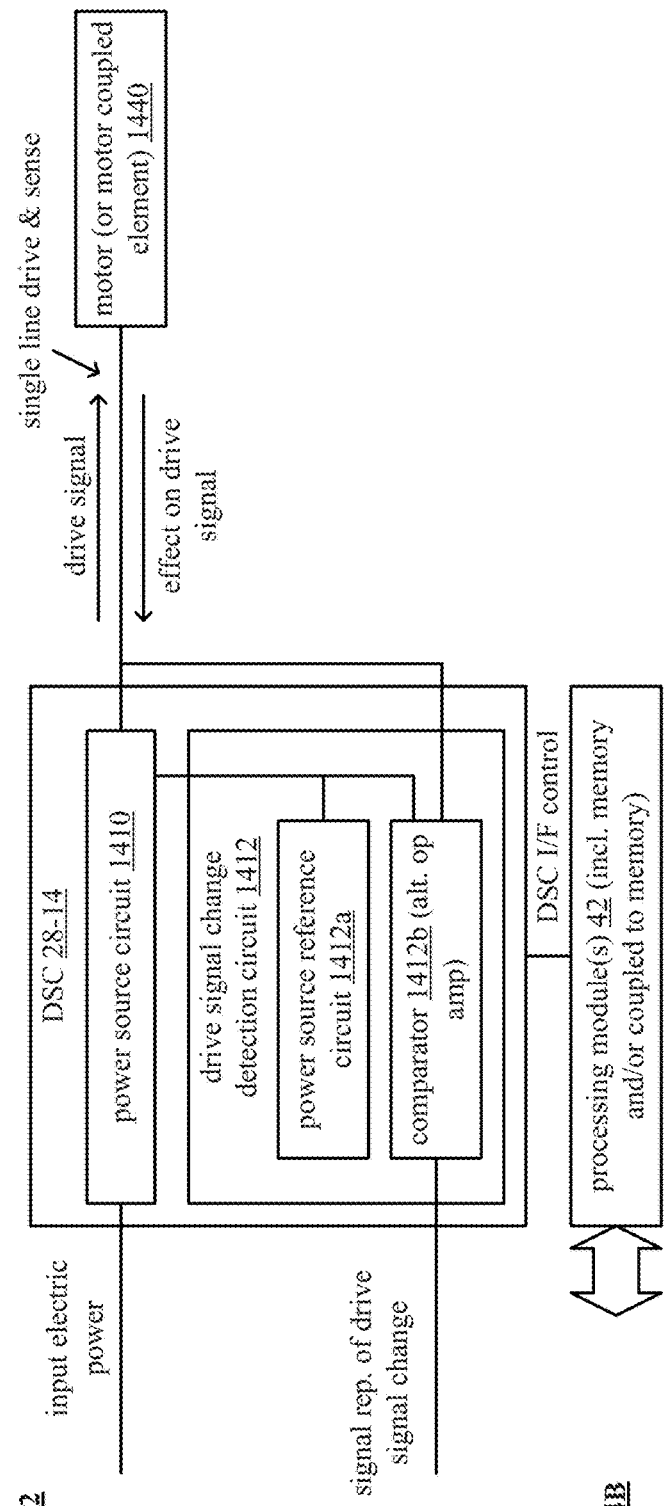

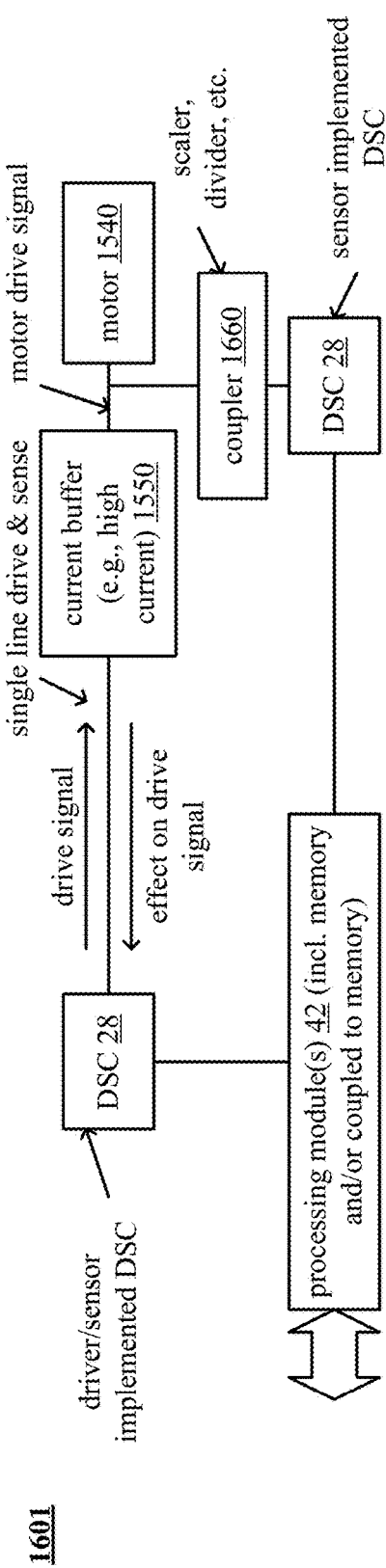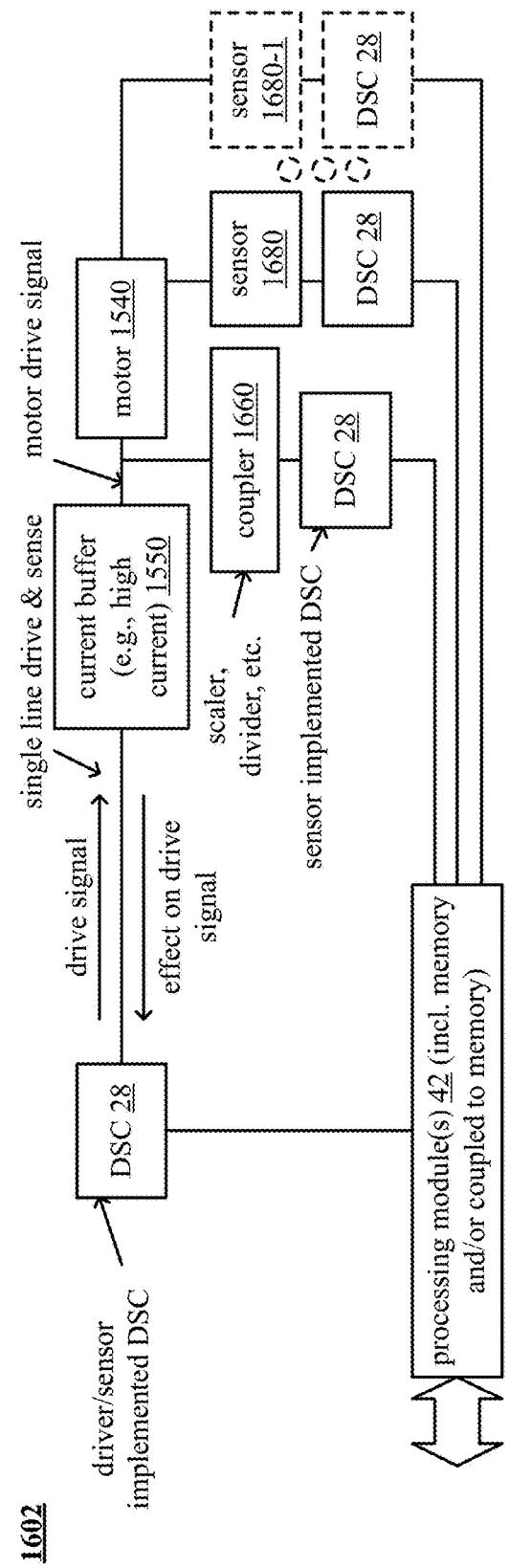

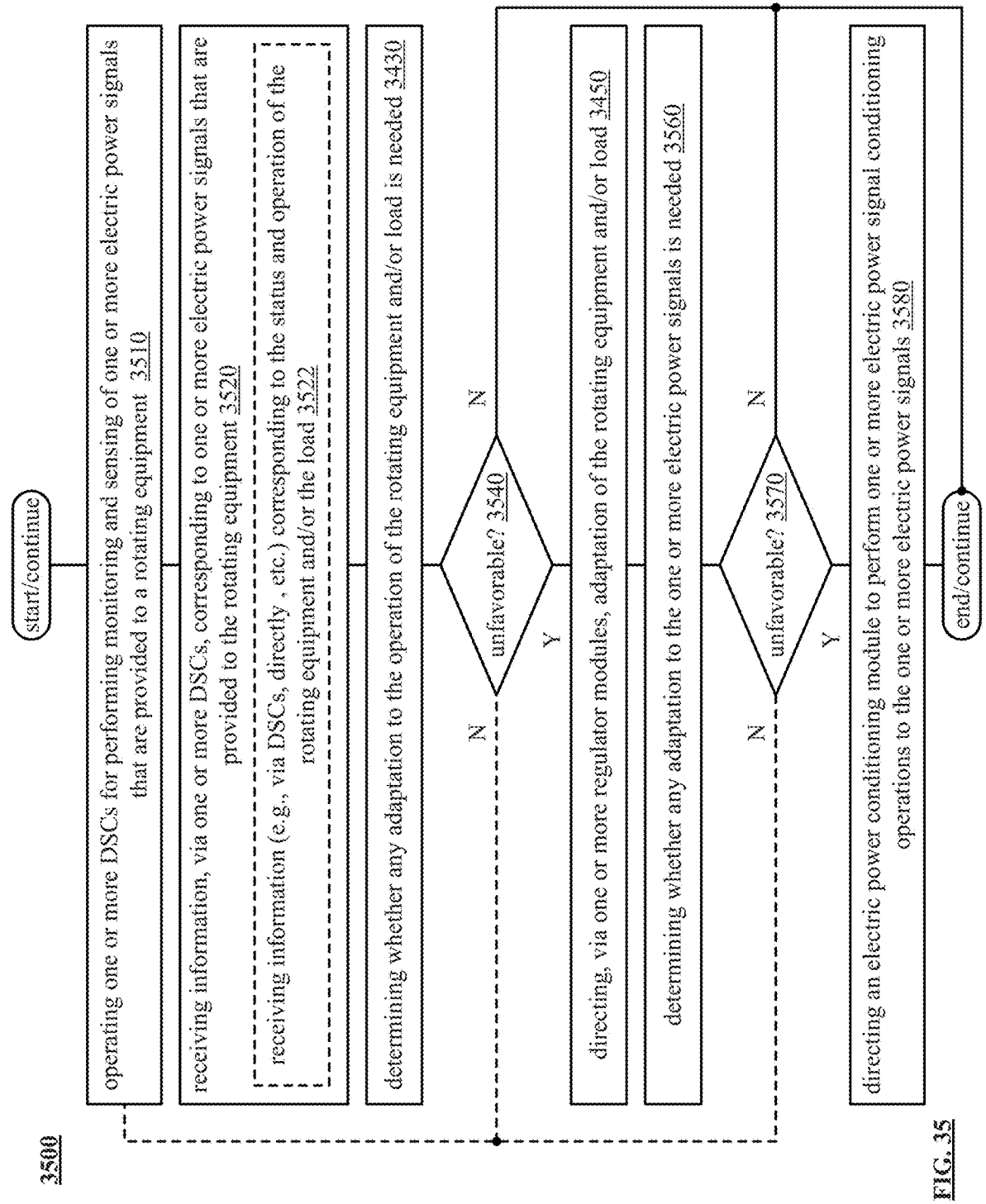

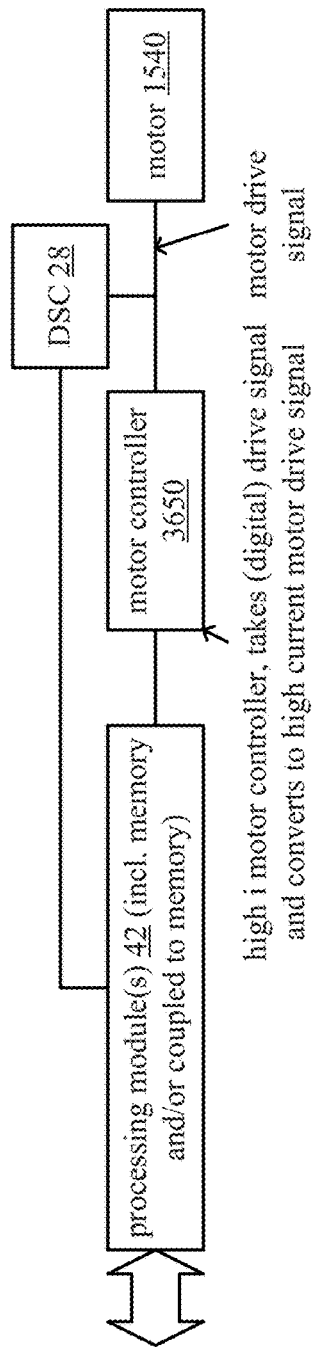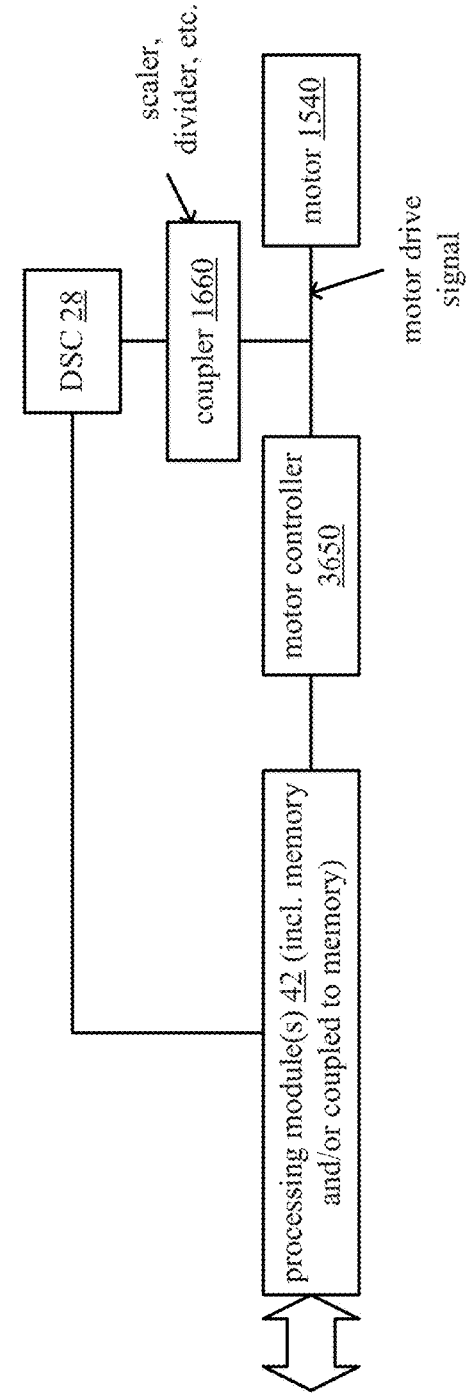

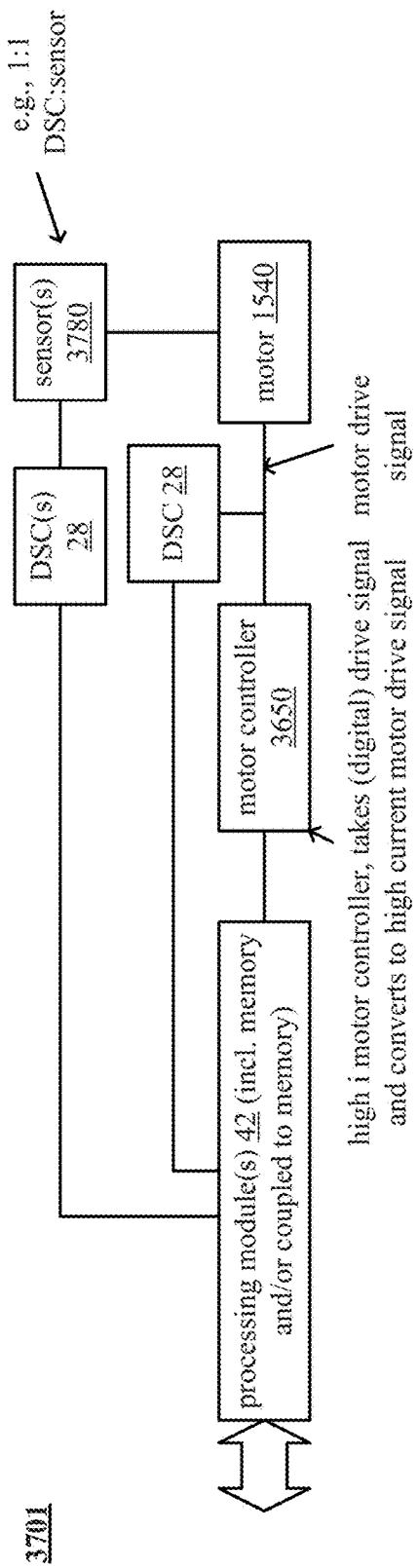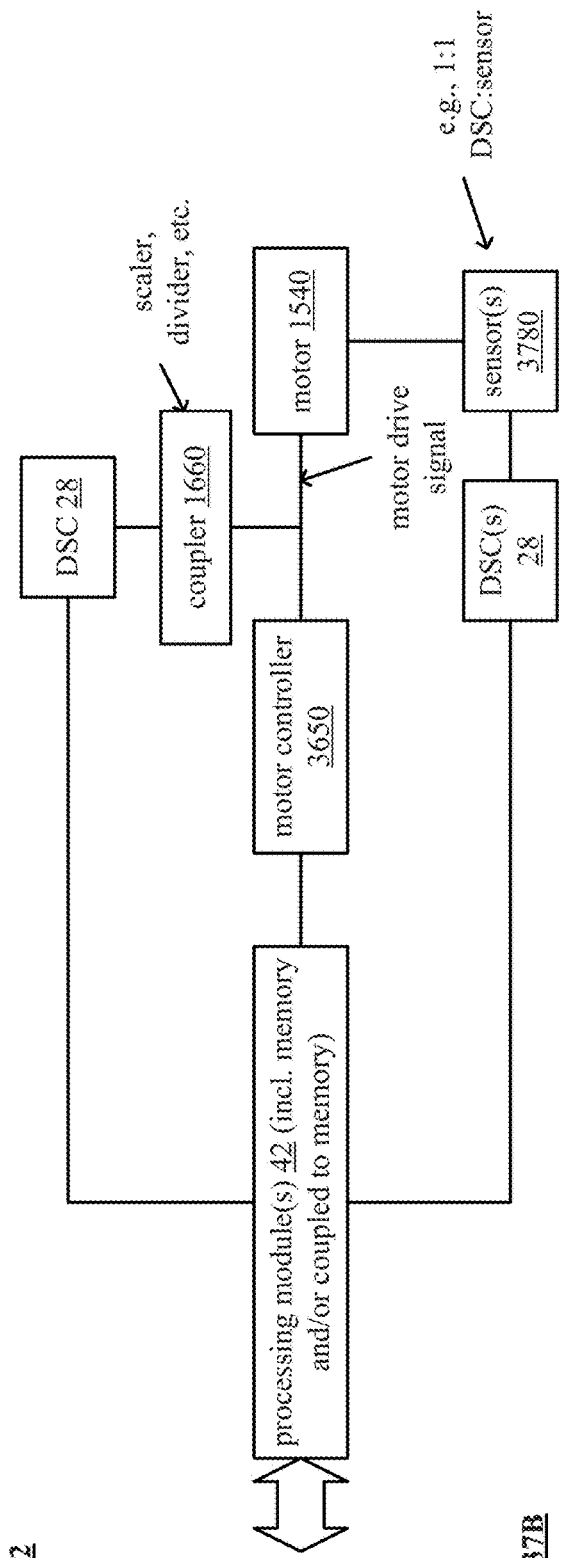

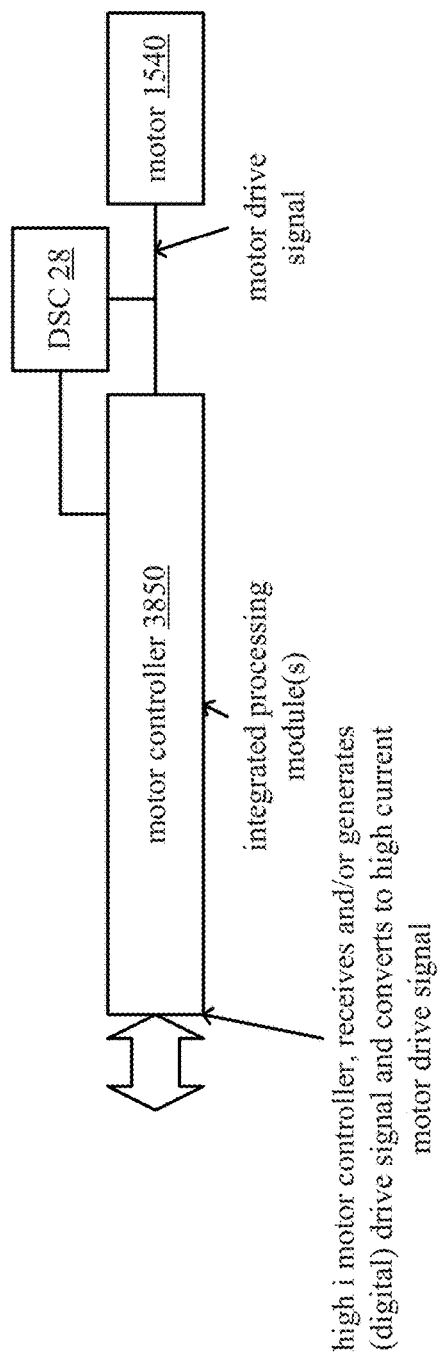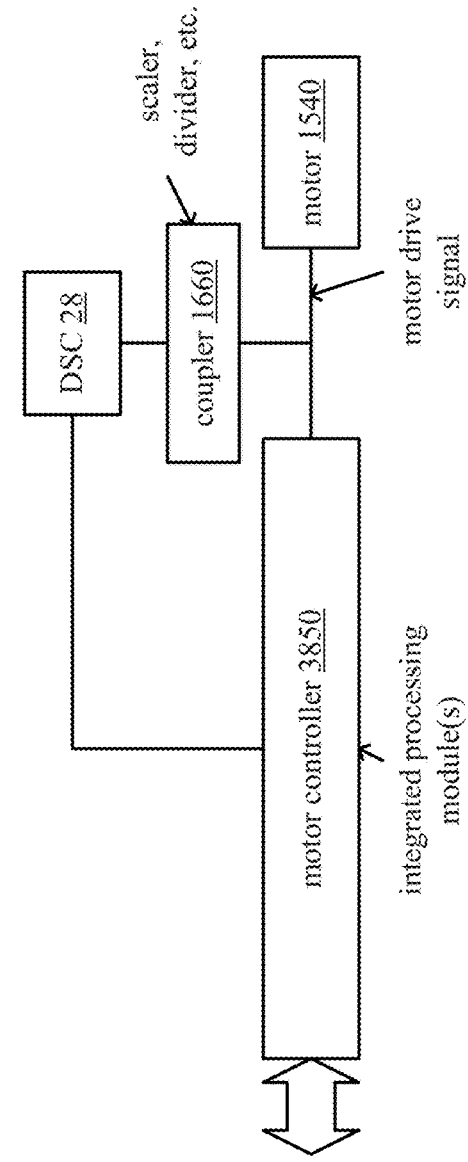

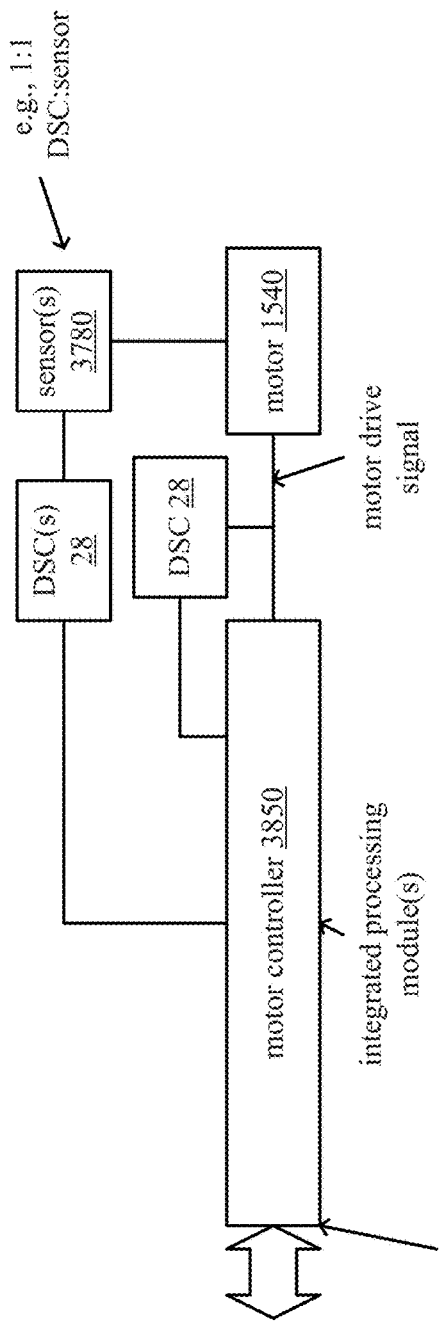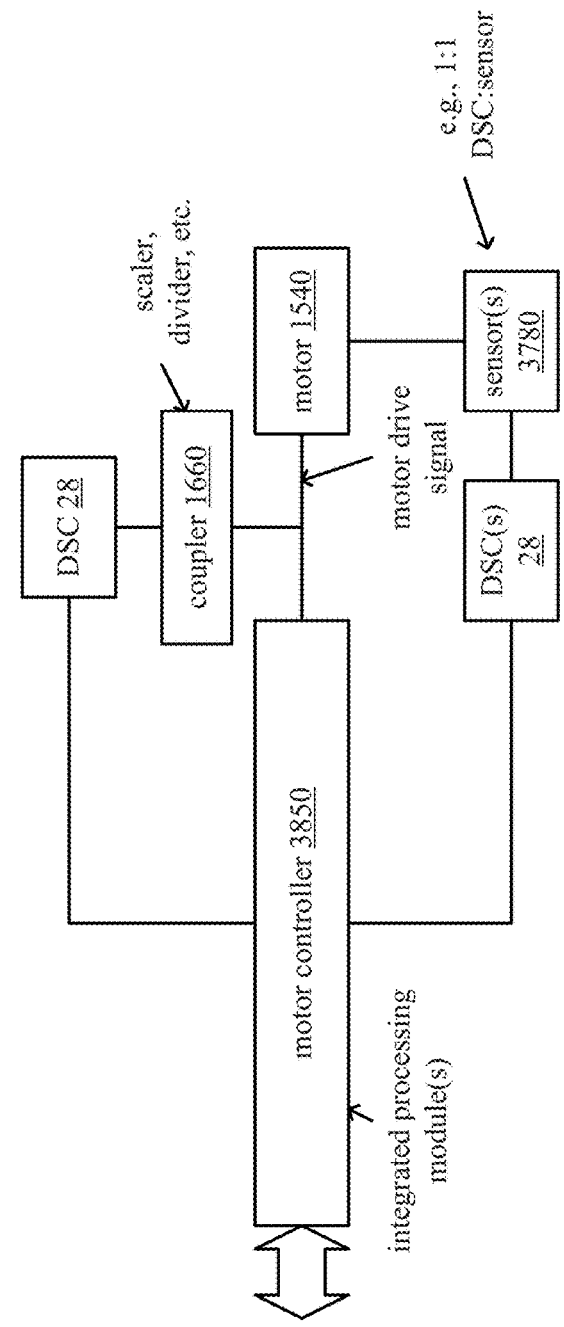
FIG. 39A
FIG. 39B

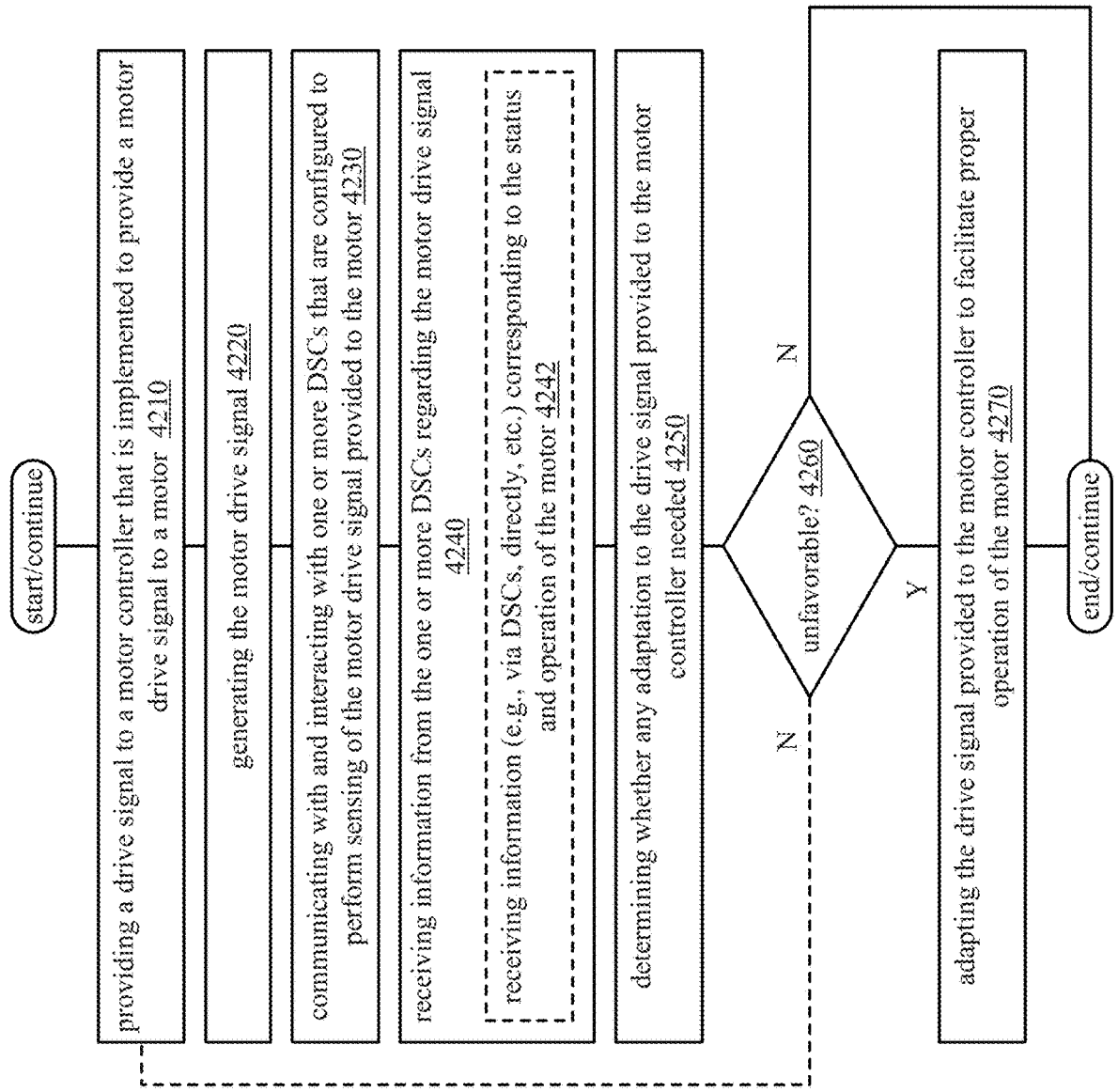

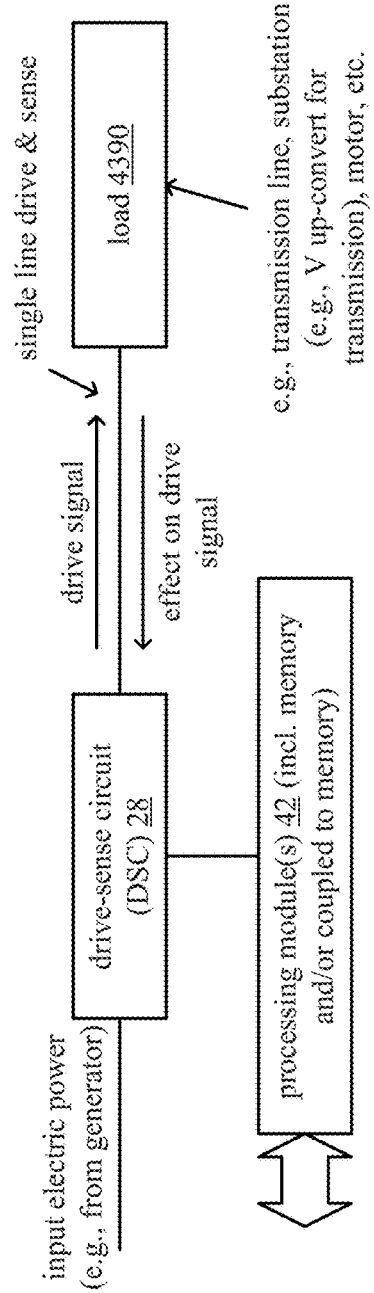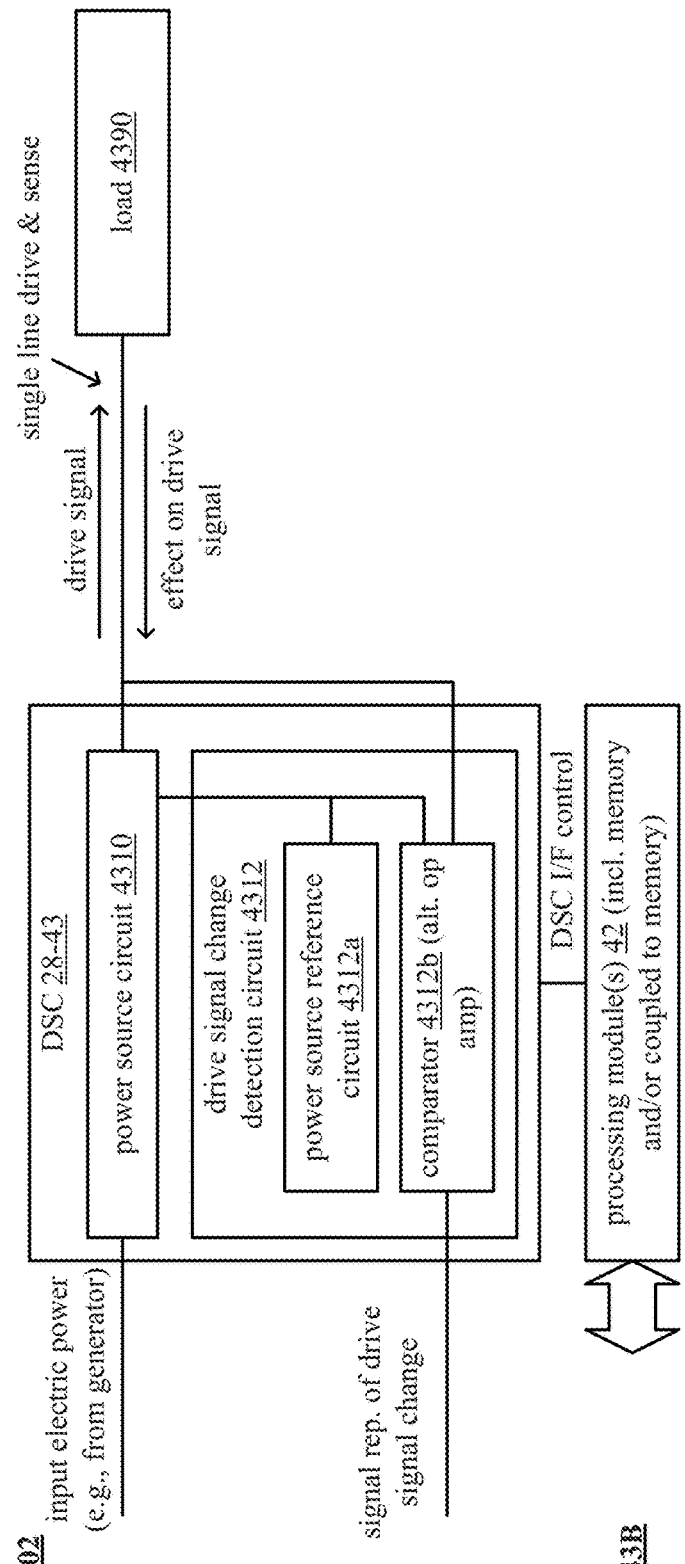
FIG. 43A
FIG. 43B

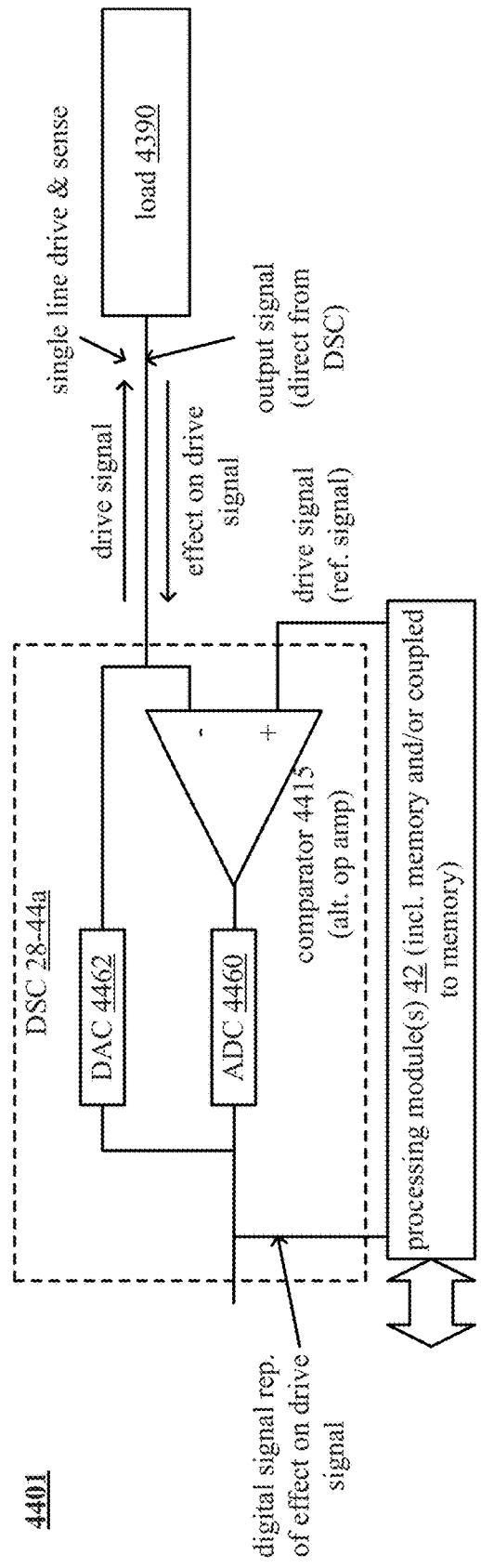
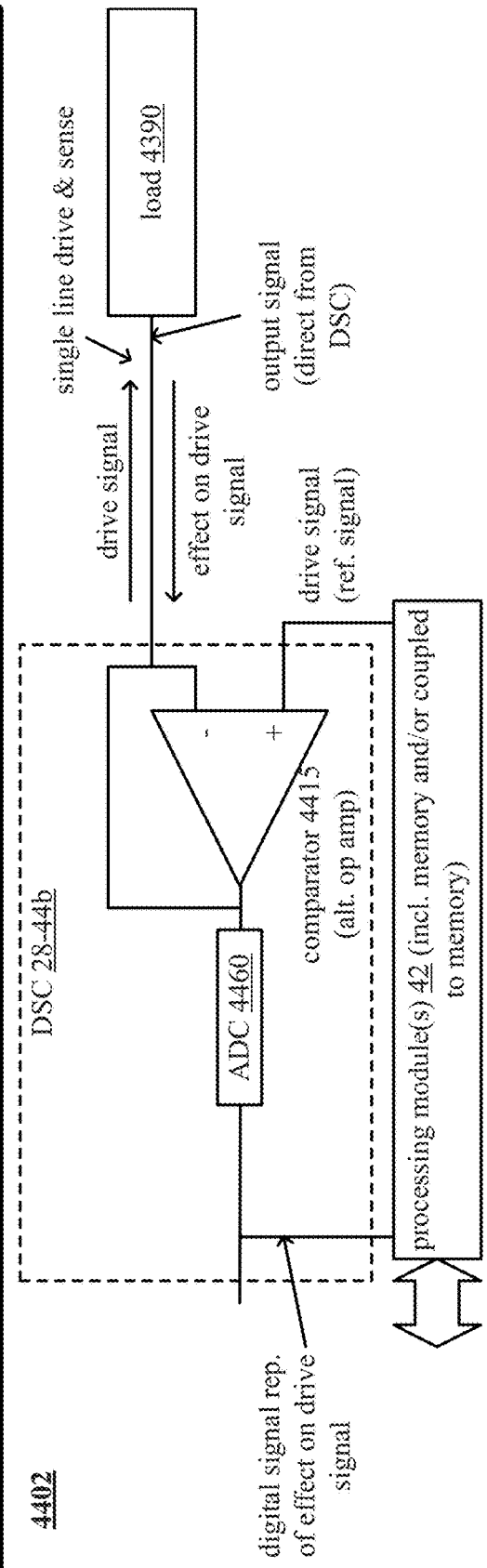
FIG. 44A
FIG. 44B

FIG. 56

5600 load(s) 4590 coupler(s) 5660

DSC(s) monitoring/sensing electric power signal(s) output from DSC(s), providing information to processing module(s)

DSC 28
DSC 28
DSC 28 output electric power (e.g., single phase, 3 phase, incl. neutral, etc.)

generator 4520 sensor 4780-1
DSC 28 sensor 4780
DSC 28

DSC(s)/sensor(s) for sensing/monitoring mechanical energy source and/or generator regulator module(s) 5550 component(s) coupling rotating equipment to other component(s)

regulator module(s) 5551 alt. control via DSC(s)

mechanical energy source 1810 sensor 4790-1
DSC 28 sensor 4790
DSC 28 e.g., motor (gas natural gas, diesel, etc.), turbine (steam, gas, natural gas, wind, hydro, etc.), etc.

processing module(s) 42 (incl. memory and/or coupled to memory)

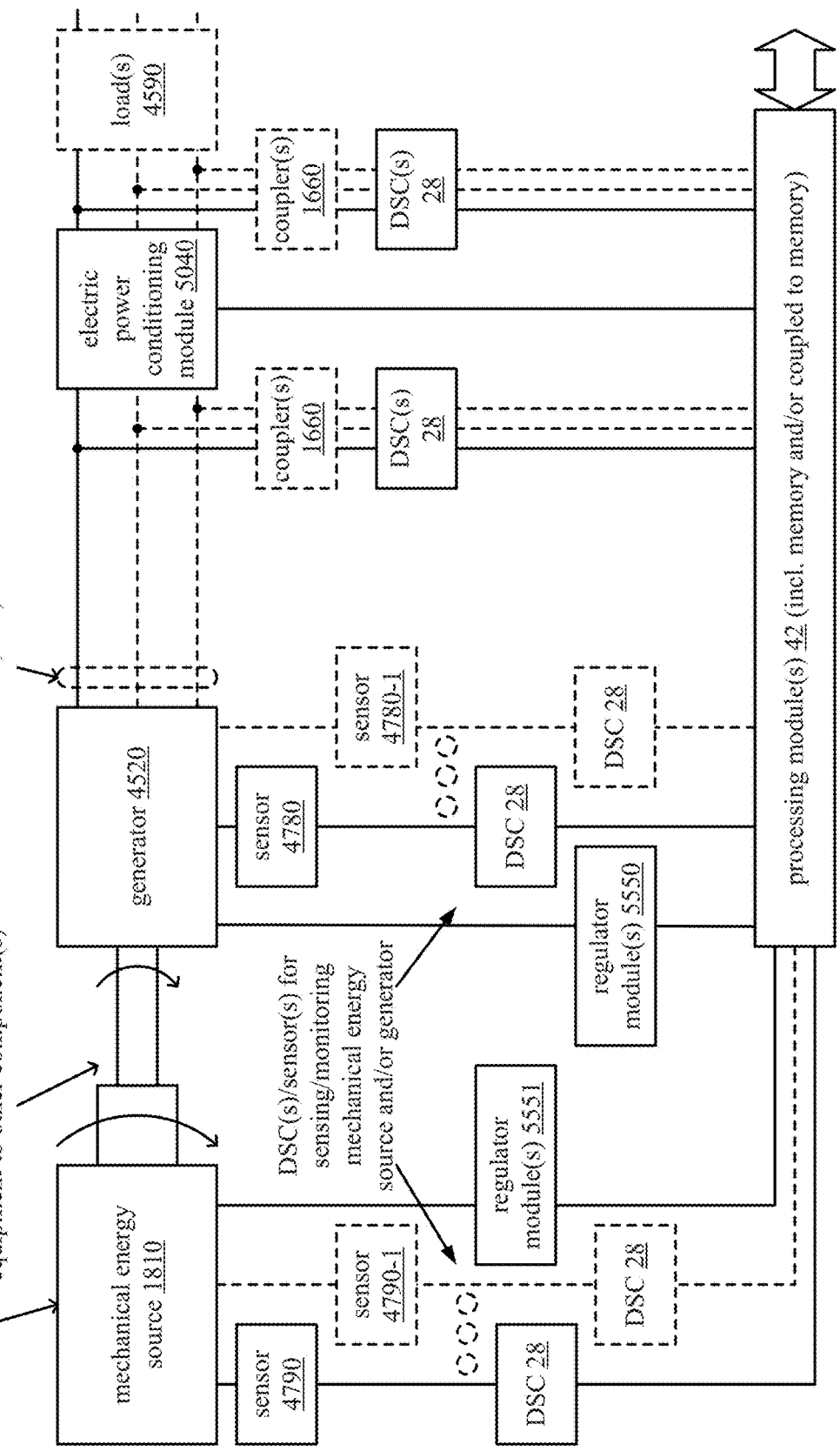

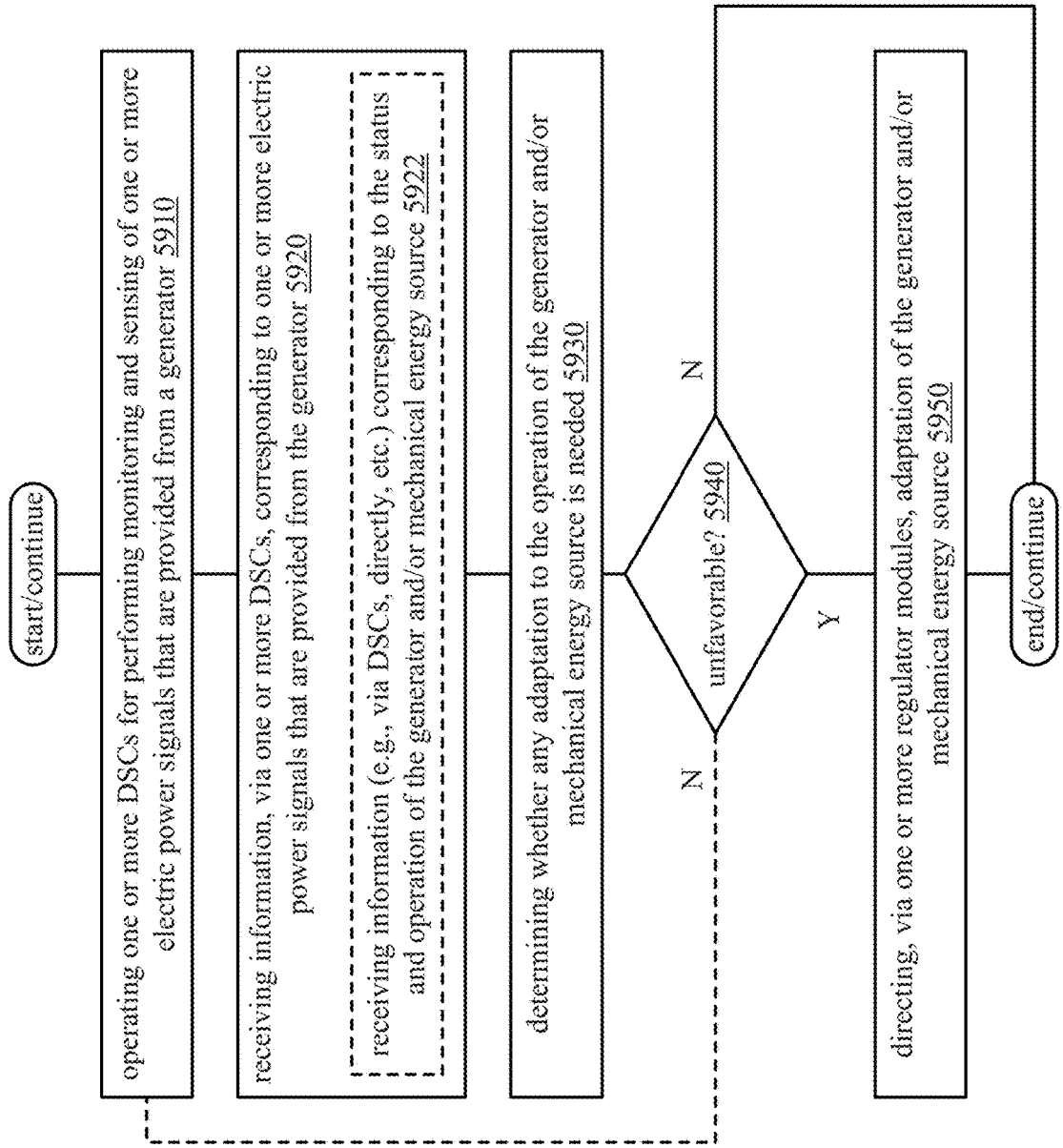

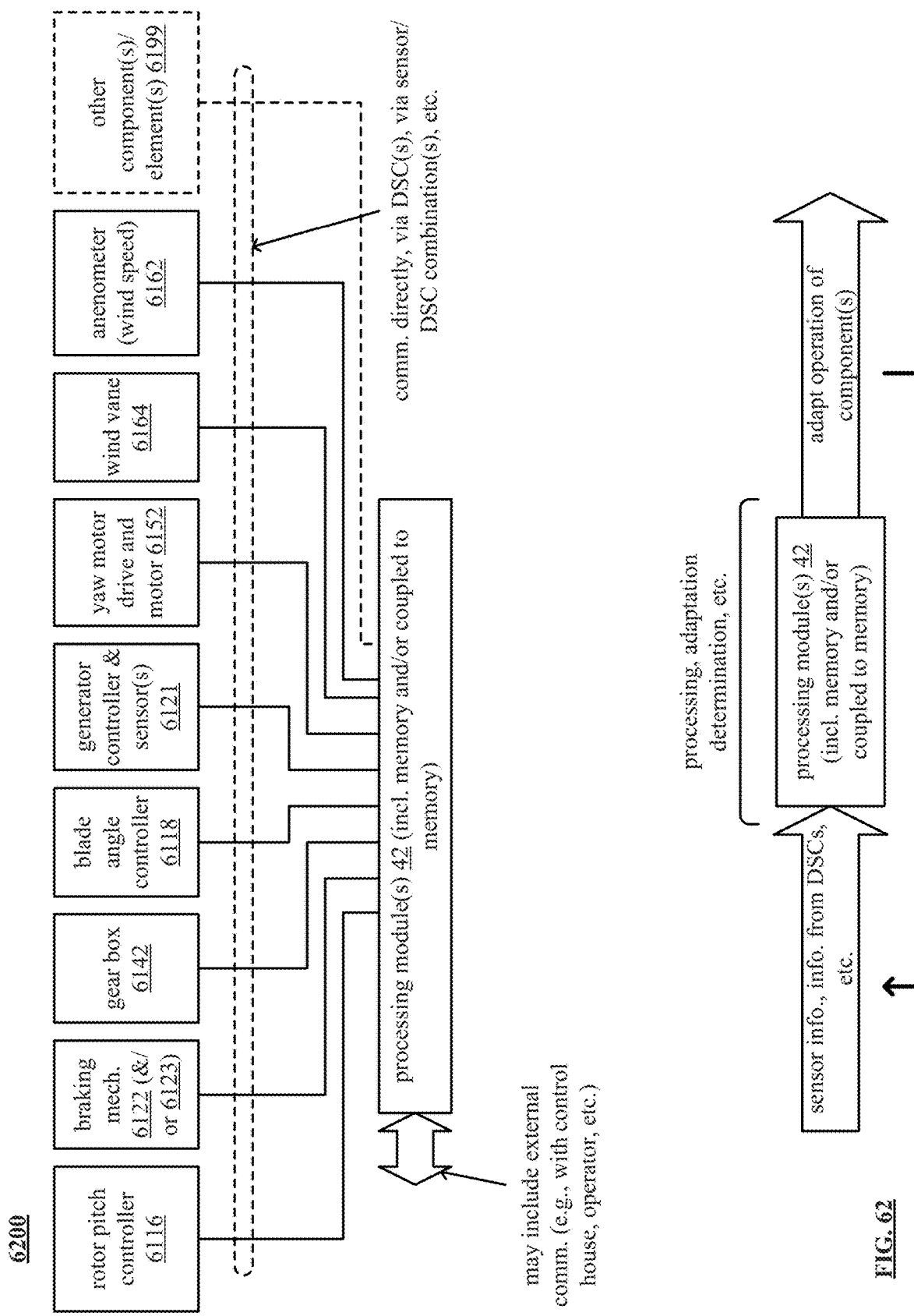

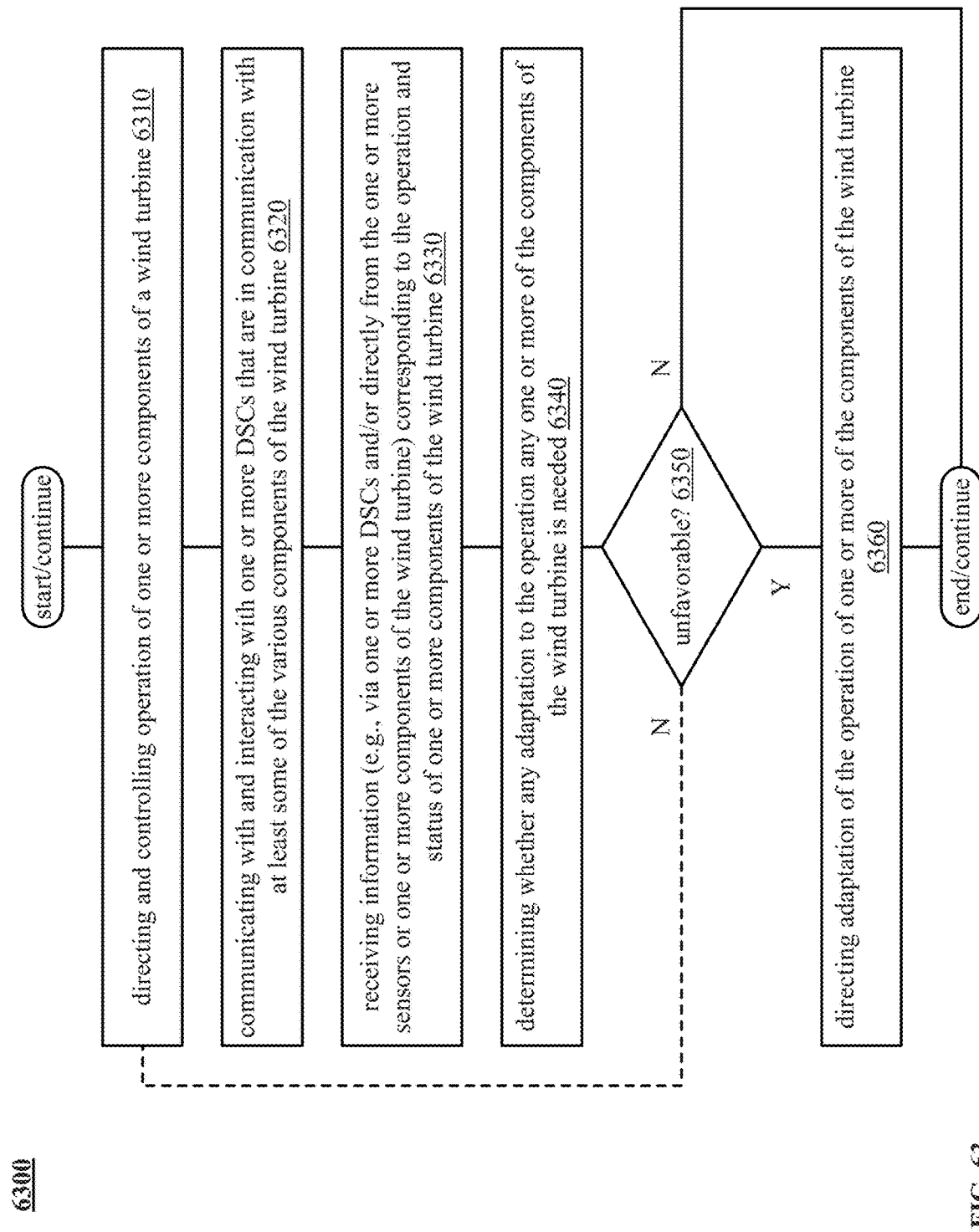

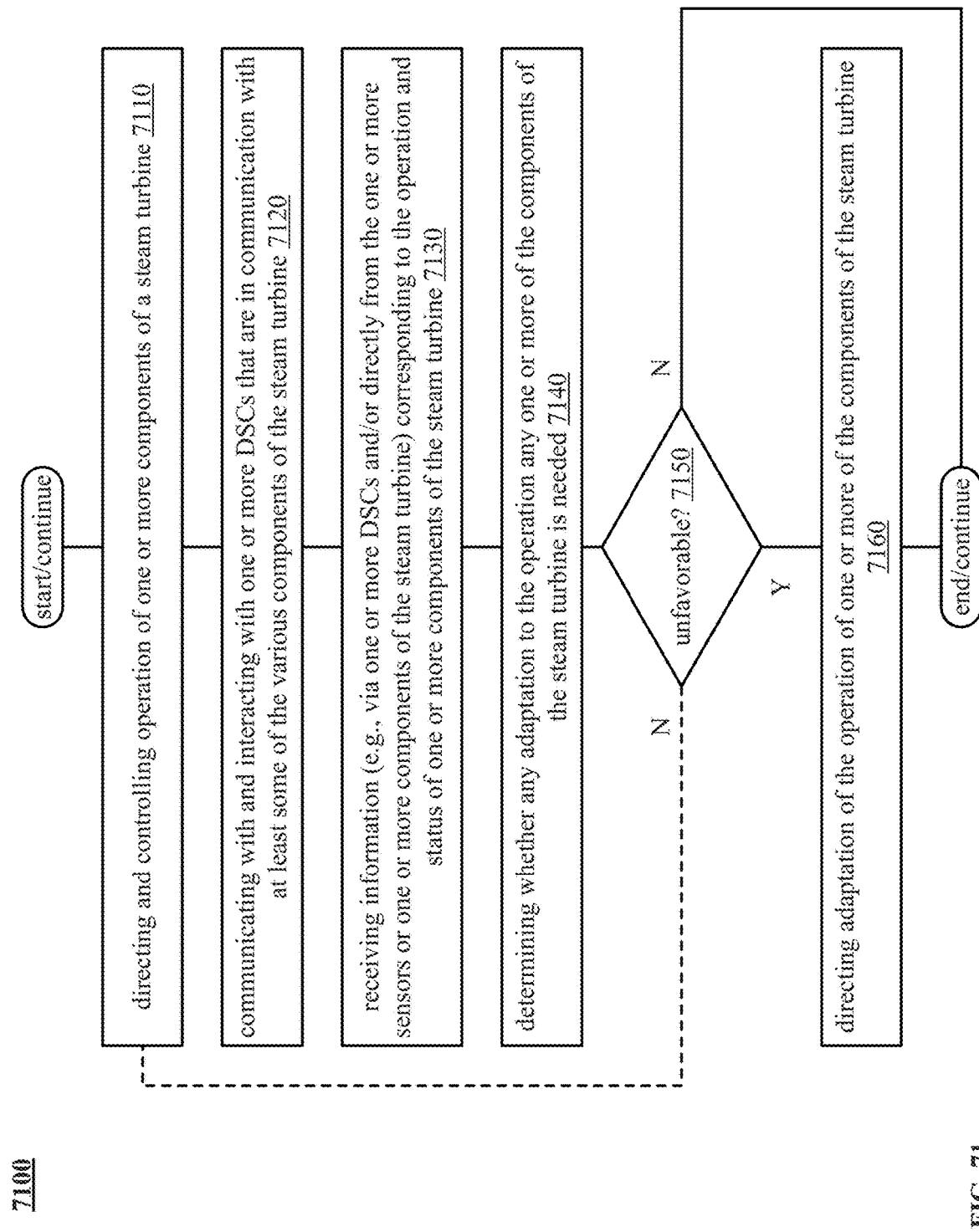

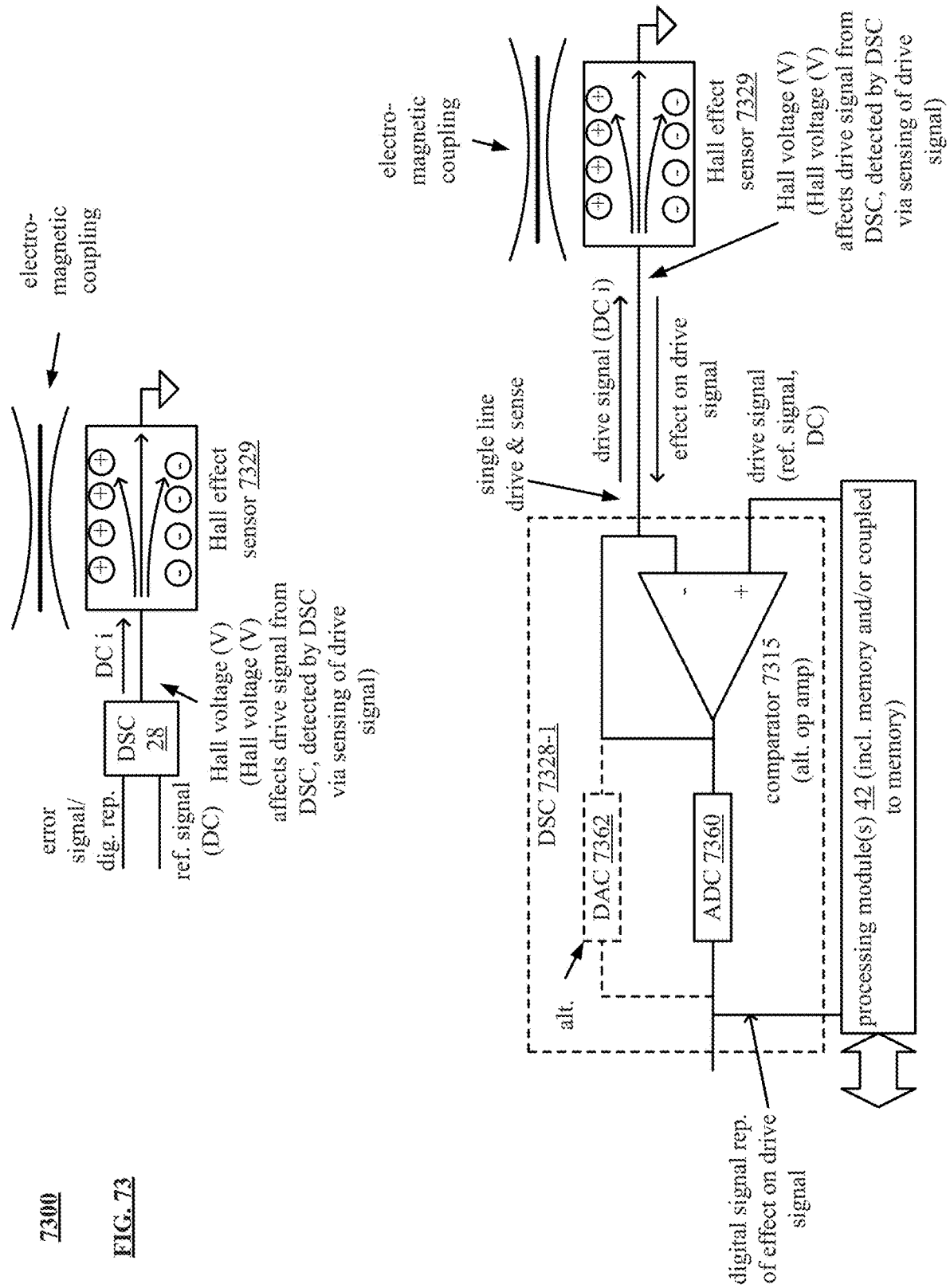

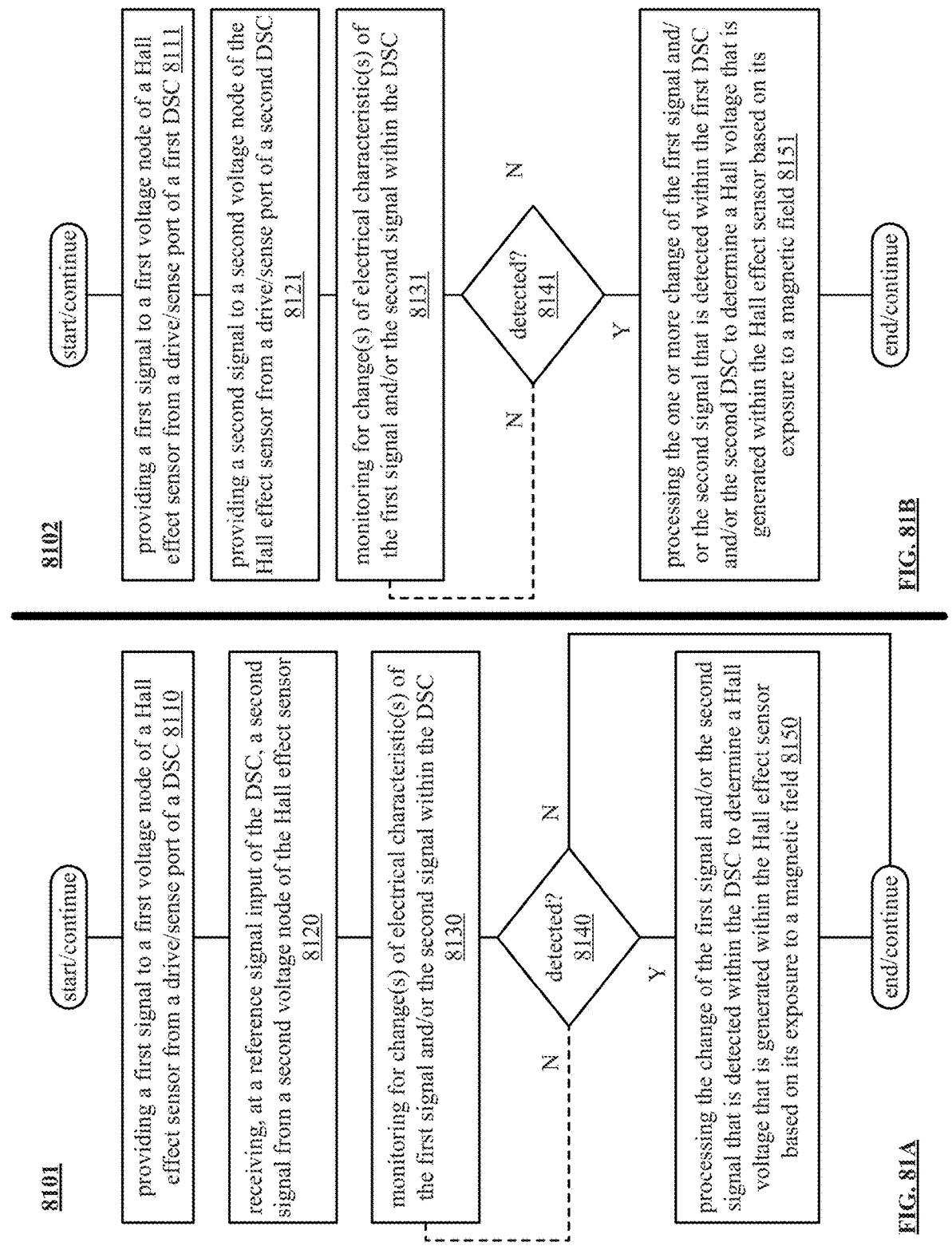

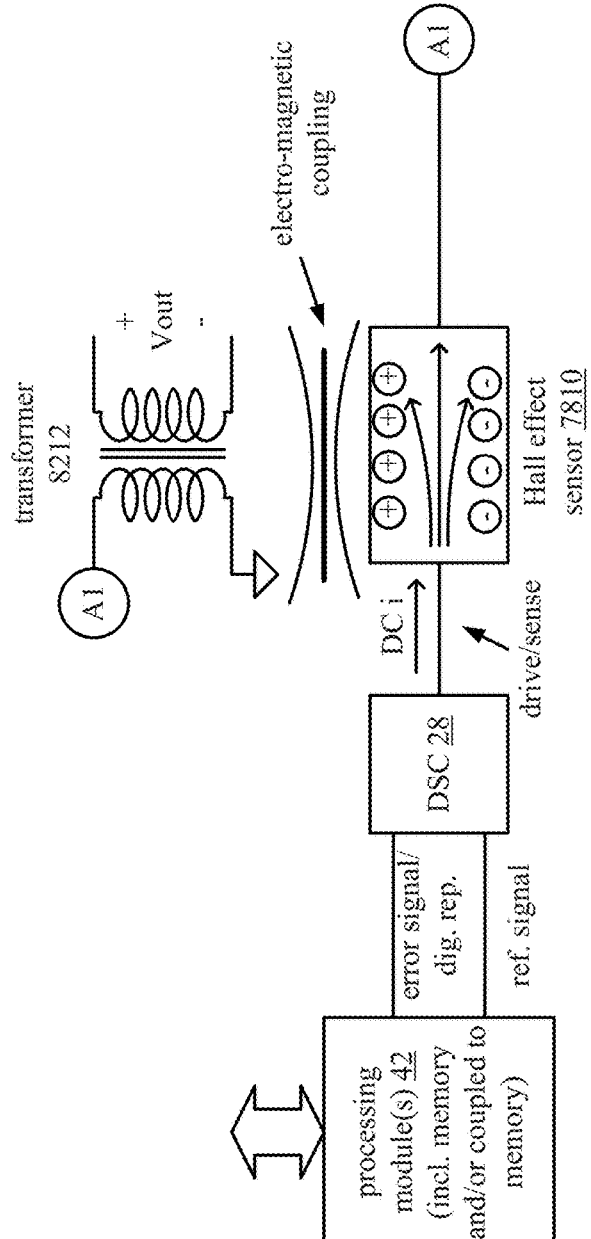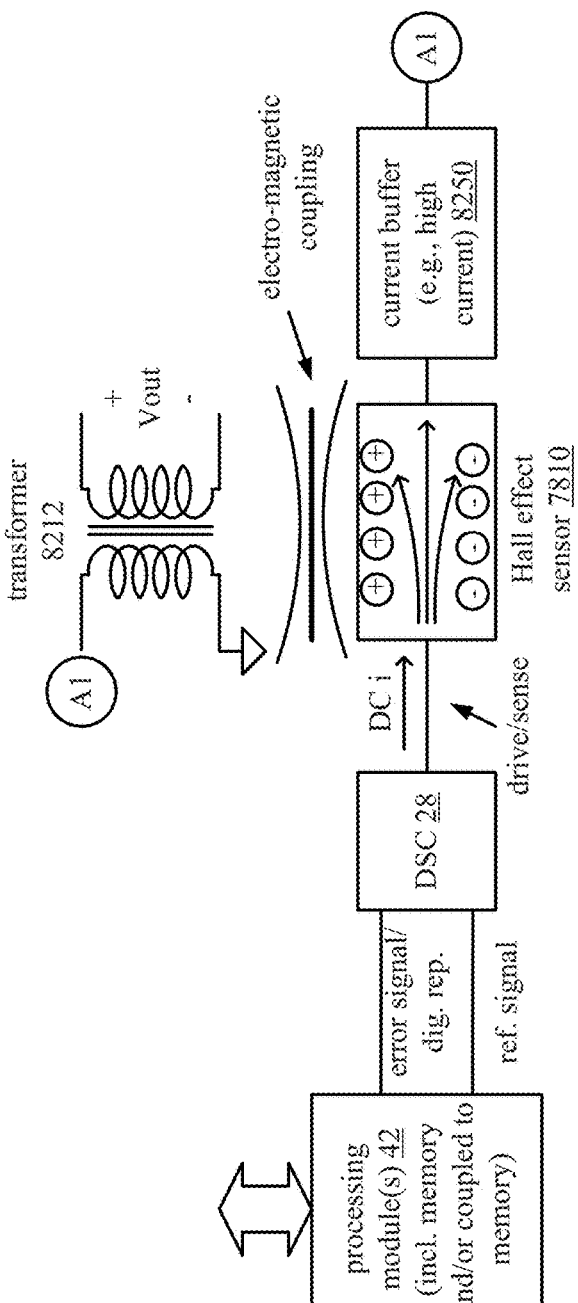

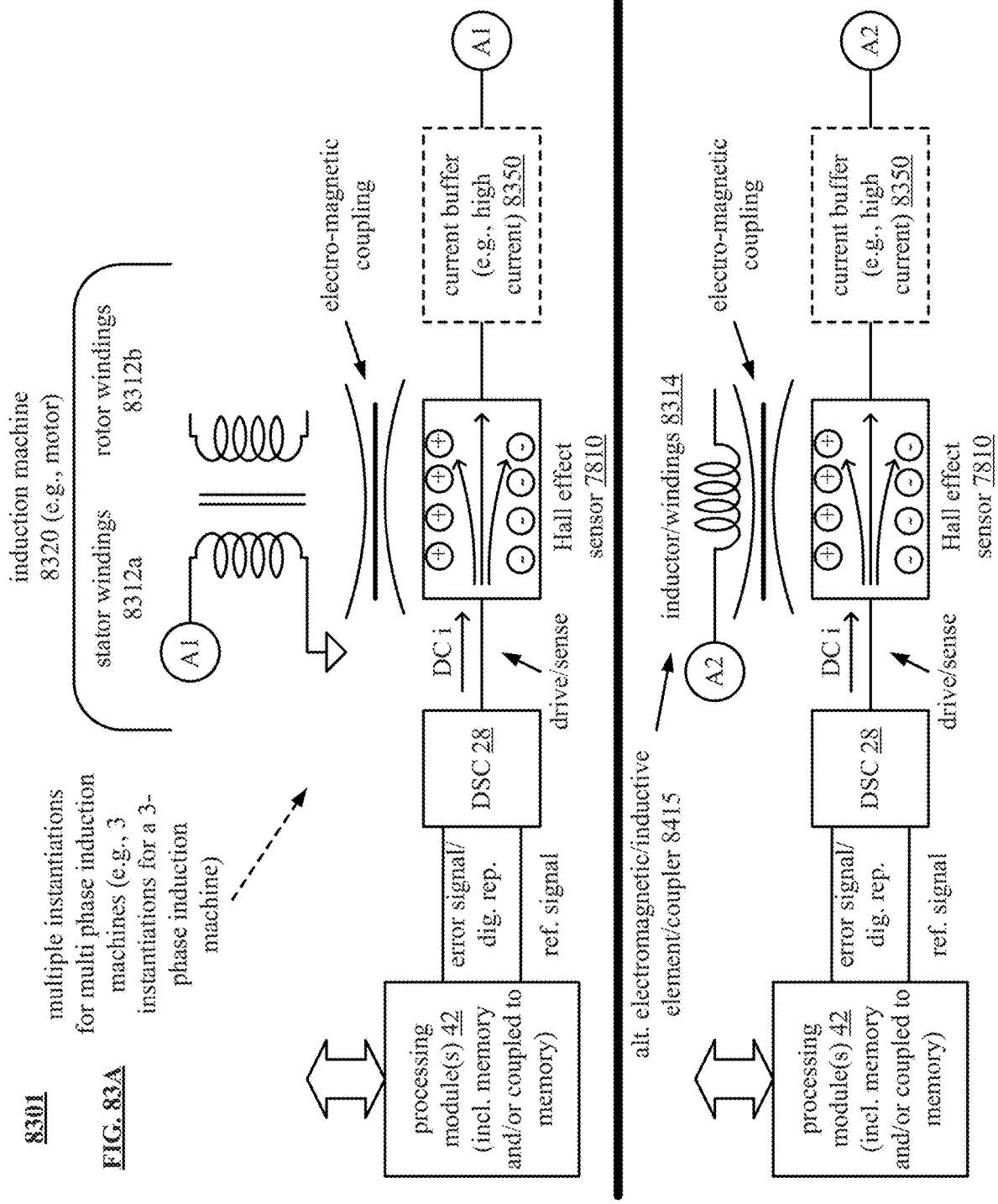

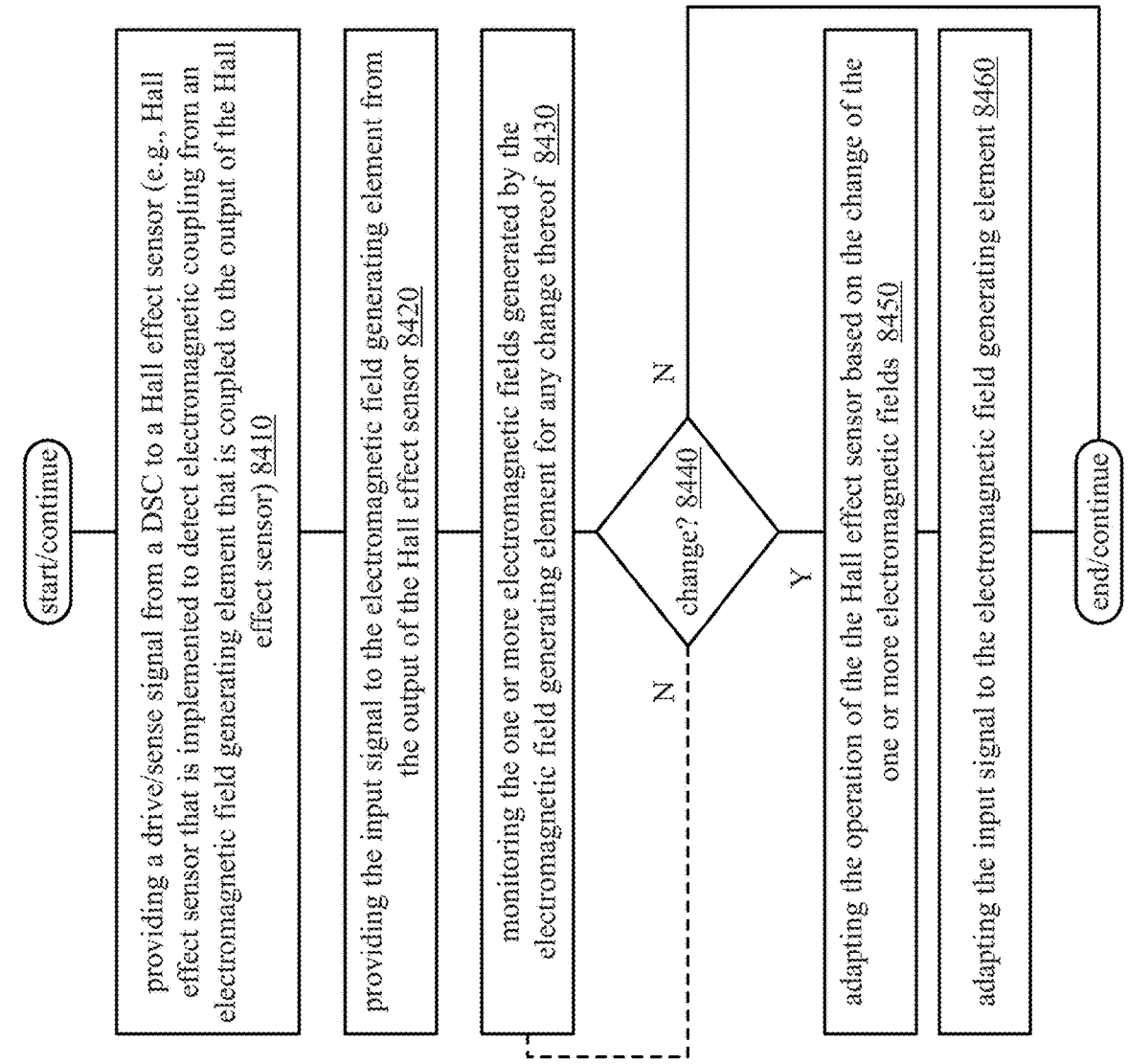

US 12,158,509 B2

SINGLE LINE HALL EFFECT SENSOR DRIVE AND SENSE

CROSS REFERENCE TO RELATED PATENTS

The present U.S. Utility patent application claims priority pursuant to 35 U.S.C. § 120 as a continuation of U.S. Utility application Ser. No. 16/355,967, entitled "Single line Hall effect sensor drive and sense," filed Mar. 18, 2019, pending and scheduled to issue as U.S. Pat. No. 11,061,082 on Jul. 13, 2021, which is hereby incorporated herein by reference in its entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

FIG. 5A is a schematic plot diagram of a computing subsystem in accordance with the present invention;

FIG. 5B is a schematic block diagram of another embodiment of a computing subsystem in accordance with the present invention;

FIG. 5D is a schematic block diagram of another embodiment of a computing subsystem in accordance with the present invention;

FIG. 6 is a schematic block diagram of a drive center circuit in accordance with the present invention;

FIG. 6A is a schematic block diagram of another embodiment of a drive sense circuit in accordance with the present invention;

FIG. 7 is an example of a power signal graph in accordance with the present invention;

FIG. 8 is an example of a sensor graph in accordance with the present invention;

FIG. 12 is a schematic block diagram of an embodiment of a power signal change detection circuit in accordance with the present invention;

FIG. 13 is a schematic block diagram of another embodiment of a drive-sense circuit in accordance with the present invention;

FIG. 14A is a schematic block diagram of an embodiment of a DSC configured simultaneously to drive and sense a drive signal to a motor or a motor coupled element in accordance with the present invention;

FIG. 14B is a schematic block diagram of another embodiment of a DSC configured simultaneously to drive and sense a drive signal to a motor or a motor coupled element in accordance with the present invention;

FIG. 16A is a schematic block diagram of another embodiment of a DSC configured simultaneously to drive and sense a drive signal to a current buffer servicing a motor including based on monitoring and sensing of a motor drive signal via a coupler in accordance with the present invention;

FIG. 16B is a schematic block diagram of another embodiment of a DSC configured simultaneously to drive and sense a drive signal to a current buffer servicing a motor including based on monitoring and sensing of a motor drive signal via a coupler and one or more additional motor related sensors in accordance with the present invention;

FIG. 35 is a schematic block diagram of another embodiment of a method for execution by one or more devices in accordance with the present invention;

FIG. 36A is a schematic block diagram of an embodiment of DSC sensing in accordance with motor control feedback and adaptation in accordance with the present invention;

FIG. 36B is a schematic block diagram of another embodiment of DSC sensing in accordance with motor control feedback and adaptation in accordance with the present invention;

FIG. 37A is a schematic block diagram of another embodiment of DSC sensing in accordance with motor control feedback and adaptation in accordance with the present invention;

FIG. 37B is a schematic block diagram of another embodiment of DSC sensing in accordance with motor control feedback and adaptation in accordance with the present invention;

FIG. 38A is a schematic block diagram of another embodiment of DSC sensing in accordance with motor control feedback and adaptation in accordance with the present invention;

FIG. 38B is a schematic block diagram of another embodiment of DSC sensing in accordance with motor control feedback and adaptation in accordance with the present invention;

FIG. 39A is a schematic block diagram of another embodiment of DSC sensing in accordance with motor control feedback and adaptation in accordance with the present invention;

FIG. 39B is a schematic block diagram of another embodiment of DSC sensing in accordance with motor control feedback and adaptation in accordance with the present invention;

FIG. 42 is a schematic block diagram of another embodiment of a method for execution by one or more devices in accordance with the present invention;

FIG. 43A is a schematic block diagram of an embodiment of input electric power adaptation based on in-line DSC configured simultaneously to drive and sense a drive signal to a load in accordance with the present invention;

FIG. 43B is a schematic block diagram of another embodiment of input electric power adaptation based on in-line DSC configured simultaneously to drive and sense a drive signal to a load in accordance with the present invention;

FIG. 44A is a schematic block diagram of an embodiment of a DSC configured simultaneously to drive and sense a drive signal to a load in accordance with the present invention;

FIG. 44B is a schematic block diagram of an embodiment of a DSC configured simultaneously to drive and sense a drive signal to a load in accordance with the present invention;

FIG. 56 is a schematic block diagram of another embodiment of prime mover and generator regulation based on output signal sensing in accordance with the present invention;

FIG. 58 is a schematic block diagram of another embodiment of prime mover and generator regulation based on output signal sensing in accordance with the present invention;

FIG. 59 is a schematic block diagram of another embodiment of a method for execution by one or more devices in accordance with the present invention;

FIG. 62 is a schematic block diagram of another embodiment of wind turbine generation system control feedback and adaptation in accordance with the present invention;

FIG. 63 is a schematic block diagram of another embodiment of a method for execution by one or more devices in accordance with the present invention;

FIG. 71 is a schematic block diagram of another embodiment of a method for execution by one or more devices in accordance with the present invention;

FIG. 73 is a schematic block diagram of another embodiment of single line Hall effect sensor drive and sense in accordance with the present invention;

FIG. 81A is a schematic block diagram of another embodiment of a method for execution by one or more devices in accordance with the present invention;

FIG. 81B is a schematic block diagram of another embodiment of a method for execution by one or more devices in accordance with the present invention;

FIG. 82A is a schematic block diagram of an embodiment of a Hall effect sensor adapted driver circuit in accordance with the present invention;

FIG. 82B is a schematic block diagram of another embodiment of a Hall effect sensor adapted driver circuit in accordance with the present invention;

FIG. 83A is a schematic block diagram of another embodiment of a Hall effect sensor adapted driver circuit in accordance with the present invention;

FIG. 83B is a schematic block diagram of another embodiment of a Hall effect sensor adapted driver circuit in accordance with the present invention;

FIG. 84 is a schematic block diagram of another embodiment of a method for execution by one or more devices in accordance with the present invention;

DETAILED DESCRIPTION OF THE INVENTION

Figure 1:
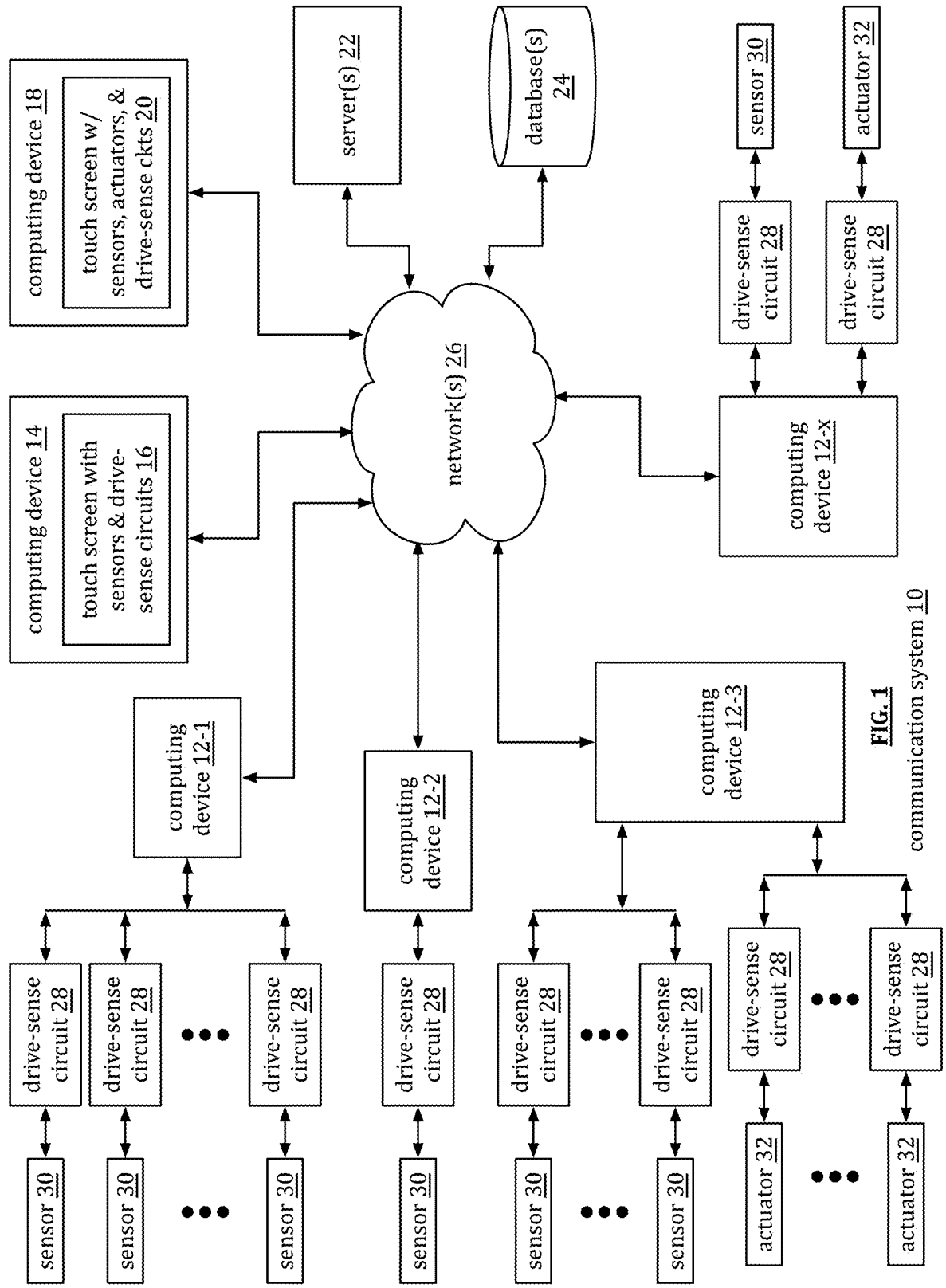
FIG. 1 is a schematic block diagram of an embodiment of a communication system in accordance with the present invention.

FIG. 1 is a schematic block diagram of an embodiment of a communication system 10 that includes a plurality of computing. devices 12-10, one or more servers 22, one or more databases 24, one or more networks 26, a plurality of drive-sense circuits 28, a plurality of sensors 30, and a plurality of actuators 32. Computing devices 14 include a touch screen 16 with sensors and drive-sensor circuits and computing devices 18 include a touch & tactic screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a senor 30. The sensor 30 and/or the drive-sense circuit 28 may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The generally functionality of the drive-sense circuits 28 coupled to the sensors 30 in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals onto power signals or regulated control signals, which are provided to the actuators 32. The actuators 32 are powered from the power signals or regulated control signals and produce the desired physical condition from the modulated actuation signals.

As another example of operation, computing device 12-*x* is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-*x*. For example, the sensor 30 may be a piezoelectric microphone and the actuator 32 may be a piezoelectric speaker.

Figure 2:
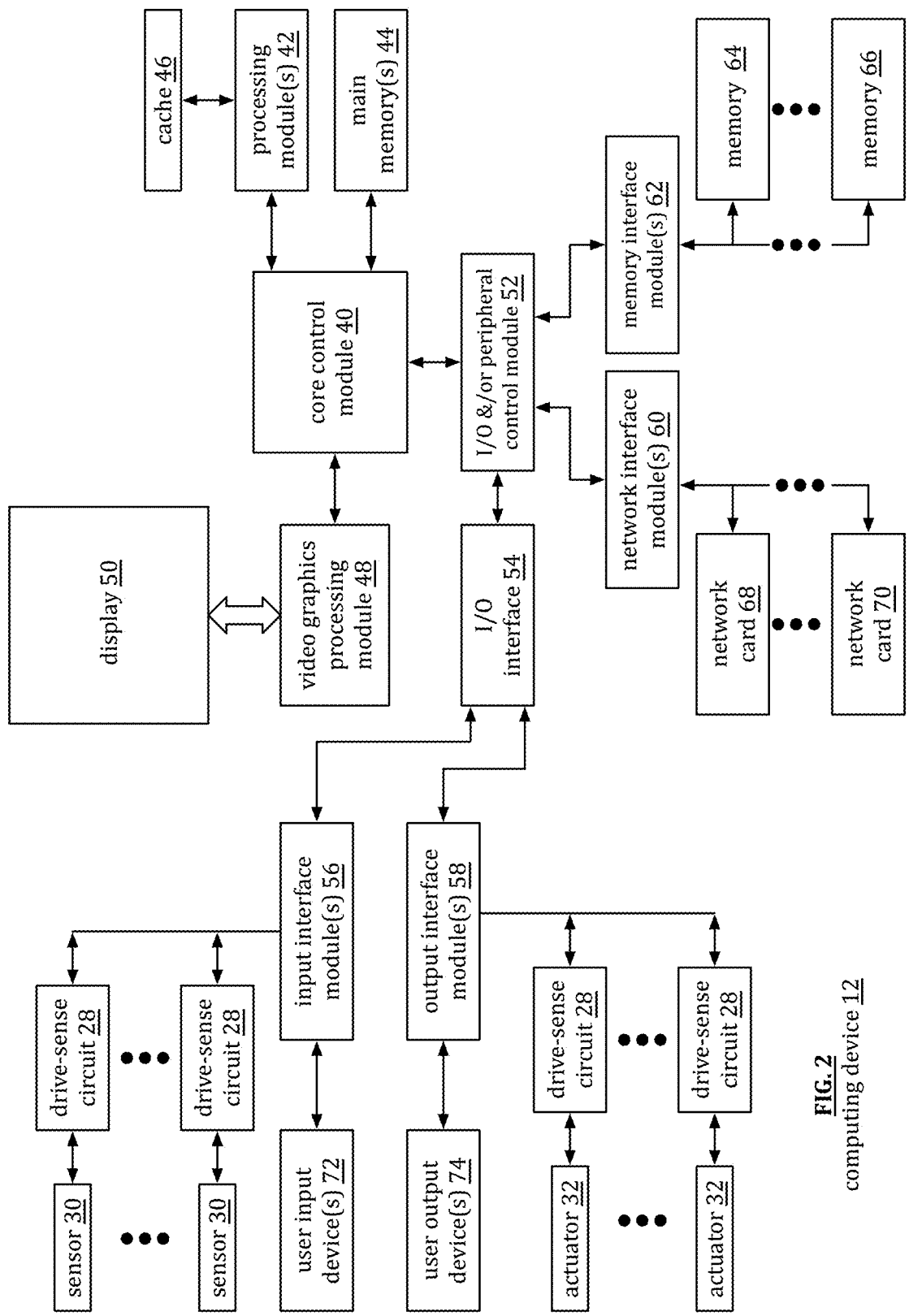
FIG. 2 is a schematic block diagram of an embodiment of a computing device in accordance with the present invention.

FIG. 2 is a schematic block diagram of an embodiment of a computing device 12 (e.g., any one of 12-1 through 12-*x*). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to drive-sense circuits 28, which are coupled to the input interface module 56 (e.g., USB port). Alternatively, one or more of the drive-sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
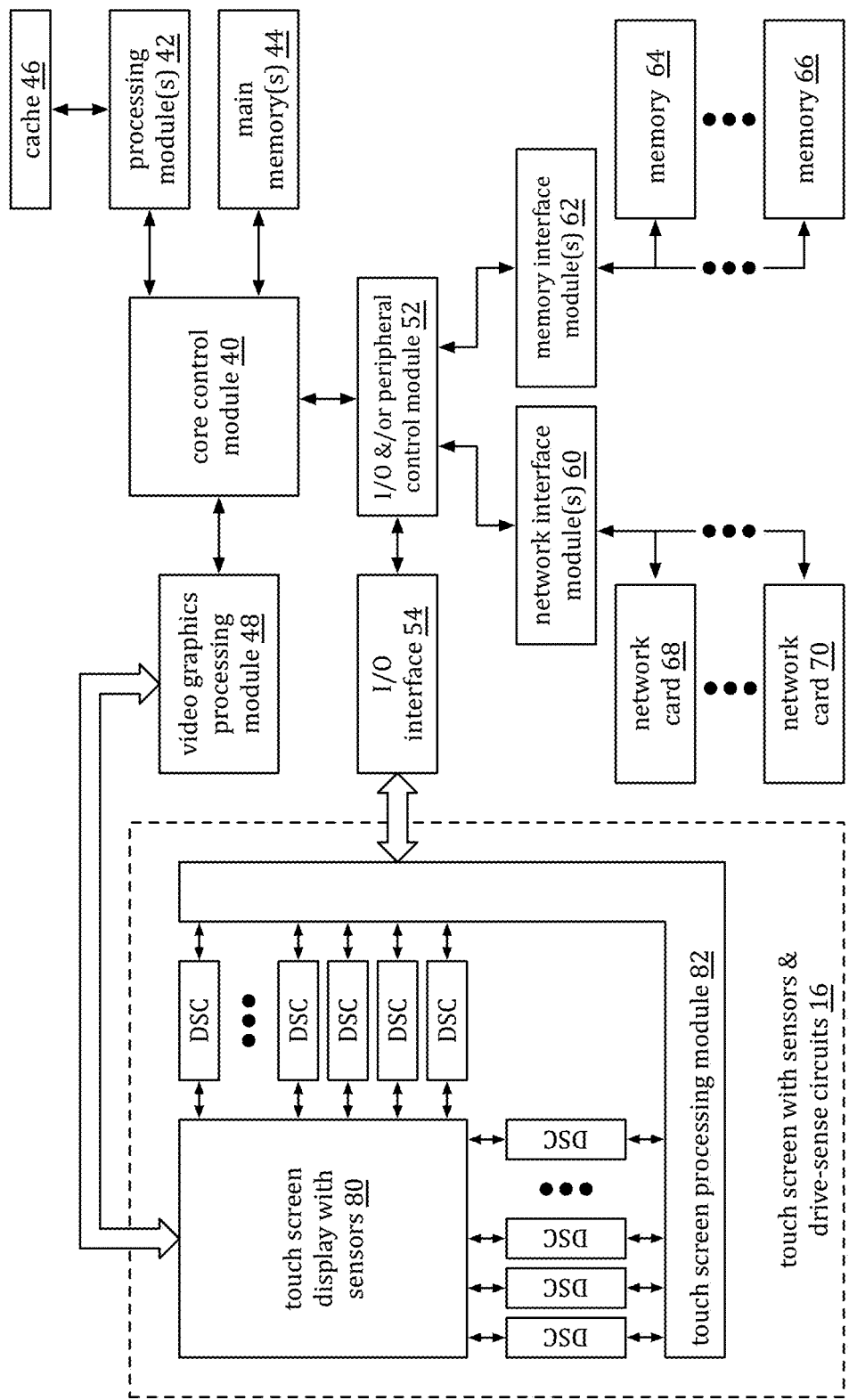
FIG. 3 is a schematic block diagram of another embodiment of a computing device in accordance with the present invention.

FIG. 3 is a schematic block diagram of another embodiment of a computing device 14 that includes a core control module 40, one or more processing modules 42, one or more main memories 44, cache memory 46, a video graphics processing module 48, a touch screen 16, an Input-Output (I/O) peripheral control module 52, one or more input interface modules 56, one or more output interface modules 58, one or more network interface modules 60, and one or more memory interface modules 62. The touch screen 16 includes a touch screen display 80, a plurality of sensors 30, a plurality of drive-sense circuits (DSC), and a touch screen processing module 82.

Computing device 14 operates similarly to computing device 12 of FIG. 2 with the addition of a touch screen as an input device. The touch screen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
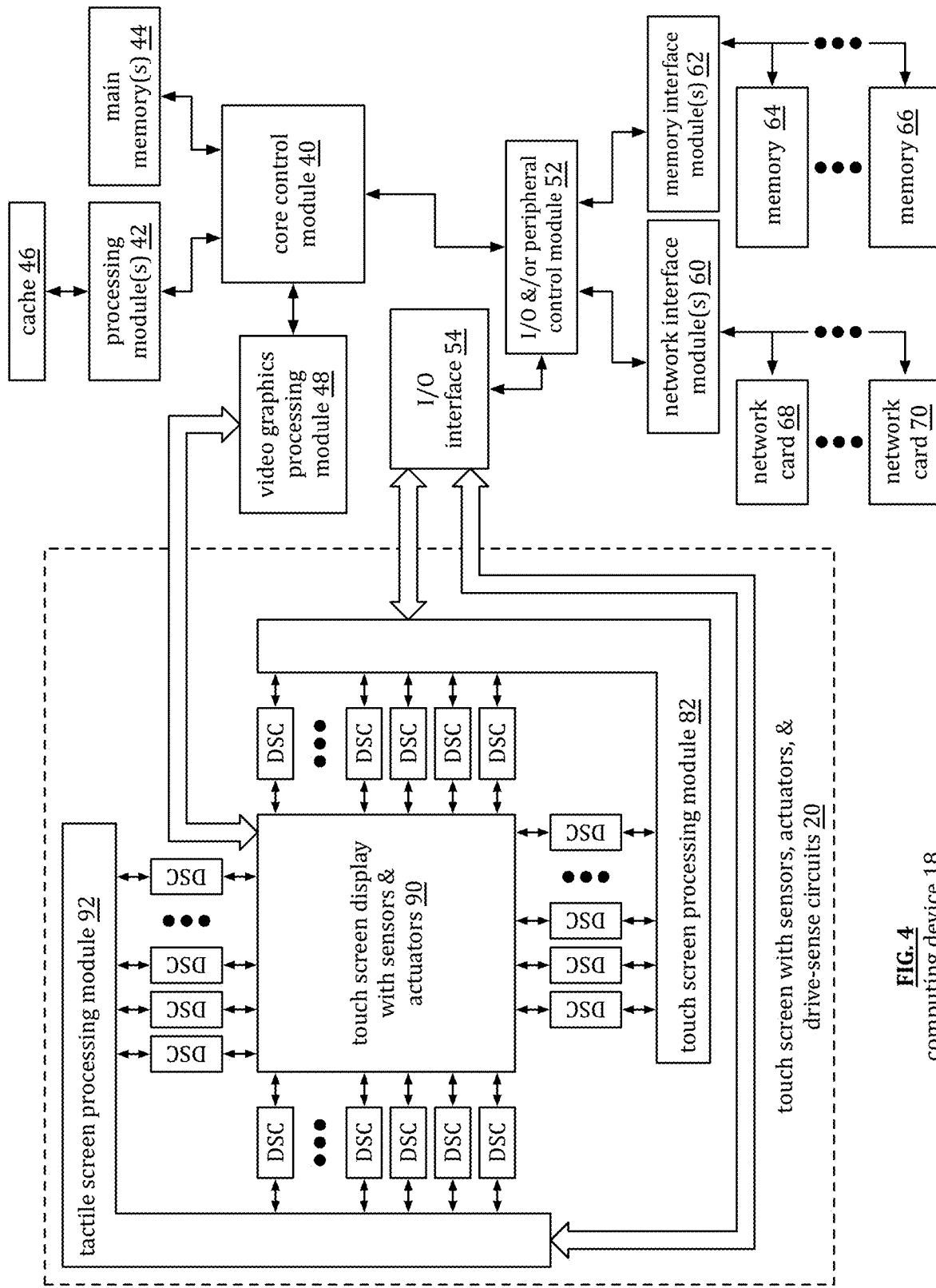
FIG. 4 is a schematic block diagram of another embodiment of a computing device in accordance with the present invention.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touch screen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

FIG. 5A is a schematic plot diagram of a computing subsystem 25 that includes a sensed data processing module 65, a plurality of communication modules 61A-x, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing devices in which processing modules 42A-x reside.

A drive-sense circuit 28 (or multiple drive-sense circuits), a processing module (e.g., 41A), and a communication module (e.g., 61A) are within a common computing device. Each grouping of a drive-sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding drive-sense circuit 28. The processing module 42A may generate the control signal, receive it from the sensed data processing module 65, or receive an indication from the sensed data processing module 65 to generate the control signal. The control signal enables the drive-sense circuit 28 to provide a drive signal to its corresponding sensor. The control signal may further include a reference signal having one or more frequency components to facilitate creation of the drive signal and/or interpreting a sensed signal received from the sensor.

Based on the control signal, the drive-sense circuit 28 provides the drive signal to its corresponding sensor (e.g., 1) on a drive & sense line. While receiving the drive signal (e.g., a power signal, a regulated source signal, etc.), the sensor senses a physical condition 1-x (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The drive-sense circuit 28 detects the effect on the drive signal via the drive & sense line and processes the affect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., x PSI (pounds per square inch)).

In accordance with a sensed data process function (e.g., algorithm, application, etc.), the sensed data processing module 65 gathers the values representing the sensed physical conditions from the processing modules. Since the sensors 1-x may be the same type of sensor (e.g., a pressure sensor), may each be different sensors, or a combination thereof, the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem 25 includes an actuator, the corresponding processing module provides an actuation control signal to the corresponding drive-sense circuit 28. The actuation control signal enables the drive-sense circuit 28 to provide a drive signal to the actuator via a drive & actuate line (e.g., similar to the drive & sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a drive-sense circuit provides a drive signal to the actuator and another drive sense signal provides the same drive signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a stand-alone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation and another subsystem monitors the city's sewage treatment plants.

Regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions.

FIG. 5B is a schematic block diagram of another embodiment of a computing subsystem 25 that includes a sensed data processing module 65, a communication module 61, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device, devices, in which processing modules 42A-x reside.

In an embodiment, the drive-sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the drive sense circuits 28, and the sensors 1-x are as discussed with reference to FIG. 5A.

Figure 5C:
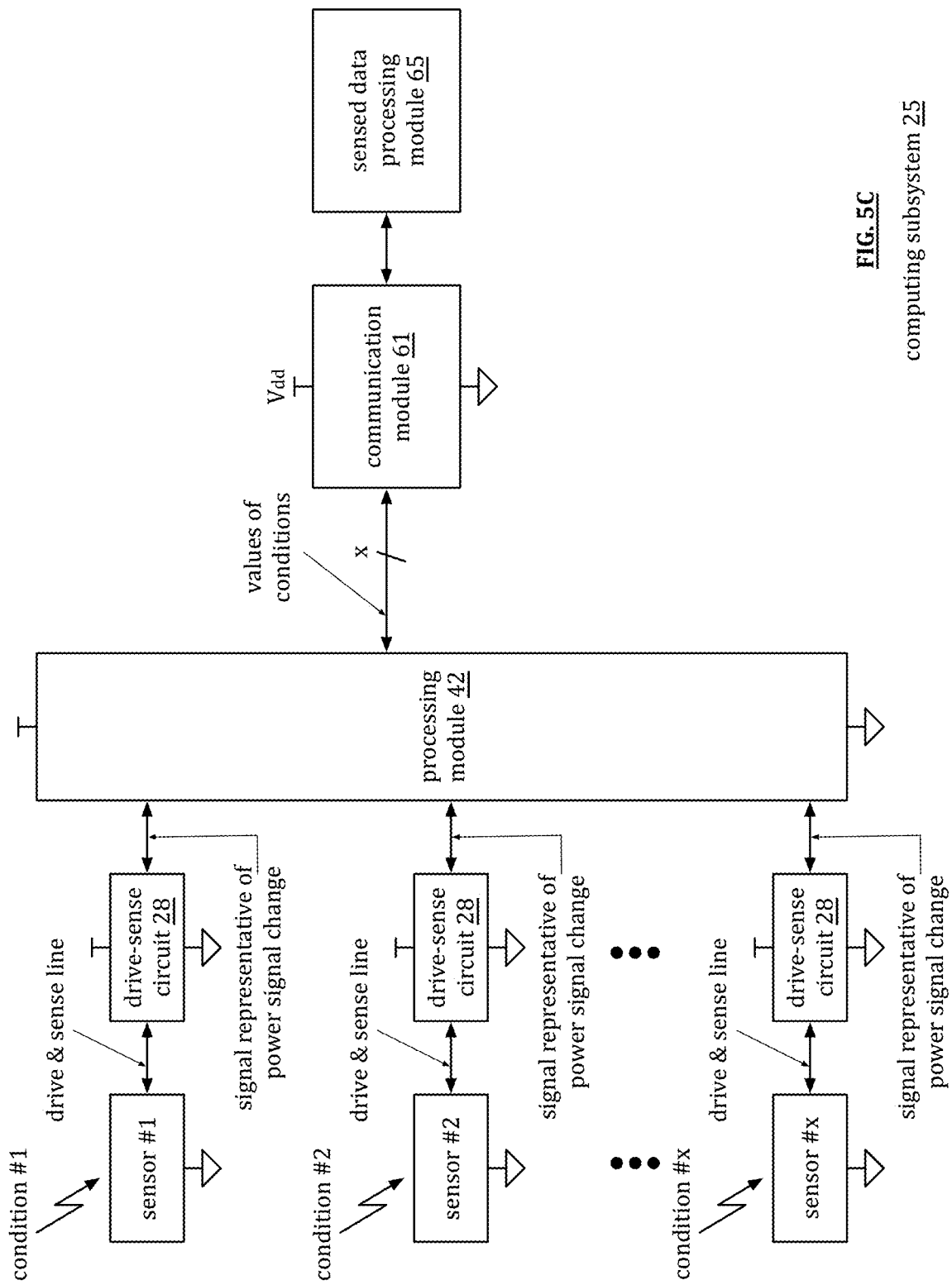
FIG. 5C is a schematic block diagram of another embodiment of a computing subsystem in accordance with the present invention.

FIG. 5C is a schematic block diagram of another embodiment of a computing subsystem 25 that includes a sensed data processing module 65, a communication module 61, a processing module 42, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device in which the processing module 42 resides.

In an embodiment, the drive-sense circuits 28, the processing module, and the communication module are within a common computing device. The functionality and operation of the sensed data processing module 65, the communication module 61, the processing module 42, the drive sense circuits 28, and the sensors 1-x are as discussed with reference to FIG. 5A.

FIG. 5D is a schematic block diagram of another embodiment of a computing subsystem 25 that includes a processing module 42, a reference signal circuit 100, a plurality of drive sense circuits 28, and a plurality of sensors 30. The processing module 42 includes a drive-sense processing block 104, a drive-sense control block 102, and a reference control block 106. Each block 102-106 of the processing module 42 may be implemented via separate modules of the processing module, may be a combination of software and hardware within the processing module, and/or may be field programmable modules within the processing module 42.

In an example of operation, the drive-sense control block 104 generates one or more control signals to activate one or more of the drive-sense circuits 28. For example, the drive-sense control block 102 generates a control signal that enables of the drive-sense circuits 28 for a given period of time (e.g., 1 second, 1 minute, etc.). As another example, the drive-sense control block 102 generates control signals to sequentially enable the drive-sense circuits 28. As yet another example, the drive-sense control block 102 generates a series of control signals to periodically enable the drive-sense circuits 28 (e.g., enabled once every second, every minute, every hour, etc.).

Continuing with the example of operation, the reference control block 106 generates a reference control signal that it provides to the reference signal circuit 100. The reference signal circuit 100 generates, in accordance with the control signal, one or more reference signals for the drive-sense circuits 28. For example, the control signal is an enable signal, which, in response, the reference signal circuit 100 generates a pre-programmed reference signal that it provides to the drive-sense circuits 28. In another example, the reference signal circuit 100 generates a unique reference signal for each of the drive-sense circuits 28. In yet another example, the reference signal circuit 100 generates a first unique reference signal for each of the drive-sense circuits 28 in a first group and generates a second unique reference signal for each of the drive-sense circuits 28 in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive-sense circuits 28. When a drive-sense circuit 28 is enabled via a control signal from the drive sense control block 102, it provides a drive signal to its corresponding sensor 30. As a result of a physical condition, an electrical characteristic of the sensor is changed, which affects the drive signal. Based on the detected effect on the drive signal and the reference signal, the drive-sense circuit 28 generates a signal representative of the effect on the drive signal.

The drive-sense circuit provides the signal representative of the effect on the drive signal to the drive-sense processing block 104. The drive-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
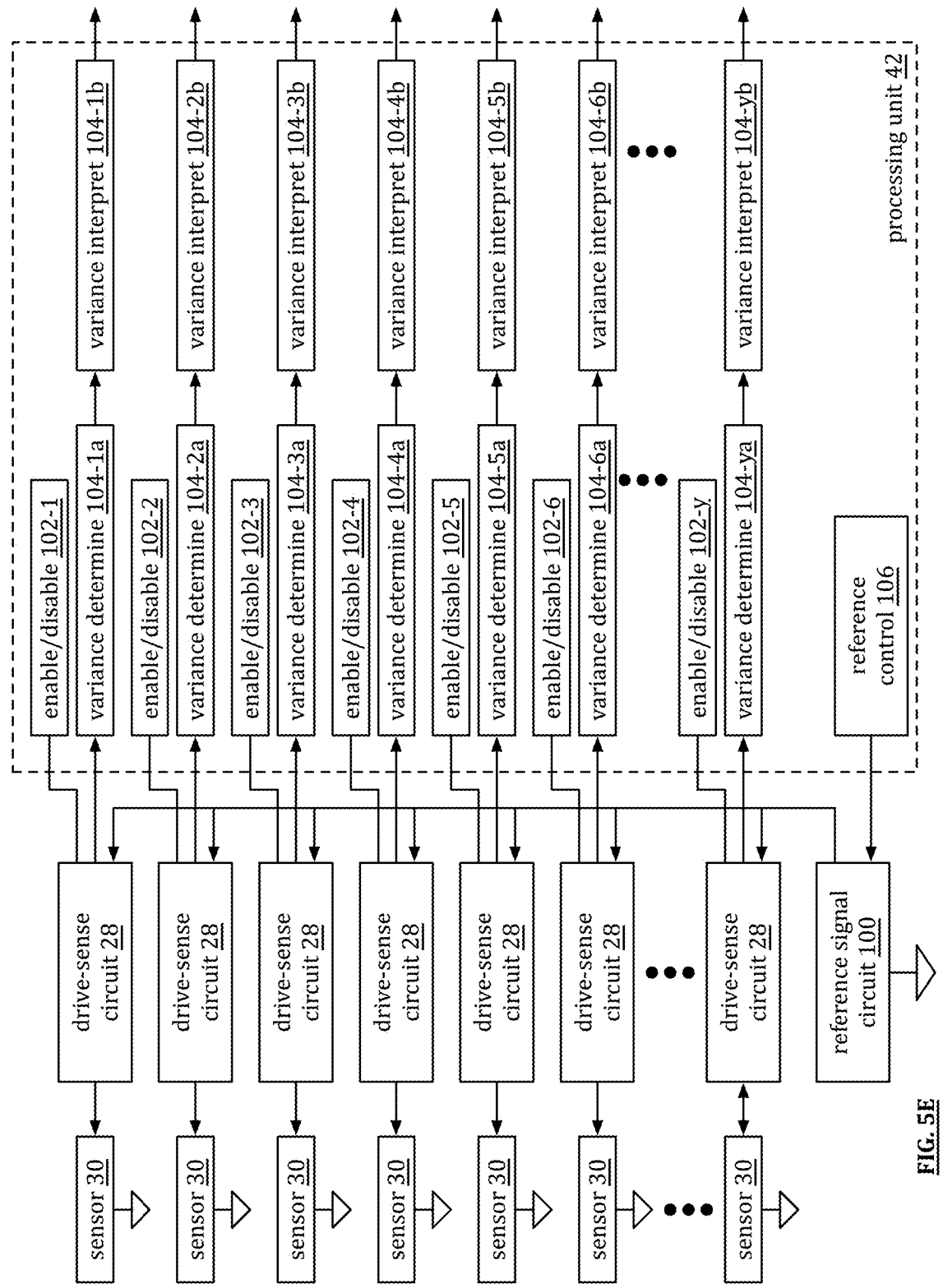
FIG. 5E is a schematic block diagram of another embodiment of a computing subsystem in accordance with the present invention.

FIG. 5E is a schematic block diagram of another embodiment of a computing subsystem 25 that includes a processing module 42, a plurality of drive sense circuits 28, and a plurality of sensors 30. This embodiment is similar to the embodiment of FIG. 5D with the functionality of the drive-sense processing block 104, a drive-sense control block 102, and a reference control block 106 shown in greater detail. For instance, the drive-sense control block 102 includes individual enable/disable blocks 102-1 through 102-y. An enable/disable block functions to enable or disable a corresponding drive-sense circuit in a manner as discussed above with reference to FIG. 5D.

The drive-sense processing block 104 includes variance determining modules 104-1a through y and variance interpreting modules 104-2a through y. For example, variance determining module 104-1a receives, from the corresponding drive-sense circuit 28, a signal representative of a physical condition sensed by a sensor. The variance determining module 104-1a functions to determine a difference from the signal representing the sensed physical condition with a signal representing a known, or reference, physical condition. The variance interpreting module 104-1b interprets the difference to determine a specific value for the sensed physical condition.

As a specific example, the variance determining module 104-1a receives a digital signal of 10010110 (150 in decimal) that is representative of a sensed physical condition (e.g., temperature) sensed by a sensor from the corresponding drive-sense circuit 28. With 8-bits, there are $2^8$ (256) possible signals representing the sensed physical condition. Assume that the units for temperature is Celsius and a digital value of 01000000 (64 in decimal) represents the known value for 25 degree Celsius. The variance determining module 104-b1 determines the difference between the digital signal representing the sensed value (e.g., 10010110, 150 in decimal) and the known signal value of (e.g., 01000000, 64 in decimal), which is 00110000 (86 in decimal). The variance determining module 104-b1 then determines the sensed value based on the difference and the known value. In this example, the sensed value equals 25+86*(100/256)=25+33.6=58.6 degrees Celsius.

FIG. 6 is a schematic block diagram of a drive center circuit 28-a coupled to a sensor 30. The drive sense-sense circuit 28 includes a power source circuit 110 and a power signal change detection circuit 112. The sensor 30 includes one or more transducers that have varying electrical characteristics (e.g., capacitance, inductance, impedance, current, voltage, etc.) based on varying physical conditions 114 (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the sensor and substantially matches impedance of the sensor. The power source circuit 110 generates the power signal 116 to include a DC (direct current) component and/or an oscillating component.

When receiving the power signal 116 and when exposed to a condition 114, an electrical characteristic of the sensor affects 118 the power signal. When the power signal change detection circuit 112 is enabled, it detects the affect 118 on the power signal as a result of the electrical characteristic of the sensor. For example, the power signal is a 1.5 voltage signal and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal and, under a first condition, the sensor draws 1 milliamp of current, which corresponds to an impedance of 1.5 K Ohms. Under a second conditions, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

The power signal 116 includes a DC component 122 and/or an oscillating component 124 as shown in FIG. 7. The oscillating component 124 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power generating circuit 110 varies frequency of the oscillating component 124 of the power signal 116 so that it can be tuned to the impedance of the sensor and/or to be off-set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power generating circuit 110 varies magnitude of the DC component 122 and/or the oscillating component 124 to improve resolution of sensing and/or to adjust power consumption of sensing. In addition, the power generating circuit 110 generates the drive signal 110 such that the magnitude of the oscillating component 124 is less than magnitude of the DC component 122.

FIG. 6A is a schematic block diagram of a drive center circuit 28-*al* coupled to a sensor 30. The drive sense-sense circuit 28-*al* includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a voltage-based signal 117, a current supply circuit (e.g., a current source circuit, a current mirror circuit, etc.) to produce a current-based signal 117, or a circuit that provide a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects 119 the signal. When the signal change detection circuit 113 is enabled, it detects the affect 119 on the signal as a result of the electrical characteristic of the sensor.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases. As an example of a second type, a capacitance touch sensor decreases in capacitance as a touch is sensed.

Figure 9:
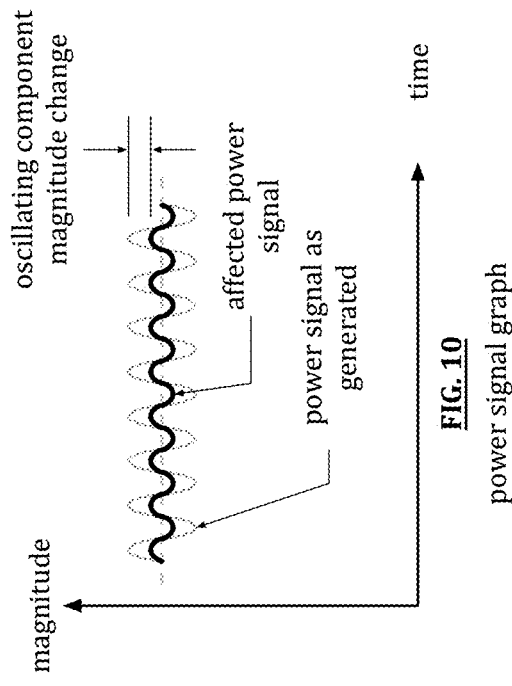
FIG. 9 is a schematic block diagram of another example of a power signal graph in accordance with the present invention.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

Figure 10:
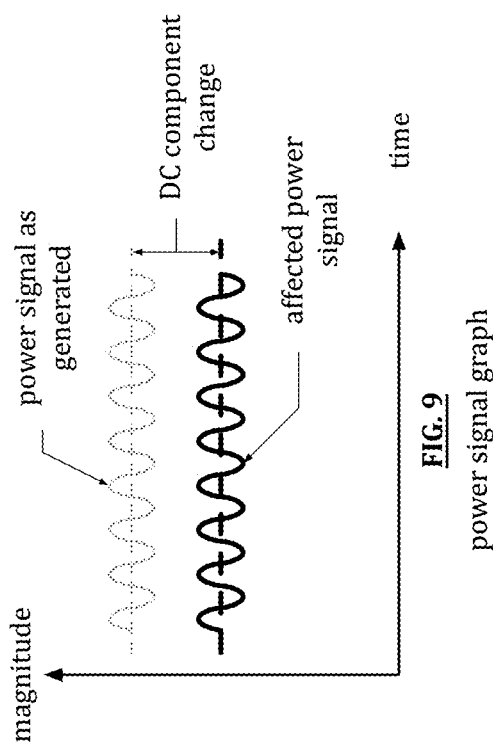
FIG. 10 is a schematic block diagram of another example of a power signal graph in accordance with the present invention.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

Figure 11A:
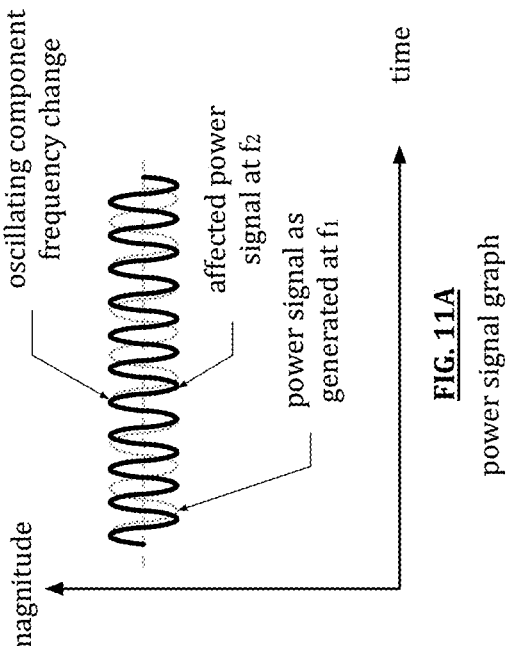
FIG. 11A is a schematic block diagram of another example of a power signal graph in accordance with the present invention.
Figure 11:
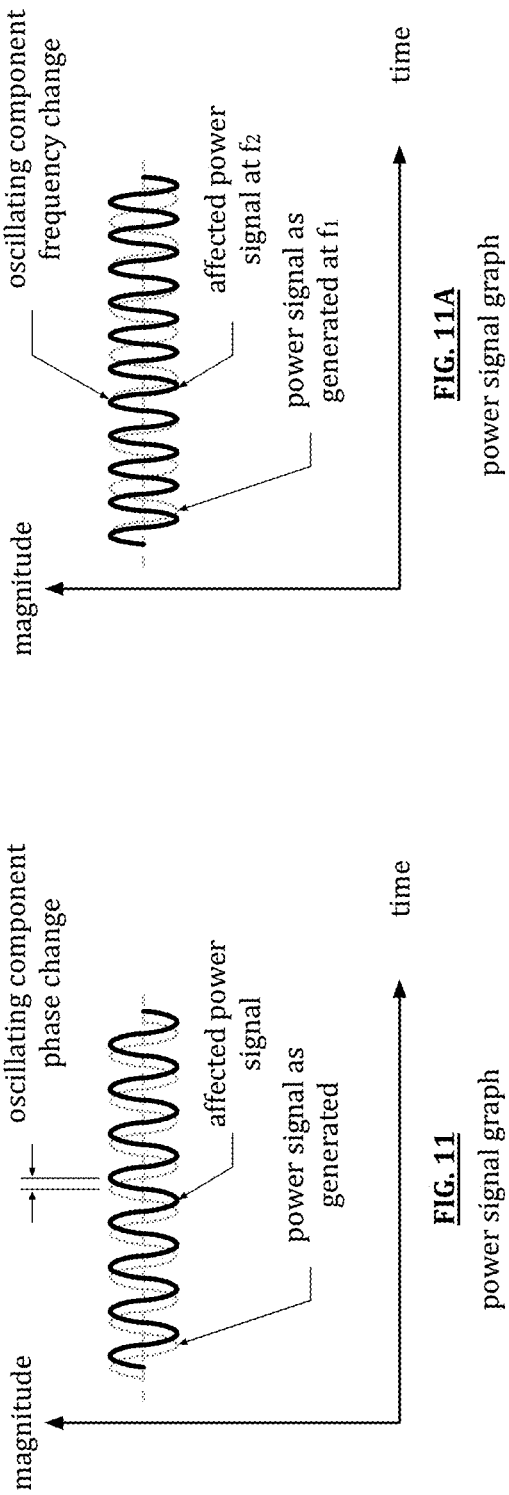
FIG. 11 is a schematic block diagram of another example of a power signal graph in accordance with the present invention.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted frequency of the oscillating component but had little to no effect on the DC component. For example, the electrical characteristic is reactance of a capacitor and/or an inductor. In this example, the reactance or change in reactance of the sensor shifted frequency of the oscillating signal component, inferring an increase in reactance (e.g., sensor is functioning as an integrator or phase shift circuit).

FIG. 11A is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of $f_1$ and converts it into a first physical condition. The second transducer is stimulated by the first physical condition to create an electrical signal at a different frequency $f_2$. In this example, the first and second transducers of the sensor change the frequency of the oscillating signal component, which allows for more granular sensing and/or a broader range of sensing.

FIG. 12 is a schematic block diagram of an embodiment of a power signal change detection circuit 112 receiving the affected power signal 118 and the power signal 116 as generated to produce, therefrom, the signal representative 120 of the power signal change. The affect 118 on the power signal is the result of an electrical characteristic and/or change in the electrical characteristic of a sensor; a few examples of the affects are shown in FIGS. 8-11A.

In an embodiment, the power signal change detection circuit 112 detect a change in the DC component 122 and/or the oscillating component 124 of the power signal 116. The power signal change detection circuit 112 then generates the signal representative 120 of the change to the power signal based on the change to the power signal. For example, the change to the power signal results from the impedance of the sensor and/or a change in impedance of the sensor. The representative signal 120 is reflective of the change in the power signal and/or in the change in the sensor's impedance.

In an embodiment, the power signal change detection circuit 112 is operable to detect a change to the oscillating component at a frequency, which may be a phase shift, frequency change, and/or change in magnitude of the oscillating component. The power signal change detection circuit 112 is also operable to generate the signal representative of the change to the power signal based on the change to the oscillating component at the frequency. The power signal change detection circuit 112 is further operable to provide feedback to the power source circuit 110 regarding the oscillating component. The feedback allows the power source circuit 110 to regulate the oscillating component at the desired frequency, phase, and/or magnitude.

FIG. 13 is a schematic block diagram of another embodiment of a drive sense circuit 28-*b* includes a change detection circuit 150, a regulation circuit 152, and a power source circuit 154. The drive-sense circuit 28-*b* is coupled to the sensor 30, which includes a transducer that has varying electrical characteristics (e.g., capacitance, inductance, impedance, current, voltage, etc.) based on varying physical conditions 114 (e.g., pressure, temperature, biological, chemical, etc.).

The power source circuit 154 is operably coupled to the sensor 30 and, when enabled (e.g., from a control signal from the processing module 42, power is applied, a switch is closed, a reference signal is received, etc.) provides a power signal 158 to the sensor 30. The power source circuit 154 may be a voltage supply circuit (e.g., a battery, a linear regulator, an unregulated DC-to-DC converter, etc.) to produce a voltage-based power signal or a current supply circuit (e.g., a current source circuit, a current mirror circuit, etc.) to produce a current-based power signal. The power source circuit 154 generates the power signal 158 to include a DC (direct current) component and an oscillating component.

When receiving the power signal 158 and when exposed to a condition 114, an electrical characteristic of the sensor affects 160 the power signal. When the change detection circuit 150 is enabled, it detects the affect 160 on the power signal as a result of the electrical characteristic of the sensor 30. The change detection circuit 150 is further operable to generate a signal 120 that is representative of change to the power signal based on the detected effect on the power signal.

The regulation circuit 152, when its enabled, generates regulation signal 156 to regulate the DC component to a desired DC level and/or regulate the oscillating component to a desired oscillating level (e.g., magnitude, phase, and/or frequency) based on the signal 120 that is representative of the change to the power signal. The power source circuit 154 utilizes the regulation signal 156 to keep the power signal at a desired setting 158 regardless of the electrical characteristic of the sensor. In this manner, the amount of regulation is indicative of the affect the electrical characteristic had on the power signal.

In an example, the power source circuit 158 is a DC-DC converter operable to provide a regulated power signal having DC and AC components. The change detection circuit 150 is a comparator and the regulation circuit 152 is a pulse width modulator to produce the regulation signal 156. The comparator compares the power signal 158, which is affected by the sensor, with a reference signal that includes DC and AC components. When the electrical characteristics is at a first level (e.g., a first impedance), the power signal is regulated to provide a voltage and current such that the power signal substantially resembles the reference signal.

When the electrical characteristics changes to a second level (e.g., a second impedance), the change detection circuit 150 detects a change in the DC and/or AC component of the power signal 158 and generates the representative signal 120, which indicates the changes. The regulation circuit 152 detects the change in the representative signal 120 and creates the regulation signal to substantially remove the effect on the power signal. The regulation of the power signal 158 may be done by regulating the magnitude of the DC and/or AC components, by adjusting the frequency of AC component, and/or by adjusting the phase of the AC component.

With respect to the operation of various drive-sense circuits as described herein and/or their equivalents, note that the operation of such a drive-sense circuit is operable simultaneously to drive and sense a signal via a single line. In comparison to switched, time-divided, time-multiplexed, etc. operation in which there is switching between driving and sensing (e.g., driving at first time, sensing at second time, etc.) of different respective signals at separate and distinct times, the drive-sense circuit is operable simultaneously to perform both driving and sensing of a signal. In some examples, such simultaneous driving and sensing is performed via a single line using a drive-sense circuit.

In addition, other alternative implementations of various drive-sense circuits are described in U.S. Utility patent application Ser. No. 16/113,379, entitled "DRIVE SENSE CIRCUIT WITH DRIVE-SENSE LINE,", filed Aug. 27, 2018, pending. Any instantiation of a drive-sense circuit as described herein may also be implemented using any of the various implementations of various drive-sense circuits described in U.S. Utility patent application Ser. No. 16/113,379.

In addition, note that the one or more signals provided from a drive-sense circuit (DSC) may be of any of a variety of types. For example, such a signal may be based on encoding of one or more bits to generate one or more coded bits used to generate modulation data (or generally, data). For example, a device is configured to perform forward error correction (FEC) and/or error checking and correction (ECC) code of one or more bits to generate one or more coded bits. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, binary convolutional code (BCC), Cyclic Redundancy Check (CRC), and/or any other type of ECC and/or FEC code and/or combination thereof, etc. Note that more than one type of ECC and/or FEC code may be used in any of various implementations including concatenation (e.g., first ECC and/or FEC code followed by second ECC and/or FEC code, etc. such as based on an inner code/outer code architecture, etc.), parallel architecture (e.g., such that first ECC and/or FEC code operates on first bits while second ECC and/or FEC code operates on second bits, etc.), and/or any combination thereof.

Also, the one or more coded bits may then undergo modulation or symbol mapping to generate modulation symbols (e.g., the modulation symbols may include data intended for one or more recipient devices, components, elements, etc.). Note that such modulation symbols may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/ or any other desired types of modulation including higher ordered modulations that may include even greater number of constellation points (e.g., 1024 QAM, etc.).

In addition, note that a signal provided from a DSC may be of a unique frequency that is different from signals provided from other DSCs. Also, a signal provided from a DSC may include multiple frequencies independently or simultaneously. The frequency of the signal can be hopped on a pre-arranged pattern. In some examples, a handshake is established between one or more DSCs and one or more processing module (e.g., one or more controllers) such that the one or more DSC is/are directed by the one or more processing modules regarding which frequency or frequencies and/or which other one or more characteristics of the one or more signals to use at one or more respective times and/or in one or more particular situations.

With respect to any signal that is driven and simultaneously detected by a DSC, note that any additional signal that is coupled into a line, an electrode, a touch sensor, a bus, a communication link, an electrical coupling or connection, etc. associated with that DSC is also detectable. For example, a DSC that is associated with such a line, an electrode, a touch sensor, a bus, a communication link, an electrical coupling or connection, etc. is configured to detect any signal from one or more other lines, electrodes, a touch sensors, a buses, a communication links, electrical couplings or connections, etc. that get coupled into that line, electrode, touch sensor, bus, communication link, electrical coupling or connection, etc.

Note that the different respective signals that are driven and simultaneously sensed by one or more DSCs may be are differentiated from one another. Appropriate filtering and processing can identify the various signals given their differentiation, orthogonality to one another, difference in frequency, etc. Other examples described herein and their equivalents operate using any of a number of different characteristics other than or in addition to frequency.

Moreover, with respect to any embodiment, diagram, example, etc. that includes more than one DSC, note that the DSCs may be implemented in a variety of manners. In one example, all of the DSCs may be of the same type, implementation, configuration, etc. In another example, the first DSC may be of a first type, implementation, configuration, etc., and a second DSC may be of a second type, implementation, configuration, etc. that is different than the first DSC. Considering a specific example, a first DSC may be implemented to detect change of impedance associated with a line, an electrode, a touch sensor, a bus, a communication link, an electrical coupling or connection, etc. associated with that first DSC, while a second DSC may be implemented to detect change of voltage associated with a line, an electrode, a touch sensor, a bus, a communication link, an electrical coupling or connection, etc. associated with that second DSC. In addition, note that a third DSC may be implemented to detect change of a current associated with a line, an electrode, a touch sensor, a bus, a communication link, an electrical coupling or connection, etc. associated with that DSC. In general, while a common reference may be used generally to show a DSC or multiple instantiations of a DSC within a given embodiment, diagram, example, etc., note that any particular DSC may be implemented in accordance with any manner as described herein, such as described in U.S. Utility patent application Ser. No. 16/113, 379, etc. and/or their equivalents.

Note that certain of the following diagrams show one or more processing modules. In certain instances, the one or more processing modules is configured to communicate with and interact with one or more other devices including one or more of DSCs, one or more components associated with a DSC, input electric power, output electric power, one or more components associated with a motor or motor coupled element, one or more components associated with a generator or generator coupled element, one or more turbines, one or more loads, etc. Note that any such implementation of one or more processing modules may include integrated memory and/or be coupled to other memory. At least some of the memory stores operational instructions to be executed by the one or more processing modules. In addition, note that the one or more processing modules may interface with one or more other devices, components, elements, etc. via one or more communication links, networks, communication pathways, channels, etc.

In addition, when a DSC is implemented to communicate with and interact with another element, the DSC is configured simultaneously to transmit and receive one or more signals with the element. For example, a DSC is configured simultaneously to drive one or more signals to the one element and to sense the one or more signals via the one element. During driving or transmission of a signal from a DSC, that same DSC is configured simultaneously to sense the signal being driven or transmitted from the DSC and any other signal may be coupled into the signal that is being driven or transmitted from the DSC.

FIG. 14A is a schematic block diagram of an embodiment 1401 of a DSC configured simultaneously to drive and sense a drive signal to a motor or a motor coupled element in accordance with the present invention. In this diagram, one or more processing modules 42 is configured to communicate with and interact with a drive-sense circuit (DSC) 28. The one or more processing modules 42 is coupled to a DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

The DSC is configured to provide a drive signal to a motor or a motor coupled element shown as reference numeral 1440. Note that such a motor may be of any of a variety of types including a DC motor, an AC/induction motor, a DC brushless motor (DCBM), etc. Also, note that such motor coupled elements may be of any of a variety of types including a motor controller, a current buffer, a sensor or monitor associated with the motor, an actuator configured to operate the component associated with the motor such as a heater, an A/C component, a vent, a fan, heating venting air conditioning (HVAC) components, etc. and/or any other element implemented with an associated with such a motor.

In general, any motor or motor coupled element 1440 may be implemented and provided a drive signal from the DSC 28. In this diagram, the DSC 28 operates to provide the drive signal to the motor or motor coupled element 1440 and also simultaneously to detect any effect on the drive signal. In this diagram, input electric power is provided to the DSC 28 and the DSC 28 is implemented to perform in-line processing of the input electric power signal to generate the drive signal that is provided to the motor or motor coupled element 1440. Note that the power supply reference input 1405 may also be provided to the DSC 1420 in certain examples. In such examples, the DSC 28 is configured to process the input electric power signal based on power supply reference input 1405. Note also that the power supply reference input 1405 may be provided from the one or more processing modules 42 in some examples. This diagram shows a general configuration by which a DSC 28 is implemented to receive an input electric power signal and to generate a drive signal to be provided to a motor or motor coupled element 1440. The DSC 28 of this diagram may be viewed as being configured to perform in-line processing of the input electric drive signal to generate the drive signal that is provided to the motor or motor coupled element 1440.

FIG. 14B is a schematic block diagram of another embodiment 1402 of a DSC configured simultaneously to drive and sense a drive signal to a motor or a motor coupled element in accordance with the present invention. In this diagram, one or more processing modules 42 is configured to communicate with and interact with a drive-sense circuit (DSC) 28-14. The one or more processing modules 42 is coupled to a DSC 28-14 and is operable to provide control to and communication with the DSC 28-14. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, DSC 28-14 includes a power source circuit 1410 that is configured to receive an input electric power signal and a drive signal change detection circuit 1412. The drive signal change detection circuit 1412 includes a power source reference circuit 1412a and a comparator 1412b. With respect to this diagram as well as others, note than any comparator may alternatively implemented as an operational amplifier as desired in certain examples. For example, while come examples are implemented such that a comparator operates to output a binary signal (e.g., either a 1 or a 0), an operational amplifier may alternatively be implemented to output any signal within a range of signals as may be desired in certain applications. In some examples, the power source circuit 1412 may be an independent current source, a dependent current source, a current mirror circuit, etc., or alternatively, an independent voltage source, a dependent voltage source, etc.

In addition, one or more processing modules 42 is configured to interact with and communicate with the DSC 28-14. In some examples, the one or more processing modules 42 is configured to provide control signals to one or more of the components within the DSC 28-14. In addition, the one or more processing modules 42 is configured to receive information from DSC 28-14. The one or more processing modules 42 is configured to process information that is received and to direct operation of one or more of the components within the DSC 28-14.

In an example of operation based on a current related implementation of the DSC 28-14, the power source reference circuit 1412a provides a current reference with at least one of DC and oscillating components to the power source circuit 1410. The current source generates a current as the drive signal based on the current reference. An electrical characteristic of the motor or motor coupled element 1440 has an effect on the current drive signal. For example, if the impedance of the motor or motor coupled element 1440 decreases and the current drive signal remains substantially unchanged, the voltage across the motor or motor coupled element 1440 is decreased.

The comparator 1412b compares the current reference with the affected drive signal to produce a signal that is representative of the change to the drive signal. For example, the current reference signal corresponds to a given current (I) times a given impedance (Z). The current reference generates the drive signal to produce the given current (I). If the impedance of the motor or motor coupled element 1440 substantially matches the given impedance (Z), then the comparator's output is reflective of the impedances substantially matching. If the impedance of the motor or motor coupled element 1440 is greater than the given impedance (Z), then the comparator's output is indicative of how much greater the impedance of the motor or motor coupled element 1440 is than that of the given impedance (Z). If the impedance of the motor or motor coupled element 1440 is less than the given impedance (Z), then the comparator's output is indicative of how much less the impedance of the motor or motor coupled element 1440 is than that of the given impedance (Z).

In an example of operation based on a voltage related implementation of the DSC 28-14, the power source reference circuit 1412a provides a voltage reference with at least one of DC and oscillating components to the power source circuit 1410. The power source circuit 1410 generates a voltage as the drive signal based on the voltage reference. An electrical characteristic of the motor or motor coupled element 1440 has an effect on the voltage drive signal. For example, if the impedance of the sensor decreases and the voltage drive signal remains substantially unchanged, the current through the sensor is increased.

The comparator 1412b compares the voltage reference with the affected drive signal to produce the signal that is representative of the change to the drive signal. For example, the voltage reference signal corresponds to a given voltage (V) divided by a given impedance (Z). The voltage reference generates the drive signal to produce the given voltage (V). If the impedance of the motor or motor coupled element 1440 substantially matches the given impedance (Z), then the comparator's output is reflective of the impedances substantially matching. If the impedance of the motor or motor coupled element 1440 is greater than the given impedance (Z), then the comparator's output is indicative of how much greater the impedance of the motor or motor coupled element 1440 is than that of the given impedance (Z). If the impedance of the motor or motor coupled element 1440 is less than the given impedance (Z), then the comparator's output is indicative of how much less the impedance of the motor or motor coupled element 1440 is than that of the given impedance (Z).

Generally speaking, this diagram shows yet another example by which a DSC may be implemented to perform in-line processing of the input electric drive signal to generate the drive signal that is provided to the motor or motor coupled element 1440. However, note that any of a variety of different implementations of the DSC may be made to generate a drive signal to be provided to a motor or motor coupled element 1440 while simultaneously monitoring and sensing that drive signal. In addition, with respect to this diagram and also with respect to others corresponding to various implementations of DSCs, note that such an implementation of a DSC may be adapted to different applications. This diagram shows of a DSC in application for a motor or motor coupled element 1440, but such an implementation of a DSC may alternative be adapted for other applications as well such that the drive signal may be provided to another component, element, device, circuitry, etc. Similarly, other implementations of DSCs as described herein may also be adapted for and applied to different applications beyond the specific application in which they are shown in a particular diagram.

Figure 15A:
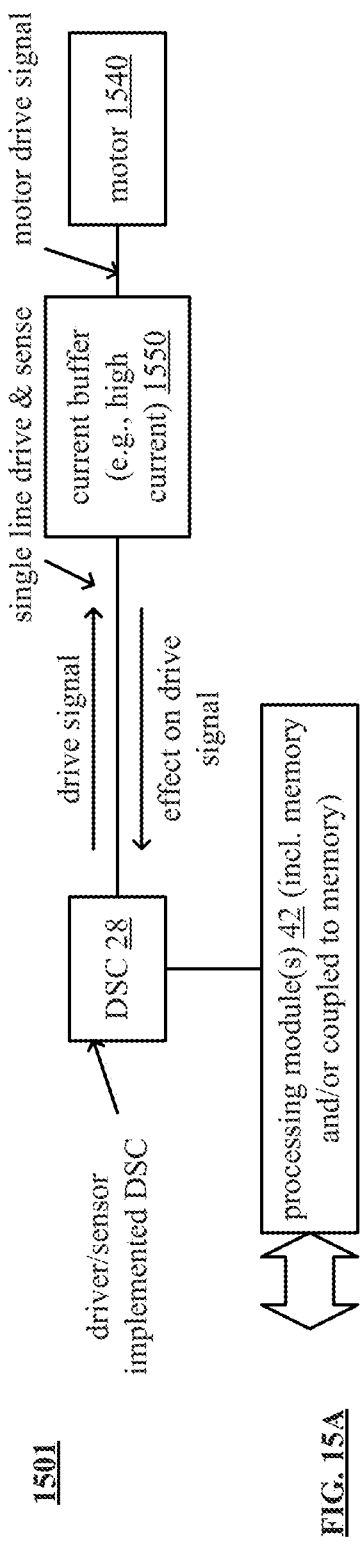
FIG. 15A is a schematic block diagram of an embodiment of a DSC configured simultaneously to drive and sense a drive signal to a current buffer servicing a motor in accordance with the present invention.

FIG. 15A is a schematic block diagram of an embodiment 1501 of a DSC configured simultaneously to drive and sense a drive signal to a current buffer servicing a motor in accordance with the present invention. In this diagram, one or more processing modules 42 is configured to communicate with and interact with a drive-sense circuit (DSC) 28. The one or more processing modules 42 is coupled to a DSC 28 and is operable to provide control to and communication with the DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, the DSC 28 is configured to provide a drive signal to a current buffer 1550 and simultaneously to sense the ground signal that is provided to the current buffer 1550. The current buffer 1550 is configured to generate a motor drive signal that is provided to a motor 1540. This diagram shows an intervening element between the DSC 28 and the motor 1540. Specifically, the current buffer 1550, which may be implemented as a high current buffer in some examples, is configured to process the drive signal provided from the DSC 28 and to generate a motor drive signal having sufficient current as to drive the motor 1540. For example, some implementations of the motors 1540 may require very large currents (e.g., several amps, 10s of amps, or even higher amperage signals for operation), and the current buffer 1550 is configured to ensure an adequate amount of current is provided for proper operation of the motor.

In some examples, note that the current buffer 1550 is configured to provide a motor drive signal to a stator winding associated with the motor 1540. For example, the buffer 1550 is configured to provide a motor drive signal so as to energize and excite the stator winding associated with motor 1540 to induce rotation of the rotor of the motor 1540. Note that multiple instantiations of the configuration of a DSC 28 coupled to a current buffer 1550 that is configured to provide a motor drive signal to the motor 1540 may be made when the motor 1540 is a multiple phase motor. Considering an example in which the motor 1540 is a 3-phase motor, multiple instantiations of the configuration of this diagram may be implemented with respect to each of the different respective phases of the motor 1540 (e.g., 3 instantiations for each phase of a 3-phase motor). Note that as few as a single processing module may be implemented to provide control to and communicate with each of the different instantiations of the DSCs in various configuration of this diagram that service the different respective phases of the motor 1540.

Figure 15B:
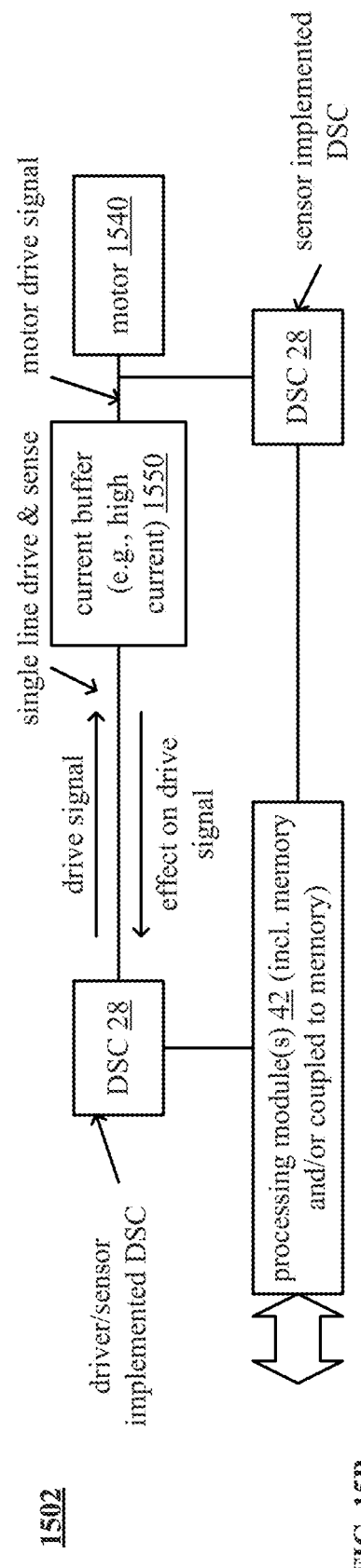
FIG. 15B is a schematic block diagram of another embodiment of a DSC configured simultaneously to drive and sense a drive signal to a current buffer servicing a motor including based on monitoring and sensing of a motor drive signal in accordance with the present invention.

FIG. 15B is a schematic block diagram of another embodiment 1502 of a DSC configured simultaneously to drive and sense a drive signal to a current buffer servicing a motor including based on monitoring and sensing of a motor drive signal in accordance with the present invention. In this diagram, one or more processing modules 42 is configured to communicate with and interact with a drive-sense circuit (DSC) 28. The one or more processing modules 42 is coupled to a DSC 28 and is operable to provide control to and communication with the DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

This diagram has some similarities to the previous diagram with at least one difference being that a sensor implemented DSC 28 is configured to monitor the motor drive signal that is provided from the current buffer 1550 the motor 1540 and to provide feedback information to the one or more processing modules 42. For example, the one or more processing modules 42 is configured to adapt operation of the DSC 28 that provides the drive signal to the current buffer 1550 based on the sensor implemented DSC 28 that is monitoring the motor drive signal. For example, based on the motor drive signal provided from the current buffer 1550 comparing unfavorably with one or more considerations (e.g., overcurrent, undercurrent, improper phase or delay, etc.), the one or more processing modules 42 is configured to direct operation of the DSC 28 that provides the drive signal to the current buffer 1550 so as to generate a motor drive signal that compares favorably with the one or more considerations. This diagram provides an example by which a motor drive signal that is provided to with motor 1540 from a current buffer 1550 that is serviced by a DSC 28 may be monitored and information generated therefrom may be used to adapt operation of the DSC 28 that provides the drive signal to the current buffer 1550 to ensure operation of the motor 1540 in a desired manner.

In addition, in one particular example in which the current buffer 1550 is failing, such as possibly providing an extremely high overcurrent that is beyond the operational range and capability of the motor 1540, the feedback provided by the sensor implemented DSC 28 may be processed by the processing modules 42 to initiate a shutdown of the system so as to prevent damage to the motor 1540. In some examples, the one or more processing modules 42 is configured to generate an error signal, provide notification to one or more other devices within the system of the error condition, etc. Note that multiple perspective DSCs 28 may be implemented within a given configuration that includes a motor such that the different perspective DSCs 28 are performing different operations and serving different needs within the system.

FIG. 16A is a schematic block diagram of another embodiment 1601 of a DSC configured simultaneously to drive and sense a drive signal to a current buffer servicing a motor including based on monitoring and sensing of a motor drive signal via a coupler in accordance with the present invention. In this diagram, one or more processing modules 42 is configured to communicate with and interact with a drive-sense circuit (DSC) 28. The one or more processing modules 42 is coupled to a DSC 28 and is operable to provide control to and communication with the DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

This diagram has some similarities to the previous diagram. In this diagram, the DSC 28 is configured to provide a drive signal to a current buffer 1550 and simultaneously to sense the ground signal that is provided to the current buffer 1550. The current buffer 1550 is configured to generate a motor drive signal that is provided to a motor 1540. This diagram shows an intervening element between the DSC 28 and the motor 1540. Specifically, the current buffer 1550, which may be implemented as a high current buffer in some examples, is configured to process the drive signal provided from the DSC 28 and to generate a motor drive signal having sufficient current as to drive the motor 1540. This diagram has some similarities to the previous diagram with at least one difference being that this diagram includes an intervening element between the motor drive signal and the sensor implemented DSC 28, namely, a coupler 1660. The coupler 1660 is configured to perform scaling, division, electrical isolation, etc. and/or some other processing of the motor drive signal from the sensor implemented DSC 28 to generate a signal that is representative of the motor drive signal to be provided to the sensor implemented DSC 28. In some examples, the motor drive signal is of a voltage or current that is higher than the sensor implemented DSC 28 is capable of processing.

In other examples, the motor drive signal is implemented to be electrically isolated from the sensor implemented DSC 28 as the coupler 1660 provides a different signal that is representative of the motor drive signal to the sensor implemented DSC 28. Generally speaking, note that coupler 1660 may be of any of a variety of types that is configured to generate a signal that is based on an representative of the motor drive signal to be provided to the sensor implemented DSC 28 including an AC coupler, a contactless current sensor such as a ferromagnetic current sensor (e.g., having a ferromagnetic element that encircles a line, connection, etc. between the current buffer 1550 in the motor 1540 and produces a signal corresponding to the current passing through the line, connection, etc. from the current buffer 1550 to the motor 1540), a fiber-optic current sensor such as may be implemented as operating based on the Faraday effect (e.g., angular rotation of the plane of polarization of an optical wave in an optical element, such as optical fiber, based on its interaction with a magnetic field generated by the line, connection, etc. between the current buffer 1550 in the motor 1540), a voltage divider (e.g., including two or more impedances), a Hall effect current sensor, etc. Generally speaking, any element that is implemented to generate a signal that is representative of the motor drive signal and to provide that signal to the sense implemented DSC 28 may be implemented as the coupler 1660.

FIG. 16B is a schematic block diagram of another embodiment 1602 of a DSC configured simultaneously to drive and sense a drive signal to a current buffer servicing a motor including based on monitoring and sensing of a motor drive signal via a coupler and one or more additional motor related sensors in accordance with the present invention. In this diagram, one or more processing modules 42 is configured to communicate with and interact with a drive-sense circuit (DSC) 28. The one or more processing modules 42 is coupled to a DSC 28 and is operable to provide control to and communication with the DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

This diagram has some similarities to the previous diagram. In this diagram, the DSC 28 is configured to provide a drive signal to a current buffer 1550 and simultaneously to sense the ground signal that is provided to the current buffer 1550. The current buffer 1550 is configured to generate a motor drive signal that is provided to a motor 1540. This diagram shows an intervening element between the DSC 28 and the motor 1540. Specifically, the current buffer 1550, which may be implemented as a high current buffer in some examples, is configured to process the drive signal provided from the DSC 28 and to generate a motor drive signal having sufficient current as to drive the motor 1540. This diagram also includes an intervening element between the motor drive signal and the sensor implemented DSC 28, namely, a coupler 1660. The coupler 1660 is configured to perform scaling, division, electrical isolation, etc. and/or some other processing of the motor drive signal from the sensor implemented DSC 28 to generate a signal that is representative of the motor drive signal to be provided to the sensor implemented DSC 28.

This diagram has some similarities to the previous diagram with at least one difference being that this diagram includes one or more sensors 1680-1681 that are respectively serviced using DSCs 1628. For example, for each respective sensor 1680-1681, respected DSC 1628 is configured to provide a signal to the respective sensor and simultaneously sense that signal that is provided to the respective sensor to determine a change of an electrical characteristic associated with the respective sensor to determine information being sent. Note that any of a variety of sensors may be implemented to provide information associated with motor operation. Some examples of such sensors include Hall effect sensors that may be implemented in a variety of ways including to detect magnetic field, current, voltage, etc., temperature sensors, vibration sensors such as may be implemented using accelerometers, airflow sensors, rotational speed sensors such as may be implemented using optical means or Hall effect-based sensing, etc. Generally speaking, any of a number of types of sensors may be implemented to provide information regarding status of the motor 1540. In this diagram, the one or more processing module 1632 is configured not only to receive information from the sensor implemented DSC 28 that provides information corresponding to the motor drive signal provided from the current buffer 1550 the motor 1540, but also from the one or more sensors 1680-1681 via the one or more corresponding DSCs 1628. The one or more processing modules 1632 is configured to process and use this additional information provided from the one or more sensors 1680-1681 in conjunction with the sensing of the motor drive signal to adapt and direct operation of the DSC 28 that provides the drive signal to the current buffer 1550.

Figure 17A:
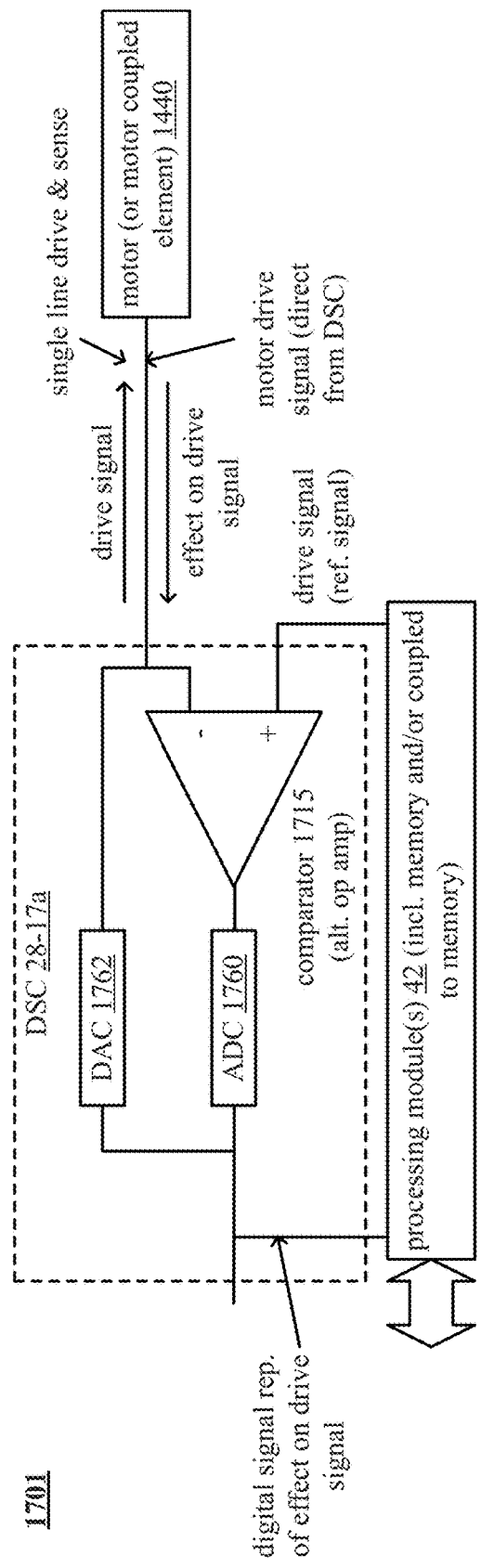
FIG. 17A is a schematic block diagram of another embodiment of a DSC configured simultaneously to drive and sense a drive signal to a motor or a motor coupled element in accordance with the present invention.

FIG. 17A is a schematic block diagram of another embodiment 1701 of a DSC configured simultaneously to drive and sense a drive signal to a motor or a motor coupled element in accordance with the present invention. In this diagram, one or more processing modules 42 is configured to communicate with and interact with a drive-sense circuit (DSC) 28-17*a*. The one or more processing modules 42 is coupled to a DSC 28-17*a* and is operable to provide control to and communication with the DSC 28-17*a*. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, the one or more processing module 42 is configured to provide a drive signal, which may be viewed as a reference signal, to one of the inputs of a comparator 1715. Note that the comparator 1715 may alternatively be implemented as an operational amplifier in certain embodiments. The other input of the comparator 1715 is coupled to provide a motor drive signal directly from the DSC 28-17a to the motor or motor coupled element 1440. The DSC 28-17a is configured to provide the drive signal to the motor or motor coupled element 1440 and also simultaneously to sense the drive signal and to detect any effect on the drive signal.

The output of the comparator 1715 is provided to an analog to digital converter (ADC) 1760 that is configured to generate a digital signal that is representative of the effect on the drive signal that is provided to the motor or motor coupled element 1440. In addition, the digital signal is output from the ADC 1760 is fed back via a digital to analog converter (DAC) 1762 to generate the drive signal is provided to the motor or motor coupled element 1440. In addition, the digital signal that is representative of the effect on the drive signal is also provided to the one or more processing modules 42. The one or more processing modules 42 is configured to provide control to and be in communication with the DSC 28-17a including to adapt the drive signal is provided to the comparator 1715 therein as desired to direct and control operation of the motor or motor coupled element 1440 via the drive signal.

Figure 17B:
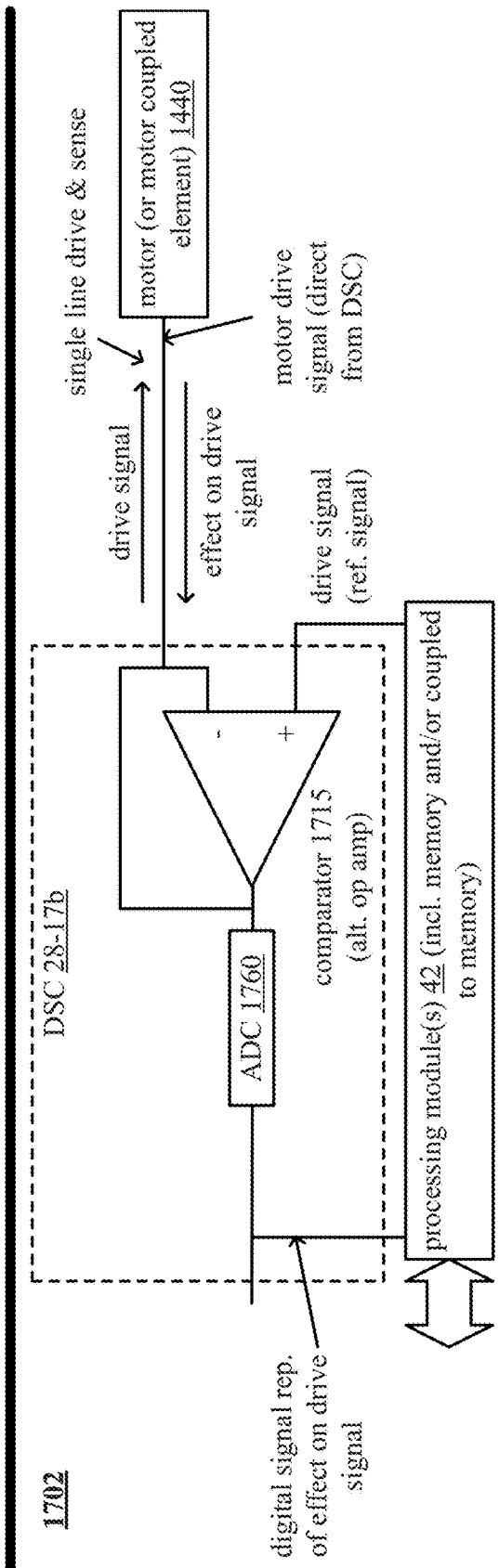
FIG. 17B is a schematic block diagram of another embodiment of a DSC configured simultaneously to drive and sense a drive signal to a motor or a motor coupled element in accordance with the present invention.

FIG. 17B is a schematic block diagram of another embodiment 1702 of a DSC configured simultaneously to drive and sense a drive signal to a motor or a motor coupled element in accordance with the present invention. In this diagram, one or more processing modules 42 is configured to communicate with and interact with a drive-sense circuit (DSC) 28-17b. The one or more processing modules 42 is coupled to a DSC 28-17b and is operable to provide control to and communication with the DSC 28-17b. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

This diagram has some similarities to the previous diagram with at least one difference being that this diagram excludes the DAC 1762 of the prior diagram. In this diagram, the analog output signal from the comparator 1715 is fed back directly to the input of the comparator 1715 that is also coupled to the motor or motor coupled element 1440 thereby providing the drive signal (and simultaneously sensing) that is provided to the motor or motor coupled element 1440.

Figure 18:
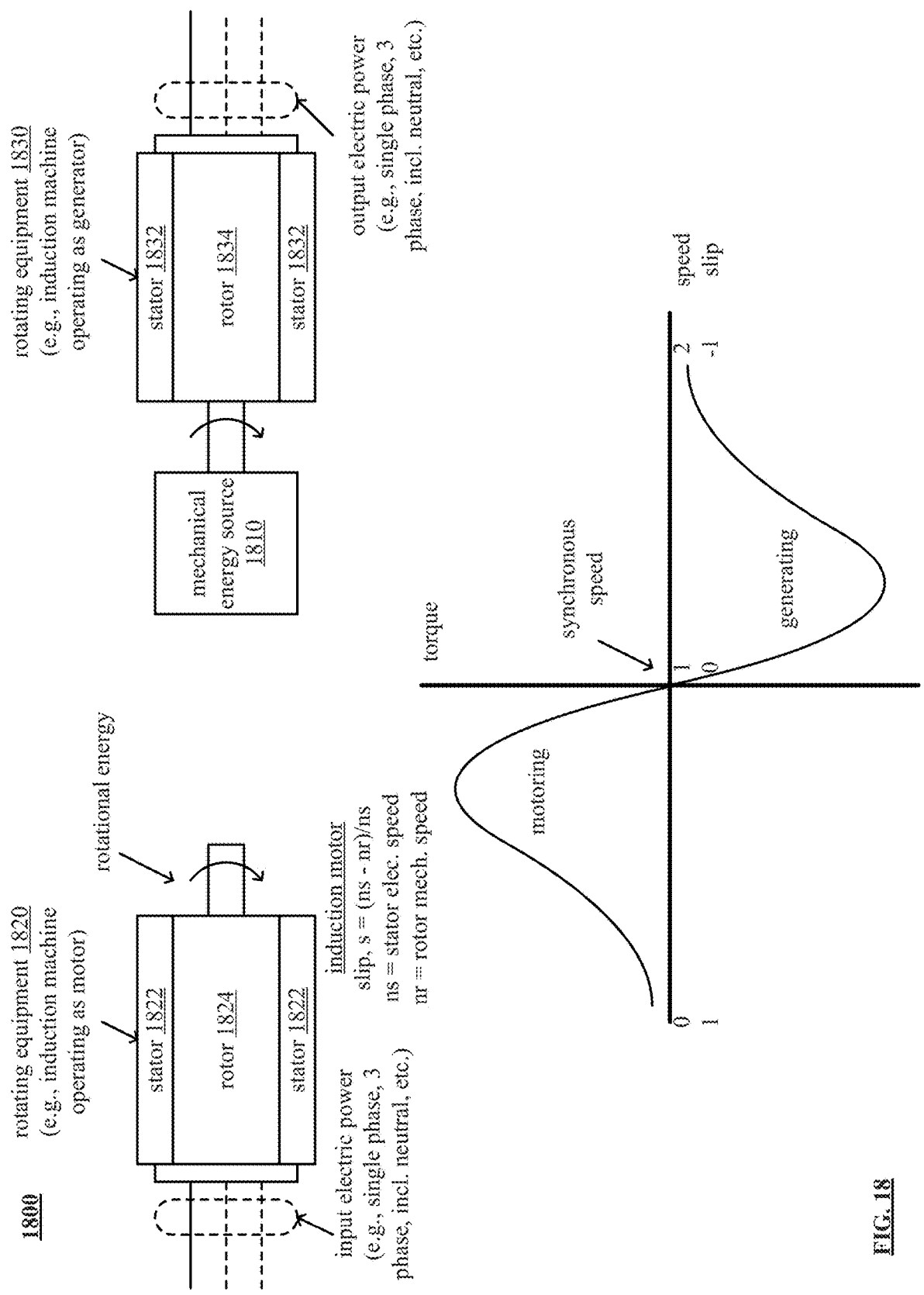
FIG. 18 is a schematic block diagram of an embodiment of induction machine operation in accordance with the present invention.

FIG. 18 is a schematic block diagram of an embodiment 1800 of induction machine operation in accordance with the present invention. This diagram shows various examples of rotating equipment that operate based on the principle of electromagnetic induction. For example, at the top left-hand side of the diagram, a rotating equipment 1820 is shown as receiving as input electric power. Note that the input electric power may be single phase, 3-phase, 3-phase including a neutral, etc. in various examples. Generally speaking, such rotating equipment operates in accordance with electromagnetic induction such that electromagnetic fields (e.g., having a North Pole and South Pole) are induced within the rotating equipment to induce movement of the rotor in a motoring application or to generate output electric power from the stator and a generating application.

The rotating equipment 1820 may be viewed as an induction machine operating as a motor when provided input electric power. As the power is provided to one or more stator windings of the rotating equipment 1820, shown as stator 1822, based on electromagnetic induction to one or more components within a rotor 1824, the rotor will rotate. One or more components may be coupled to the rotor as it rotates thereby harnessing the rotational energy provided by the motor.

In an alternative configuration, at the top right-hand side of the diagram, a rotating equipment 1830 is shown as including a rotor 1834 that is driven by a mechanical energy source 1810. Note that such a mechanical energy source 1810 may alternatively be referred to as a prime mover. As the rotor 1834 turns within the rotating equipment 1830, output electric power is generated via one or more stator windings 1832 of the rotating equipment 1830. Note that the output electric power electric power may be single phase, 3-phase, 3-phase including a neutral, etc. in various examples. Generally speaking, the operation of an induction machine has a motor or generator are complement three to one another. The rotation of the rotor within the rotating equipment 1810 may be induced by providing appropriately providing input electric power to the one or more stator windings of the rotating equipment. Alternatively, rotating the rotor within the rotating equipment (e.g., using some mechanical energy source) may be performed to provide output electric power from the one or more stator windings of the rotating equipment. In general, the induction machine operates based on electromagnetic induction between a magnetic field of this one or more stator windings to the one or more rotor windings, or alternatively between the one or more rotor windings to the one or more stator windings.

Note also that such an induction machine may operate both in accordance with motoring and in accordance with generating at different times. For example, with respect to an induction motor, slip, s, is defined as a function of the rotational speed of the magnetic field within the rotor, ns, the stator electrical speed, and the rotational speed of the rotor itself, nr, the rotor mechanical speed. A typical definition of slip, s, within an induction motor (or generally an induction machine) is s=(ns−nr)/ns. The bottom of the diagram shows torque of an induction machine as a function of speed or slip. As can be seen, when this slip is varying between 0 and −1, induction machine operates in accordance with generating electric power. Alternatively, when the slip is varying between 0 and 1, induction machine operates in accordance with motoring.

The principles of operation of an induction motor are analogous to the principles of operation of a generator, yet in reverse. Considering the operation of an induction motor, AC power is provided to one or more of the stator windings of the rotating equipment thereby creating a magnetic field that rotates synchronously with the frequency of the AC power that is provided to the stator windings. That is to say, the frequency of the AC signals provided to the stator windings will induce a magnetic field that rotates at the same frequency. Considering an example in which the AC signals are of 60 Hz, then oscillation of the magnetic field within the rotating equipment will also be of 60 Hz. Within an induction machine implemented to operate as a motor, the induction motor's rotor 1824 rotates at a slightly different frequency than the magnetic field rotates within the stator 1822.

Within the induction motor, the magnetic field associated with the one or more stator windings changes and rotates relative to the one or more rotor windings. Similar to how electric current is induced within the transformer via electromagnetic coupling between the primary and secondary windings of the transformer, the rotating magnetic field within the one or more stator windings of the rotating equipment will induce current within the one or more rotor windings of the rotating equipment. The interaction between the induced current within the one or more rotor windings of the rotating equipment also generates a magnetic field within the rotor that interacts with the magnetic field being generated within the stator. Generally speaking, the direction of the magnetic field created by the current flowing in the one or more stator windings will oppose any change in current through the one or more rotor windings (e.g., in accordance with Lenz's Law). These opposite an opposing magnetic fields between the one or more stator windings in the one or more rotor windings will induce rotation of the rotor. Generally speaking, considering a motoring application, the rotor will accelerate to an operational speed at which the torque being generated in accordance with the rotational energy of the rotor matches the mechanical load being placed on the rotor.

With respect to this slip that provides an indication between the difference of the stator electrical speed and the rotor mechanical speed, slip can vary such as being more than 5% for small motors to less than 1% for larger motors. Generally speaking, a nonzero slip value indicates that the induction machine is not operating synchronously such that the rotor is rotating synchronously with the magnetic field within the one or more stator windings. Generally speaking, higher values of slip are associated with more induced voltage, more current, and stronger magnetic fields in accordance with the electromagnetic coupling within the induction machine. When operating as a motor, the rotating speed of the rotor of the induction machine will be less spending electrical rotating speed of the magnetic field within the one or more stator windings (e.g., which is often referred to as the synchronous speed of the induction motor). Alternatively, for the induction machine to operate as a generator, its rotational operating speed is above the rated synchronous speed of the induction machine thereby inducing current in the stator windings of the induction machine based on mechanically induced rotation of the rotor of induction machine.

One or more processing modules implemented to perform monitoring and controlling the operation of an induction machine will operate more effectively having more highly accurate information regarding the position of the rotor within the induction machine, the rate of rotation of the rotor within the induction machine, the frequency of the rotation of the magnetic field within the one or more stator windings of the induction machine, etc.

One or more appropriately implemented DSCs, including one or more in-line DSCs in certain examples, may be implemented to provide and/or monitor the input electrical signals provided to the one or more stator windings of an induction machine in a motoring application or to monitor the output electrical signals provided from the one or more stator windings of an induction machine in a generating application. Information provided by one or more such appropriately implemented DSCs can be used to provide specific location of the rotor within the induction machine. For example, as the highly accurate and highly sensitive detection capabilities of a DSC can detect when a rotor winding passes by a stator winding when the rotor is rotating within the induction machine. A number of different implementations may be made by which a DSC can detect the interaction between the rotor winding and the stator winding as they pass by one another in accordance with operation of the induction machine.

Generally speaking, the frequency and location of the electrical rotating magnetic field with any one or more stator windings is known, in that, it corresponds to the signals being provided to the one or more stator windings. In accordance with an application in which one or more DSCs are implemented either to drive and sense the one or more electrical signals being provided to the one or more stator windings or to sense the one or more electrical signals being provided to the one or more stator windings, the characteristics of the electrical signals being provided to the one or more stator windings is known. To determine the slip of the induction machine, one or more DSCs are implemented to detect the interaction of the one or more rotor windings with the one or more stator windings to determine when a rotor winding is located next to or is passing a stator winding. Based on the particular configuration of the induction machine, whether a single phase induction machine, 3-phase induction machine, or other type, the one or more DSCs are implemented to detect when the one or more rotor windings are interacting with the one or more stator windings and thereby providing information that may be used to determine the slip of the induction machine. Knowing particularly when the one or more rotor windings are interacting with and passing the one or more stator windings provides indication of the mechanical speed at which the rotor of the induction machine is rotating. This information coupled with the known information of the electrical rotating magnetic field with any one or more stator windings is used to determine the slip of the induction machine.

In some examples, within a motoring application, an in-line DSC is implemented to provide and sense an input electric signal to a stator winding of the induction machine. In doing so, the in-line DSC is implemented to detect when a rotor winding of the induction machine passes by the stator winding based on the electromagnetic interaction between the rotor winding in the stator winding of the induction machine during rotation of the rotor within the induction machine. Analogously, within a generating application, and in-line DSC is implemented to receive and sense an output electric signal from a stator winding of the induction machine. In doing so, such an in-line DSC is implemented to detect when a rotor of the induction machine passes by the stator winding based on the electromagnetic interaction between the rotor winding in the stator winding of the induction machine during rotation of the rotor within the induction machine, only this time in accordance with a generating application.

An even other examples, whether in a motoring application or a generating application, one or more appropriately implemented DSCs (e.g., including applications that may include one or more non-in-line DSCs) operate to sense the electrical signals going into and/or out of the stator windings of the induction machine to provide information related to the location of the rotor within the induction machine based on detecting the interaction of the stator and rotor windings as they pass one another during rotation of the rotor of the induction machine.

While certain sensors may be implemented to detect the location of the rotor within the induction machine during operation, one or more appropriately implemented DSCs (e.g., including possibly one or more in-line DSCs and one or more non-in-line DSCs) can obviate the need of such sensors. However, in examples in which such sensors may be used (e.g., such as Hall effect sensors implemented to determine the location of the rotor within the induction machine), one or more appropriately implemented DSCs operating in cooperation with sensors will also improve the performance of those sensors. The use and implementation of such DSCs within such induction motor applications may be performed to improve significantly the accuracy of the information regarding the operation of the induction motor thereby providing the ability for much better operational management and control of the induction machine.

Figure 19:
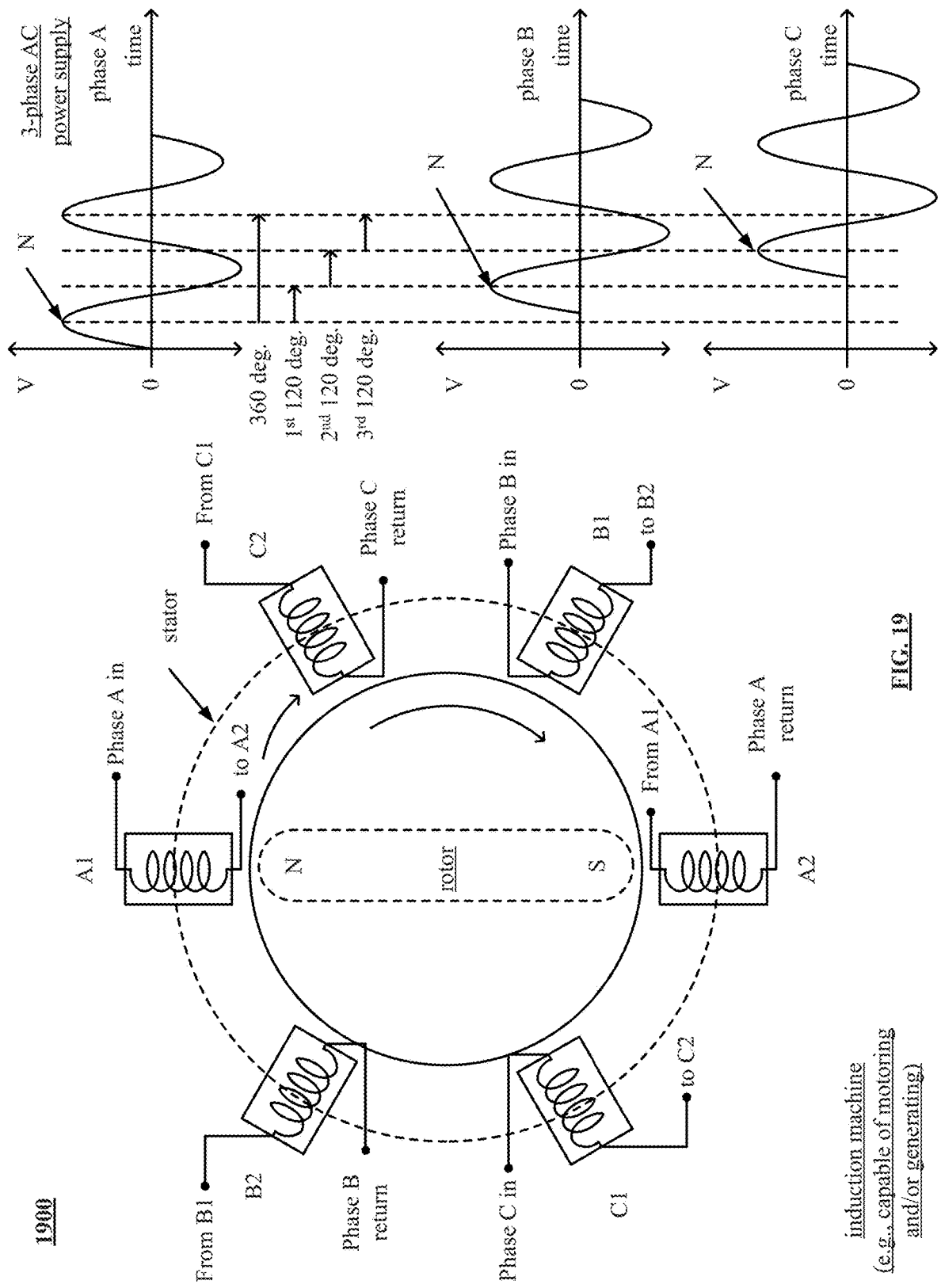
FIG. 19 is a schematic block diagram of an embodiment of a 2-pole, 3-phase induction machine in accordance with the present invention.

FIG. 19 is a schematic block diagram of an embodiment 1900 of a 2-pole, 3-phase induction machine in accordance with the present invention. In this diagram, the 3-phase induction machine has three sets of windings, with each phase connected to a different set of windings. Consider three different electric power signals being out of phase with one another by 120°. On the right-hand side of the diagram shows the 3-phase AC power supply such that phase A may be viewed as having a phase of 0°, phase B may be viewed as having a phase of 120°, and phase C may be viewed as having a phase of 240°. The rotor of the induction machine is implemented as having a North Pole and South Pole. By appropriately providing electric power input signals to the stator windings of the induction machine, specifically shown as phase A in, phase B in, and in phase A in, a rotating magnetic field will be induced within the stator windings of the induction machine. In this example, which includes a 2-pole, 3-phase induction machine, each respective phase includes two corresponding sets of windings, as can be seen as an example from the A1 and A2 stator windings associated with phase A, the B1 and B2 stator windings associated with phase B, and the C1 and C2 stator windings associated with phase C.

When appropriate input electric power signals are applied to the respective stator windings of the 2-pole, 3-phase induction machine, the current flowing through the stator windings of the induction machine will create a North Pole and South Pole via electromagnetic induction. In this diagram, the induction machine includes one North Pole and one South Pole being a 2-pole induction machine. The rotating magnetic field of the stator windings of the induction machine will induce current to flow within the windings of the rotor. In some examples, the windings of the rotor are implemented in what is called a squirrel cage configuration, such that the rotating magnetic field of the stator crosses the windings of the rotor within the squirrel cage configuration and the current flowing within the rotor windings produce its own magnetic field. Rotation of the rotor is induced such that the magnetic field that is generated by the current flowing in the windings of the rotor attempts to follow the magnetic field rotating within the windings of the stator. As such, the mechanical directional rotation of the rotor is same as the direction of rotation of the magnetic field within the stator. Note that within such a 3-phase induction machine application, reversing the connectivity of any two phases of the 3-phase AC power supply being provided to the induction machine, within a motoring application, will reverse the directional rotation of the rotor within the induction machine.

With respect to such an induction machine, as mentioned above, whether operating in a motoring application oriented generating application, know that one or more appropriately implemented DSCs (e.g., including one or more in-line DSCs and/or non-in-line DSCs), may be implemented to provide and/or monitor the input electrical signals provided to the one or more stator windings of an induction machine in a motoring application or to monitor the output electrical signals provided from the one or more stator windings of an induction machine in a generating application. This diagram shows one particular example by which an induction machine may be configured specifically showing the location of the stator windings of the three respective phases of a 2-pole, 3-phase induction machine and their connectivity including the relationship between needle different respective electrical signals of the 3-phase AC power supply being provided to those stator windings of the three respective phases of a 2-pole, 3-phase induction machine. Note that sensing of the electrical signals being provided to or provided from the one or more stator windings of such a 2-pole, 3-phase induction machine can provide for highly accurate information regarding the location of the stator within the 2-pole, 3-phase induction machine based on the interaction of the windings of the rotor and the stator as the rotor rotates within the 2-pole, 3-phase induction machine. In some examples, the use and requirement of Hall effect sensors implemented to help determine the location of the stator within the 2-pole, 3-phase induction machine are obviated entirely because of the ability to drive current signals to the stator windings in a motoring application and simultaneously sense to them and/or to detect the current signals provided from the stator windings in a generating application. In certain other examples, the operation of such Hall effect sensors implemented within such a 2-pole, 3-phase induction machine is significantly improved by appropriately implemented one or more DSCs operating in conjunction with one or more Hall effect sensors.

Figure 20:
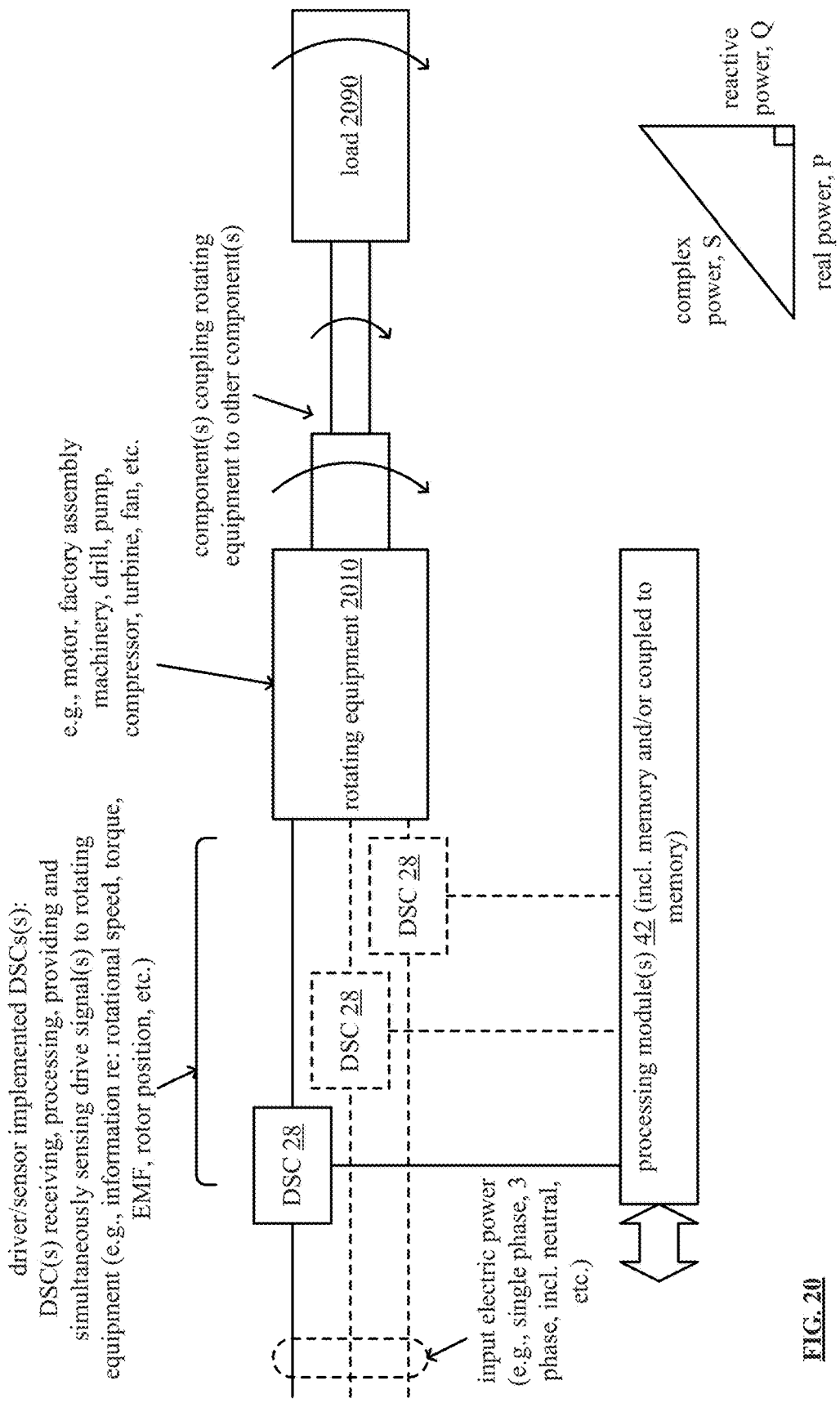
FIG. 20 is a schematic block diagram of an embodiment of in-line DSCs implemented in accordance with providing electric power signals to rotating equipment in accordance with the present invention.

FIG. 20 is a schematic block diagram of an embodiment 2000 of in-line DSCs implemented in accordance with providing electric power signals to rotating equipment in accordance with the present invention. In this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, the one or more DSCs 28 are configured to receive one or more input electric power signals and to process those one or more input electric power signals to generate drive signals to be provided to the rotating equipment 2010. In an example in which the rotating equipment 2010 operates based on 3-phase power, there are three respective DSCs 28 implemented to receive the three respective input electric power signals. In certain examples that include 3-phase power including a neutral, a fourth DSC 28 may also and optionally be implemented in-line of the neutral as well as may be desired in certain implementations. In an example in which rotating equipment 2010 operates based on single phase power, there is one DSC 28 implemented to receive the single phase input electric power signal. Note that the number of input electric power signals that are received corresponds to the number of DSCs 28 that received those respective input electric power signals.

Note that the rotating equipment 2010 of this diagram or other rotating equipment referenced in other diagrams may be any of a variety of types of machinery including a motor, factory assembly machinery, a drill, a pump, a compressor, a turbine, a fan, etc. The rotating equipment 2010 is connected to a load 2090 directly or via one or more components coupling the rotating equipment to the load 2090. Note that the load may be any of a variety of components that is driven or is operated on based on the rotating equipment 2010.

Considering an example in which the rotating equipment 2010 is a drill, the load 2090 may be an article of manufacture or some component that is being drilled by a drill bit that that is being driven by the rotating equipment 2010. Considering an example in which the rotating equipment 2010 is a pump, the load may be the fluid being pumped the a pathway or from one location to another. Considering an example in which the rotating equipment 2010 is a compressor, the load may be the reservoir or container that is being compressed. Generally speaking, any of a variety of types of rotating equipment 2010 and load 2090 may be implemented various examples. Generally speaking, other references to rotating equipment and loads, etc. within other diagrams, examples, embodiment, etc. herein may also be interpreted broadly as including any such types of components and their equivalents.

In this diagram, the one or more DSCs 28 are implemented in an in-line configuration with the one or more power supply signals to provide conditioned power signals to the rotating equipment 2010. In addition, they are configured to adapt control of the one or more motor drive signals being provided to the rotating equipment 2010. The one or more DSCs 28 are configured to receive the input electric power signals, perform processing on them, to provide drive signals to the rotating equipment 2010 and simultaneously to sense those drive signals being provided to the rotating equipment 2010. The one or more DSCs 28 are configured to provide a variety of types of information to be used by the one or more processing modules 42. For example, the one or more DSCs 28 operating by sensing of the one or more motor drive signals to the rotating equipment 2010 may provide information to determine the rotational speed of the rotor, the torque, the electromotive force (EMF), counter- or back-EMF, the rotor position, slip, etc. Based on any such information that is determined based on the sensing of the one or more motor drive signals provided to the rotating equipment 2010, the one or more processing modules 42 may adapt operation of the one or more DSCs 28.

In some examples, the one or more processing modules 42 is configured to direct the one or more DSCs 28 to perform conditioning, adjusting, filtering, etc. of the one or more motor drive signals being provided to the rotating equipment 2010. In other examples, the one or more processing modules 42 is configured to direct the one or more DSCs 28 to provide more current (e.g., based on detection of a high or higher back-EMF, an increased load, the rotor rotating at a slower speed than desired, etc.) or less current (e.g., based on detection of a low or lower back-EMF, a decreased load, the rotor rotating at a higher speed than desired, etc.) via the one or more motor drive signals being provided to the rotating equipment 2010. Similarly, the voltage of the one or more motor drive signals being provided from the one or more DSCs 28 to the rotating equipment 2010 may be adapted or modified accordingly based on such considerations.

Generally speaking, the one or more processing modules 42 is configured to direct the one or more DSCs 28 to perform adaptation of the one or more motor drive signals provided to the rotating equipment 2010. In some examples, this involves modifying the amplitude or magnitude of the current and/or voltage of the one or more motor drive signals. In other examples, this involves modifying the phase (e.g., forward/advancing or backward/delaying) of the current and/or voltage of the one or more motor drive signals. In even other examples, this involves filtering of the one or more motor drive signals (e.g., low pass filtering, bandpass filtering, high pass filtering, and/or any combination of such filtering) to generate the one or more motor drive signals. Note that such processing and filtering is performed in certain examples to compensate for and/or remove one or more conditions affecting the one or more motor drive signals (e.g., noise, interference, undesired harmonics, glitches, etc.).

In yet other examples, the one or more processing modules 42 is configured to direct the one or more DSCs 28 to increase the voltage or reduce the voltage of the one or more motor drive signals being provided to the rotating equipment 2010. In certain examples, the one or more processing modules 42 is configured to direct operation of the one or more DSCs 28 by modifying the one or more respective reference signals being provided to the one or more DSCs 28. For example, based on the one or more processing modules 42 adapting or modifying a reference signal that is being provided to a DSC 28 will adapt operation of that DSC 28 and thereby modify the drive signal being provided from that DSC 28 to the rotating equipment 2010.

Also, in certain examples, the one or more processing modules 42 is configured to detect and monitor the voltage and current of the one or more input electric power signals received and/or provided, such as after processing, electric power conditioning, etc., to the rotating equipment 2010 (e.g., via one or more in-line DSCs 28 implemented as shown in this diagram, or based on one or more sensing implemented DSCs 28 as described in the following diagram and others). Based on information provided to the one or more processing modules 42 via one or more DSCs 28, regardless of their particular implementation, the one or more processing modules 42 is configured to detect and monitor the voltage and current of the signals. As such, the one or more processing modules 42 is configured to determine the power factor of any one or more of these electric power signals. Generally speaking, the power factor of an electric power signal corresponds to the ratio of the real power absorbed by the load to the apparent power flowing the circuit. Real power, P, sometimes referred to as active power, is expressed in watts. Reactive power, Q, is typically expressed in reactive volt-amperes (vars). A complex power measure, S, is complex combined expression of P and Q and is typically expressed in volt-amperes (VAs). Generally speaking, the relationship between these is as follows:

S=P+j Q, such that S is the complex/vector combination of P and Q, with P having a phase of 0° and Q having a phase of 90°, such that S is the complex/vector combination of P and Q, and the magnitude of S, |S|, being expressed as follows:

$$|S|=\mathrm{sqrt}(P^2+Q^2)$$

Consider an angle theta, θ, as being in reference to the angle between S being the hypotenuse of a right triangle formed such that S is the complex/vector combination of P (e.g., horizontal line of the right triangle) and Q (vertical line of the right triangle) such as based on S=P+j Q), then $$\cos \theta, \text{ power factor}=P/|S|$$

As can be seen, as this angle θ Decreases, approaching 0°, the cos θ, power factor approaches 1, its maximum possible value, and Q reduces to zero such that the load is primarily resistive and less reactive (e.g., having little or no inductive and/or capacitive characteristics). That is to say, in a purely resistive system, the voltage and current waveforms are in phase with one another, and all the electric power being delivered to the load is consumed. However, when the load is reactive to at least some degree (e.g., exhibiting inductive and/or capacitive characteristics), then energy will be stored in the loads and thereby creating difference between the current and voltage of the electric power signals. This energy that is stored within the load temporarily may be viewed as being stored in electric and/or magnetic fields during the operation of the system.

Generally speaking, a lagging power factor is based on a positive angle θ (e.g., such that the value of Q it is a positive number, a positive reactive power), and a leading power factor is based on a negative angle θ (e.g., such that the value of Q it is a negative number, a negative reactive power). These terms refer to whether the phase of the current is leading or lagging the phase of the voltage. When there is a lagging power factor, the load being driven by the electric power signal is typically inductive, and the load consumes reactive power Q. Alternatively, when there is a leading power factor, the load being driven by the electric power signal is typically capacitive, and the load supplies reactive power Q.

Within the operation of electric motors, generators, etc., where there is a significant amount of electromagnetic induction between various components including between the stator windings and rotor windings, the load (e.g., a motor, stator windings of a motor, induction motors, etc.) may exhibit inductive characteristics. However, well-constructed components within such loads load (e.g., a motor, stator windings of a motor, induction motors, etc.) can exhibit linear characteristics with relatively low power factors.

The one or more processing modules 42 is configured to direct operation of the one or more DSCs 28 to adjust and adapt one or both of the voltage and/or current of these electric power signals. In doing so, the one or more processing modules 42 is configured to effectuate power factor adjustment. Generally speaking, a load (e.g., a motor, stator windings of a motor, induction motors, etc.) with a lower power factor draws more current than a load with a higher power factor for the same amount of power transfer.

The one or more processing modules 42 is configured to direct operation of the one or more DSCs 28 to adjust the power factor of the one or more electric power signals being provided to the rotating equipment 2010 by modifying the voltage and/or current of these electric power signals. For example, consider a situation in which relatively less power is being required by the rotating equipment 2010 (e.g., a load that is decreasing, such as having decreased torque, etc.), then the one or more processing modules 42 is configured to direct operation of the one or more DSCs 28 to adjust the relationship between the voltage and current of an electric power signal to effectuate a power factor corresponding to the delivery of less power (e.g., less real power and more reactive power) to the rotating equipment 2010 thereby improving the efficiency and operation of the rotating equipment 2010. Alternatively, consider a situation in which relatively more power is being required by the rotating equipment 2010 (e.g., a load that is increasing, such as having increased torque, etc.), then the one or more processing modules 42 is configured to direct operation of the one or more DSCs 28 to adjust the relationship between the voltage and current of an electric power signal to effectuate a power factor corresponding to the delivery of more power (e.g., more real power and less reactive power) to the rotating equipment 2010 thereby improving the efficiency and operation of the rotating equipment 2010.

Generally speaking, any of the variety of information that may be determined based on analysis of the sensing of the one or more motor drive signals being provided to the rotating equipment 2010 may be used to adapt operation of the one or more DSCs 28 by the one or more processing modules 42 to control and/or adapt the operation of the rotating equipment 2010.

Figure 21:
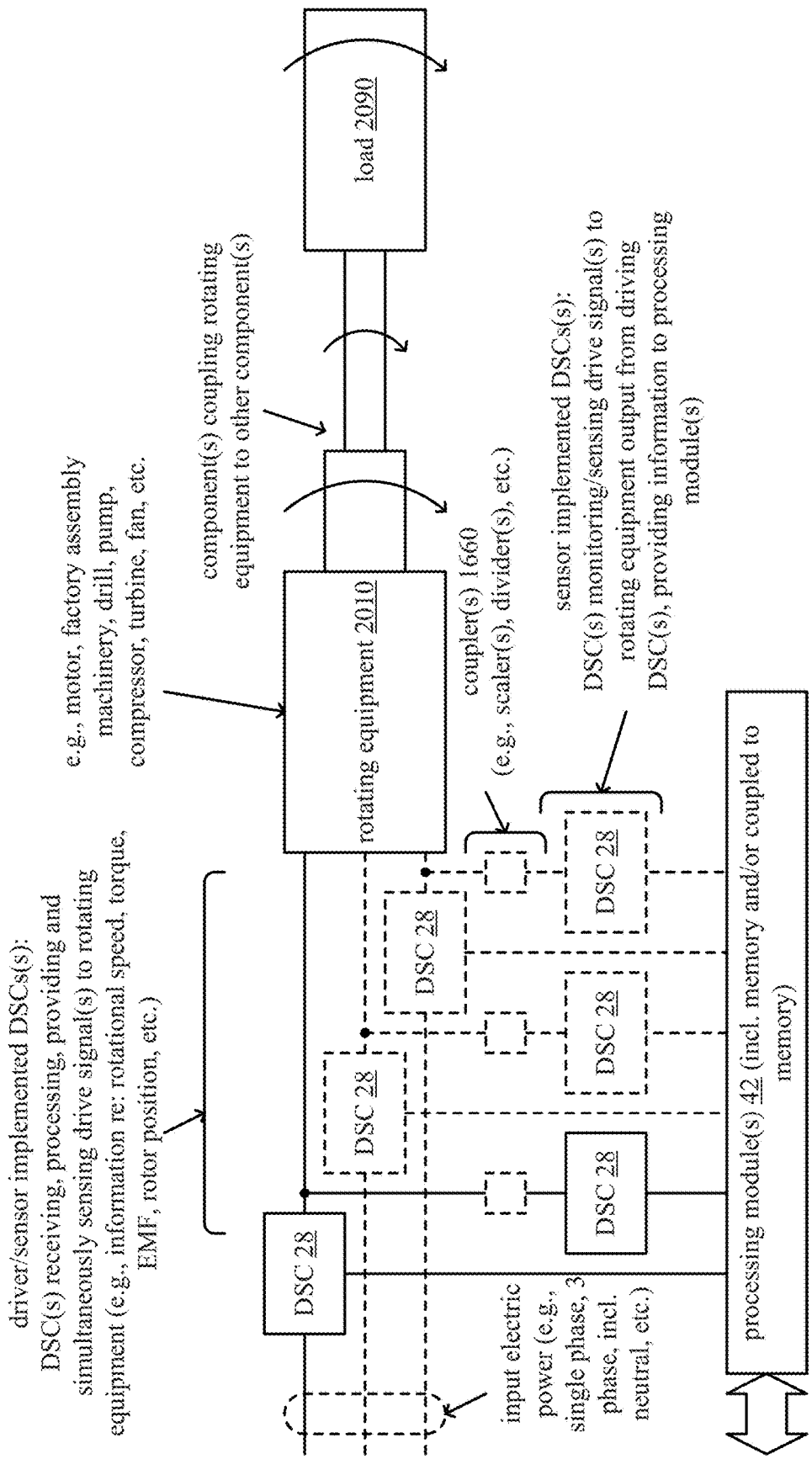
FIG. 21 is a schematic block diagram of another embodiment of in-line DSCs implemented in accordance with providing electric power signals to rotating equipment in accordance with the present invention.

FIG. 21 is a schematic block diagram of another embodiment 2100 of in-line DSCs implemented in accordance with providing electric power signals to rotating equipment in accordance with the present invention. This diagram has some similarities to the previous diagram. For example, in this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. The one or more DSCs 28 are configured to receive one or more input electric power signals and to process those one or more input electric power signals to generate drive signals to be provided to the rotating equipment 2010. The rotating equipment 2010 is connected to a load 2090 directly or via one or more components coupling the rotating equipment 2010 to the load 2090.

This diagram also includes one or more additional DSCs 28 that are implemented as sensors to monitor the drive signals that are output from the in-line DSCs 28 that receive the one or more input electric power signals. In this diagram, these one or more additional DSCs 28 are shown as sensing and monitoring the one or more conditioned input electric power signals from the one or more in-line DSCs 28 that provide the one or more conditioned input electric power signals to the rotating equipment 2010. In other embodiments, note that these one or more additional DSCs 28 may alternatively be implemented to sense and monitor the one or more input electric power signals that are provided from the to the one or more in-line DSCs 28 (e.g., monitoring and sensing the one or more inputs to the one or more in-line DSCs 28 alternatively to or in addition to the monitoring and sensing of the one or more outputs from the one or more in-line DSCs 28).

These one or more additional DSCs 28 are also in communication with the one or more processing modules 42. In certain examples, these sensor implemented DSCs 28 are connected to the drive signal lines output from the in-line DSCs 28 via one or more couplers 1660. As described elsewhere herein, the couplers 1660 may be of any of a variety of types that provide one or more other signals to the sensor implemented DSCs 28 that are representative of the one or more motor drive signals that are output from the in-line DSCs 28 and provided to the rotating equipment 2010.

This diagram shows an alternative implementation in which a first one or more in-line DSCs 28 is configured to perform adaptation and control of the one or more motor drive signals that are provided to the rotating equipment 2010 and a second one or more sensor implemented DSCs 28 is configured to perform sensing of the one or more motor drive signals that are provided to the rotating equipment 2010. Note that different DSCs 28 in this diagram may be implemented to perform different operations. For example, the one or more in-line DSCs 28 is configured to perform both the providing of the one or more motor drive signals to the rotating equipment 2010 and also simultaneously to perform sensing of those one or more motor drive signals to the rotating equipment 2010 as the one or more sensor implemented DSCs 28 is configured also to perform sensing of the one or more motor drive signals. In another example, the one or more in-line DSCs 28 is configured to perform only the providing of the one or more motor drive signals to the rotating equipment 2010 as the one or more sensor implemented DSCs 28 is configured to perform sensing of the one or more motor drive signals. In even other examples, the one or more sensor implemented DSCs 28 is configured to operate to perform adaptation of the one or more motor drive signals output from the in-line DSCs 28 such that for any given drive signal that is provided to the rotating equipment 2010, a corresponding in-line DSC 28 and also another DSC 28 operate cooperatively to perform any modification or adaptation of that respective drive signal is provided to the rotating equipment 2010.

Figure 22:
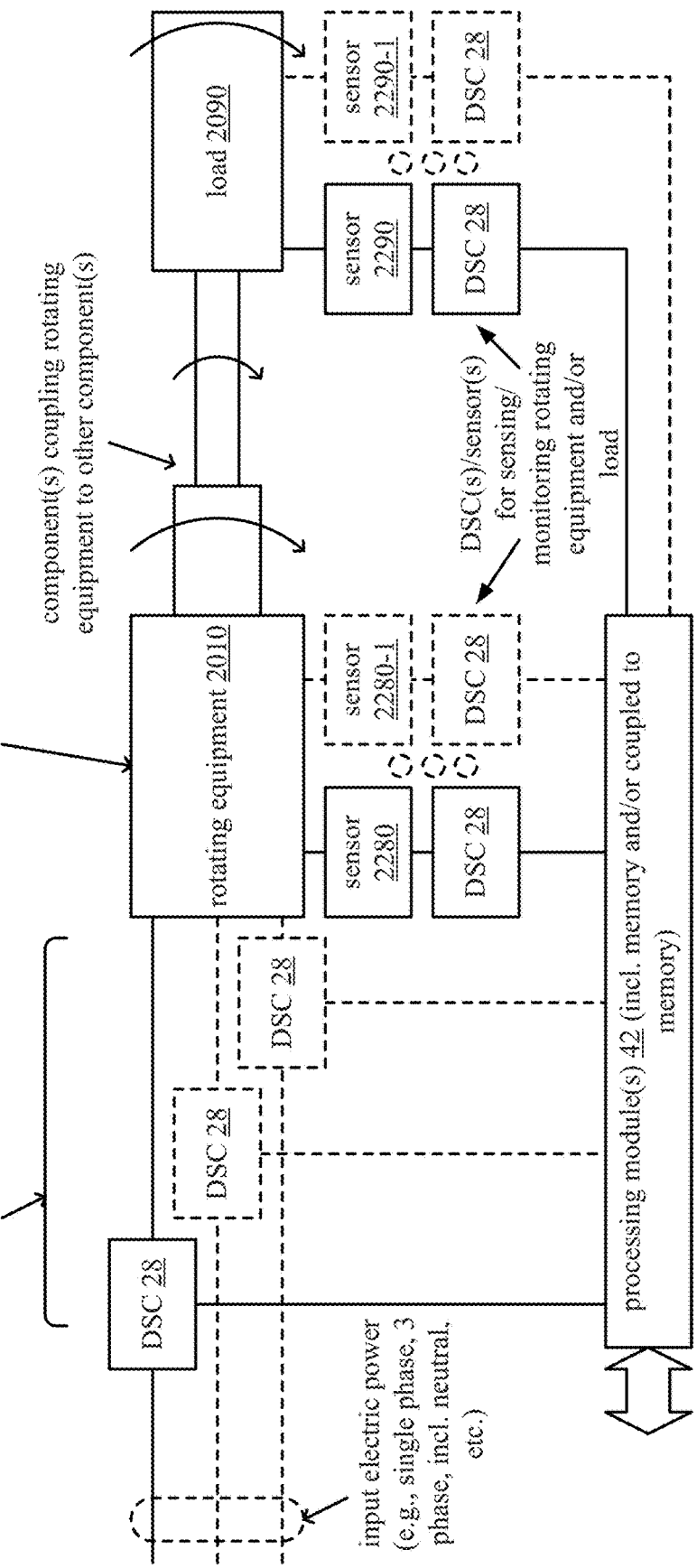
FIG. 22 is a schematic block diagram of another embodiment of in-line DSCs implemented in accordance with providing electric power signals to rotating equipment in accordance with the present invention.

FIG. 22 is a schematic block diagram of another embodiment 2200 of in-line DSCs implemented in accordance with providing electric power signals to rotating equipment in accordance with the present invention. This diagram has some similarities to the previous diagram of FIG. 20. For example, in this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. The one or more DSCs 28 are configured to receive one or more input electric power signals and to process those one or more input electric power signals to generate drive signals to be provided to the rotating equipment 2010. The rotating equipment 2010 is connected to a load 2090 directly or via one or more components coupling the rotating equipment 2010 to the load 2090.

This diagram also includes one or more additional DSCs 28 that are implemented to interface to one or more sensors that provide additional information regarding the rotating equipment 2010 and the load 2090. For example, one or more sensors 2280 to 2280-1 are implemented and serviced via one or more DSCs 28 to provide information regarding the rotating equipment 2010, and/or one or more sensors 2290 to 2290-1 are implemented and serviced via one or more DSCs 28 to provide information regarding the load 2090. Note that the number and type of sensors implemented to provide information on rotating equipment 2010 may be of a variety of different types. Examples of such sensors implemented to provide information of the rotating equipment 2010 may include one or more of Hall effect sensors, optical speed sensors, temperature sensors, accelerometers such as may be implemented to monitor and detect for vibrations, etc. Similarly, such types of sensors may also be implemented to provide information regarding the load 2090. In addition, based on the particular type of load 2090, appropriately tailored sensors may be implemented (e.g., rate of flow sensors for a pump application, pressure sensors for a compressor application, etc.).

This diagram shows an example in which additional information regarding the status and operation of the rotating equipment 2010 and/or the load 2090 is provided to the one or more processing modules 42 be used to direct and control operation of the various DSCs 28 and possibly including the one or more in-line DSCs 28 that provide the one or more motor drive signals to the rotating equipment 2010.

Figure 23:
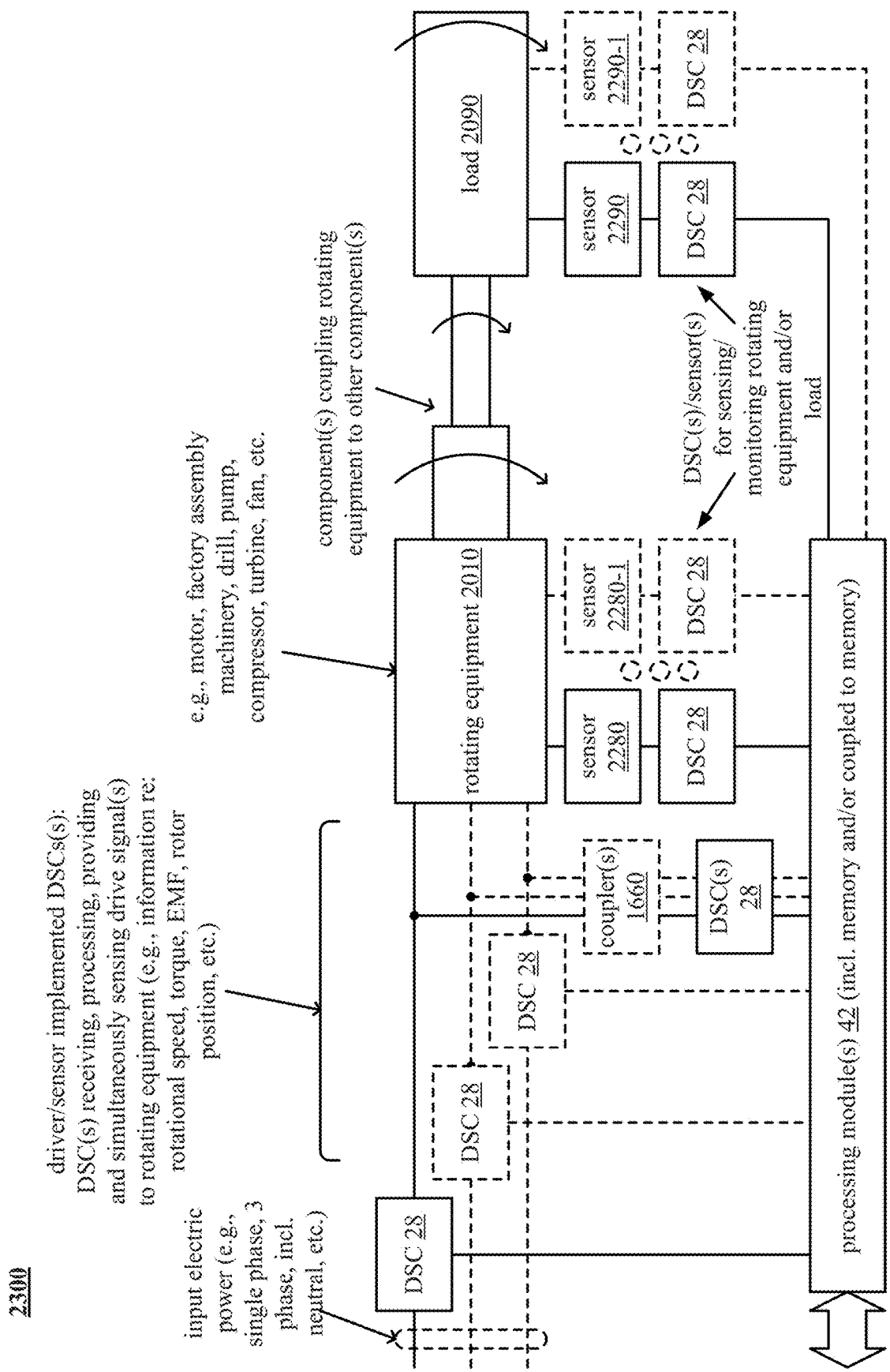
FIG. 23 is a schematic block diagram of another embodiment of in-line DSCs implemented in accordance with providing electric power signals to rotating equipment in accordance with the present invention.

FIG. 23 is a schematic block diagram of another embodiment 2300 of in-line DSCs implemented in accordance with providing electric power signals to rotating equipment in accordance with the present invention. This diagram has some similarities to certain of the previous diagrams. For example, in this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. The one or more DSCs 28 are configured to receive one or more input electric power signals and to process those one or more input electric power signals to generate drive signals to be provided to the rotating equipment 2010. The rotating equipment 2010 is connected to a load 2090 directly or via one or more components coupling the rotating equipment 2010 to the load 2090.

This diagram also includes one or more additional DSCs 28 that are implemented as sensors to monitor the drive signals that are output from the in-line DSCs 28 that receive the one or more input electric power signals. Note that these one or more additional DSCs 28 may be coupled to the one or more drive signal lines output from the in-line DSCs 28 via one or more couplers 1660.

This diagram shows an example in which additional information regarding the one or more motor drive signals output from one or more in-line DSCs 28 as well as information regarding the status and operation of the rotating equipment 2010 and/or the load 2090 is provided to the one or more processing modules 42 be used to direct and control operation of the various DSCs 28 and possibly including the one or more in-line DSCs 28 that provide the one or more motor drive signals to the rotating equipment 2010.

In an example of operation and implementation, a rotating equipment system with in-line drive-sense circuit (DSC)

electric power signal processing includes rotating equipment 2010, in-line drive-sense circuits (DSCs) 28, and one or more processing modules 42. The rotating equipment 2010 is operably coupled to receive a plurality of motor drive signals. When enabled, the rotating equipment 2010 is configured to operate based on power delivered via the plurality of motor drive signals.

Note that the one or more processing modules 42 may include integrated memory and/or be coupled to other memory. At least some of the memory stores operational instructions to be executed by the one or more processing modules 42. In addition, note that the one or more processing modules may interface with one or more other devices, components, elements, etc. via one or more communication links, networks, communication pathways, channels, etc.

A plurality of in-line drive-sense circuits (DSCs) 28 is operably coupled to receive a plurality of input electrical power signals and to generate the plurality of motor drive signals. When enabled, an in-line DSC 28 of the plurality of in-line DSCs 28 is operably coupled and configured to receive an input electrical power signal of a plurality of input electrical power signals, process the input electrical power signal to generate a motor drive signal, and to output the motor drive signal to the rotating equipment 2010 via a single line and simultaneously to sense the motor drive signal via the single line. Also, the in-line DSC 28 is operably coupled and configured to detect an effect on the motor drive signal that is based on an electrical characteristic of the rotating equipment 2010 based on the sensing of the motor drive signal via the single line. The in-line DSC 28 is operably coupled and configured to generate a digital signal representative of the electrical characteristic of the rotating equipment 2010.

The one or more processing modules 42 is operably coupled to the plurality of in-line DSCs 28. When enabled, the one or more processing modules 42 is configured to receive the digital signal representative of the electrical characteristic of the rotating equipment 2010 from the in-line DSC of the plurality of in-line DSCs and process the digital signal to determine information regarding one or more operational conditions of the rotating equipment 2010. Based on the information regarding the one or more operational conditions of the rotating equipment 2010, the one or more processing modules 42 is configured determine whether to perform adaptation of the motor drive signal. Also, based on a determination to perform adaptation of the motor drive signal, the one or more processing modules 42 is configured to identify one or more adaptation operations to be performed on the motor drive signal and direct the in-line DSC to perform the one or more adaptation operations on the motor drive signal.

In some examples, the system includes another plurality of DSCs operably coupled as sensors to monitor the plurality of motor drive signals that are output from the plurality of in-line DSCs. When enabled, a DSC of the another plurality of DSCs operably coupled and configured to sense the motor drive signal via another single line, detect the effect on the motor drive signal that is based on at least one of the electrical characteristic of the rotating equipment 2010 or the one or more adaptation operations that is performed on the motor drive signal by the in-line DSC, and generate another digital signal representative of the at least one of the electrical characteristic of the rotating equipment 2010 or the one or more adaptation operations.

The one or more processing modules 42, when enabled, are further configured to receive the another digital signal representative of the at least one of the electrical characteristic of the rotating equipment 2010 or the one or more adaptation operations, process the another digital signal to determine other information regarding the at least one of the electrical characteristic of the rotating equipment 2010 or the one or more adaptation operations. Based on the other information regarding the at least one of the electrical characteristic of the rotating equipment 2010 or the one or more adaptation operations, the one or more processing modules 42 are configured to determine whether to perform additional adaptation of the motor drive signal. Also, based on another determination to perform the additional adaptation of the motor drive signal, the one or more processing modules 42 are configured to identify one or more additional adaptation operations to be performed on the motor drive signal and direct the in-line DSC to perform the one or more additional adaptation operations on the motor drive signal.

In some other examples, the system includes a plurality of sensors (e.g., 2280 to 2280-1 and/or 2290 to 2290-1) operably coupled to the one or more processing modules 42 via another plurality of DSCs and implemented to monitor a plurality of analog features associated with at least one of the rotating equipment 2010 or a load that is serviced by the rotating equipment 2010. When enabled, a DSC of the another plurality of DSCs is configured to drive and sense a sensor of the plurality of sensor via another single line, generate another digital signal representative of a sensed analog feature to which the sensor of the plurality of sensors is exposed, and transmit the another digital signal to the one or more processing modules 42.

The one or more processing modules 42, when enabled, are further configured to receive the another digital signal representative of the sensed analog feature, process the another digital signal to determine other information regarding the at least one of the rotating equipment 2010 or the load that is serviced by the rotating equipment 2010. Based on the other information regarding the at least one of the rotating equipment 2010 or the load that is serviced by the rotating equipment 2010, the one or more processing modules 42 are configured to determine whether to perform additional adaptation of the motor drive signal. Based on another determination to perform the additional adaptation of the motor drive signal, the one or more processing modules 42 are configured to identify one or more additional adaptation operations to be performed on the motor drive signal and direct the in-line DSC to perform the one or more additional adaptation operations on the motor drive signal.

In some examples, the in-line DSC further includes a power source circuit operably coupled to the single line. When enabled, the power source circuit is configured to provide the motor drive signal via the single line coupling to the rotating equipment 2010, and wherein the motor drive signal includes at least one of a DC (direct current) component and an oscillating component. The in-line DSC further includes a power source change detection circuit operably coupled to the power source circuit. When enabled, the power source change detection circuit is configured to detect the effect on the motor drive signal that is based on the electrical characteristic of the rotating equipment 2010 and generate the digital signal representative of the electrical characteristic of the rotating equipment 2010.

Also, in some examples, the power source circuit includes a power source to source at least one of a voltage or a current to the rotating equipment 2010 via the single line and the power source change detection circuit that includes a power source reference circuit configured to provide at least one of a voltage reference or a current reference, and a comparator configured to compare the at least one of the voltage and the current provided to the rotating equipment 2010 to the at least one of the voltage reference and the current reference to produce the motor drive signal.

In certain examples, note that the one or more operational conditions of the rotating equipment 2010 includes one or more of rotational speed of a rotor of the rotating equipment 2010, torque on the rotor of the rotating equipment 2010, electromotive force (EMF) of the rotating equipment 2010 including counter-EMF or back-EMF, a position of the rotor of the rotating equipment 2010, slip of the rotating equipment 2010 that is based on the rotational speed of a magnetic field within the rotor of the rotating equipment 2010, a stator electrical speed of the rotating equipment 2010, and the rotational speed of the rotor of the rotating equipment 2010.

Also, in some examples, the one or more adaptation operations to be performed on the motor drive signal includes any one or more of modification of amplitude or magnitude of at least one of a current or a voltage of the motor drive signal, modification of phase of the at least one of the current or the voltage of the motor drive signal, filtering of motor drive signal based on one or more of low pass filtering, bandpass filtering, and high pass filtering, and/or removal of one or more of noise, interference, undesired harmonics, and glitches.

Figure 24:
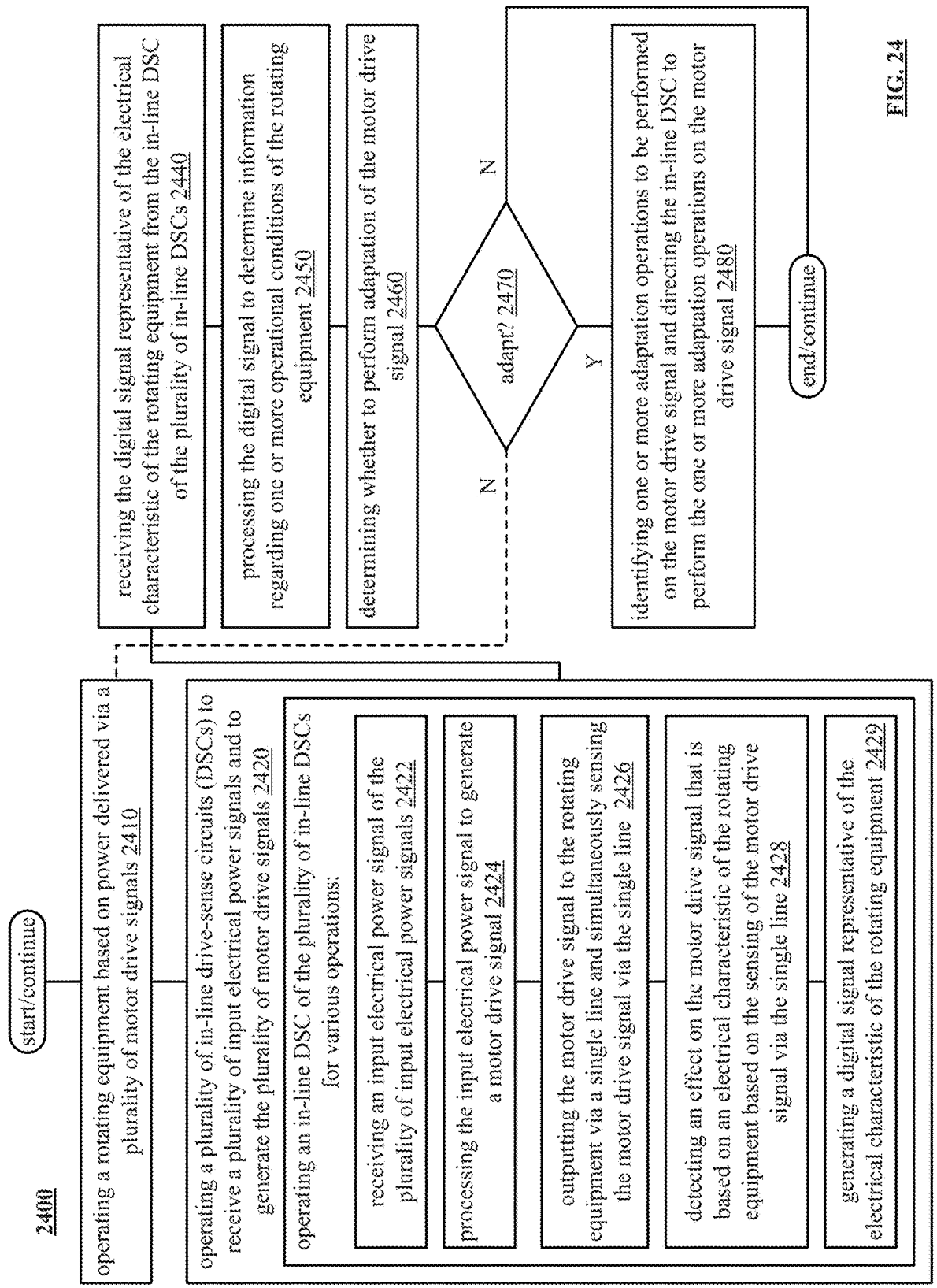
FIG. 24 is a schematic block diagram of an embodiment of a method for execution by one or more devices in accordance with the present invention.

FIG. 24 is a schematic block diagram of an embodiment of a method 2400 for execution by one or more devices in accordance with the present invention. The method 2400 may also be viewed as a method for execution by a rotating equipment system with in-line drive-sense circuit (DSC) electric power signal processing. The method 2400 operates in step 2410 by operating a rotating equipment based on power delivered via a plurality of motor drive signals.

The method 2400 also operates in step 2420 by operating a plurality of in-line drive-sense circuits (DSCs) to receive a plurality of input electrical power signals and to generate the plurality of motor drive signals. This involves operating an in-line DSC of the plurality of in-line DSCs for various operations including receiving an input electrical power signal of the plurality of input electrical power signals in step 2422, processing the input electrical power signal to generate a motor drive signal in step 2424, outputting the motor drive signal to the rotating equipment via a single line and simultaneously sensing the motor drive signal via the single line in step 2426, detecting an effect on the motor drive signal that is based on an electrical characteristic of the rotating equipment based on the sensing of the motor drive signal via the single line in step 2428, and generating a digital signal representative of the electrical characteristic of the rotating equipment in step 2429.

The method 2400 also operates in step 2420 (e.g., by one or more processing modules) by receiving the digital signal representative of the electrical characteristic of the rotating equipment from the in-line DSC of the plurality of in-line DSCs in step 2440, processing the digital signal to determine information regarding one or more operational conditions of the rotating equipment in step 2450. Based on the information regarding the one or more operational conditions of the rotating equipment, the method 2400 also operates in step 2460 by determining whether to perform adaptation of the motor drive signal. Based on a determination to perform adaptation of the motor drive signal, the method 2400 also operates in step 2470 by identifying one or more adaptation operations to be performed on the motor drive signal and directing the in-line DSC to perform the one or more adaptation operations on the motor drive signal in step 2480.

Alternatively, based on a determination not to perform adaptation of the motor drive signal in step 2470, the method 2400 ends or alternatively returns to step 2410 and continues to perform the method 2400.

Variants of the method 2400 may also include operating another plurality of DSCs operably coupled as sensors to monitor the plurality of motor drive signals that are output from the plurality of in-line DSCs for various operations. Examples of such operations include sensing the motor drive signal via another single line, detecting the effect on the motor drive signal that is based on at least one of the electrical characteristic of the rotating equipment or the one or more adaptation operations that is performed on the motor drive signal by the in-line DSC and generating another digital signal representative of the at least one of the electrical characteristic of the rotating equipment or the one or more adaptation operations. Such variants of the method 2400 may also include (e.g., by one or more processing modules) receiving the another digital signal representative of the at least one of the electrical characteristic of the rotating equipment or the one or more adaptation operations. This may also involve processing the another digital signal to determine other information regarding the at least one of the electrical characteristic of the rotating equipment or the one or more adaptation operations. Based on the other information regarding the at least one of the electrical characteristic of the rotating equipment or the one or more adaptation operations, variants of the method 2400 may also include determining whether to perform additional adaptation of the motor drive signal. Also, based on another determination to perform the additional adaptation of the motor drive signal, variants of the method 2400 may also include identifying one or more additional adaptation operations to be performed on the motor drive signal and directing the in-line DSC to perform the one or more additional adaptation operations on the motor drive signal.

Other variants of the method 2400 may also include operating a plurality of sensors operably coupled to another plurality of DSCs to monitor a plurality of analog features associated with at least one of the rotating equipment or a load that is serviced by the rotating equipment including operating a DSC of the another plurality of DSCs for various operations. Examples of such operations may include driving and sensing a sensor of the plurality of sensor via another single line generating another digital signal representative of a sensed analog feature to which the sensor of the plurality of sensors is exposed. This may also involve processing the another digital signal to determine other information regarding the at least one of the rotating equipment or the load that is serviced by the rotating equipment. Based on the other information regarding the at least one of the rotating equipment or the load that is serviced by the rotating equipment, such variants of the method 2400 may also involve determining whether to perform additional adaptation of the motor drive signal. Based on another determination to perform the additional adaptation of the motor drive signal, variants of the method 2400 may also include identifying one or more additional adaptation operations to be performed on the motor drive signal and directing the in-line DSC to perform the one or more additional adaptation operations on the motor drive signal.

With respect to an in-line DSC implemented to facilitate operation of such a method, the in-line DSC may be implemented to include a power source circuit operably coupled to the single line. When enabled, the power source circuit is configured to provide the motor drive signal via the single line coupling to the rotating equipment, and the motor drive signal includes at least one of a DC (direct current) component and an oscillating component. Also, the in-line DSC includes a power source change detection circuit operably coupled to the power source circuit. When enabled, the power source change detection circuit is configured to detect the effect on the motor drive signal that is based on the electrical characteristic of the rotating equipment and to generate the digital signal representative of the electrical characteristic of the rotating equipment.

In some specific implementations of such an in-line DSC, the power source circuit including a power source to source at least one of a voltage or a current to the rotating equipment via the single line. Also, the power source change detection circuit includes a power source reference circuit configured to provide at least one of a voltage reference or a current reference, and a comparator configured to compare the at least one of the voltage and the current provided to the rotating equipment to the at least one of the voltage reference and the current reference to produce the motor drive signal. Note that the rotating equipment may be of any of a variety of types including a motor, a factory assembly machinery, a drill, a pump, a compressor, a turbine, or a fan.

Also, note that the one or more operational conditions of the rotating equipment may corresponds to and include one or more of rotational speed of a rotor of the rotating equipment, torque on the rotor of the rotating equipment, electromotive force (EMF) of the rotating equipment including counter-EMF or back-EMF, a position of the rotor of the rotating equipment, slip of the rotating equipment that is based on the rotational speed of a magnetic field within the rotor of the rotating equipment, a stator electrical speed of the rotating equipment, and/or the rotational speed of the rotor of the rotating equipment.

Also, note that the one or more adaptation operations to be performed on the motor drive signal may include one or more of modification of amplitude or magnitude of at least one of a current or a voltage of the motor drive signal, modification of phase of the at least one of the current or the voltage of the motor drive signal, filtering of motor drive signal based on one or more of low pass filtering, bandpass filtering, and high pass filtering, and removal of one or more of noise, interference, undesired harmonics, and/or glitches.

Figure 25:
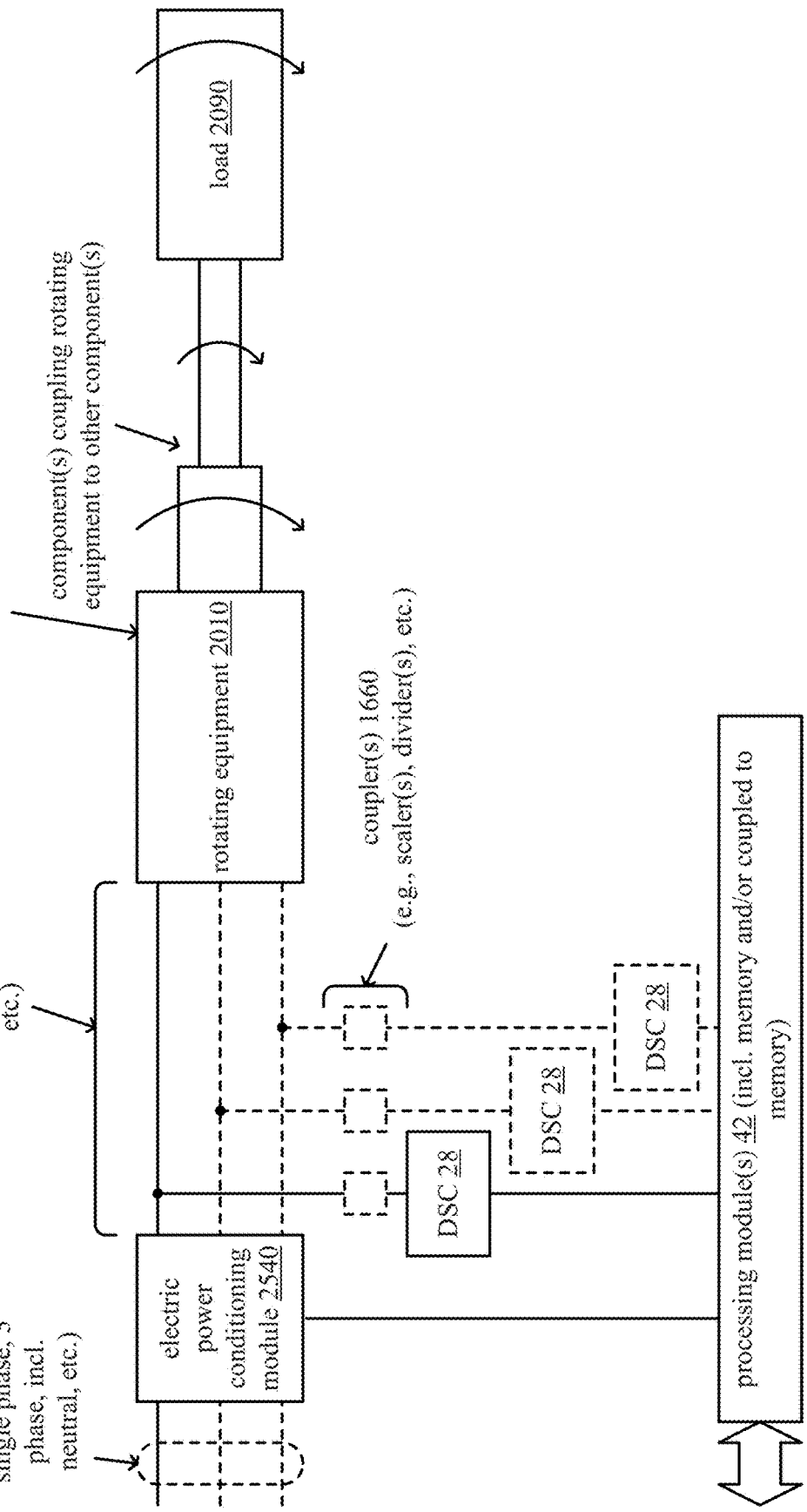
FIG. 25 is a schematic block diagram of an embodiment of DSC sensing in accordance with providing electric power signal conditioning for rotating equipment in accordance with the present invention.

FIG. 25 is a schematic block diagram of an embodiment 2500 of DSC sensing in accordance with providing electric power signal conditioning for rotating equipment in accordance with the present invention. This diagram has some similarities to certain of the previous diagrams. For example, in this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. In addition, the rotating equipment 2010 is connected to a load 2090 directly or via one or more components coupling the rotating equipment to the load 2090.

Also, in this diagram, an electric power conditioning module 2540, which is in communication with the one or more processing modules 42, is configured to process the one or more input electric power signals that are to be provided to rotating equipment 2010 that is connected to a load 2090 directly or via one or more components coupling the rotating equipment 2010 to the load 2090. The one or more DSCs 28 that are implemented as sensors to monitor the drive signals that are output from the electric power conditioning module 2540 that receives the one or more input electric power signals. Note that these one or more DSCs 28 may be coupled to the one or more conditioned input electric power signals that are provided to the rotating equipment 2010 via one or more couplers 1660 (e.g., by operating in accordance with any of the one or more characteristics of a coupler as described herein, their equivalents, etc. and as may be desired in various examples).

In certain of the previous diagrams, one or more in-line DSCs are implemented to perform input electric power signal processing to generate the one or more motor drive signals that are provided to the rotating equipment 2010. In this diagram, the electric power conditioning module 2540 is implemented to perform input electric power signal processing to generate the one or more motor drive signals that are provided to rotating equipment. The electric power conditioning module 2540 is configured to perform processing of the one or more input electric power signals based on the control and direction provided from the one or more processing modules 42 based on information provided from the one or more DSCs 28 regarding the drive signals being provided to the rotating equipment 2010.

Generally speaking, such an implementation using an electric power conditioning module 2540 is operative using means that are alternative to in-line DSCs to perform such processing of the input electric power signals for additional means in conjunction with in-line DSCs to perform such processing of the input electric power signals to generate one or more conditioned input electric power signals to be provided to the rotating equipment 2010. The electric power conditioning module 2540 may be implemented to perform any of a number of operations on the one or more input electric power signals to generate the one or more drives signals that are provided to the rotating equipment 2010. Examples of such modification of the one or more input electric power signals may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

In some examples, the electric power conditioning module 2540 is implemented to include a number of discrete elements that may be selected based on one or more control signals provided from the one or more processing modules 42. In an example, the electric power conditioning module 2540 includes filter banks having different properties, and one or more of those filters is selected by the one or more processing modules 42 to perform desired filtering on the one or more input electric power signals. In a specific example, when the one or more input electric power signals is adversely affected by one or more of noise, interference, undesired harmonics, glitches, etc., the one or more processing modules 42 is configured to select one or more filters from the filter banks element within the electric power conditioning module 2540 to reduce or remove the adverse effects from the one or more input electric power signals.

In another specific example, when the one or more input electric power signals is adversely affected by an overvoltage condition, the one or more processing modules 42 is configured to select an appropriate scaling factor and element within the electric power conditioning module 2540 (e.g., a voltage divider from among a number of available voltage dividers, to adjust a variable voltage divider to an appropriate value, etc.) so that the one or more motor drive signals are provided to the rotating equipment 2010 in a manner that is in accordance with the requirements, constraints, ranges etc. by which the rotating equipment 2010 operates, requires, and/or is best suited for.

In another specific example, when the one or more input electric power signals is adversely affected by an undervoltage condition such as a voltage sag, the one or more processing modules 42 is configured to select an appropriate scaling factor and element within the electric power conditioning module 2540 (e.g., an amplifier from among a number of available amplifiers, to adjust a programmable gain amplifier to an appropriate value, etc.) so that the one or more motor drive signals are provided to the rotating equipment 2010 in a manner that is in accordance with the requirements, constraints, ranges etc. by which the rotating equipment 2010 operates, requires, and/or is best suited for.

In another specific example, when the one or more input electric power signals is adversely affected by an out of phase condition, the one or more processing modules 42 is configured to select an appropriate phase adjustment value and element within the electric power conditioning module 2540 (e.g., a phase delay element implemented to delay a signal by an appropriate value, a phase advancement element implemented to advance a signal by an appropriate value, a programmable phase adjustment element that is adjusted to an appropriate value, etc.) so that the one or more motor drive signals are provided to the rotating equipment 2010 in a manner that is in accordance with the requirements, constraints, ranges etc. by which the rotating equipment 2010 operates, requires, and/or is best suited for.

Generally speaking, this diagram shows an implementation by which one or more DSCs 28 are implemented to perform sensing of the one or more motor drive signals that are being provided to the rotating equipment 2010 from the electric power conditioning module 2540 and are implemented to provide information to one or more processing modules 42 that is configured to adapt operation of the electric power conditioning module 2540 to ensure that the one or more motor drive signals that are provided to the rotating equipment 2010 have desired properties for the application. This diagram shows the feedback implementation in which the one or more motor drive signals output from the electric power conditioning module 2540 are sensed by the one or more DSCs 28, information generated based on that sensing is provided to the one or more processing modules 42, and the one or more processing modules 42 is configured to adapt operation of the electric power conditioning module 2540.

Figure 26:
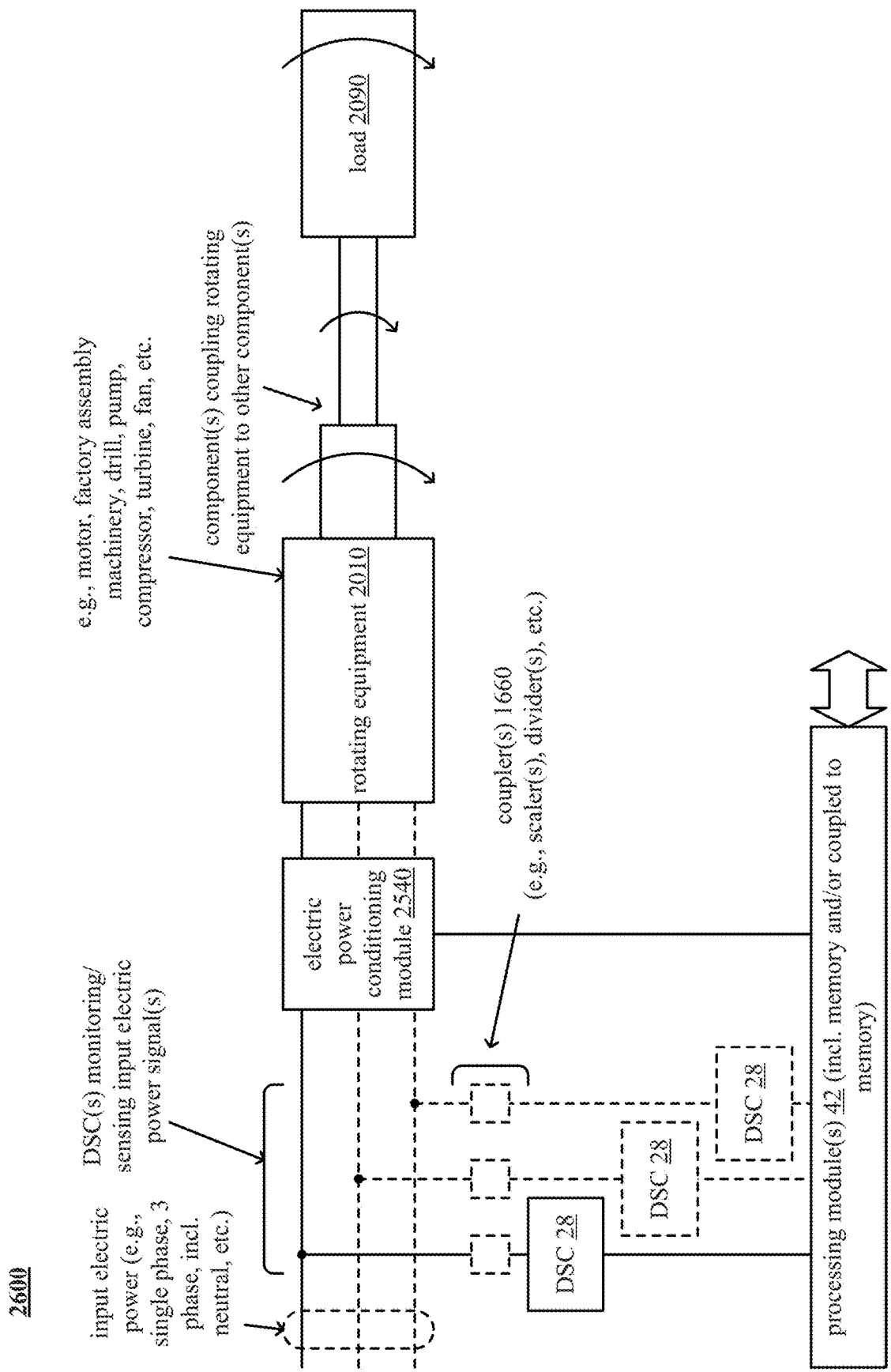
FIG. 26 is a schematic block diagram of an embodiment of DSC sensing in accordance with providing electric power signal conditioning for rotating equipment in accordance with the present invention.

FIG. 26 is a schematic block diagram of an embodiment 2600 of DSC sensing in accordance with providing electric power signal conditioning for rotating equipment in accordance with the present invention. This diagram as many similarities to the previous diagram with at least one difference being that one or more DSCs 28 are implemented to perform sensing of the one or more input electric power signals before they are received by the electric power conditioning module 2540. This diagram shows a feedforward implementation in which the one or more input electric power signals are sensed by the one or more DSCs 28, information generated based on that sensing is provided to the one or more processing modules 42, and the one or more processing modules 42 is configured to adapt operation of the electric power conditioning module 2540. As in other diagrams, note that the one or more DSCs 28 that are implemented to perform sensing of the one or more input electric power signals may be implemented to receive one or more signals via one or more couplers 1660 (e.g., by operating in accordance with any of the one or more characteristics of a coupler as described herein, their equivalents, etc. and as may be desired in various examples).

Figure 27:
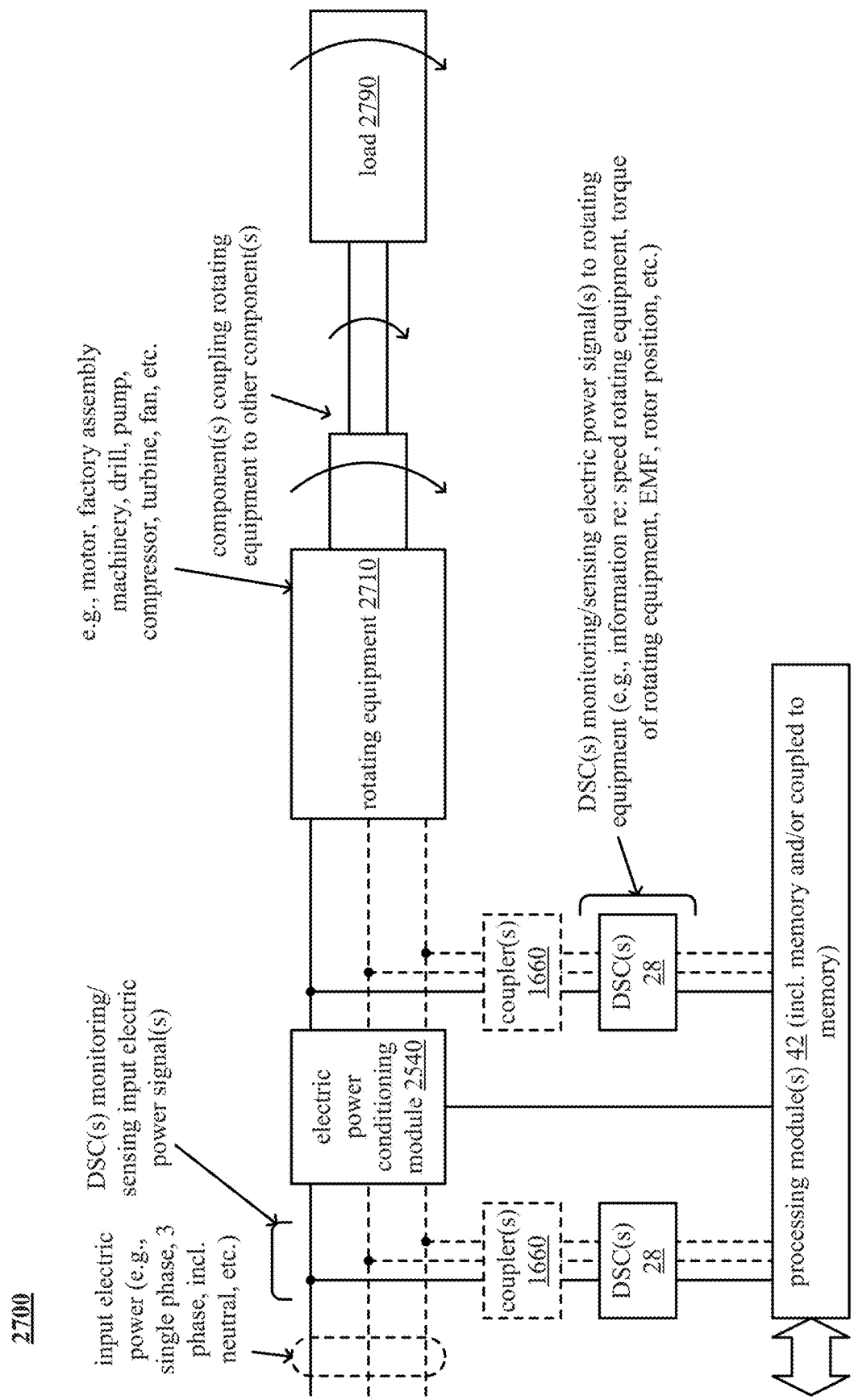
FIG. 27 is a schematic block diagram of an embodiment of DSC sensing in accordance with providing electric power signal conditioning for rotating equipment in accordance with the present invention.

FIG. 27 is a schematic block diagram of an embodiment 2700 of DSC sensing in accordance with providing electric power signal conditioning for rotating equipment in accordance with the present invention. This diagram as many similarities to certain of the previous diagrams with at least one difference being that a first one or more DSCs 28 are implemented to perform sensing of the one or more input electric power signals before they are received by the electric power conditioning module 2540 and a second one or more DSCs 28 are implemented perform sensing of the one or more motor drive signals that are output from the electric power conditioning module 2540.

This diagram shows a combination feedback and feedforward implementation in which the one or more input electric power signals are sensed by the first one or more DSCs 28 and the one or more motor drive signals output from the electric power conditioning module 2540 are sensed by the second one or more DSCs 28, information generated based on the sensing as performed by the first one or more DSCs 28 and the second one or more DSCs 28 is provided to the one or more processing modules 42, and the one or more processing modules 42 is configured to adapt operation of the electric power conditioning module 2540. As in other diagrams, note that the first second one or more DSCs 28 that are implemented to perform sensing of the one or more input electric power signals and/or the second one or more DSCs 28 that are implemented to perform sensing of the one or more motor drive signals output from the electric power conditioning module 2540 may be implemented to receive one or more signals via one or more couplers 1660 (e.g., by operating in accordance with any of the one or more characteristics of a coupler as described herein, their equivalents, etc. and as may be desired in various examples).

Figure 28:
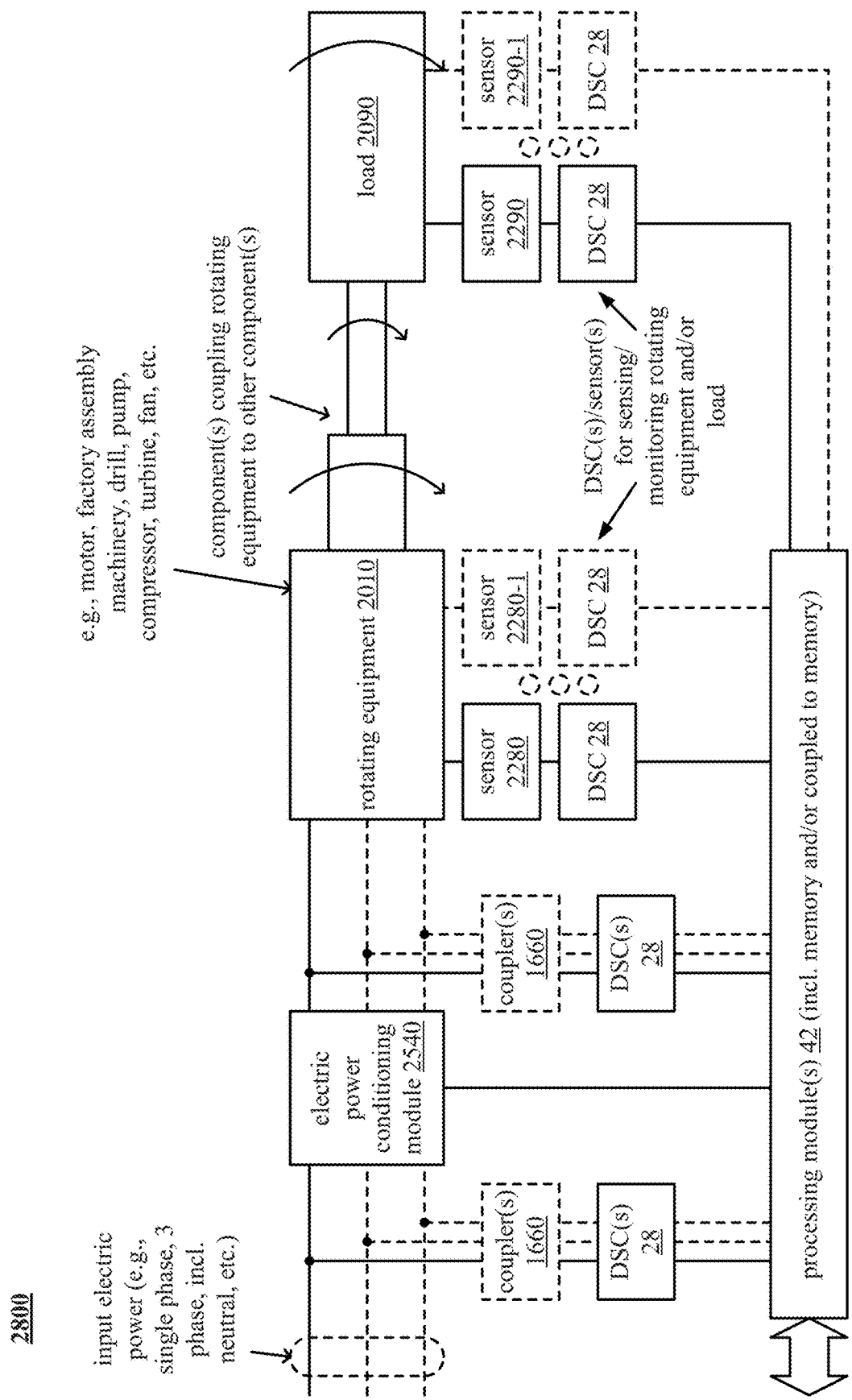
FIG. 28 is a schematic block diagram of an embodiment of DSC sensing in accordance with providing electric power signal conditioning for rotating equipment in accordance with the present invention.

FIG. 28 is a schematic block diagram of an embodiment 2800 of DSC sensing in accordance with providing electric power signal conditioning for rotating equipment in accordance with the present invention. This diagram as many similarities to the previous diagrams with at least one difference being that one or more sensors 2280 to 2280-1 are implemented to provide information regarding the rotating equipment 2010 to the one or more processing modules 42 and/or one or more sensors 2290 to 2290-1 are implemented to provide information regarding the load 2090 to the one or more processing modules 42.

In some examples, note that the respective one or more sensors 2280 to 2280-1 and/or the respective one or more sensors 2290 to 2290-1 are serviced using respective DSCs 28. In certain particular examples, the sensor 2280 is in communication with a DSC 28 that is in communication with the one or more processing modules 42. Similarly, in certain other examples, the sensor 2290 is in communication with the DSC that is in communication with the one or more processing modules 42. Generally speaking, one or more DSCs may be implemented to perform interaction with the one or more sensors and to provide information from the one or more sensors to the one or more processing modules 42 to be used thereby in accordance with adaptation of the operation of electric power conditioning module 2540. This diagram shows an example by which not only sensing of the one or more input electric power signals into the electric power conditioning module 2540 and/or sensing of the one or more motor drive signals output from the electric power conditioning module 2540 is made, and that information provided from one or more sensors 2280 to 2280-1 and/or the one or more sensors 2290 to 2290-1 is also provided to the one or more processing modules 42 to be used as desired in accordance with adapting operation of the electric power conditioning module 2540.

Figure 29:
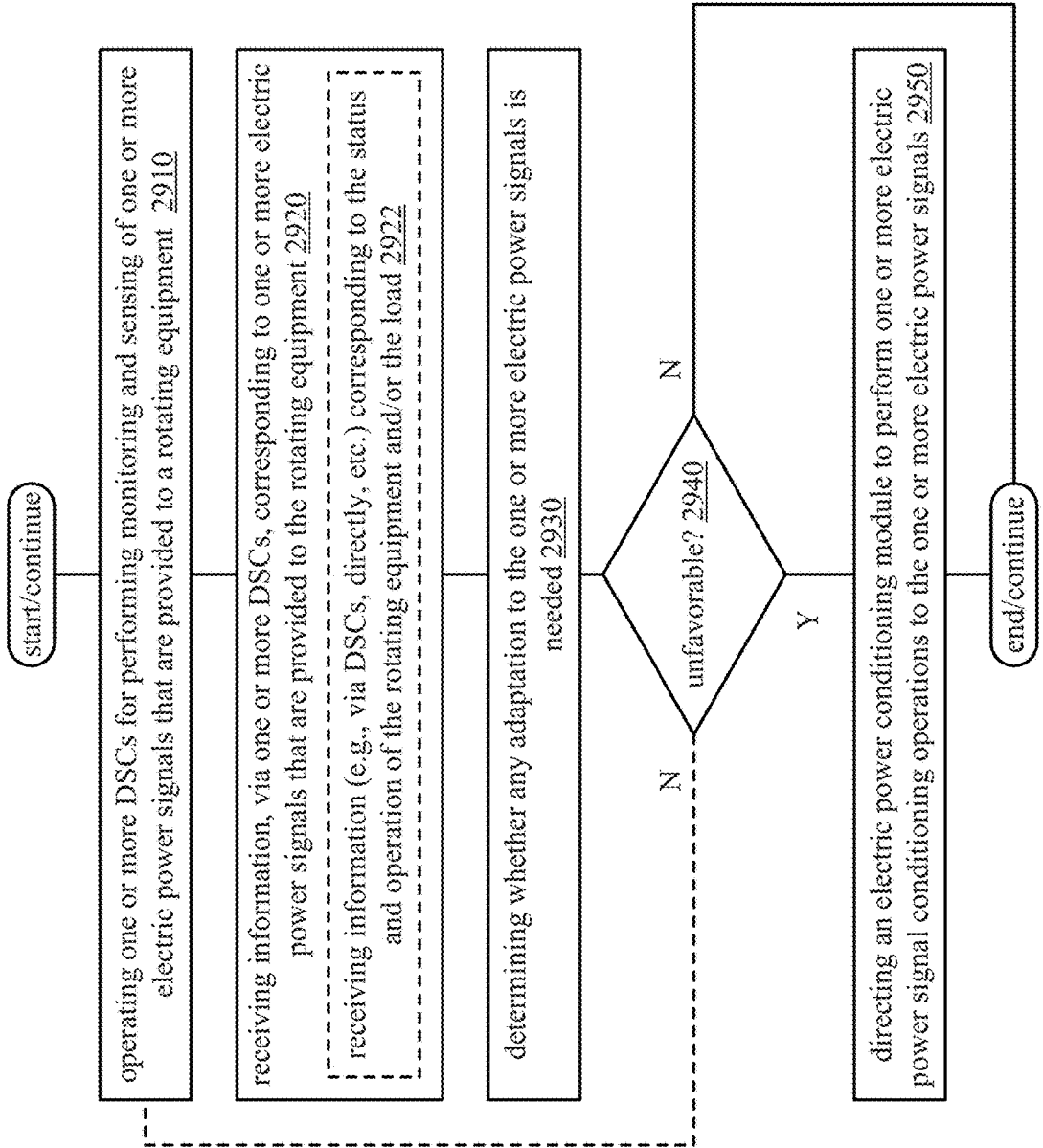
FIG. 29 is a schematic block diagram of another embodiment of a method for execution by one or more devices in accordance with the present invention.

FIG. 29 is a schematic block diagram of another embodiment of a method 2900 for execution by one or more devices in accordance with the present invention. The method 2900 operates by operating one or more DSCs for performing monitoring and sensing of one or more electric power signals that are provided to a rotating equipment in step 2910.

The method 2900 continues by operating one or more processing modules for receiving information, via one or more DSCs, corresponding to one or more electric power signals that are provided to the rotating equipment in step 2920. For example, in a 3-phase electric power signal implementation, three respective DSCs are implemented to provide information corresponding to the three respective electric power signals that are provided to the rotating equipment.

Also, in some examples, one or more sensors, which may be serviced by one or more DSCs, are implemented to provide information regarding the status and operation of the rotating equipment itself and/or a load that is being serviced by the rotating equipment. Examples of such sensors implemented to provide information of the rotating equipment may include one or more of Hall effect sensors, optical speed sensors, temperature sensors, accelerometers such as may be implemented to monitor and detect for vibrations, etc. Similarly, such types of sensors may also be implemented to provide information regarding the load. In addition, based on the particular type of load, appropriately tailored sensors may be implemented (e.g., rate of flow sensors for a pump application, pressure sensors for a compressor application, etc.). In such examples in which one or more sensors are implemented to provide information regarding the status and operation of the rotating equipment itself and/or a load, the method 2900 also operates in step 2922 by operating one or more processing modules for receiving information (e.g., via DSCs in some examples, directly from the sensors and other examples, etc.) corresponding to the status and operation of the rotating equipment and/or the load.

The method 2900 continues in step 2930 by operating one or more processing modules to process the information for determining whether any adaptation to the one or more electric power signals is needed. Based on an unfavorable comparison of the one or more electric power signals (and/or the status and operation of the rotating equipment and/or the load) to one or more operational criteria in step 2940, the one or more processing modules operates by directing an electric power conditioning module to perform one or more electric power signal conditioning operations to the one or more electric power signals in step 2950. Some examples of unfavorable comparison of the one or more electric power signals to one or more operational criteria may include any one or more of the one or more electric power signals being of improper magnitude, improper phase, including an unacceptable amount of noise, interference, undesired harmonics, glitches, etc.

Some examples of unfavorable comparison of the status and operation of the rotating equipment and/or load may include any one or more of overtemperature (e.g., temperature of the rotating equipment and/or load being above a prescribed or recommended upper temperature), under temperature (e.g., temperature of the rotating equipment and/or load being below a prescribed or recommended lower temperature), overspeed (e.g., the rotating equipment and/or load operating at faster than a prescribed or recommended speed), under speed (e.g., the rotating equipment and/or load operating at slower than a prescribed or recommended speed), slip of the rotating equipment (e.g., in a motoring application) being outside of a prescribed or recommended range, etc.

Some examples of modification of the one or more input electric power signals may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

In some examples, the information regarding the electric power signals is received by the one or more processing modules via one or more couplers that perform one or more of scaling, division, electrical isolation, etc. and/or some other processing of the one or more electric power signals to generate one or more other signals representative of the one or more electric power signals and these one or more other signals are provided and sensed by the one or more DSCs. Note also that the information that is received by the one or more processing modules may be received from sensing of the one or more electric power signals before and/or after the electric power conditioning module. Examples of such one or more electric power signal conditioning operations may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

Alternatively, based on a favorable comparison of the one or more electric power signals (and/or the status and operation of the rotating equipment and/or the load) to one or more operational criteria in step 2940, the method 2900 ends or continues such as by looping back and performing the operational step 2910 and continuing to perform the method 2900.

Figure 30:
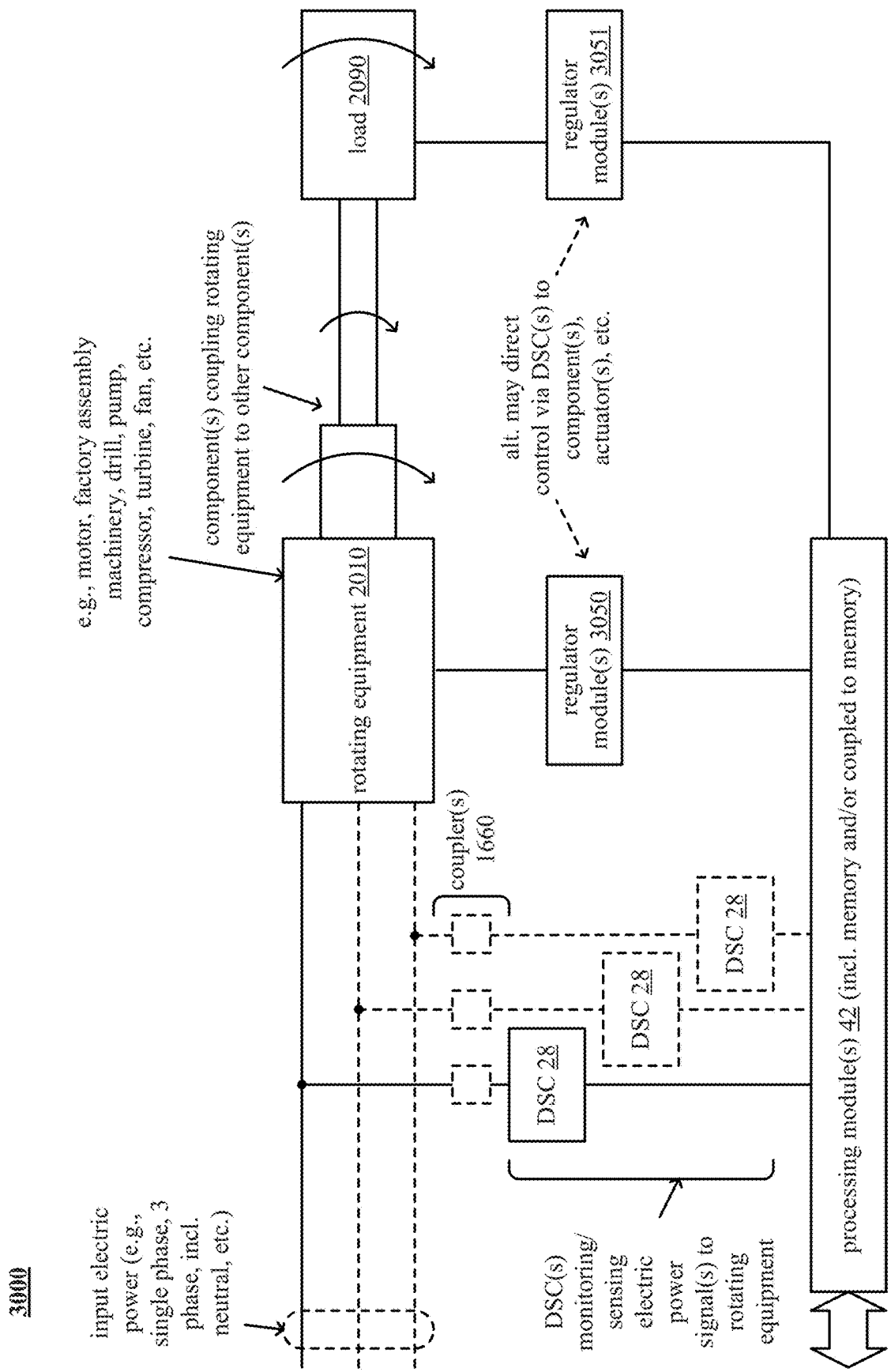
FIG. 30 is a schematic block diagram of an embodiment of DSC sensing in accordance with rotating equipment regulation in accordance with the present invention.

FIG. 30 is a schematic block diagram of an embodiment 3000 of DSC sensing in accordance with rotating equipment regulation in accordance with the present invention. This diagram has some similarities to certain of the previous diagrams. For example, in this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. In addition, the rotating equipment 2010 is connected to a load 2090 directly or via one or more components coupling the rotating equipment to the load 2090.

Also, in this diagram, a first one or more regulator modules 3050 is in communication with the one or more processing modules 42 and is configured to adapt and direct operation of the rotating equipment 2010. Similarly, a second one or more regulator modules 3051 is in communication with the one or more processing modules 42 and is configured to adapt and direct operation of the load 2090.

Generally speaking the one or more regulator modules 3050 is configured to control operation of the rotating equipment 2010 and/or one or more associated components, and the one or more regulator modules 3051 is configured to control operation of the load 2090 and/or one or more associated components. Considering the rotating equipment 2010, the rotational speed of the rotor of the rotating equipment 2010 may be adapted or adjusted by the one or more processing modules 42 via the one or more regulator modules 3050. In an example in which the rotating equipment 2010 is a motor, a drill, etc., the one or more processing modules 42, via the one or more regulator modules 3050, is configured to adjust the speed of the motor. An example in which the rotating equipment 2010 is a compressor, the one or more processing modules 42, via the one or more regulator modules 3050, is configured to adjust the pressure by which the compressor operates on a particular element (e.g., air, liquid, a container or vessel holding some element, etc.). In an example in which the rotating equipment 2010 is a pump, the one or more processing modules 42, be the one or more regulator modules 3050, is configured to adjust the rate by which the pump is operating, the pressure by which it is operating, etc.

In addition, one or more components may be associated with the rotating equipment 2010. For example, the rotating equipment 1810 may include or have associated one or more vents, air flow mechanisms such as one or more cooling fans, environmental heating and/or cooling such as associated with an enclosed cover within which the rotating equipment 2010 is located. The one or more processing modules 42, via the one or more regulator modules 3050 is configured to direct operation of any such associated components. For example, based on information provided via the sensing performed by the one or more DSCs 28, the one or more processing modules 42 is configured to control or adjust, via the one or more regulator modules 3050, the operation of any such components associated with the rotating equipment 2010. In one example, the one or more processing modules 42 is configured, via the one or more regulator modules 3050, provide more or less airflow such as by opening or closing one or more vents and/or adjusting operation of one or more cooling fans. In another example, the one or more processing modules 42 is configured, via the one or more regulator modules 3050, adjust the temperature within an enclosure in which the rotating equipment 2010 is located such as by controlling the heating venting air conditioning (HVAC) of the inside of the enclosure as is appropriate.

Similarly, the one or more processing modules 42 is configured, via the other one or more regulator modules 3051, to control operation of the load 2090 and/or one or more associated components. Considering an example in which the load 2090 is a variable or selectable load, the one or more processing modules 42 is configured, via the via the other one or more regulator modules 3051, to adapt the amount of the load 2090 that is being serviced by the rotating equipment 2010. This may involve switching in additional load to increase the load 2090 or switching out load to reduce the load 2090.

In an example in which the load is an element (e.g., a drivetrain, a conveyor belt, etc.) and the rotating equipment 2010 is a motor, the one or more processing modules 42, via the one or more regulator modules 3050, is configured to adjust the amount of load that is being serviced by the motor.

In an example in which load 2090 is an element (e.g., article of manufacture, material, etc.) that is being operated on by rotating equipment 2010 that is a drill, the one or more processing modules 42, via the one or more regulator modules 3050, is configured to adjust any one or more operational parameters such as speed of the drill, the torque of the drill, the proximity of the end of a drill bit of the drill to the element on which it is operating (e.g., thereby controlling the force, the pressure, the back-pressure, etc. by which the drill bit interacts with the element it is drilling), etc.

In addition, with respect to power factor considerations including those described above, the one or more the one or more processing modules 42 is configured, via the one or more regulator modules 3050, to control operation of the rotating equipment 2010 and/or one or more components associated therewith as well as, via the one or more regulator modules 3051 including to effectuate power factor correction and adjustment such as by switching in or out components having capacitive and/or inductive characteristics that operate to compensate for and/or cancel the capacitive and/or inductive characteristics of the rotating equipment 2010 and/or the load 2090. For example, the one or more processing modules 42 is configured to effectuate power factor modification and/or correction (e.g., such as by bringing the power factor closer to 1). For example, one or more elements having capacitive characteristics may be switched in to compensate for inductive effects of the rotating equipment 2010 and/or the load 2090. In some instances, the rotating equipment 2010 and/or the load 2090 includes such capability internally, such as one or more elements included therein (e.g., within the rotating equipment 2010 and/or the load 2090) having such characteristics that can be switched in or out via the one or more regulator modules 3050 and/or the one or more regulator modules 3051. Alternatively, such one or more elements may be implemented in an external component and appropriately switched in or out (e.g., via the one or more regulator modules 3050 and/or the one or more regulator modules 3051) to effectuate power factor correction.

Generally speaking, the one or more processing modules 42 is configured, via the one or more regulator modules 3051, to control operation of the rotating equipment 2010 and/or one or more components associated therewith as well as, via the one or more regulator modules 3051, to control operation of the load 2090 and/or one or more components associated therewith. In this diagram, the one or more processing modules 42 is configured to effectuate such control based on information received via the one or more DSCs 28 that are configured to sense the one or more input electric power signals that are being provided to the rotating equipment 2010. In addition, in some examples, note that the one or more regulator modules 3050 and/or the one or more regulator modules 3051 are configured to effectuate control of one or more components of the rotating equipment 2010 and the load 2090 directly, via one or more DSCs that are configured to facilitate the operation of those one or more components, etc. That is to say, communication with control of, and interaction with any one of the components and/or associated components of the rotating equipment 2010 and/or load 2090 may be facilitated via an appropriately implemented DSC that interacts with the component. In such instances and in certain examples, note that the one or more regulator modules 3050 and/or the one or more regulator modules 3051 may be configured not only to direct control of the one or more components, but also to sense information via the respective one or more control signal lines provided to the one or more components. The drive-sense functionality of a DSC 28 as described herein is configured not only to drive a signal via a signal line to facilitate operation of a component but also to sense information regarding operation of the component via the signal line.

Figure 31:
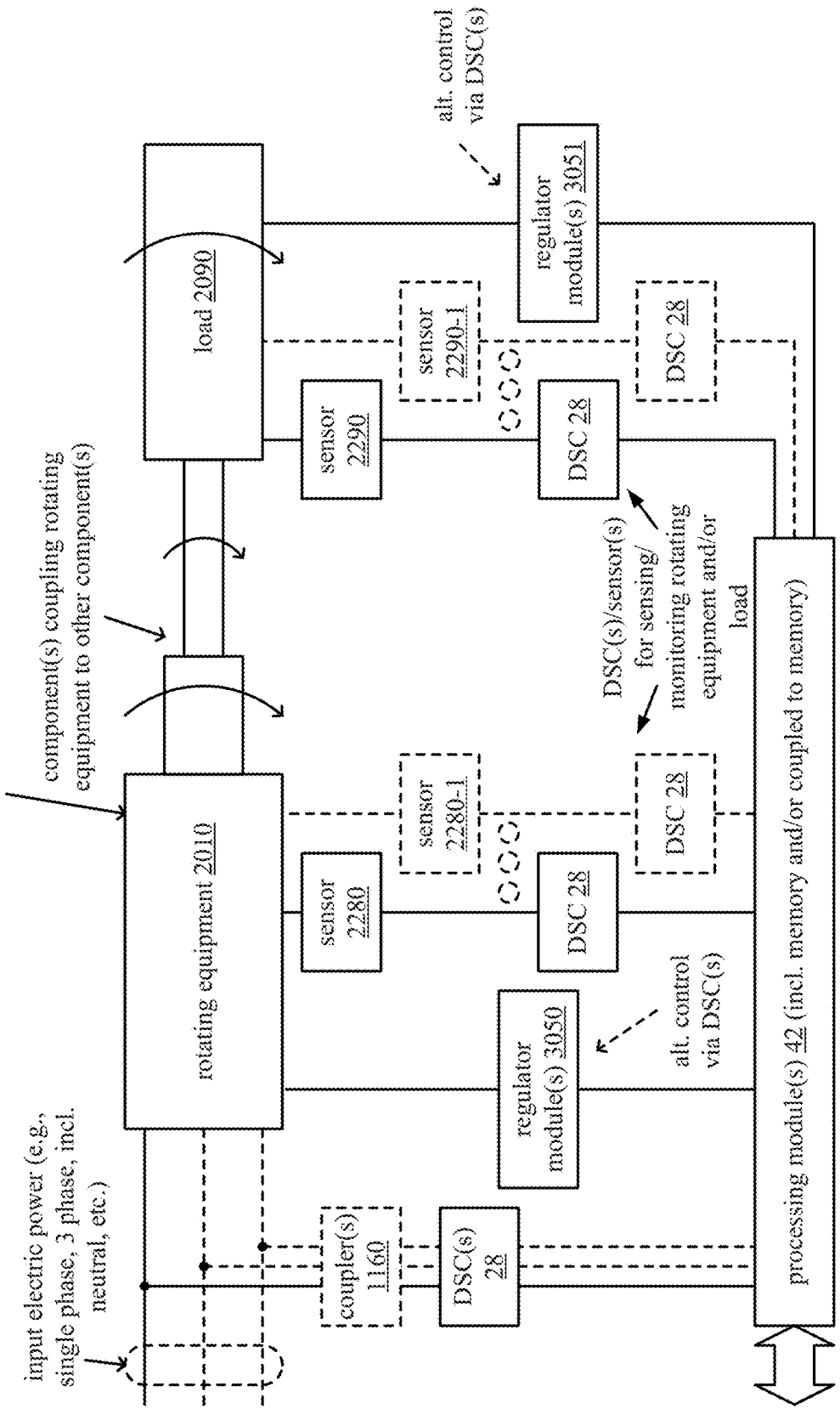
FIG. 31 is a schematic block diagram of another embodiment of DSC sensing in accordance with rotating equipment regulation in accordance with the present invention.

FIG. 31 is a schematic block diagram of another embodiment 3100 of DSC sensing in accordance with rotating equipment regulation in accordance with the present invention. This diagram as many similarities to the previous diagrams with at least one difference being that one or more sensors 2280 to 2280-1 are implemented to provide information regarding the rotating equipment 2010 to the one or more processing modules 42 and/or one or more sensors 2290 to 2290-1 are implemented to provide information regarding the load 2090 to the one or more processing modules 42.

In some examples, note that the respective one or more sensors 2280 to 2280-1 and/or the respective one or more sensors 2290 to 2290-1 are serviced using respective DSCs 28. In certain particular examples, the sensor 2280 is in communication with a DSC 28 that is in communication with the one or more processing modules 42. Similarly, in certain other examples, the sensor 2290 is in communication with the DSC that is in communication with the one or more processing modules 42.

In such an implementation, the one or more processing modules 42 is configured also to consider information provided via the one or more sensors 2280 to 2280-1 that are implemented to provide information regarding the rotating equipment 2010 and/or the respective one or more sensors 2290 to 2290-1 that are implemented to provide information regarding the load 2090.

Figure 32:
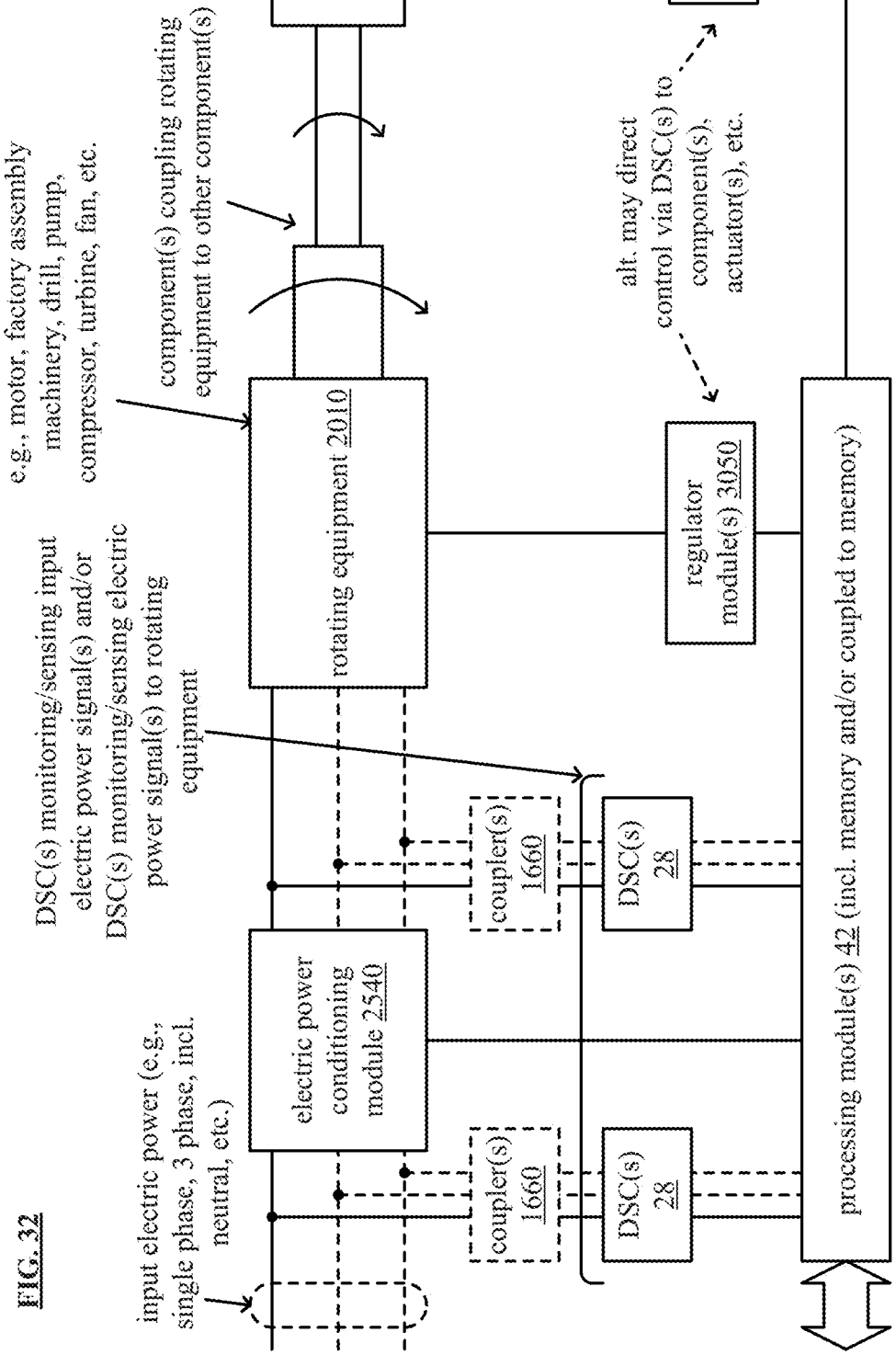
FIG. 32 is a schematic block diagram of another embodiment of DSC sensing in accordance with rotating equipment regulation in accordance with the present invention.

FIG. 32 is a schematic block diagram of another embodiment 3200 of DSC sensing in accordance with rotating equipment regulation in accordance with the present invention. This diagram as many similarities to certain of the previous diagrams (e.g., including electric power conditioning module 2540, one or more DSCs 28 implemented to perform sensing of signals being provided to or output from the electric power conditioning module 2540, etc.) including that an electric power conditioning module 2540 is implemented to process the one or more input electric power signals to generate one or more motor drive signals that are provided to the rotating equipment 2010. In addition, as desired in certain examples, the first one or more DSCs 28 (optionally connected via one or more couplers 1660) is configured to monitor and sense the one or more input electric power signals that are provided to the electric power conditioning module 2540 and/or a second one or more DSCs 28 (optionally connected via one or more couplers 1660) is configured to monitor and sense the one or more motor drive signals output from the electric power conditioning module 2540 and provided to the rotating equipment 2010.

This diagram shows an example by which sensing of the one or more input electric power signals into the electric power conditioning module 2540 and/or sensing of the one or more motor drive signals output from the electric power conditioning module 2540 may be made to generate information of the signals being provided to and from the electric power conditioning module 2540, and that information is provided to the one or more processing modules 42 to be used as desired in accordance with adapting operation of any one or more of the electric power conditioning module 2540, the one or more regulator modules 3050, and/or the one or more regulator modules 3051 to effectuate control of any one or more of the components within the system.

Figure 33:
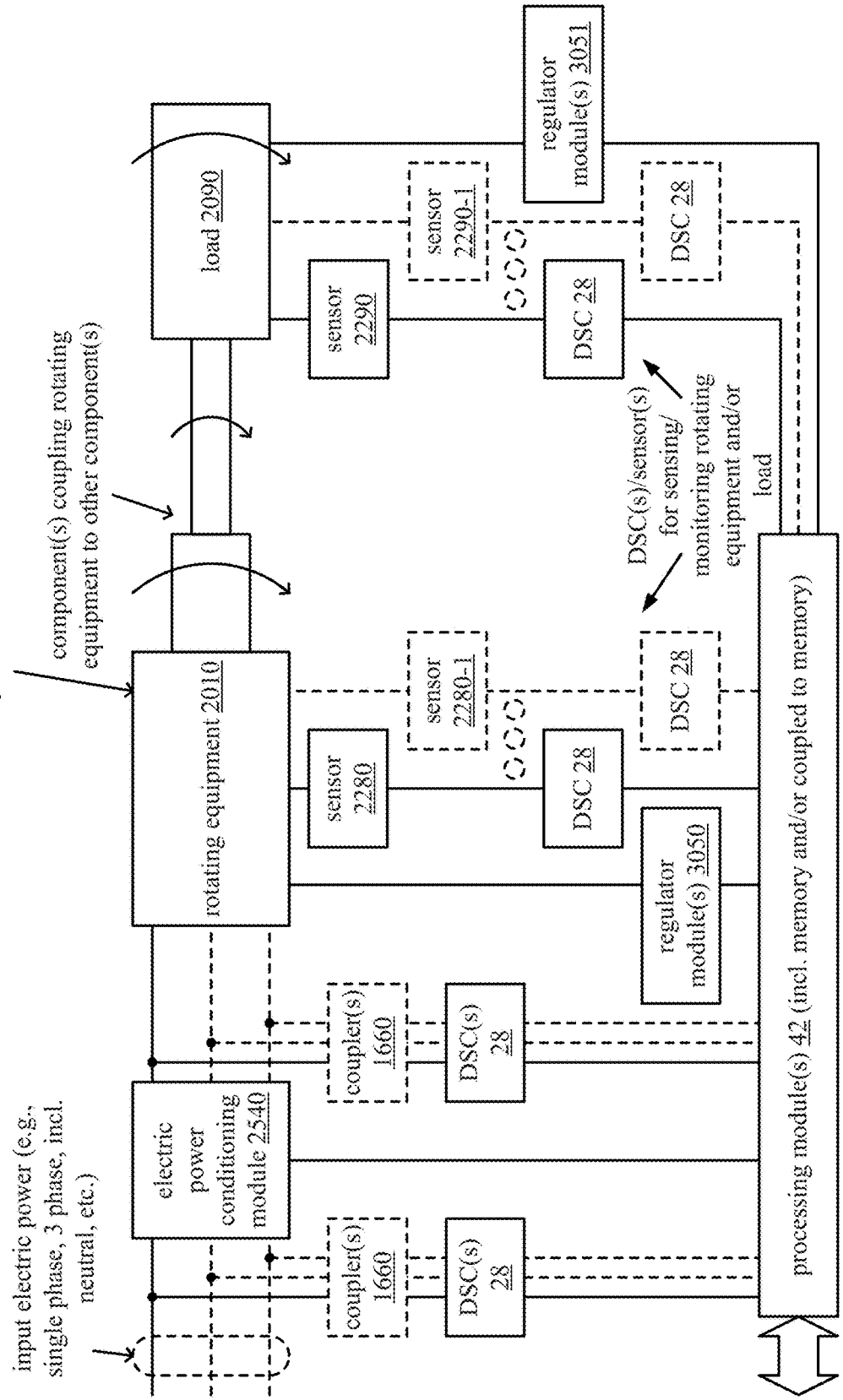
FIG. 33 is a schematic block diagram of another embodiment of DSC sensing in accordance with rotating equipment regulation in accordance with the present invention.

FIG. 33 is a schematic block diagram of another embodiment 3300 of DSC sensing in accordance with rotating equipment regulation in accordance with the present invention. This diagram as many similarities to the previous diagram with at least one difference being that one or more sensors 2280 to 2280-1 are also implemented to provide information regarding the rotating equipment 2010 to the one or more processing modules 42 and/or one or more sensors 2290 to 2290-1 are implemented to provide information regarding the load 2090 to the one or more processing modules 42. The one or more processing modules 42 is configured to receive information from the first one or more DSCs 28 that are configured to sense and monitor the one or more input electric power signals being provided to the electric power conditioning module 2540, the one or more motor drive signals output from the electric power conditioning module 2540, information provided via the one or more sensors 2280 to 2280-1 that are implemented to provide information regarding the rotating equipment 2010, and/or information provided via the one or more sensors 2290 to 2290-1 that are implemented to provide information regarding the load 2090 to effectuate control of any one or more of the components within the system.

Figure 34:
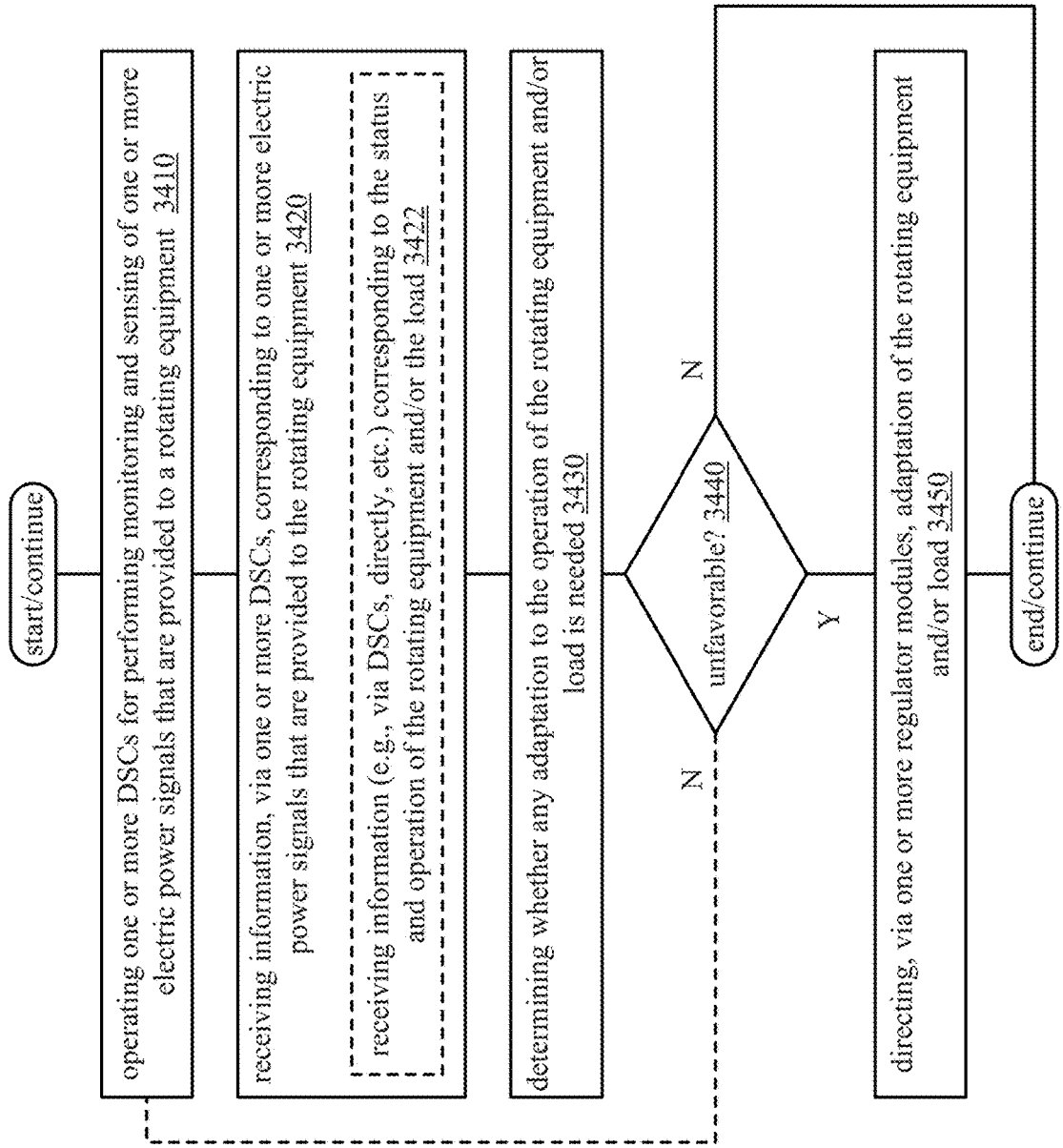
FIG. 34 is a schematic block diagram of another embodiment of a method for execution by one or more devices in accordance with the present invention.

FIG. 34 is a schematic block diagram of another embodiment of a method 3400 for execution by one or more devices in accordance with the present invention. The method 3400 operates by operating one or more DSCs for performing monitoring and sensing of one or more electric power signals that are provided to a rotating equipment in step 3410.

The method 3400 continues by operating one or more processing modules for receiving information, via one or more DSCs, corresponding to one or more electric power signals that are provided to the rotating equipment in step 3420. For example, in a 3-phase electric power signal implementation, three respective DSCs are implemented to provide information corresponding to the three respective electric power signals that are provided to the rotating equipment.

Also, in some examples, one or more sensors, which may be serviced by one or more DSCs, are implemented to provide information regarding the status and operation of the rotating equipment itself and/or a load that is being serviced by the rotating equipment. Examples of such sensors implemented to provide information of the rotating equipment may include one or more of Hall effect sensors, optical speed sensors, temperature sensors, accelerometers such as may be implemented to monitor and detect for vibrations, etc. Similarly, such types of sensors may also be implemented to provide information regarding the load. In addition, based on the particular type of load, appropriately tailored sensors may be implemented (e.g., rate of flow sensors for a pump application, pressure sensors for a compressor application, etc.). In such examples in which one or more sensors are implemented to provide information regarding the status and operation of the rotating equipment itself and/or a load, the method 3400 also operates in step 3422 by operating one or more processing modules for receiving information (e.g., via DSCs in some examples, directly from the sensors and other examples, etc.) corresponding to the status and operation of the rotating equipment and/or the load.

The method 3400 continues in step 3430 by operating one or more processing modules to process the information for determining whether any adaptation to the operation of the rotating equipment and/or load is needed. Based on an unfavorable comparison of the one or more electric power signals (and/or the status and operation of the rotating equipment and/or the load) to one or more operational criteria in step 3440, the one or more processing modules operates by directing, via one or more regulator modules, adaptation of the rotating equipment and/or load in step 3450. Some examples of unfavorable comparison of the one or more electric power signals to one or more operational criteria may include any one or more of the one or more electric power signals being of improper magnitude, improper phase, including an unacceptable amount of noise, interference, undesired harmonics, glitches, etc.

Some examples of modification of the one or more input electric power signals may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

Some examples of unfavorable comparison of the status and operation of the rotating equipment and/or load may include any one or more of overtemperature (e.g., temperature of the rotating equipment and/or load being above a prescribed or recommended upper temperature), under temperature (e.g., temperature of the rotating equipment and/or load being below a prescribed or recommended lower temperature), overspeed (e.g., the rotating equipment and/or load operating at faster than a prescribed or recommended speed), under speed (e.g., the rotating equipment and/or load operating at slower than a prescribed or recommended speed), slip of the rotating equipment (e.g., in a motoring application) being outside of a prescribed or recommended range, etc.

Some examples of directing adaptation (e.g., from the one or more processing modules via the one or more regulator modules) of the rotating equipment and/or load may include any one or more of adjusting the rotational speed of the rotor of the rotating equipment such as when the rotating equipment is a motor, a drill, etc., adjust the pressure by which the rotating equipment in a compressor example operates on a particular element (e.g., air, liquid, a container or vessel holding some element, etc.), adjusting the rate by which the rotating equipment in a pump example the pump is operating, etc. Some other examples of directing adaptation (e.g., from the one or more processing modules via the one or more regulator modules) of the rotating equipment and/or load may include any one or more of adjusting venting, air flow mechanisms such as one or more cooling fans, environmental heating and/or cooling such as associated with one or more enclosed covers within which the rotating equipment and/or load is/are located, controlling or adjusting the operation of any such components associated with the rotating equipment and/or load, providing more or less airflow such as by opening or closing one or more vents and/or adjusting operation of one or more cooling fans associated with the rotating equipment and/or load, adjusting the temperature within one or more enclosures in which the rotating equipment and/or load is located such as by controlling the heating venting air conditioning (HVAC) of the inside of the enclosures as is appropriate.

In some examples, the information regarding the electric power signals is received by the one or more processing modules via one or more couplers that perform one or more of scaling, division, electrical isolation, etc. and/or some other processing of the one or more electric power signals to generate one or more other signals representative of the one or more electric power signals and these one or more other signals are provided and sensed by the one or more DSCs. Note also that the information that is received by the one or more processing modules may be received from sensing of the one or more electric power signals before and/or after the electric power conditioning module. Examples of such one or more electric power signal conditioning operations may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

Alternatively, based on a favorable comparison of the one or more electric power signals (and/or the status and operation of the rotating equipment and/or the load) to one or more operational criteria in step 3440, the method 3400 ends or continues such as by looping back and performing the operational step 3410 and continuing to perform the method 3400.

FIG. 35 is a schematic block diagram of another embodiment of a method 3500 for execution by one or more devices in accordance with the present invention. The method 3500 operates by operating one or more DSCs for performing monitoring and sensing of one or more electric power signals that are provided to a rotating equipment in step 3510.

The method 3500 continues by operating one or more processing modules for receiving information, via one or more DSCs, corresponding to one or more electric power signals that are provided to the rotating equipment in step 3520. For example, in a 3-phase electric power signal implementation, three respective DSCs are implemented to provide information corresponding to the three respective electric power signals that are provided to the rotating equipment.

Also, in some examples, one or more sensors, which may be serviced by one or more DSCs, are implemented to provide information regarding the status and operation of the rotating equipment itself and/or a load that is being serviced by the rotating equipment. Examples of such sensors implemented to provide information of the rotating equipment may include one or more of Hall effect sensors, optical speed sensors, temperature sensors, accelerometers such as may be implemented to monitor and detect for vibrations, etc. Similarly, such types of sensors may also be implemented to provide information regarding the load. In addition, based on the particular type of load, appropriately tailored sensors may be implemented (e.g., rate of flow sensors for a pump application, pressure sensors for a compressor application, etc.). In such examples in which one or more sensors are implemented to provide information regarding the status and operation of the rotating equipment itself and/or a load, the method 3500 also operates in step 3522 by operating one or more processing modules for receiving information (e.g., via DSCs in some examples, directly from the sensors and other examples, etc.) corresponding to the status and operation of the rotating equipment and/or the load.

The method 3500 continues in step 3530 by operating one or more processing modules to process the information for determining whether any adaptation to the operation of the rotating equipment and/or load is needed. Based on an unfavorable comparison of the one or more electric power signals (and/or the status and operation of the rotating equipment and/or the load) to one or more operational criteria in step 3540, the one or more processing modules operates by directing, via one or more regulator modules, adaptation of the rotating equipment and/or load in step 3550. Some examples of unfavorable comparison of the one or more electric power signals to one or more operational criteria may include any one or more of the one or more electric power signals being of improper magnitude, improper phase, including an unacceptable amount of noise, interference, undesired harmonics, glitches, etc. Some examples of unfavorable comparison of the status and operation of the rotating equipment and/or load may include any one or more of overtemperature (e.g., temperature of the rotating equipment and/or load being above a prescribed or recommended upper temperature), under temperature (e.g., temperature of the rotating equipment and/or load being below a prescribed or recommended lower temperature), overspeed (e.g., the rotating equipment and/or load operating at faster than a prescribed or recommended speed), under speed (e.g., the rotating equipment and/or load operating at slower than a prescribed or recommended speed), slip of the rotating equipment (e.g., in a motoring application) being outside of a prescribed or recommended range, etc.

Some examples of directing adaptation (e.g., from the one or more processing modules via the one or more regulator modules) of the rotating equipment and/or load may include any one or more of adjusting the rotational speed of the rotor of the rotating equipment such as when the rotating equipment is a motor, a drill, etc., adjust the pressure by which the rotating equipment in a compressor example operates on a particular element (e.g., air, liquid, a container or vessel holding some element, etc.), adjusting the rate by which the rotating equipment in a pump example the pump is operating, etc. Some other examples of directing adaptation (e.g., from the one or more processing modules via the one or more regulator modules) of the rotating equipment and/or load may include any one or more of adjusting venting, air flow mechanisms such as one or more cooling fans, environmental heating and/or cooling such as associated with one or more enclosed covers within which the rotating equipment and/or load is/are located, controlling or adjusting the operation of any such components associated with the rotating equipment and/or load, providing more or less airflow such as by opening or closing one or more vents and/or adjusting operation of one or more cooling fans associated with the rotating equipment and/or load, adjusting the temperature within one or more enclosures in which the rotating equipment and/or load is located such as by controlling the heating venting air conditioning (HVAC) of the inside of the enclosures as is appropriate.

In some examples, the information regarding the electric power signals is received by the one or more processing modules via one or more couplers that perform one or more of scaling, division, electrical isolation, etc. and/or some other processing of the one or more electric power signals to generate one or more other signals representative of the one or more electric power signals and these one or more other signals are provided and sensed by the one or more DSCs. Note also that the information that is received by the one or more processing modules may be received from sensing of the one or more electric power signals before and/or after the electric power conditioning module. Examples of such one or more electric power signal conditioning operations may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

Alternatively, based on a favorable comparison of the one or more electric power signals (and/or the status and operation of the rotating equipment and/or the load) to one or more operational criteria in step 3540, the method 3500 ends or continues such as by looping back and performing the operational step 3510 and continuing to perform the method 3500.

After performing step 3530, the method 3500 continues in step 3560 by operating one or more processing modules to process the information for determining whether any adaptation to the one or more electric power signals is needed. Based on an unfavorable comparison of the one or more electric power signals (and/or the status and operation of the rotating equipment and/or the load) to one or more operational criteria in step 3570, the one or more processing modules operates by directing an electric power conditioning module to perform one or more electric power signal conditioning operations to the one or more electric power signals in step 3580.

Alternatively, based on a favorable comparison of the one or more electric power signals (and/or the status and operation of the rotating equipment and/or the load) to one or more operational criteria in step 3540, the method 3500 ends or continues such as by looping back and performing the operational step 3510 and continuing to perform the method 3500.

FIG. 36A is a schematic block diagram of an embodiment 3601 of DSC sensing in accordance with motor control feedback and adaptation in accordance with the present invention. In this diagram, one or more processing modules 42 is in communication with a motor controller 3650 that is configured to provide a motor drive signal to a motor 1540. The motor controller 3650 is configured to receive a drive signal, such as the digital drive signal from the one or more processing modules 42, and to convert the drive signal to a high current motor drive signal (or to generate a motor drive signal based on the drive signal provided from the one or more processing modules 42) to direct and control operation of the motor 1540. In some instances, the motor drive signal is a high current motor drive signal. In some examples, the motor controller 3650 may be implemented as a high current motor controller.

Also, in this diagram, one or more processing modules 42 is configured to communicate with and interact with one or more drive-sense circuits (DSCs), shown in the diagram as DSC 28. The one or more DSCs 28 is configured to perform sensing of the motor drive signal provided from the motor controller 3650 to the motor 1540. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

The motor controller 3650 may be viewed as one or more control electronics and/or regulated power supplies. Note also that the motor controller 3650 may be implemented to include the motor driver in some embodiments. Generally speaking, a motor driver is implemented to output and provide the sometimes high currents required within the one or more motor drive signals to the selected operation of the motor 1540 and also to deliver the adequate power to drive the motor 1540. Often times a motor driver operates using larger circuitry (e.g., a larger integrated circuit and typically within a low-power or low current application motor controller) that is capable of operating at higher currents and voltages than is often used within integrated circuitry (e.g., such as voltages that are higher than 5 V DC, 3.3 V DC power supplies as may be implemented within integrated circuitry).

In some examples, multiple different circuitries and functionality are included within the motor controller 3650. In some examples, the one or more processing modules 42 is configured to provide one or more digital drive signals to the motor controller 3650, and the motor controller 3650 converts those one or more digital drive signals to one or more motor drive signals to be provided to facilitate operation of the motor 1540. In some instances, the motor controller 3650 is configured to generate the one or more motor drive signals based on the one or more digital drive signals provided from the one or more processing modules 42.

Generally speaking, a motor controller 3650 is the device that provides the interfacing between the one or more processing modules 42 (e.g., sometimes implemented as a microcontroller, microprocessor, etc.) and the motor 1540 and/or one or more actuators associated with the motor. In certain applications, the one or more processing modules 42 is implemented to provide relatively low power and low current signals (e.g., such as signals less than 1 amp, in the range of 100s of milli-amps, etc.) whereas various types of motors 1540 may require very large currents (e.g., several amps, 10s of amps, or even higher amperage signals for operation). In some instances, the motor controller 3650 includes one or more mechanisms to facilitate the starting of the motor 1540, the stopping of the motor 1540, selection and operation of the direction of rotation of the rotor of the motor 1540, selection and operation of the rotating mechanical speed of the rotor of the motor 1540, selection and operation of the torque being delivered by the motor 1540, etc.

In certain implementations, the communication from the one or more processing modules 42 to the motor controller 3650 is effectuated via digital communication. In other implementations, communication and interactivity between the one or more processing modules and the motor controller 3650 is effectuated using analog signaling or alternatively a combination of analog and digital signaling. Regardless of the particular implementation by which communication is implemented between the one or more processing modules 42 and the motor controller 3650, one or more DSCs 28 is implemented to perform sensing and monitoring of the one or more motor drive signals provided from the motor controller 3650 to the motor 1540. The one or more processing modules 42 is configured to process information provided via the one or more DSCs 28 implemented to perform sensing and monitoring of the one or more motor drive signals to adapt and control operation of the motor controller 3650.

For example, the one or more DSCs 28 are implemented to sense the one or more motor drive signals provided from the motor controller 3650 to the motor 1540. The one or more DSCs 28 are configured to provide information to the one or more processing modules 42 to be used to determine the rotational speed of the rotor, the torque, the electromotive force (EMF), counter- or back-EMF, the rotor position, slip, etc. Based on any such information that is determined based on the sensing of the one or more motor drive signals provided from the motor controller 3650 the motor 1540, the one or more processing modules 42 may adapt operation of the motor controller 3650.

In some examples, the one or more processing modules 42 is also configured to adapt operation of the one or more DSCs 28 that are implemented to sense the one or more motor drive signals provided from the motor controller 3650 to the motor 1540 (e.g., such as by adjustment of any parameter of a reference signal provided to one of the one or more DSCs 28 such as signal frequency, signal type, amplitude, magnitude, phase, DC offset, etc.). In addition, in certain examples, the one or more processing modules 42 is also configured to modify the one or more motor drive signals provided from the motor controller 3650 to the motor 1540 via the one or more DSCs 28. The one or more processing modules 42 is configured to direct operation of the motor 1540 via the motor controller 3650. Considering an instance in which the motor controller 3650 is not providing the appropriate or adequate one or more motor drive signals to facilitate operation of the motor 1540 in accordance with the manner directed from the one or more processing modules 42, the one or more processing modules 42 is configured to modify the one or more motor drive signals being provided to the motor 1540, the one or more DSCs 28, to ensure proper operation of the motor 1540. For example, there may be instances in which the motor controller 3650 is failing or failing to operate within its prescribed parameters. In such cases, the one or more DSCs 28 is configured to assist the operation of the motor controller 3650, by the direction and control of the one or processing modules 42, to facilitate proper operation of the motor 1540 by appropriate modification of the one or more motor drive signals provided from the motor controller 3650 to the motor 1540. In certain applications, the one or more DSCs 28 is configured not only to provide monitoring and sensing information related to the one or more motor drive signals provided for the motor controller 3650 to the motor 1540, but also to serve as a means by which the one or more motor drive signals may be modified to facilitate proper operation of the motor 1540.

FIG. 36B is a schematic block diagram of another embodiment 3602 of DSC sensing in accordance with motor control feedback and adaptation in accordance with the present invention. This diagram has some similarities to the previous diagram with at least one difference being that one or more couplers 1660 is implemented to provide one or more signals to the one or more DSCs that are in communication with the one or more processing modules 42 based on connection to the one or more signal lines that connect to the motor controller 3650 to the motor 1540 via which the one or more motor drive signals are provided.

FIG. 37A is a schematic block diagram of another embodiment 3701 of DSC sensing in accordance with motor control feedback and adaptation in accordance with the present invention. This diagram the has some similarities to certain of the previous diagrams. In this diagram, one or more sensors 3780 is implemented to provide information regarding the status and operation of the motor 1540 and/or one or more other components associated there with. In addition, another one or more DSCs 28 is implemented to service the one or more sensors 3780. In certain examples, the number of DSCs 28 that service the number of sensors 3780 is on a one-to-one basis such that a respective DSC is implemented to service each respective sensor 3780. In other examples, more than one of the sensors 3780 is serviced by a singular DSC 28. In yet other examples, more than one DSC 28 is implemented to service a singular sensor 3780. Note that the different respective sensors 3780 may be of any variety in types as described herein providing information regarding the status and operation of the motor 1540 (e.g., operational speed, temperature such as motor temperature and/or environmental temperature, vibration, etc. and other information pertaining to status and operation of the motor 1540).

This other one or more DSCs 28 also provides information to the one or more processing modules 42. The one or more processing modules 42 is then configured to use both the information from the one or more DSCs 28 that provide information regarding the one or more motor drive signals that are provided from the motor controller 3650 to the motor 1540 and also information regarding the status and operation of the motor 1540. This diagram provides another example by which additional information may be used by the one or more processing modules 42 to adapt operation of one or more motor drive signals that are provided to the motor controller 3650 to facilitate proper operation of the motor 1540.

FIG. 37B is a schematic block diagram of another embodiment 3702 of DSC sensing in accordance with motor control feedback and adaptation in accordance with the present invention. This diagram has some similarities to the previous diagram. In this diagram, at least one the one or more DSCs 28 is implemented to perform sensing of the one or more motor drive signals provided from the motor controller 3650 to the motor 1540 via a connection provided from a coupler 1660 that receives a motor drive signal from the motor controller 3650 that is provided to the motor 1540 and provides a signal representative of that motor drive signal. As in other diagrams, note that the one or more DSCs 28 that are implemented to perform sensing of the one or more one or more motor drive signals are implemented to receive one or more signals via one or more couplers 1660 (e.g., by operating in accordance with any of the one or more characteristics of a coupler as described herein, their equivalents, etc. and as may be desired in various examples). In this particular diagram, the one or more couplers 1660 is implemented to provide one or more signals to the one or more DSCs 28 that is representative of the one or more motor drive signals that is provided from the motor controller 3650 to the motor 1540.

FIG. 38A is a schematic block diagram of another embodiment 3801 of DSC sensing in accordance with motor control feedback and adaptation in accordance with the present invention. This diagram has some similarities to certain of the previous diagrams with at least one difference being that a motor controller 3850 shown in this diagram includes one or more integrated processing modules. The motor controller 3850 receives and/or generates the one or more motor drive signals that are provided to the motor 1540 to facilitate operation thereof. The motor controller 3850, which includes one or more integrated processing modules, is in communication with one or more DSCs that are implemented to perform sensing of the one or more motor drive signals provided from the motor controller 3852 the motor 1540.

In this diagram, note that the motor controller 3850, which includes the one or more integrated processing modules, is coupled to the one or more DSCs 28 and is operable to provide control to and communication with the one or more DSCs 28. Note that motor controller 3850 may include integrated memory and/or be coupled to other memory. At least some of the memory stores operational instructions to be executed by the one or more processing modules of the motor controller 3850. In addition, note that the motor controller 3850 may interface with one or more other devices, components, elements, etc. via one or more communication links, networks, communication pathways, channels, etc.

In some examples, the motor controller 3850 receives one or more motor drive signals, which may be digital drive signals, and generates the one or more motor drive signals based thereon. In other examples, the motor controller 3850 itself generates the one or more motor drive signals and generates the one or more motor drive signals based thereon. In even other examples, the motor controller 3850 generates the one or more motor drive signals directly without first generating or receiving one or more (digital) drive signals.

FIG. 38B is a schematic block diagram of another embodiment 3802 of DSC sensing in accordance with motor control feedback and adaptation in accordance with the present invention. This diagram has some similarities to the previous diagram with at least one difference being that the one or more DSCs 28 that are implemented to perform sensing of the one or more motor drive signals are implemented to receive one or more signals via one or more couplers 1660 (e.g., by operating in accordance with any of the one or more characteristics of a coupler as described herein, their equivalents, etc. and as may be desired in various examples). In this particular diagram, the one or more couplers 1660 is implemented to provide one or more signals to the one or more DSCs 28 that is representative of the one or more motor drive signals that is provided from the motor controller 3850 to the motor 1540.

FIG. 39A is a schematic block diagram of another embodiment 3901 of DSC sensing in accordance with motor control feedback and adaptation in accordance with the present invention. This diagram has some similarities to certain of the previous diagrams. In this diagram, one or more sensors 3780 is implemented to provide information regarding the status and operation of the motor 1540 and/or one or more other components associated there with. In addition, another one or more DSCs 28 is implemented to service the one or more sensors 3780. In certain examples, the number of DSCs 28 that service the number of sensors 3780 is on a one-to-one basis such that a respective DSC is implemented to service each respective sensor 3780. In other examples, more than one of the sensors 3780 is serviced by a singular DSC 28. In yet other examples, more than one DSC 28 is implemented to service a singular sensor 3780. Note that the different respective sensors 3780 may be of any variety in types as described herein providing information regarding the status and operation of the motor 1540 (e.g., operational speed, temperature such as motor temperature and/or environmental temperature, vibration, etc. and other information pertaining to status and operation of the motor 1540).

This other one or more DSCs 28 also provides information to the motor controller 3850. The motor controller 3850 is then configured to use both the information from the one or more DSCs 28 that provide information regarding the one or more motor drive signals that are provided from the motor controller 3650 to the motor 1540 and also information regarding the status and operation of the motor 1540. This diagram provides another example by which additional information may be used by the motor controller 3850 to adapt operation of one or more motor drive signals that are provided to the motor controller 3650 to facilitate proper operation of the motor 1540.

FIG. 39B is a schematic block diagram of another embodiment 3902 of DSC sensing in accordance with motor control feedback and adaptation in accordance with the present invention. This diagram has some similarities to the previous diagram with at least one difference being that the one or more DSCs 28 that are implemented to perform sensing of the one or more motor drive signals is implemented to receive one or more signals via one or more couplers 1660 (e.g., by operating in accordance with any of the one or more characteristics of a coupler as described herein, their equivalents, etc. and as may be desired in various examples). In this particular diagram, the one or more couplers 1660 is implemented to provide one or more signals to the one or more DSCs 28 that is representative of the one or more motor drive signals that is provided from the motor controller 3850 to the motor 1540.

Figure 40A:
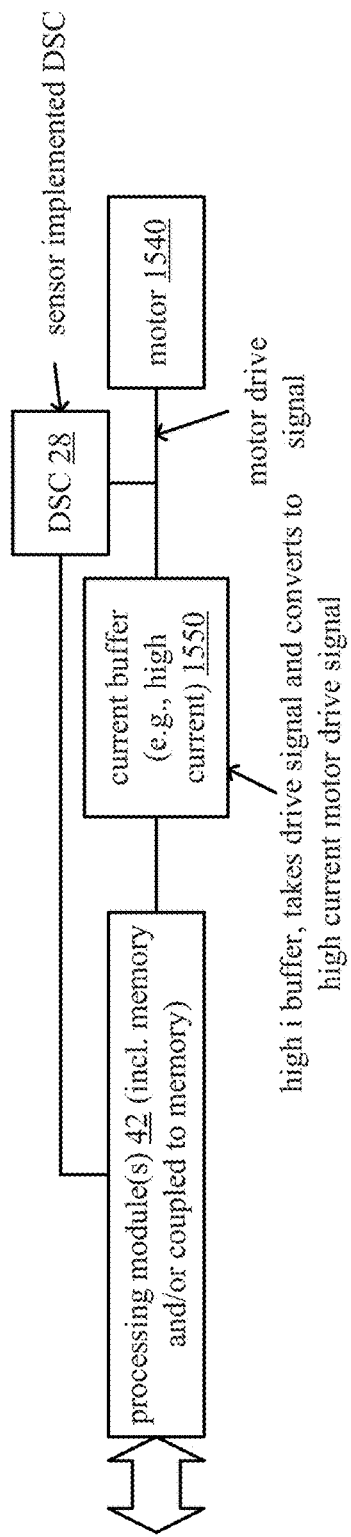
FIG. 40A is a schematic block diagram of another embodiment of DSC sensing in accordance with motor control feedback and adaptation in accordance with the present invention.

FIG. 40A is a schematic block diagram of another embodiment 4001 of DSC sensing in accordance with motor control feedback and adaptation in accordance with the present invention. In this diagram, one or more processing modules 42 is in communication with a current buffer 1550 that is configured to provide a motor drive signal to a motor 1540. The current buffer 1550 is configured to receive a drive signal, such as the digital drive signal from the one or more processing modules 42, and to convert the drive signal to a high current motor drive signal (or to generate a motor drive signal based on the drive signal provided from the one or more processing modules 42) to direct and control operation of the motor 1540. In some instances, the motor drive signal is a high current motor drive signal. In some examples, the current buffer 1550 may be implemented as a high current motor controller.

Also, in this diagram, one or more processing modules 42 is configured to communicate with and interact with one or more drive-sense circuits (DSCs), shown in the diagram as DSC 28. The one or more DSCs 28 is configured to perform sensing of the motor drive signal provided from the current buffer 1550 to the motor 1540. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

Based on direction, control, and communication from the one or more processing modules 42, the current buffer 1550 is configured to generate a motor drive signal that is provided to a motor 1540. This diagram shows an intervening element between the DSC 28 and the motor 1540. Specifically, the current buffer 1550, which may be implemented as a high current buffer in some examples, is configured to process the drive signal provided from the DSC 28 and to generate a motor drive signal having sufficient current as to drive the motor 1540.

In some examples, note that the current buffer 1550 is configured to provide a motor drive signal to a stator winding associated with the motor 1540. For example, the buffer 1550 is configured to provide a motor drive signal so as to energize and excite the stator winding associated with motor 1540 to induce rotation of the rotor of the motor 1540. Note that multiple instantiations of the configuration of a DSC 28 coupled to a current buffer 1550 that is configured to provide a motor drive signal to the motor 1540 may be made when the motor 1540 is a multiple phase motor. Considering an example in which the motor 1540 is a 3-phase motor, multiple instantiations of the configuration of this diagram may be implemented with respect to each of the different respective phases of the motor 1540. For example, in certain implementations, more than one current buffer 1550 is in communication with the one or more processing modules 42, and each of the respective current buffers 1550 is configured to provide a respective motor drive signal to a respective phase of the motor 1540. Note that as few as a single processing module may be implemented to provide control to and communicate with each of the different instantiations of current buffers 1550 configuration of this diagram that service the different respective phases of the motor 1540.

Figure 40B:
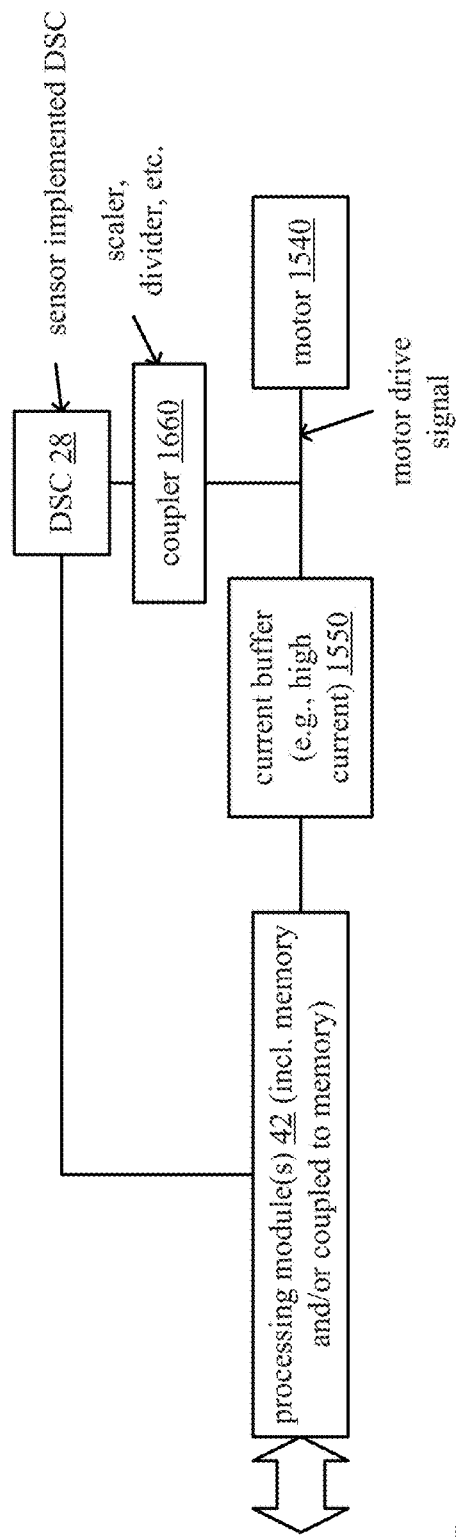
FIG. 40B is a schematic block diagram of another embodiment of DSC sensing in accordance with motor control feedback and adaptation in accordance with the present invention.

FIG. 40B is a schematic block diagram of another embodiment 4002 of DSC sensing in accordance with motor control feedback and adaptation in accordance with the present invention. This diagram has some similarities to the previous diagram with at least one difference being that the one or more DSCs 28 that are implemented to perform sensing of the one or more motor drive signals are implemented to receive one or more signals via one or more couplers 1660 (e.g., by operating in accordance with any of the one or more characteristics of a coupler as described herein, their equivalents, etc. and as may be desired in various examples). In this particular diagram, the one or more couplers 1660 is implemented to provide one or more signals to the one or more DSCs 28 that is representative of the one or more motor drive signals that is provided from the current buffer 1550 to the motor 1540.

Figure 41A:
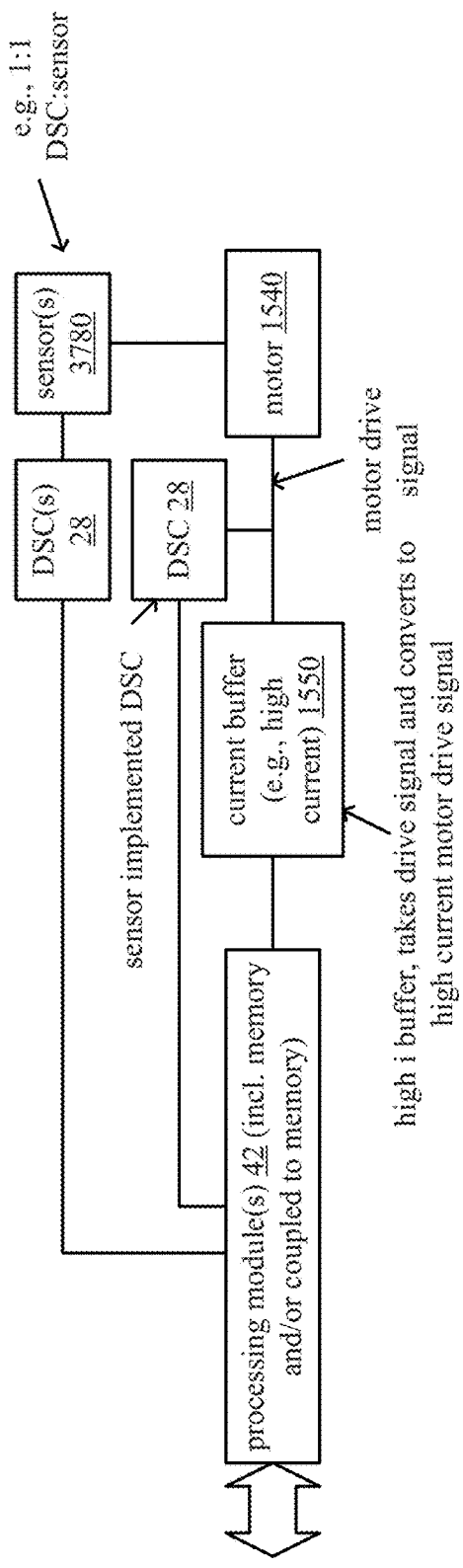
FIG. 41A is a schematic block diagram of another embodiment of DSC sensing in accordance with motor control feedback and adaptation in accordance with the present invention.

FIG. 41A is a schematic block diagram of another embodiment 4101 of DSC sensing in accordance with motor control feedback and adaptation in accordance with the present invention. This diagram has some similarities to certain of the previous diagrams. In this diagram, one or more sensors 3780 is implemented to provide information regarding the status and operation of the motor 1540 and/or one or more other components associated there with. In addition, another one or more DSCs 28 is implemented to service the one or more sensors 3780. In certain examples, the number of DSCs 28 that service the number of sensors 3780 is on a one-to-one basis such that a respective DSC is implemented to service each respective sensor 3780. In other examples, more than one of the sensors 3780 is serviced by a singular DSC 28. In yet other examples, more than one DSC 28 is implemented to service a singular sensor 3780. Note that the different respective sensors 3780 may be of any variety in types as described herein providing information regarding the status and operation of the motor 1540 (e.g., operational speed, temperature such as motor temperature and/or environmental temperature, vibration, etc. and other information pertaining to status and operation of the motor 1540).

This other one or more DSCs 28 also provides information to the one or more processing modules 42. The one or more processing modules 42 is then configured to use both the information from the one or more DSCs 28 that provide information regarding the one or more motor drive signals that are provided from the current buffer 1550 to the motor 1540 and also information regarding the status and operation of the motor 1540. This diagram provides another example by which additional information may be used by the one or more processing modules 42 to adapt operation of one or more motor drive signals that are provided to the motor controller 3650 to facilitate proper operation of the motor 1540.

Figure 41B:
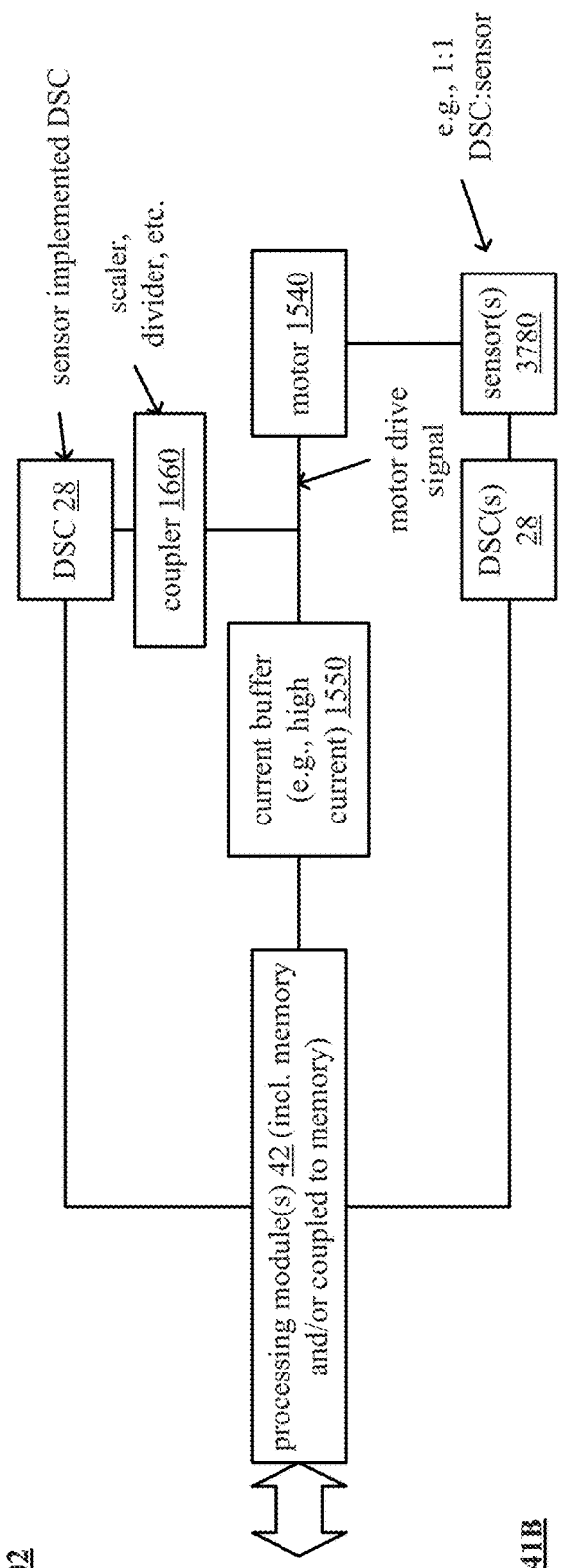
FIG. 41B is a schematic block diagram of another embodiment of DSC sensing in accordance with motor control feedback and adaptation in accordance with the present invention.

FIG. 41B is a schematic block diagram of another embodiment 4102 of DSC sensing in accordance with motor control feedback and adaptation in accordance with the present invention. This diagram has some similarities to the previous diagram. In this diagram, at least one the one or more DSCs 28 is implemented to perform sensing of the one or more motor drive signals provided from the current buffer 1550 to the motor 1540 via a connection provided from a coupler 1660 that receives a motor drive signal from the current buffer 1550 that is provided to the motor 1540 and provides a signal representative of that motor drive signal. As in other diagrams, note that the one or more DSCs 28 that are implemented to perform sensing of the one or more one or more motor drive signals are implemented to receive one or more signals via one or more couplers 1660 (e.g., by operating in accordance with any of the one or more characteristics of a coupler as described herein, their equivalents, etc. and as may be desired in various examples). In this particular diagram, the one or more couplers 1660 is implemented to provide one or more signals to the one or more DSCs 28 that is representative of the one or more motor drive signals that is provided from the current buffer 1550 to the motor 1540.

FIG. 42 is a schematic block diagram of another embodiment of a method 4200 for execution by one or more devices in accordance with the present invention. The method 4200 operates in step 4210 by operating one or more processing modules for providing a drive signal to a motor controller that is implemented to provide a motor drive signal to a motor. In some examples, the one or more processing modules and motor controller integrated into a single device such as a motor controller that includes one or more processing modules.

The method 4200 operates in step 4220 by generating a motor drive signal. In some examples, this generation of a motor drive signal is performed within the motor controller. The method also operates in step 4230 by operating the one or more processing modules for communicating with and interacting with one or more DSCs that are configured to perform sensing of the motor drive signal provided to the motor. In some examples, this monitoring by the one or more of DSCs is performed based on the connection or coupling from the motor controller to the motor such that the motor drive signal is monitored and sensed.

The method 4200 continues in step 4240 by receiving, by the one or more processing modules, information from the one or more DSCs regarding the motor drive signal. Also, in some examples, one or more sensors, which may be serviced by one or more DSCs, are implemented to provide information regarding the status and operation of the motor itself. Moreover, in some examples, the information regarding the electric power signals is received by the one or more processing modules via one or more couplers that perform one or more of scaling, division, electrical isolation, etc. and/or some other processing of the motor drive signal to generate one or more other signals representative of the motor drive signal and these one or more other signals are provided and sensed by the one or more DSCs. In such examples in which one or more sensors are implemented to provide information regarding the status and operation of the motor, the method 4200 also operates in step 4242 by operating one or more processing modules for receiving information (e.g., via DSCs in some examples, directly from the sensors and other examples, etc.) corresponding to the status and operation of the motor.

The method 4200 continues in step 4250 by operating one or more processing modules to process the information for determining whether any adaptation of the drive signal provided (e.g., from the one or more processing modules) to the motor controller is needed. Based on an unfavorable comparison of the motor drive signal (and/or the status and operation of the motor) to one or more operational criteria in step 4260, the one or more processing modules operates by adapting the drive signal provided to the motor controller in step 4270 to facilitate proper operation of the motor. Some examples of unfavorable comparison of the motor drive signal to one or more operational criteria may include any one or more of the motor drive signal being different than what is expected from the motor controller taste on the drive signal provided from the one or more processing modules to the motor controller, the motor drive signal being of improper magnitude, improper phase, including an unacceptable amount of noise, interference, undesired harmonics, glitches, etc.

Some examples of unfavorable comparison of the status and operation of the motor may include any one or more of overtemperature (e.g., temperature of the motor being above a prescribed or recommended upper temperature), under temperature (e.g., temperature of the motor being below a prescribed or recommended lower temperature), overspeed (e.g., the motor operating at faster than a prescribed or recommended speed), under speed (e.g., the motor operating at slower than a prescribed or recommended speed), slip of the motoring being outside of a prescribed or recommended range, etc.

Alternatively, based on a favorable comparison of the motor drive signal (and/or the status and operation of the motor) to one or more operational criteria in step 4260, the method 4200 ends or continues such as by looping back and performing the operational step 3410 and continuing to perform the method 4200.

In some alternative examples, note that the drive signal provided from the one or more processing modules is provided to a current buffer that is implemented to generate the motor drive signal that is provided to the motor.

Certain of the following diagrams, examples, embodiments, etc. are directed towards electric power generation related applications. Generators that generate electric power may be implemented in a variety of ways. Generally speaking, an induction machine is described elsewhere herein in which the rotor is driven by some mechanical energy source may be implemented to operate as a generator. There are a wide variety of means by which such a mechanical energy source may be implemented. A motor (e.g., a motor based on a gas, natural gas, diesel, etc. as a fuel) may be implemented as the mechanical energy source. A turbine (e.g., such as may be driven by steam, gas, natural gas, wind, water/hydro sometimes referred to as hydraulic, etc.) may also be implemented as a mechanical energy source. Generally speaking, any mechanism implemented to facilitate rotation of the rotor is in an induction machine may serve as the mechanical energy source to generate electric power from the stator of the induction machine. Generators may be implemented in a variety of ways including single phase, 3-phase, etc. Some 3-phase generators also may be implemented to provide output neutral line or connection.

Implementation of one or more DSCs as described herein and their equivalents provide for the improvement of the operation of such generator systems. One or more DSCs may be implemented to perform processing of the electrical power signals that are generated by such generators, to sense the electric power signals that are generated by such generators, to drive and service various sensors, actuators, components, etc. associated with such generator systems, etc. certain of the following diagrams, examples, embodiments, etc. provide various implementations by which one or more DSCs may be implemented to improve the quality of the electric power signals that are generated within such systems and to improve the overall operation of such systems. Note that some implementations include one or more DSCs that are implemented perform both drive and sense operations and/or one or more DSCs that are implemented performed sense only operations.

FIG. 43A is a schematic block diagram of an embodiment 4301 of input electric power adaptation based on in-line DSC configured simultaneously to drive and sense a drive signal to a load in accordance with the present invention. In this diagram, input electric power signal is provided to a drive-sense circuit (DSC) 28. In some examples, the input electric power signal is provided from a generator. Also, in this diagram, one or more processing modules 42 is configured to communicate with and interact with the DSC 28. The one or more processing modules 42 is coupled to a DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

The DSC is configured to provide a drive signal to a load, shown as reference numeral 4390. Note that such the load 4390 may generally be viewed as any type of load as described herein and/or their equivalents. In some examples, the load 4390 is a transmission line such as output from an electric power generation station. In other examples, the load 4390 is a substation within one or more electric power grid, transmission and distribution (T&D) networks, such that the substation is implemented to perform the voltage up conversion from the generation level voltage to one or more higher transmission voltage levels (e.g., 69 kV, 115 kV, 230 kV, 500 kV, 765 kV, etc.) that is appropriate for transmission so the electric power can travel over longer distances more efficiently. In even other examples, the load 4390 is a motor such as described herein or their equivalents (e.g., such as a DC motor, and AC/induction motor, a DC brushless motor (DCBM), etc.). In other examples, the load 4390 is some form of machinery such as a drill, a pump, a compressor, etc. Generally speaking, any element implemented to receive and consume electric power may be viewed as the load 4390.

In general, any load 4390 may be implemented and provided a drive signal from the DSC 28. In this diagram, the DSC 28 operates to provide the drive signal to the load 4390 and also simultaneously to detect any effect on the drive signal. In this diagram, input electric power is provided to the DSC 28 and the DSC 28 is implemented to perform in-line processing of the input electric power signal to generate the drive signal that is provided to the load 4390. Note that the power supply reference input 1405 may also be provided to the DSC 1420 in certain examples. In such examples, the DSC 28 is configured to process the input electric power signal based on power supply reference input 1405. Note also that the power supply reference input 1405 may be provided from the one or more processing modules 42 in some examples. This diagram shows a general configuration by which a DSC 28 is implemented to receive an input electric power signal from a generator and to generate a drive signal to be provided to the load 4390.

FIG. 43B is a schematic block diagram of another embodiment 4302 of input electric power adaptation based on in-line DSC configured simultaneously to drive and sense a drive signal to a load in accordance with the present invention. In this diagram, one or more processing modules 42 is configured to communicate with and interact with a drive-sense circuit (DSC) 28-43 that is configured to receive an input electric power signal (e.g., from a generator). The one or more processing modules 42 is coupled to a DSC 28-43 and is operable to provide control to and communication with the DSC 28-43. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, DSC 28-43 includes a power source circuit 1410 that is configured to receive an input electric power signal (e.g., from a generator) and a drive signal change detection circuit 1412. The drive signal change detection circuit 1412 includes a power source reference circuit 1412a and a comparator 1412b. With respect to this diagram as well as others, note than any comparator may alternatively implemented as an operational amplifier as desired in certain examples. For example, while come examples are implemented such that a comparator operates to output a binary signal (e.g., either a 1 or a 0), an operational amplifier may alternatively be implemented to output any signal within a range of signals as may be desired in certain applications. In some examples, the power source circuit 1412 may be an independent current source, a dependent current source, a current mirror circuit, etc., or alternatively, an independent voltage source, a dependent voltage source, etc.

In addition, one or more processing modules 42 is configured to interact with and communicate with the DSC 28-43. In some examples, the one or more processing modules 42 is configured to provide control signals to one or more of the components within the DSC 28-43. In addition, the one or more processing modules 42 is configured to receive information from DSC 28-43. The one or more processing modules 42 is configured to process information that is received and to direct operation of one or more of the components within the DSC 28-43.

In an example of operation based on a current related implementation of the DSC 28-43, the power source reference circuit 1412a provides a current reference with at least one of DC and oscillating components to the power source circuit 1410. The current source generates a current as the drive signal based on the current reference. An electrical characteristic of the load 4390 has an effect on the current drive signal. For example, if the impedance of the load 4390 decreases and the current drive signal remains substantially unchanged, the voltage across the load 4390 is decreased.

The comparator 1412b compares the current reference with the affected drive signal to produce a signal that is representative of the change to the drive signal. For example, the current reference signal corresponds to a given current (I) times a given impedance (Z). The current reference generates the drive signal to produce the given current (I). If the impedance of the load 4390 substantially matches the given impedance (Z), then the comparator's output is reflective of the impedances substantially matching. If the impedance of the load 4390 is greater than the given impedance (Z), then the comparator's output is indicative of how much greater the impedance of the load 4390 is than that of the given impedance (Z). If the impedance of the load 4390 is less than the given impedance (Z), then the comparator's output is indicative of how much less the impedance of the load 4390 is than that of the given impedance (Z).

In an example of operation based on a voltage related implementation of the DSC 28-43, the power source reference circuit 1412a provides a voltage reference with at least one of DC and oscillating components to the power source circuit 1410. The power source circuit 1410 generates a voltage as the drive signal based on the voltage reference. An electrical characteristic of the load 4390 has an effect on the voltage drive signal. For example, if the impedance of the sensor decreases and the voltage drive signal remains substantially unchanged, the current through the sensor is increased.

The comparator 1412b compares the voltage reference with the affected drive signal to produce the signal that is representative of the change to the drive signal. For example, the voltage reference signal corresponds to a given voltage (V) divided by a given impedance (Z). The voltage reference generates the drive signal to produce the given voltage (V). If the impedance of the load 4390 substantially matches the given impedance (Z), then the comparator's output is reflective of the impedances substantially matching. If the impedance of the load 4390 is greater than the given impedance (Z), then the comparator's output is indicative of how much greater the impedance of the load 4390 is than that of the given impedance (Z). If the impedance of the load 4390 is less than the given impedance (Z), then the comparator's output is indicative of how much less the impedance of the load 4390 is than that of the given impedance (Z).

Generally speaking, this diagram shows yet another example by which a DSC may be implemented to perform in-line processing of the input electric drive signal to generate the drive signal that is provided to the load 4390. However, note that any of a variety of different implementations of the DSC may be made to generate a drive signal to be provided to a load 4390 while simultaneously monitoring and sensing that drive signal.

FIG. 44A is a schematic block diagram of an embodiment 4401 of a DSC configured simultaneously to drive and sense a drive signal to a load in accordance with the present invention. In this diagram, one or more processing modules 42 is configured to communicate with and interact with a drive-sense circuit (DSC) 28-44a. The one or more processing modules 42 is coupled to a DSC 28-44a and is operable to provide control to and communication with the DSC 28-44a. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, the one or more processing module 42 is configured to provide a drive signal, which may be viewed as a reference signal, to one of the inputs of a comparator 1715. Note that the comparator 1715 may alternatively be implemented as an operational amplifier in certain embodiments. The other input of the comparator 1715 is coupled to provide a drive signal directly from the DSC 28-44a to the load 4390. The DSC 28-44a is configured to provide the drive signal to the load 4390 and also simultaneously to sense the drive signal and to detect any effect on the drive signal.

The output of the comparator 1715 is provided to an analog to digital converter (ADC) 1760 that is configured to generate a digital signal that is representative of the effect on the drive signal that is provided to the load 4390. In addition, the digital signal is output from the ADC 1760 is fed back via a digital to analog converter (DAC) 1762 to generate the drive signal is provided to the load 4390. In addition, the digital signal that is representative of the effect on the drive signal is also provided to the one or more processing modules 42. The one or more processing modules 42 is configured to provide control to and be in communication with the DSC 28-44a including to adapt the drive signal is provided to the comparator 1715 therein as desired to direct and control operation of the load 4390 via the drive signal.

FIG. 44B is a schematic block diagram of an embodiment 4402 of a DSC configured simultaneously to drive and sense a drive signal to a load in accordance with the present invention. In this diagram, one or more processing modules 42 is configured to communicate with and interact with a drive-sense circuit (DSC) 28-44b. The one or more processing modules 42 is coupled to a DSC 28-44b and is operable to provide control to and communication with the DSC 28-44b. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

This diagram has some similarities to the previous diagram with at least one difference being that this diagram excludes the DAC 1762 of the prior diagram. In this diagram, the analog output signal from the comparator 1715 is fed back directly to the input of the comparator 1715 that is also coupled to the load 4390 thereby providing the drive signal (and simultaneously sensing) that is provided to the load 4390.

Figure 45:
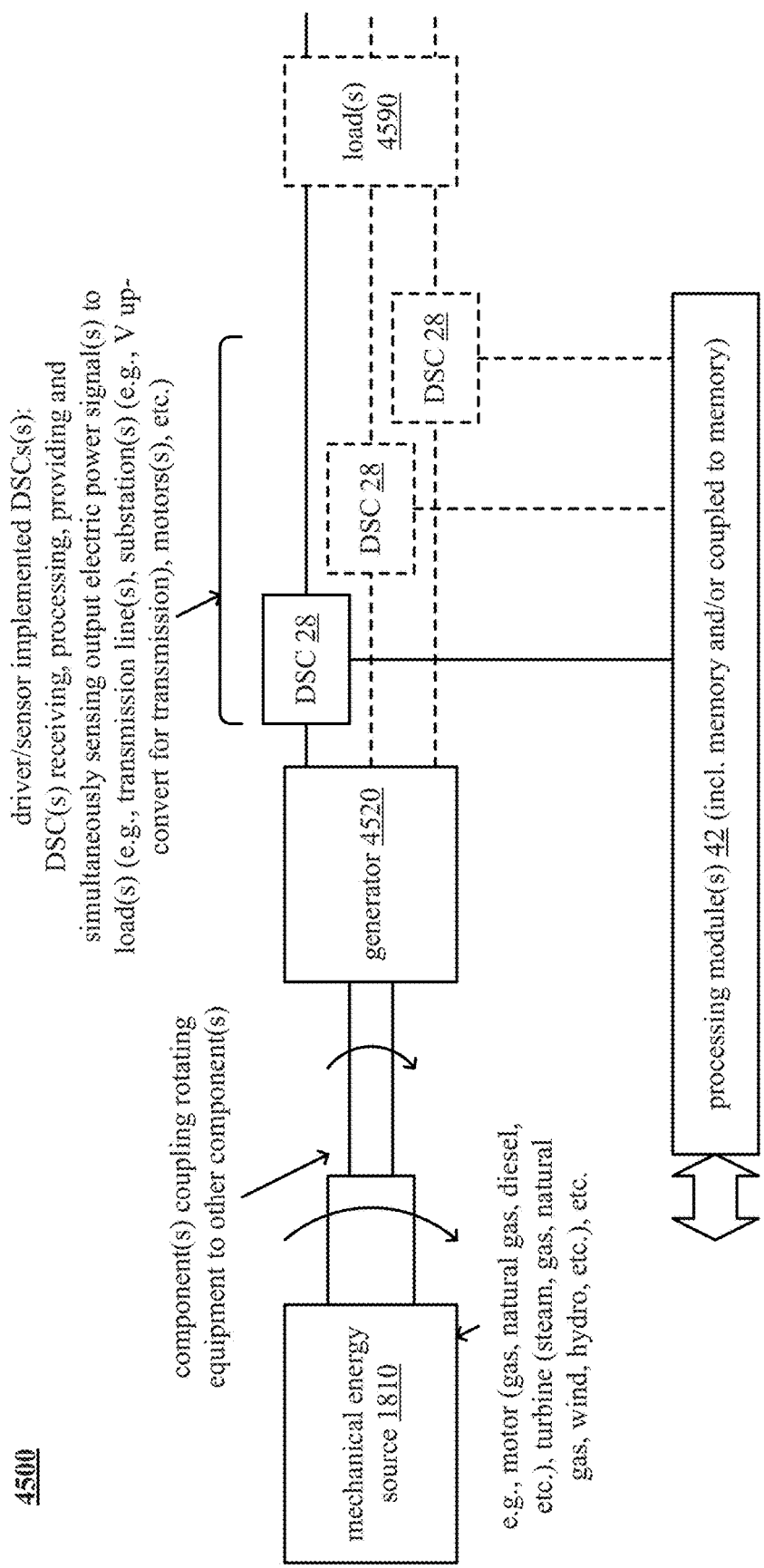
FIG. 45 is a schematic block diagram of an embodiment of generator output adaptation with in-line DSC in accordance with the present invention.

FIG. 45 is a schematic block diagram of an embodiment 4500 of generator output adaptation with in-line DSC in accordance with the present invention. In this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, the one or more DSCs 28 are configured to receive one or more output electric power signals from a generator 4520 and to process those one or more output electric power signals that are provided to load 4590 (e.g., which may be implemented as one or more loads 4590). The generator 4520 is connected to a mechanical energy source 1810. The mechanical energy source 1810 may be any of a variety of different types including a motor (e.g., such as operated based on gas, natural gas, diesel, etc. or some other fuel), a turbine (e.g., as operated based on steam, gas, natural gas, wind, water/hydro, etc.), etc. and/or any other type of mechanical energy source.

In an example in which the generator 4520 is implemented to output power signals that are based on 3-phase power, there are three respective DSCs 28 implemented to receive the three respective output electric power signals. In certain examples that include 3-phase power including a neutral, a fourth DSC 28 may also and optionally be implemented in-line of the neutral as well as may be desired in certain implementations. In an example in which generator 4520 operates based on single phase power, there is one DSC 28 implemented to receive the single phase output electric power signal. Note that the number of output electric power signals that are received corresponds to the number of DSCs 28 that received those respective output electric power signals.

The generator 4520 is connected to the load 4590 via the one or more DSCs 28. Note that the load 4590 may be any of a variety of components that is driven or is operated on based on the one or more output electric power signals that are provided from the generator 4520 via the one or more DSCs 28. Note that the load 4590 of this diagram or any other load referenced in other diagrams may be any of a variety of types of machinery including a motor, factory assembly machinery, a drill, a pump, a compressor, a turbine, a fan, etc. In this diagram as well as others herein, generally speaking, any element implemented to receive and consume electric power may be viewed as the load 4390.

In this diagram, the one or more DSCs 28 are implemented in an in-line configuration with the one or more output electric power signals to perform conditioning, as desired and/or needed, to the one or more electric power signals that are provided to and received by the load 4590. In addition, they are configured to adapt control of the one or output electric power signals being provided to the load 4590 from the generator 4520. The one or more DSCs 28 are configured to receive the output electric power signals, perform processing on them, to provide one or more conditioned output electric power signals to the load 4590 and simultaneously to sense those one or more conditioned output electric power signals being provided to the load 4590. The one or more DSCs 28 are configured to provide a variety of types of information to be used by the one or more processing modules 42. For example, the one or more DSCs 28 operating by sensing of the one or more conditioned output electric power signals to the load 4590 may provide information to determine the amount of electric current being consumed by the load, the voltage of the load, the impedance of the load, and/or any change of electric current, voltage, impedance associated with the load. In addition, any characteristic associated with any of the current, voltage, impedance associate with the load may also be determined based on information that is provided from the one or more DSCs 28 implemented to perform in-line sensing of the one or more conditioned output electric power signals that are provided to load 4590.

For example, considering an implementation in which the load 4590 is an electric power grid, one or more transmission and distribution (T&D) networks, etc., based on the reactants of the transmission lines of such a system, appropriate sensing by the one or more DSCs 28 of the one or more conditioned output electric power signals that are being provided to the load 4590 may provide information to the one or more processing modules 42 to be used to adapt operation of the one or more DSCs 28 to perform appropriate processing and conditioning of the one or more output electric power signals from the generator 4522 facilitate more efficient transmission of electric power via the electric power grid, one or more transmission and distribution (T&D) networks, etc. In addition, as also described with respect to other diagrams, examples, embodiments, etc. herein, such sensing by the one or more DSCs 28 of the one or more conditioned output electric power signals that are being provided to the load 4590 may provide information to the one or more processing modules 42 to be used to adapt operation of the operation of the generator 4520, the mechanical energy source 1810, and/or one or more other components within the system.

In some examples, the one or more processing modules 42 is configured to direct the one or more DSCs 28 to perform conditioning, adjusting, filtering, etc. of the one or more output electric power signals being provided to the load 4590. In other examples, the one or more processing modules 42 is configured to direct the one or more DSCs 28 to provide more current (e.g., based on detection of a high or higher back-EMF, an increased load, the rotor rotating at a slower speed than desired, etc.) or less current (e.g., based on detection of a low or lower back-EMF, a decreased load, the rotor rotating at a higher speed than desired, etc.) via the one or more output electric power signals being provided to the load 4590. Similarly, the voltage of the one or more output electric power signals being provided from the one or more DSCs 28 to the load 4590 may be adapted or modified accordingly based on such considerations.

Generally speaking, the one or more processing modules 42 is configured to direct the one or more DSCs 28 to perform adaptation of the one or more output electric power signals provided to the load 4590. In some examples, this involves modifying the amplitude or magnitude of the current and/or voltage of the one or more output electric power signals. In other examples, this involves modifying the phase (e.g., forward/advancing or backward/delaying) of the current and/or voltage of the one or more output electric power signals. In even other examples, this involves filtering of the one or more output electric power signals (e.g., low pass filtering, bandpass filtering, high pass filtering, and/or any combination of such filtering) to generate the one or more output electric power signals. Note that such processing and filtering is performed in certain examples to compensate for and/or remove one or more conditions affecting the one or more output electric power signals (e.g., noise, interference, undesired harmonics, glitches, etc.).

In yet other examples, the one or more processing modules 42 is configured to direct the one or more DSCs 28 to increase the voltage or reduce the voltage of the one or more output electric power signals being provided to the load 4590. In certain examples, the one or more processing modules 42 is configured to direct operation of the one or more DSCs 28 by modifying the one or more respective reference signals being provided to the one or more DSCs 28. For example, based on the one or more processing modules 42 adapting or modifying a reference signal that is being provided to a DSC 28 will adapt operation of that DSC 28 and thereby modify the output electric power signal being provided from that DSC 28 to the load 4590.

Generally speaking, any of the variety of information that may be determined based on analysis of the sensing of the one or more output electric power signals being provided to the load 4590 may be used to adapt operation of the one or more DSCs 28 by the one or more processing modules 42 to control and/or adapt the operation of the load 4590.

Figure 46:
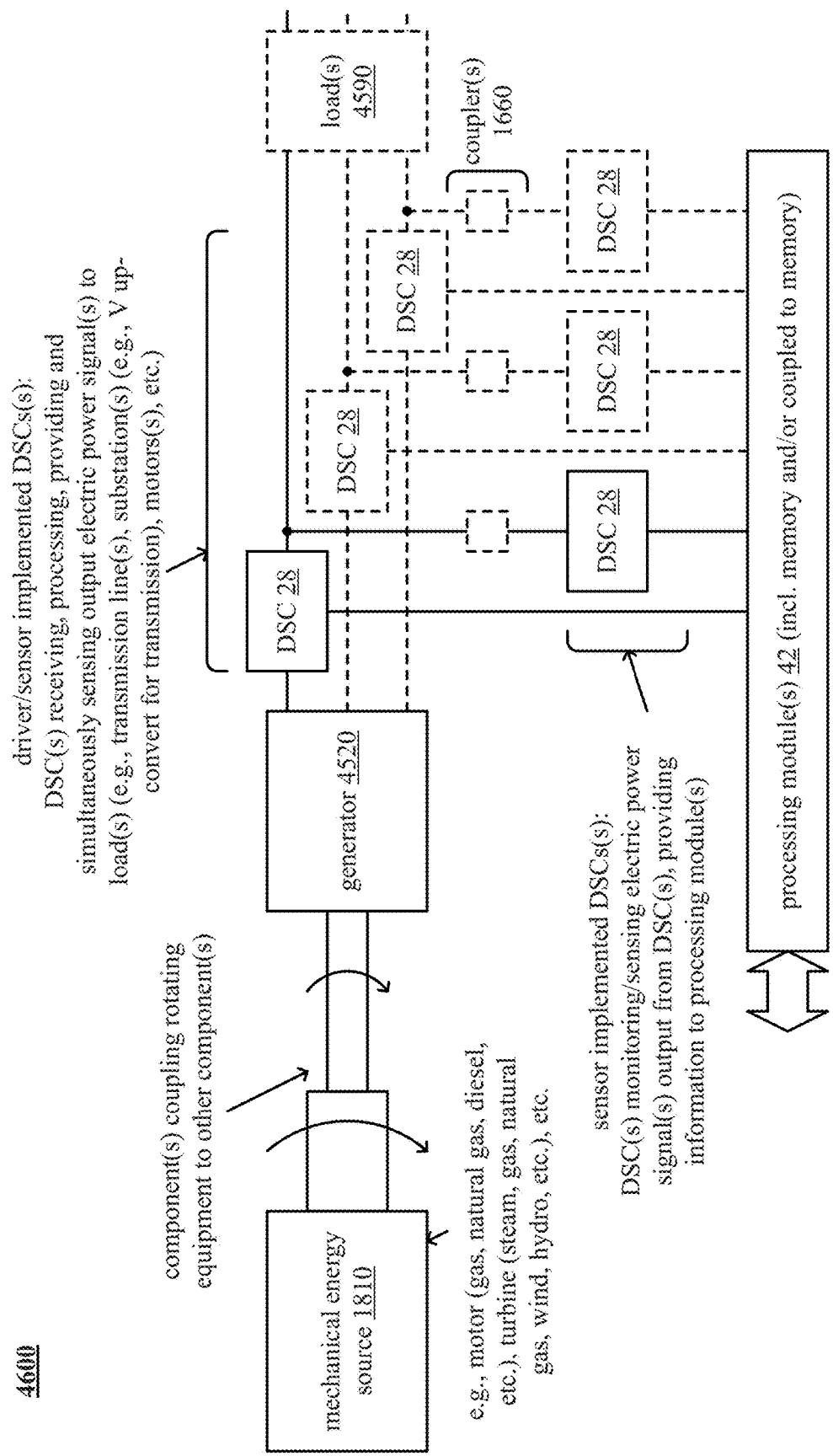
FIG. 46 is a schematic block diagram of another embodiment of generator output adaptation with in-line DSC in accordance with the present invention.

FIG. 46 is a schematic block diagram of another embodiment 4600 of generator output adaptation with in-line DSC in accordance with the present invention. This diagram has some similarities to the previous diagram. For example, in this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. The one or more DSCs 28 are configured to receive one or more output electric power signals and to process those one or more output electric power signals to generate one or more conditioned output electric power signals to be provided to the load 4590. The mechanical energy source 1810 is connected to the generator 4520 directly or via one or more components coupling the mechanical energy source 1810 to the generator 4520.

This diagram also includes one or more additional DSCs 28 that are implemented as sensors to monitor the drive signals that are output from the in-line DSCs 28 that receive the one or more output electric power signals. In this diagram, these one or more additional DSCs 28 are shown as sensing and monitoring the one or more conditioned output electric power signals from the one or more in-line DSCs 28 that provide the one or more conditioned output electric power signals to the load 4590. In other embodiments, note that these one or more additional DSCs 28 may alternatively be implemented to sense and monitor the one or more output electric power signals that are provided from the generator 4520 (e.g., monitoring and sensing the one or more inputs to the one or more in-line DSCs 28 alternatively to or in addition to the monitoring and sensing of the one or more outputs from the one or more in-line DSCs 28).

These one or more additional DSCs 28 are also in communication with the one or more processing modules 42. In certain examples, these sensor implemented DSCs 28 are connected to the drive signal lines output from the in-line DSCs 28 via one or more couplers 1660. As described elsewhere herein, the couplers 1660 may be of any of a variety of types that provide one or more other signals to the sensor implemented DSCs 28 that are representative of the one or conditioned output electric power signals that are output from the in-line DSCs 28 and provided to the load 4590.

This diagram shows an alternative implementation in which a first one or more in-line DSCs 28 is configured to perform adaptation and control of the one or more conditioned output electric power signals that are provided to the load 4590 and a second one or more sensor implemented DSCs 28 is configured to perform sensing of the one or one or more conditioned output electric power signals that are provided to the load 4590. Note that different DSCs 28 in this diagram may be implemented to perform different operations. For example, the one or more in-line DSCs 28 is configured to perform both the providing of the one or more conditioned output electric power signals to the load 4590 and also simultaneously to perform sensing of those one or more conditioned output electric power signals to the load 4590 as the one or more sensor implemented DSCs 28 is configured also to perform sensing of the one or more conditioned output electric power signals. In another example, the one or more in-line DSCs 28 is configured to perform only the providing of the one or more conditioned output electric power signals to the load 4590 as the one or more sensor implemented DSCs 28 is configured to perform sensing of the one or more conditioned output electric power signals. In even other examples, the one or more sensor implemented DSCs 28 is configured to operate to perform adaptation of the one or more conditioned output electric power signals output from the in-line DSCs 28 such that for any given drive signal that is provided to the load 4590, a corresponding in-line DSC 28 and also another DSC 28 operate cooperatively to perform any modification or adaptation of that respective drive signal is provided to the load 4590.

Figure 47:
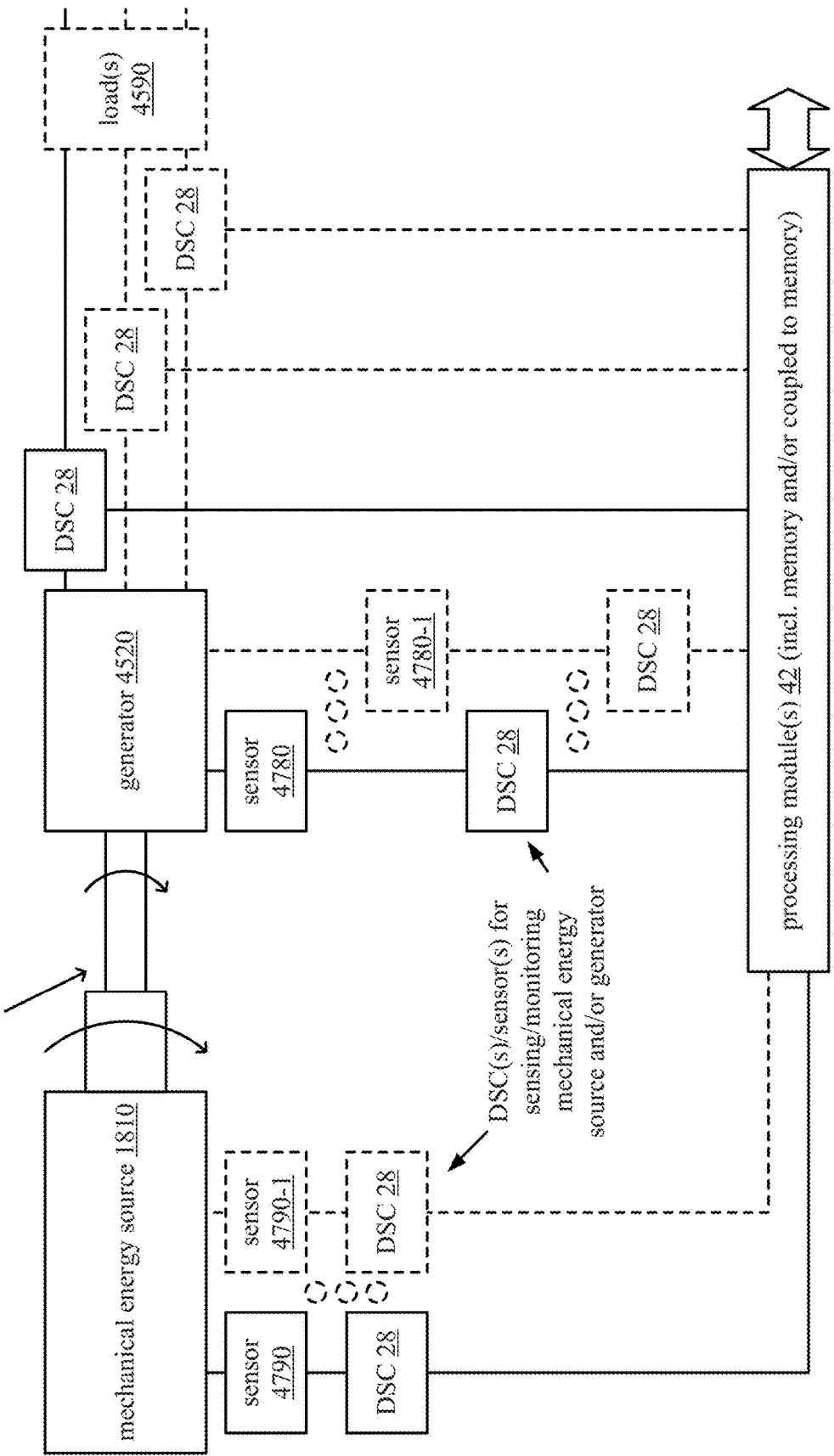
FIG. 47 is a schematic block diagram of another embodiment of generator output adaptation with in-line DSC in accordance with the present invention.

FIG. 47 is a schematic block diagram of another embodiment 4700 of generator output adaptation with in-line DSC in accordance with the present invention. This diagram has some similarities to the previous diagram of FIG. 46. For example, in this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. The one or more DSCs 28 are configured to receive one or more output electric power signals from the generator 4520 and to process those one or more output electric power signals to generate drive signals to be provided to load 4590. The mechanical energy source 1810 is connected to a generator 4520 directly or via one or more components coupling the mechanical energy source 1810 and the generator 4520.

This diagram also includes one or more additional DSCs 28 that are implemented to interface to one or more sensors that provide additional information regarding the mechanical energy source 1810 and the generator 4520. For example, one or more sensors 4780 to 4780-1 are implemented and serviced via one or more DSCs 28 to provide information regarding the generator 4520, and/or one or more sensors 4790 to 4790-1 are implemented and serviced via one or more DSCs 28 to provide information regarding the mechanical energy source 1810. Note that the number and type of sensors implemented to provide information on the mechanical energy source 1810 and the generator 4520 may be of a variety of different types. Examples of such sensors implemented to provide information of the mechanical energy source 1810 and/or the generator 4520 may include one or more of Hall effect sensors, optical speed sensors, temperature sensors, accelerometers such as may be implemented to monitor and detect for vibrations, etc. Similarly, such types of sensors may also be implemented to provide information regarding the load 4590. In addition, based on the particular type of load 4590, appropriately tailored sensors may be implemented (e.g., rate of flow sensors for a pump application, pressure sensors for a compressor application, etc.).

This diagram shows an example in which additional information regarding the status and operation of the mechanical energy source 1810 and/or the generator 4520 is provided to the one or more processing modules 42 be used to direct and control operation of the various DSCs 28 and possibly including the one or more in-line DSCs 28 that provide the one or motor conditioned electric power output signals to the load 4590.

Figure 48:
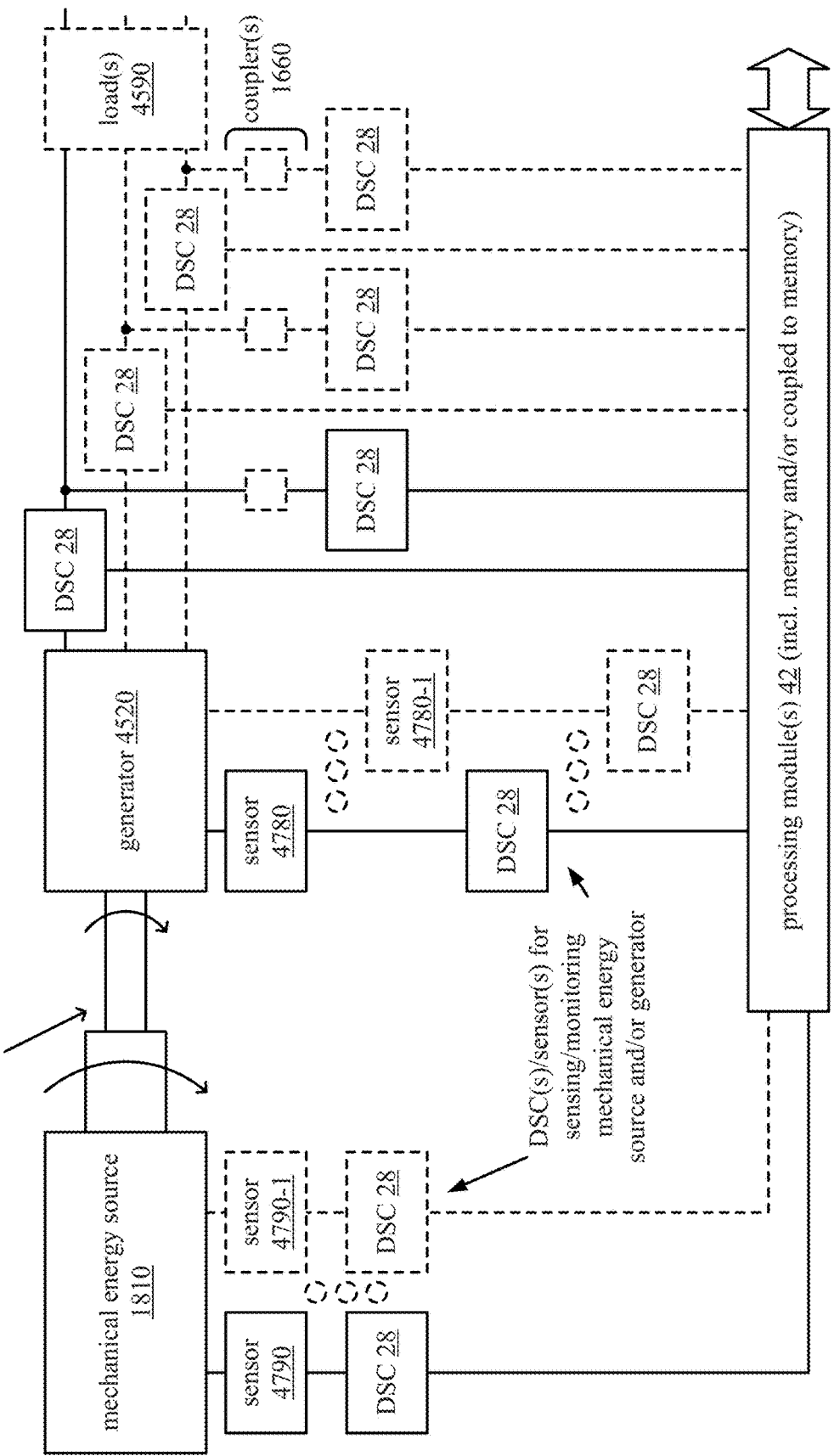
FIG. 48 is a schematic block diagram of another embodiment of generator output adaptation with in-line DSC in accordance with the present invention.

FIG. 48 is a schematic block diagram of another embodiment 4800 of generator output adaptation with in-line DSC in accordance with the present invention. This diagram has some similarities to certain of the previous diagrams. For example, in this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. The one or more DSCs 28 are configured to receive one or more output electric power signals from the generator 4520 and to process those one or more output electric power signals to generate drive signals to be provided to load 4590. The mechanical energy source 1810 is connected to a generator 4520 directly or via one or more components coupling the mechanical energy source 1810 and the generator 4520.

This diagram also includes one or more additional DSCs 28 that are implemented as sensors to monitor the one or more conditioned electric power signals that are output from the in-line DSCs 28 that receive the one or more output electric power signals that are output from the generator 4520. Note that these one or more additional DSCs 28 may be coupled to the one or more drive signal lines output from the in-line DSCs 28 via one or more couplers 1660.

This diagram shows an example in which additional information regarding the one or more conditioned electric power signals output from one or more in-line DSCs 28 as well as information regarding the status and operation of the mechanical energy source 1810 and/or the generator 4520 is provided to the one or more processing modules 42 be used to direct and control operation of the various DSCs 28 and possibly including the one or more in-line DSCs 28 that provide the one or more conditioned electric power signals to the load 4590.

Figure 49:
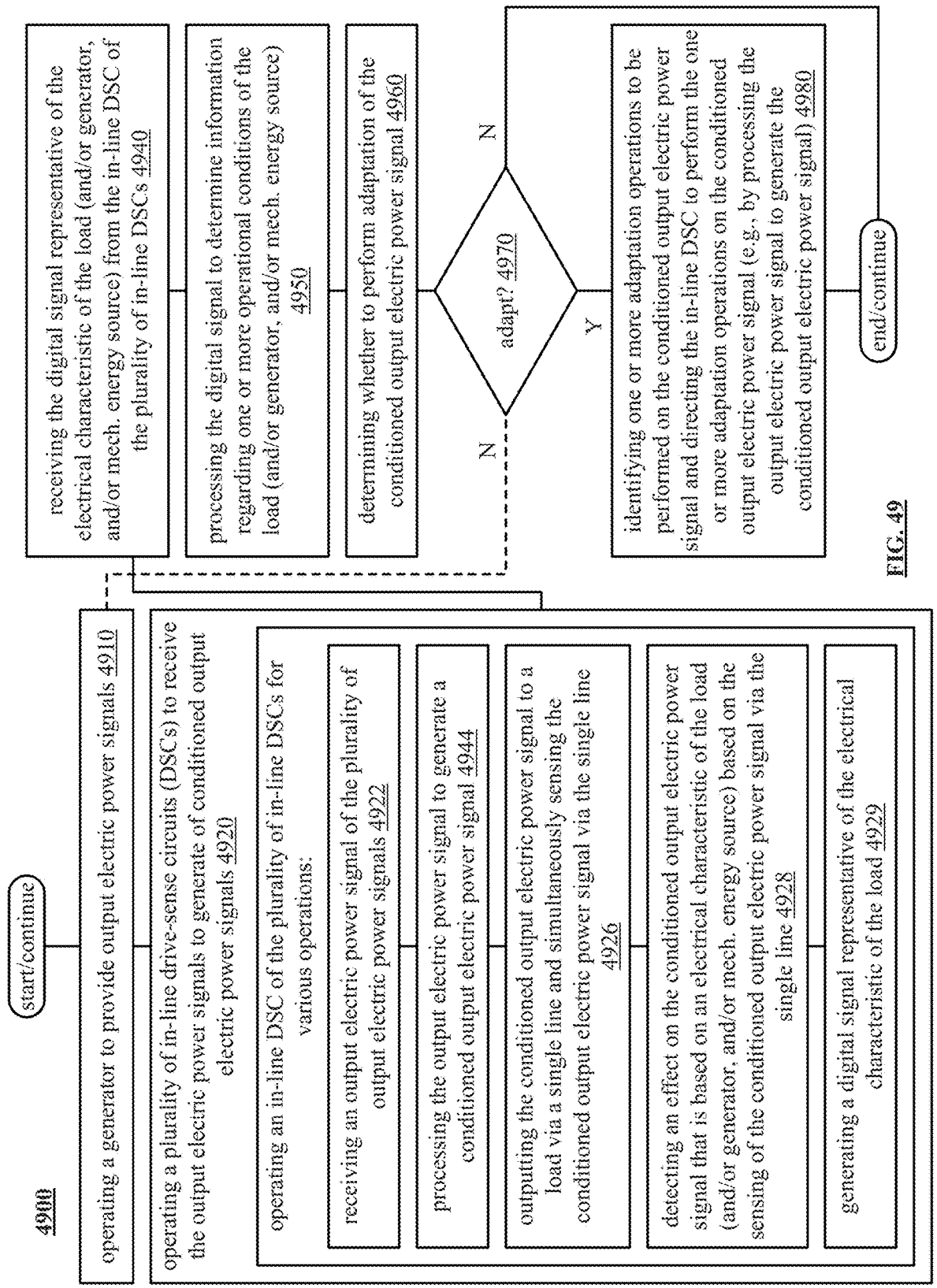
FIG. 49 is a schematic block diagram of another embodiment of a method for execution by one or more devices in accordance with the present invention.

FIG. 49 is a schematic block diagram of another embodiment of a method 4900 for execution by one or more devices in accordance with the present invention. The method 4900 may also be viewed as a method for execution by one or more devices to perform generator output adaptation with in-line drive-sense circuit (DSC).

The method 4900 operates in step 4910 by operating a generator to provide a plurality of output electric power signals. The method 4900 also operates in step 4920 by operating a plurality of in-line drive-sense circuits (DSCs) to receive the plurality of electric power signals to generate a plurality of plurality of conditioned electric power signals.

The method 4900 also operates in step 4920 by operating a plurality of in-line drive-sense circuits (DSCs) to receive a plurality of input electrical power signals and to generate the plurality of motor drive signals. This involves operating an in-line DSC of the plurality of in-line DSCs for various operations including This involves operating an in-line DSC of the plurality of in-line DSCs for various operations including receiving an output electric power signal of the plurality of output electric power signals in step 4922, processing the output electric power signal to generate a conditioned output electric power signal in step 4924, outputting the conditioned output electric power signal to a load via a single line and simultaneously sensing the conditioned output electric power signal via the single line in step 4926, detecting an effect on the conditioned output electric power signal that is based on an electrical characteristic of the load (and/or generator, and/or mech. energy source) based on the sensing of the conditioned output electric power signal via the single line in step 4928, and generating a digital signal representative of the electrical characteristic of the load in step 4929.

The method 4900 also operates in step 4920 (e.g., by one or more processing modules) by receiving the digital signal representative of the electrical characteristic of the load (and/or generator, and/or mech. energy source) from the in-line DSC of the plurality of in-line DSCs in step 4940, processing the digital signal to determine information regarding one or more operational conditions of the load (and/or generator, and/or mech. energy source) in step 4950. Based on the information regarding the one or more operational conditions of the rotating equipment, the method 4900 also operates in step 4960 by determining whether to perform adaptation of the conditioned output electric power signal. Based on a determination to perform adaptation of the conditioned output electric power signal, the method 4900 also operates in step 4970 by identifying one or more adaptation operations to be performed on the conditioned output electric power signal and directing the in-line DSC to perform the one or more adaptation operations on the conditioned output electric power signal (e.g., by processing the output electric power signal to generate the conditioned output electric power signal) in step 4980.

Alternatively, based on a determination not to perform adaptation of the motor drive signal in step 4970, the method 4900 ends or alternatively returns to step 4910 and continues to perform the method 4900.

Figure 50:
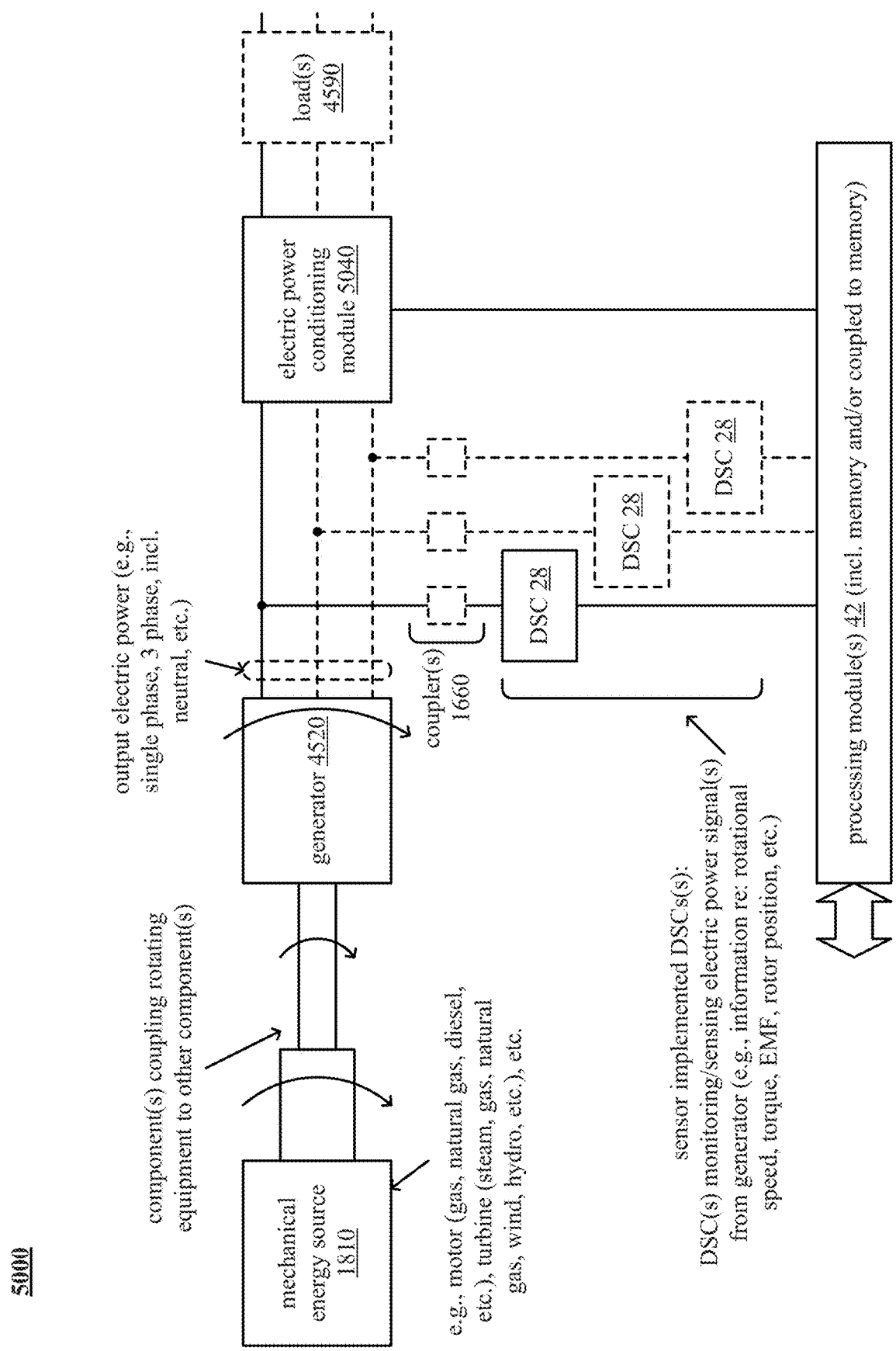
FIG. 50 is a schematic block diagram of an embodiment of generator output signal monitoring and conditioning in accordance with the present invention.

FIG. 50 is a schematic block diagram of an embodiment 5000 of generator output signal monitoring and conditioning in accordance with the present invention. In this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. In addition, the one or more DSCs 28 are configured to sense and monitor one or more output electric power signals from the generator 4520 and to process those one or more output electric power signals to generate information that is provided to the one or more processing modules 42. Also, the mechanical energy source 1810 is connected to a generator 4520 directly or via one or more components coupling the mechanical energy source 1810 and the generator 4520.

Also, in this diagram, an electric power conditioning module 5040, which is in communication with the one or more processing modules 42, is configured to process the one or more output electric power signals that are output from the generator 4522 generate one or more conditioned output electric power signals to be provided to the load 4590 (e.g., which may include more than one load insert examples). The one or more DSCs 28 that are implemented as sensors to monitor the drive signals that are input to the electric power conditioning module 5040 that receives the one or more output electric power signals that are provided from the generator 4520. Note that these one or more DSCs 28 may be coupled to the one or more output electric power signals output from the generator 4520 and provided to the electric power conditioning module 5040 via one or more couplers 1660 (e.g., by operating in accordance with any of the one or more characteristics of a coupler as described herein, their equivalents, etc. and as may be desired in various examples).

In certain of the previous diagrams, one or more in-line DSCs are implemented to perform output electric power signal processing to generate the one or more conditioned output electric power signals that are provided to the load 4590. In this diagram, the electric power conditioning module 5040 is implemented to perform output electric power signal processing of the one or more output electric power signals generated by the generator 4520 to generate the one or more conditioned output electric power signals to be provided to the load 4590. The electric power conditioning module 5040 is configured to perform processing of the one or more output electric power signals from the generator 4520 based on the control and direction provided from the one or more processing modules 42 based on information provided from the one or more DSCs 28 regarding the one or more output electric power signals being provided from the generator 4520.

Generally speaking, such an implementation using an electric power conditioning module 5040 is operative using means that are alternative to in-line DSCs to perform such processing of the output electric power signals for additional means in conjunction with in-line DSCs to perform such processing of the output electric power signals to generate one or more conditioned output electric power signals to be provided to the load 4590. The electric power conditioning module 5040 may be implemented to perform any of a number of operations on the one or more output electric power signals to generate the one or more conditioned output electric power signals that are provided to the load 4590. Examples of such modification of the one or more output electric power signals may include any one or more of adjustment of the magnitude or amplitude of the voltage and/or current of the one or more output electric power signals, modification of the phase of the one or more output electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

In some examples, the electric power conditioning module 5040 is implemented to include a number of discrete elements that may be selected based on one or more control signals provided from the one or more processing modules 42. In an example, the electric power conditioning module 5040 includes filter banks having different properties, and one or more of those filters is selected by the one or more processing modules 42 to perform desired filtering on the one or more output electric power signals. In a specific example, when the one or more output electric power signals is adversely affected by one or more of noise, interference, undesired harmonics, glitches, etc., the one or more processing modules 42 is configured to select one or more filters from the filter banks element within the electric power conditioning module 5040 to reduce or remove the adverse effects from the one or more output electric power signals.

In another specific example, when the one or more output electric power signals is adversely affected by an overvoltage condition, the one or more processing modules 42 is configured to select an appropriate scaling factor and element within the electric power conditioning module 5040 (e.g., a voltage divider from among a number of available voltage dividers, to adjust a variable voltage divider to an appropriate value, etc.) so that the one or more conditioned output electric power signals that are provided to the load 4590 are done so in a manner that is in accordance with the requirements, constraints, ranges etc. by which the load 4590 operates, requires, and/or is best suited for.

In another specific example, when the one or more output electric power signals is adversely affected by an undervoltage condition such as a voltage sag, the one or more processing modules 42 is configured to select an appropriate scaling factor and element within the electric power conditioning module 5040 (e.g., an amplifier from among a number of available amplifiers, to adjust a programmable gain amplifier to an appropriate value, etc.) so that the one or more conditioned output electric power signals that are provided to the load 4590 are done so in a manner that is in accordance with the requirements, constraints, ranges etc. by which the load 4590 operates, requires, and/or is best suited for.

In another specific example, when the one or more output electric power signals is adversely affected by an out of phase condition, the one or more processing modules 42 is configured to select an appropriate phase adjustment value and element within the electric power conditioning module 5040 (e.g., a phase delay element implemented to delay a signal by an appropriate value, a phase advancement element implemented to advance a signal by an appropriate value, a programmable phase adjustment element that is adjusted to an appropriate value, etc.) so that the one or more conditioned output electric power signals that are provided to the load 4590 are done so in a manner that is in accordance with the requirements, constraints, ranges etc. by which the load 4590 operates, requires, and/or is best suited for.

Generally speaking, this diagram shows an implementation by which one or more DSCs 28 are implemented to perform sensing of the one or more output electric power signals that are being provided from the generator 4520 in electric power conditioning module 5040 and are implemented to provide information to one or more processing modules 42 that is configured to adapt operation of the electric power conditioning module 5040 to ensure that the one or more output electric power signals that are being provided from the generator 4520 have desired properties for the application. This diagram shows the feedforward implementation in which one or more output electric power signals output from the generator 4520 are sensed by the one or more DSCs 28, information generated based on that sensing is provided to the one or more processing modules 42, and the one or more processing modules 42 is configured to adapt operation of the electric power conditioning module 5040 to process those output from the electric power conditioning module 5040 as needed, desired, etc.

Figure 51:
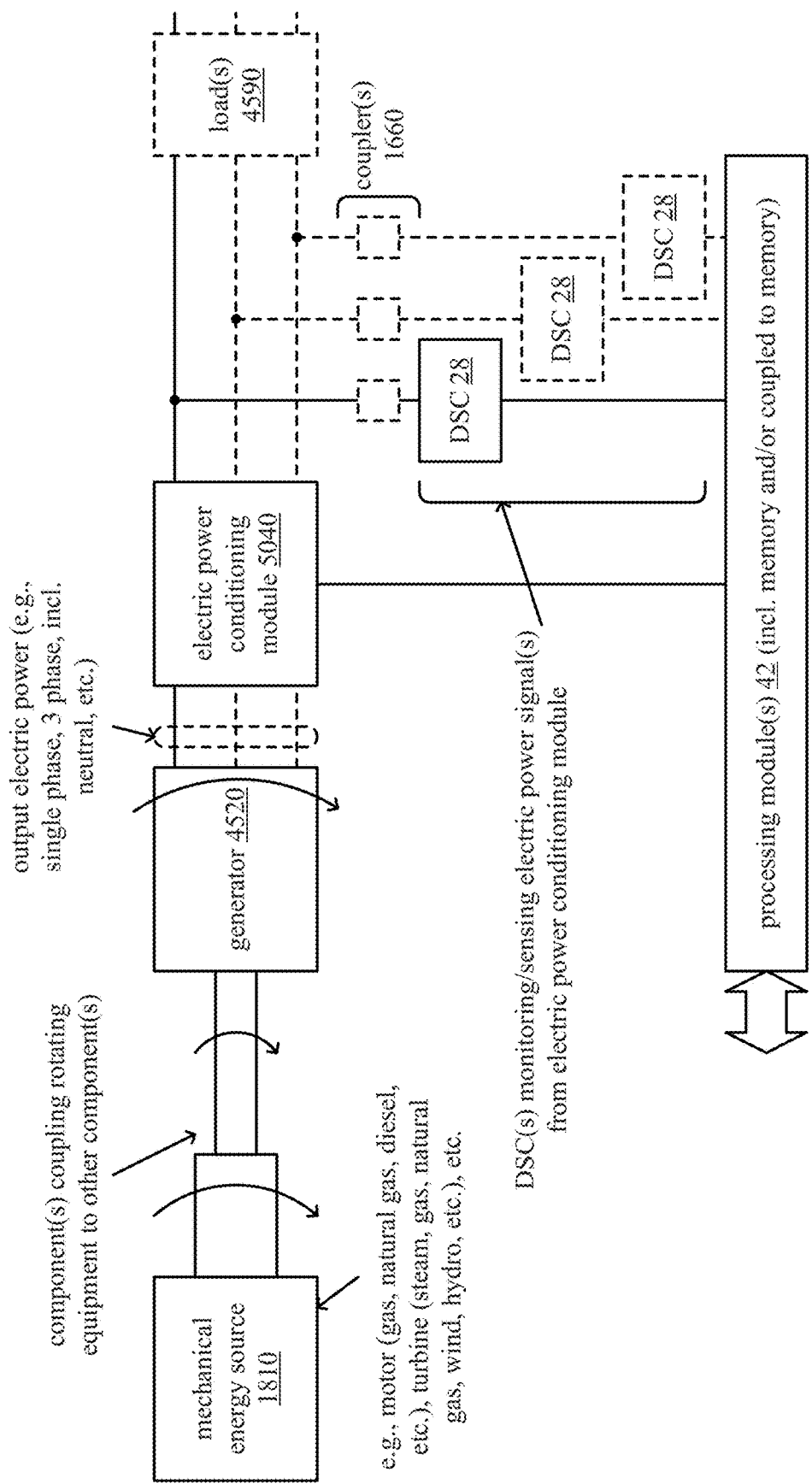
FIG. 51 is a schematic block diagram of another embodiment of generator output signal monitoring and conditioning in accordance with the present invention.

FIG. 51 is a schematic block diagram of another embodiment 5100 of generator output signal monitoring and conditioning in accordance with the present invention. This diagram as many similarities to the previous diagram with at least one difference being that one or more DSCs 28 are implemented to perform sensing of the one or more output electric power signals after they are received and processed by the electric power conditioning module 5040. This diagram shows a feedback implementation in which the one or more conditioned output electric power signals that are output from the electric power conditioning module 5040 are sensed by the one or more DSCs 28, information generated based on that sensing is provided to the one or more processing modules 42, and the one or more processing modules 42 is configured to adapt operation of the electric power conditioning module 5040. As in other diagrams, note that the one or more DSCs 28 that are implemented to perform sensing of the one or more output electric power signals may be implemented to receive one or more signals via one or more couplers 1660 (e.g., by operating in accordance with any of the one or more characteristics of a coupler as described herein, their equivalents, etc. and as may be desired in various examples).

Figure 52:
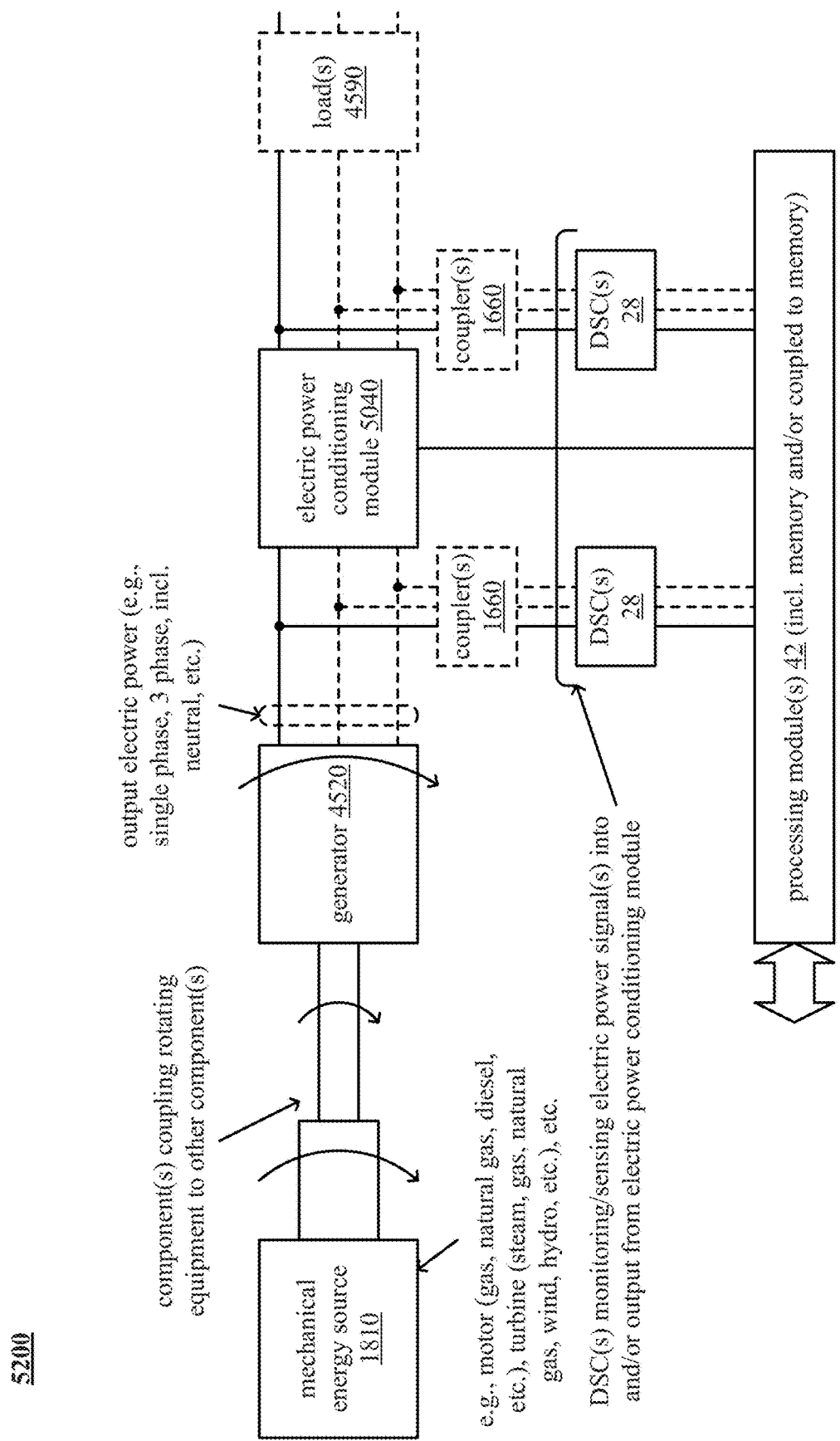
FIG. 52 is a schematic block diagram of another embodiment of generator output signal monitoring and conditioning in accordance with the present invention.

FIG. 52 is a schematic block diagram of another embodiment 5200 of generator output signal monitoring and conditioning in accordance with the present invention. This diagram as many similarities to certain of the previous diagrams with at least one difference being that a first one or more DSCs 28 are implemented to perform sensing of the one or more output electric power signals before they are received by the electric power conditioning module 5040 and a second one or more DSCs 28 are implemented perform sensing of the one or more conditioned output electric power signals that are output from the electric power conditioning module 5040 and provided to the load 4590.

This diagram shows a combination feedback and feedforward implementation in which the one or more output electric power signals output from the generator 4520 are sensed by the first one or more DSCs 28 and the one or more conditioned output electric power signals output from the electric power conditioning module 5040 are sensed by the second one or more DSCs 28, information generated based on the sensing as performed by the first one or more DSCs 28 and the second one or more DSCs 28 is provided to the one or more processing modules 42, and the one or more processing modules 42 is configured to adapt operation of the electric power conditioning module 5040. As in other diagrams, note that the first second one or more DSCs 28 that are implemented to perform sensing of the one or more output electric power signals and/or the second one or more DSCs 28 that are implemented to perform sensing of the one or more conditioned output electric power signals output from the electric power conditioning module 5040 may be implemented to receive one or more signals via one or more couplers 1660 (e.g., by operating in accordance with any of the one or more characteristics of a coupler as described herein, their equivalents, etc. and as may be desired in various examples).

Figure 53:
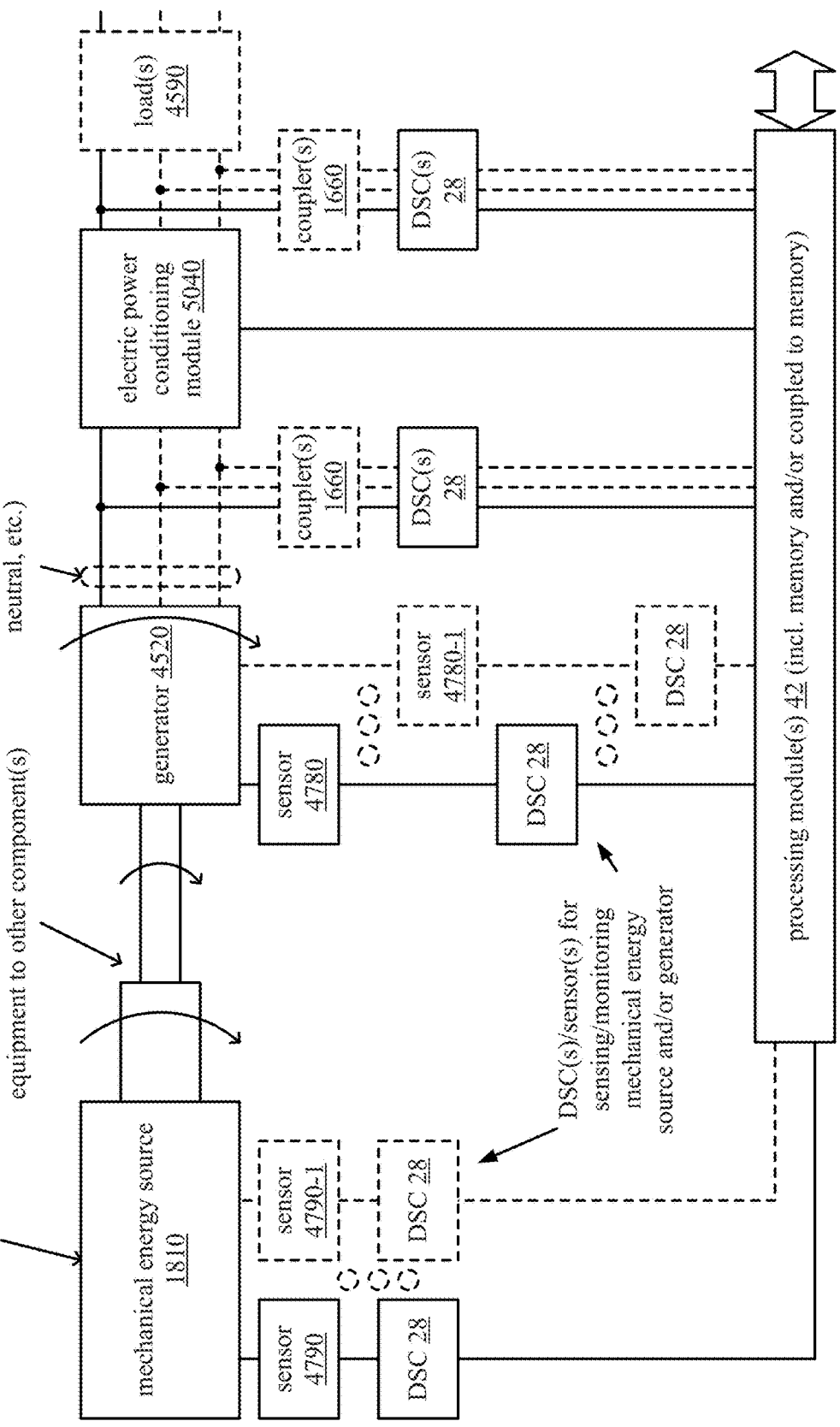
FIG. 53 is a schematic block diagram of another embodiment of generator output signal monitoring and conditioning in accordance with the present invention.

FIG. 53 is a schematic block diagram of another embodiment 5300 of generator output signal monitoring and conditioning in accordance with the present invention. This diagram as many similarities to the previous diagrams with at least one difference being that one or more sensors 4780 to 4780-1 are implemented to provide information regarding the generator 4520 to the one or more processing modules 42 and/or one or more sensors 4790 to 4790-1 are implemented to provide information regarding the mechanical energy source 1810 to the one or more processing modules 42.

In some examples, note that the respective one or more sensors 4780 to 4780-1 and/or the respective one or more sensors 4790 to 4790-1 are serviced using respective DSCs 28. In certain particular examples, the sensor 4780 is in communication with a DSC 28 that is in communication with the one or more processing modules 42. Similarly, in certain other examples, the sensor 4790 is in communication with the DSC that is in communication with the one or more processing modules 42. Generally speaking, one or more DSCs may be implemented to perform interaction with the one or more sensors and to provide information from the one or more sensors to the one or more processing modules 42 to be used thereby in accordance with adaptation of the operation of electric power conditioning module 5040. This diagram shows an example by which not only sensing of the one or more output electric power signals output from the generator 4520 that are provided to the electric power conditioning module 5040 and/or sensing of the one or more conditioned output electric power signals that are output from the electric power conditioning module 5040 is made, and that information provided from one or more sensors 4780 to 4780-1 and/or the one or more sensors 4790 to 4790-1 is also provided to the one or more processing modules 42 to be used as desired in accordance with adapting operation of the electric power conditioning module 5040.

Figure 54:
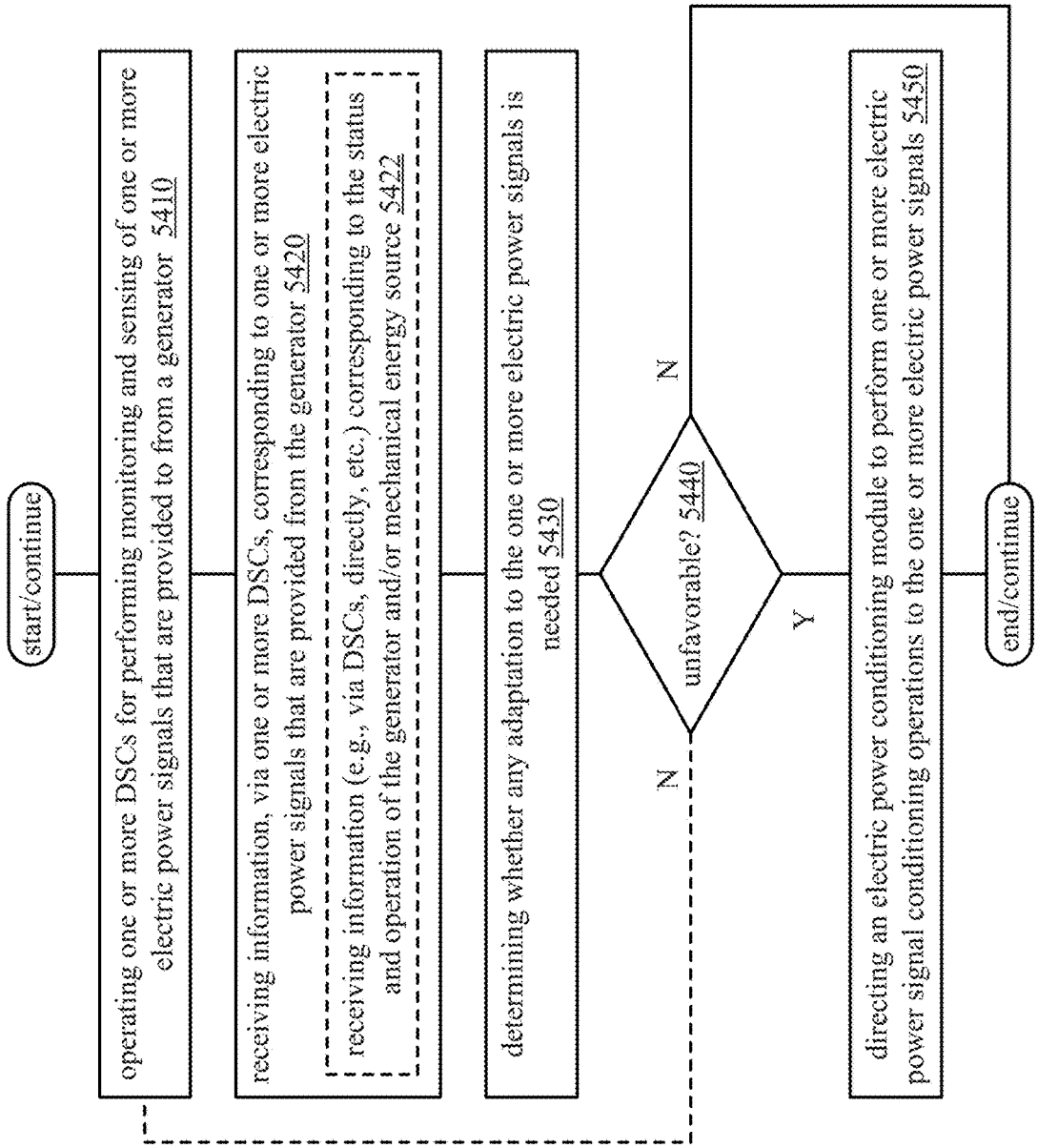
FIG. 54 is a schematic block diagram of another embodiment of a method for execution by one or more devices in accordance with the present invention.

FIG. 54 is a schematic block diagram of another embodiment 5400 of a method for execution by one or more devices in accordance with the present invention. The method 5400 operates by operating one or more DSCs for performing monitoring and sensing of one or more electric power signals that are provided from a generator in step 5410.

The method 5400 continues by operating one or more processing modules for receiving information, via one or more DSCs, corresponding to one or more electric power signals that are provided from the generator in step 5420. For example, in a 3-phase electric power signal implementation by which the generator is implemented to output 3-phase electric power, three respective DSCs are implemented to provide information corresponding to the three respective electric power signals that are provided to the rotating equipment.

Also, in some examples, one or more sensors, which may be serviced by one or more DSCs, are implemented to provide information regarding the status and operation of the generator itself and/or a mechanical energy source that is implemented to serve as the prime mover for the generator. Examples of such sensors implemented to provide information of the generator and/or mechanical energy source may include one or more of Hall effect sensors, optical speed sensors, temperature sensors, accelerometers such as may be implemented to monitor and detect for vibrations, etc. Similarly, such types of sensors may also be implemented to provide information regarding the load. In such examples in which one or more sensors are implemented to provide information regarding the status and operation of the generator and/or the mechanical energy source, the method 5400 also operates in step 5422 by operating one or more processing modules for receiving information (e.g., via DSCs in some examples, directly from the sensors and other examples, etc.) corresponding to the status and operation of the generator and/or the mechanical energy source.

The method 5400 continues in step 5430 by operating one or more processing modules to process the information for determining whether any adaptation to the one or more electric power signals is needed. Based on an unfavorable comparison of the one or more electric power signals (and/or the status and operation of the generator and/or the mechanical energy source) to one or more operational criteria in step 5440, the one or more processing modules operates by directing an electric power conditioning module to perform one or more electric power signal conditioning operations to the one or more electric power signals in step 5450. Some examples of unfavorable comparison of the one or more electric power signals to one or more operational criteria may include any one or more of the one or more electric power signals being of improper magnitude, improper phase, including an unacceptable amount of noise, interference, undesired harmonics, glitches, etc.

Some examples of unfavorable comparison of the status and operation of the generator and/or the mechanical energy source may include any one or more of overtemperature (e.g., temperature of the rotating equipment and/or load being above a prescribed or recommended upper temperature), under temperature (e.g., temperature of the rotating equipment and/or load being below a prescribed or recommended lower temperature), overspeed (e.g., the rotating equipment and/or load operating at faster than a prescribed or recommended speed), under speed (e.g., the rotating equipment and/or load operating at slower than a prescribed or recommended speed), slip of the rotating equipment (e.g., in a motoring application) being outside of a prescribed or recommended range, etc.

Some examples of modification of the one or more input electric power signals may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

In some examples, the information regarding the electric power signals is received by the one or more processing modules via one or more couplers that perform one or more of scaling, division, electrical isolation, etc. and/or some other processing of the one or more electric power signals to generate one or more other signals representative of the one or more electric power signals and these one or more other signals are provided and sensed by the one or more DSCs. Note also that the information that is received by the one or more processing modules may be received from sensing of the one or more electric power signals before and/or after the electric power conditioning module. Examples of such one or more electric power signal conditioning operations may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

Alternatively, based on a favorable comparison of the one or more electric power signals (and/or the status and operation of the generator and/or the mechanical energy source) to one or more operational criteria in step 5440, the method 5400 ends or continues such as by looping back and performing the operational step 5410 and continuing to perform the method 5400.

Figure 55:
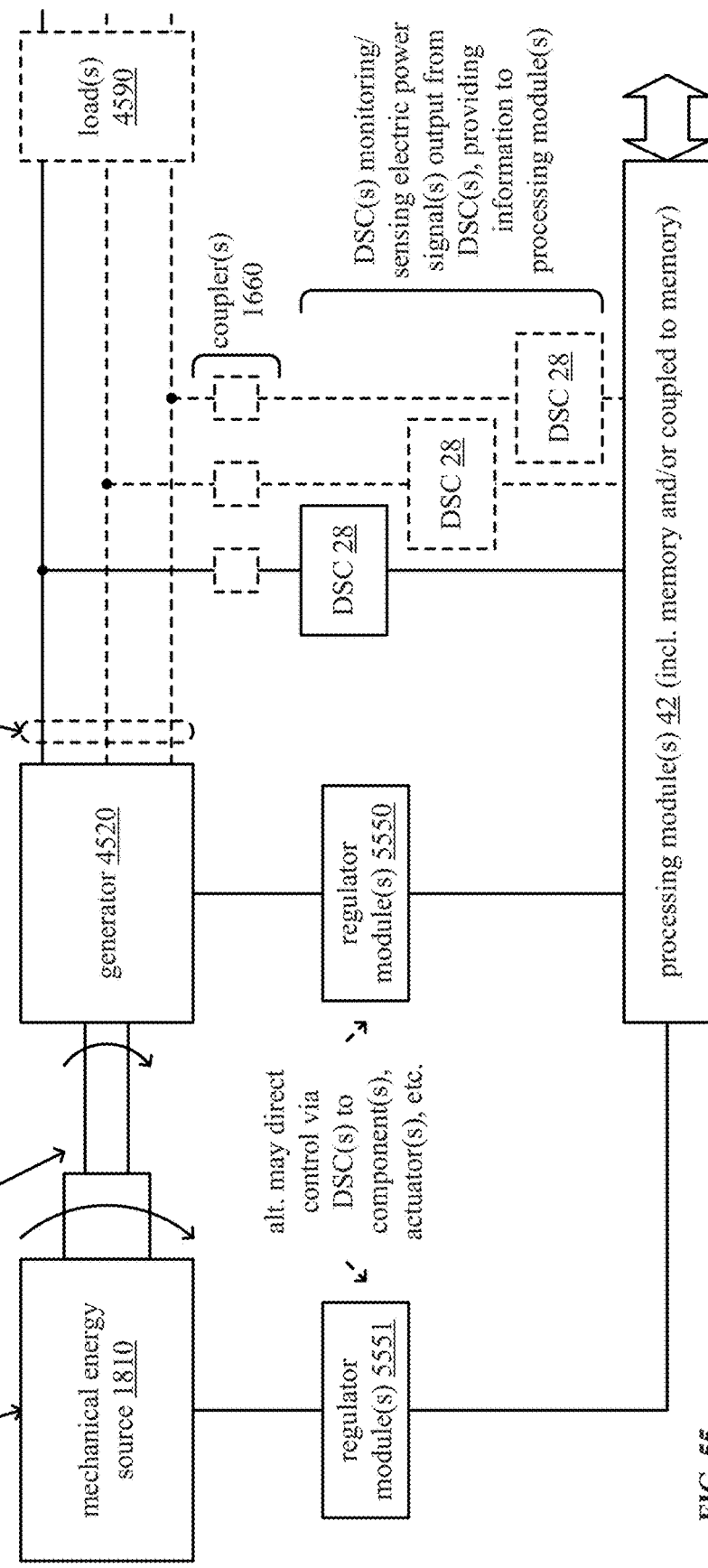
FIG. 55 is a schematic block diagram of an embodiment of prime mover and generator regulation based on output signal sensing in accordance with the present invention.

FIG. 55 is a schematic block diagram of an embodiment 5500 of prime mover and generator regulation based on output signal sensing in accordance with the present invention. This diagram has some similarities to certain of the previous diagrams. For example, in this diagram, one or more processing modules 42 is configured to communicate with and interact with one or more drive-sense circuits (DSCs) 28. The one or more processing modules 42 is coupled to the one or more DSCs 28 and is operable to provide control to and communication with the one or more DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. In addition, the one or more DSCs 28 are configured to sense and monitor one or more output electric power signals from the generator 4520 and to process those one or more output electric power signals to generate information that is provided to the one or more processing modules 42. Also, the mechanical energy source 1810 is connected to a generator 4520 directly or via one or more components coupling the mechanical energy source 1810 and the generator 4520.

Also, in this diagram, a first one or more regulator modules 3050 is in communication with the one or more processing modules 42 and is configured to adapt and direct operation of the mechanical energy source 1810. Similarly, a second one or more regulator modules 3051 is in communication with the one or more processing modules 42 and is configured to adapt and direct operation of the load 2090.

Generally speaking the one or more regulator modules 5551 is configured to control operation of the mechanical energy source 1810 and/or one or more associated components, and the one or more regulator modules 5550 is configured to control operation of the generator 4520 and/or one or more associated components. Considering the mechanical energy source 1810, the rotational speed of the rotor of the mechanical energy source 1810 may be adapted or adjusted by the one or more processing modules 42 via the one or more regulator modules 5551. In an example in which the mechanical energy source 1810 is a motor, a turbine, etc., the one or more processing modules 42, via the one or more regulator modules 5551, is configured to adjust the speed thereof (e.g., such as increasing speed, slowing speed such as braking, adjusting one or more operational parameters associated with one or more components of the motor, turbine, etc.).

In addition, one or more components may be associated with the mechanical energy source 1810. For example, the rotating equipment 1810 may include or have associated one or more vents, air flow mechanisms such as one or more cooling fans, environmental heating and/or cooling such as associated with an enclosed cover within which the mechanical energy source 1810 is located. The one or more processing modules 42, via the one or more regulator modules 5551 is configured to direct operation of any such associated components. For example, based on information provided via the sensing performed by the one or more DSCs 28, the one or more processing modules 42 is configured to control or adjust, via the one or more regulator modules 5551, the operation of any such components associated with the mechanical energy source 1810. In one example, the one or more processing modules 42 is configured, via the one or more regulator modules 5551, provide more or less airflow such as by opening or closing one or more vents and/or adjusting operation of one or more cooling fans. In another example, the one or more processing modules 42 is configured, via the one or more regulator modules 5551, adjust the temperature within an enclosure in which the mechanical energy source 1810 is located such as by controlling the heating venting air conditioning (HVAC) of the inside of the enclosure as is appropriate.

In another example, considering the mechanical energy source 1810 to be a wind turbine, the one or more processing modules 42 is configured, via the one or more regulator modules 5551, to adjust one or more operational parameters of the wind turbine such as the rate at which the rotor of the turbine rotates such as via a braking mechanism, the angular position of the blades of the wind turbine, the yaw and/or pitch of the wind turbine, and/or any other operational parameter associated with the wind turbine.

In another example, considering the mechanical energy source to be a hydro turbine the one or more processing modules 42 is configured, via the one or more regulator modules 5551, to adjust one or more operational parameters of the hydro turbine such as the waterflow going into and through the hydro turbine, the speed at which the hydro turbine rotates such as via a braking mechanism for increased waterflow, and/or any other operational parameter associated with the hydro turbine Similarly, the one or more processing modules 42 is configured, via the other one or more regulator modules 5550, to control operation of the generator 4520 and/or one or more associated components. Similarly, as described above with respect to the mechanical energy source 1810, the generator 4520 may include or have associated one or more vents, air flow mechanisms such as one or more cooling fans, environmental heating and/or cooling such as associated with an enclosed cover within which the generator 4520 is located. The one or more processing modules 42, via the one or more regulator modules 5550 is configured to direct operation of any such associated components. For example, based on information provided via the sensing performed by the one or more DSCs 28, the one or more processing modules 42 is configured to control or adjust, via the one or more regulator modules 5550, the operation of any such components associated with the generator 4520. In one example, the one or more processing modules 42 is configured, via the one or more regulator modules 5550, provide more or less airflow such as by opening or closing one or more vents and/or adjusting operation of one or more cooling fans. In another example, the one or more processing modules 42 is configured, via the one or more regulator modules 5550, adjust the temperature within an enclosure in which the generator 4520 is located such as by controlling the heating venting air conditioning (HVAC) of the inside of the enclosure as is appropriate.

Generally speaking, the one or more processing modules 42 is configured, via the one or more regulator modules 5551, to control operation of the mechanical energy source 1810 and/or one or more components associated therewith as well as, via the one or more regulator modules 5550, to control operation of the generator 4520 and/or one or more components associated therewith. In this diagram, the one or more processing modules 42 is configured to effectuate such control based on information received via the one or more DSCs 28 that are configured to sense the one or more input electric power signals that are being provided to the mechanical energy source 1810. In addition, in some examples, note that the one or more regulator modules 5551 and/or the one or more regulator modules 5550 are configured to effectuate control of one or more components of the mechanical energy source 1810 and the generator 4520 directly, via one or more DSCs that are configured to facilitate the operation of those one or more components, etc. That is to say, communication with control of, and interaction with any one of the components and/or associated components of the mechanical energy source 1810 and/or generator 4520 may be facilitated via an appropriately implemented DSC that interacts with the component. In such instances and in certain examples, note that the one or more regulator modules 5551 and/or the one or more regulator modules 5550 may be configured not only to direct control of the one or more components, but also to sense information via the respective one or more control signal lines provided to the one or more components. The drive-sense functionality of a DSC 28 as described herein is configured not only to drive a signal via a signal line to facilitate operation of a component but also to sense information regarding operation of the component via the signal line.

FIG. 56 is a schematic block diagram of another embodiment 5600 of prime mover and generator regulation based on output signal sensing in accordance with the present invention. This diagram as many similarities to the previous diagrams with at least one difference being that one or more sensors 4780 to 4780-1 are implemented to provide information regarding the generator 4520 to the one or more processing modules 42 and/or one or more sensors 4790 to 4790-1 are implemented to provide information regarding the mechanical energy source 1810 to the one or more processing modules 42.

In some examples, note that the respective one or more sensors 4780 to 4780-1 and/or the respective one or more sensors 4790 to 4790-1 are serviced using respective DSCs 28. In certain particular examples, the sensor 4780 is in communication with a DSC 28 that is in communication with the one or more processing modules 42. Similarly, in certain other examples, the sensor 4790 is in communication with the DSC that is in communication with the one or more processing modules 42.

In such an implementation, the one or more processing modules 42 is configured also to consider information provided via the one or more sensors 4780 to 4780-1 that are implemented to provide information regarding the generator 4520 and/or the respective one or more sensors 4790 to 4790-1 that are implemented to provide information regarding the mechanical energy source 1810.

Figure 57:
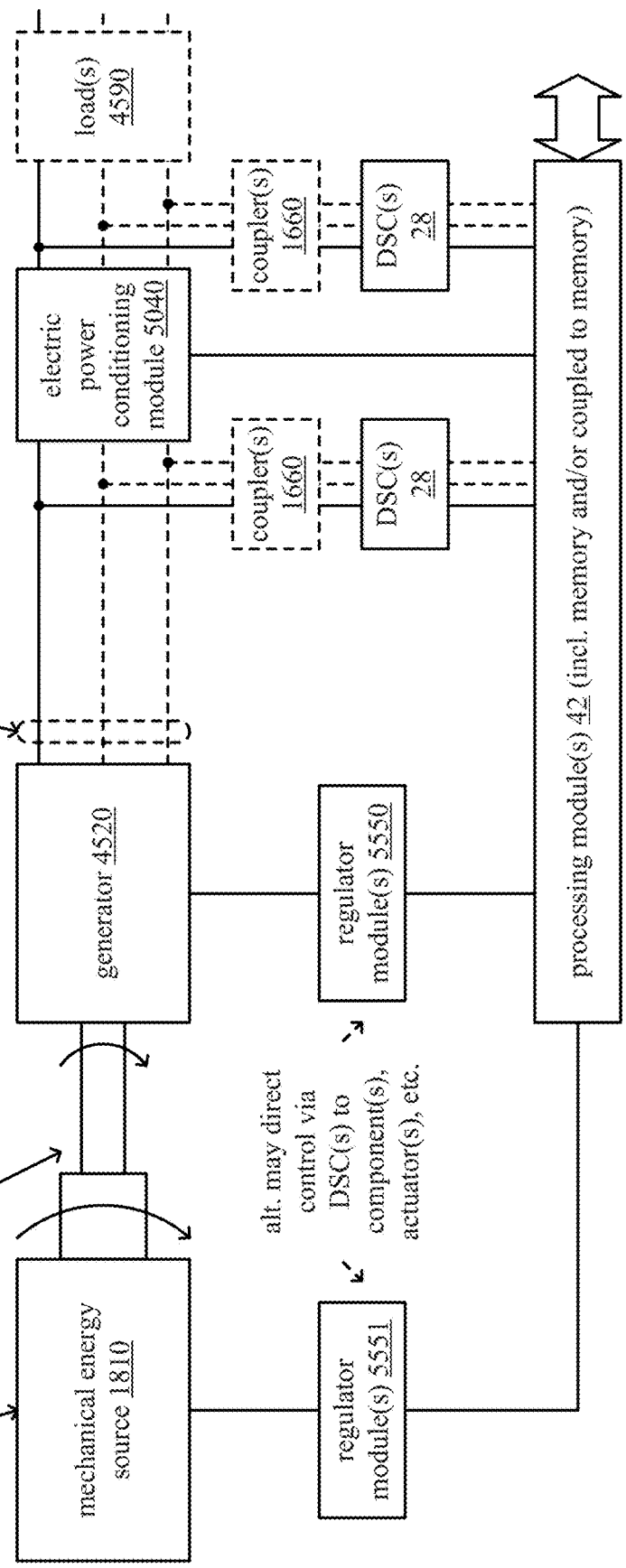
FIG. 57 is a schematic block diagram of another embodiment of prime mover and generator regulation based on output signal sensing in accordance with the present invention.

FIG. 57 is a schematic block diagram of another embodiment 5700 of prime mover and generator regulation based on output signal sensing in accordance with the present invention. This diagram as many similarities to certain of the previous diagrams (e.g., including electric power conditioning module 5040, one or more DSCs 28 implemented to perform sensing of signals being provided to or output from the electric power conditioning module 5040, etc.) including that an electric power conditioning module 5040 is implemented to process the one or more output electric power signals to generate one or more conditioned output electric power signals that are provided to the generator 4520. In addition, as desired in certain examples, the first one or more DSCs 28 (optionally connected via one or more couplers 1660) is configured to monitor and sense the one or more output electric power signals that are provided from the generator 4520 to the electric power conditioning module 5040 and/or a second one or more DSCs 28 (optionally connected via one or more couplers 1660) is configured to monitor and sense the one or more conditioned output electric power signals output from the electric power conditioning module 5040 and provided to the load 4590.

This diagram shows an example by which sensing of the one or more input electric power signals into the electric power conditioning module 5040 and/or sensing of the one or more conditioned output electric power signals output from the electric power conditioning module 5040 may be made to generate information of the signals being provided to and from the electric power conditioning module 5040, and that information is provided to the one or more processing modules 42 to be used as desired in accordance with adapting operation of any one or more of the electric power conditioning module 5040, the one or more regulator modules 3050, and/or the one or more regulator modules 3051 to effectuate control of any one or more of the components within the system.

FIG. 58 is a schematic block diagram of another embodiment 5800 of prime mover and generator regulation based on output signal sensing in accordance with the present invention. This diagram as many similarities to the previous diagram with at least one difference being that one or more sensors 4780 to 4780-1 are also implemented to provide information regarding the generator 4520 to the one or more processing modules 42 and/or one or more sensors 4790 to 4790-1 are implemented to provide information regarding the mechanical energy source 1810 to the one or more processing modules 42. The one or more processing modules 42 is configured to receive information from the first one or more DSCs 28 that are configured to sense and monitor the one or more input electric power signals being provided to the electric power conditioning module 5040, the one or more conditioned output electric power signals output from the electric power conditioning module 5040, information provided via the one or more sensors 4780 to 4780-1 that are implemented to provide information regarding the generator 4520, and/or information provided via the one or more sensors 4790 to 4790-1 that are implemented to provide information regarding the mechanical energy source 1810 to effectuate control of any one or more of the components within the system.

FIG. 59 is a schematic block diagram of another embodiment of a method 5900 for execution by one or more devices in accordance with the present invention. The method 5900 operates by operating one or more DSCs for performing monitoring and sensing of one or more electric power signals that are provided from a generator in step 5910. The method 5900 continues by operating one or more processing modules for receiving information, via one or more DSCs, corresponding to one or more electric power signals that are provided from the generator in step 5920. For example, in a 3-phase electric power signal implementation by which the generator is implemented to output 3-phase electric power, three respective DSCs are implemented to provide information corresponding to the three respective electric power signals that are provided to the rotating equipment.

Also, in some examples, one or more sensors, which may be serviced by one or more DSCs, are implemented to provide information regarding the status and operation of the generator itself and/or a mechanical energy source that is being serviced by the generator. Examples of such sensors implemented to provide information of the generator may include one or more of Hall effect sensors, optical speed sensors, temperature sensors, accelerometers such as may be implemented to monitor and detect for vibrations, etc. Similarly, such types of sensors may also be implemented to provide information regarding the mechanical energy source. In such examples in which one or more sensors are implemented to provide information regarding the status and operation of the generator itself and/or a mechanical energy source, the method 5900 also operates in step 5922 by operating one or more processing modules for receiving information (e.g., via DSCs in some examples, directly from the sensors and other examples, etc.) corresponding to the status and operation of the generator and/or the mechanical energy source.

The method 5900 continues in step 5930 by operating one or more processing modules to process the information for determining whether any adaptation to the operation of the generator and/or mechanical energy source is needed. Based on an unfavorable comparison of the one or more electric power signals (and/or the status and operation of the generator and/or the mechanical energy source) to one or more operational criteria in step 5940, the one or more processing modules operates by directing, via one or more regulator modules, adaptation of the generator and/or mechanical energy source in step 5950. Some examples of unfavorable comparison of the one or more electric power signals to one or more operational criteria may include any one or more of the one or more electric power signals being of improper magnitude, improper phase, including an unacceptable amount of noise, interference, undesired harmonics, glitches, etc.

Some examples of modification of the one or more input electric power signals may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

Some examples of unfavorable comparison of the status and operation of the generator and/or mechanical energy source may include any one or more of overtemperature (e.g., temperature of the generator and/or mechanical energy source being above a prescribed or recommended upper temperature), under temperature (e.g., temperature of the generator and/or mechanical energy source being below a prescribed or recommended lower temperature), overspeed (e.g., the generator and/or mechanical energy source operating at faster than a prescribed or recommended speed), under speed (e.g., the generator and/or mechanical energy source operating at slower than a prescribed or recommended speed), slip of the generator being outside of a prescribed or recommended range, etc.

Some examples of directing adaptation (e.g., from the one or more processing modules via the one or more regulator modules) of the generator and/or mechanical energy source may include any one or more of adjusting the rotational speed of the rotor of the generator. Some other examples of directing adaptation (e.g., from the one or more processing modules via the one or more regulator modules) of the generator and/or mechanical energy source may include any one or more of adjusting venting, air flow mechanisms such as one or more cooling fans, environmental heating and/or cooling such as associated with one or more enclosed covers within which the generator and/or mechanical energy source is/are located, controlling or adjusting the operation of any such components associated with the generator and/or mechanical energy source, providing more or less airflow such as by opening or closing one or more vents and/or adjusting operation of one or more cooling fans associated with the generator and/or mechanical energy source, adjusting the temperature within one or more enclosures in which the generator and/or mechanical energy source is located such as by controlling the heating venting air conditioning (HVAC) of the inside of the enclosures as is appropriate.

In some examples, the information regarding the electric power signals is received by the one or more processing modules via one or more couplers that perform one or more of scaling, division, electrical isolation, etc. and/or some other processing of the one or more electric power signals to generate one or more other signals representative of the one or more electric power signals and these one or more other signals are provided and sensed by the one or more DSCs. Note also that the information that is received by the one or more processing modules may be received from sensing of the one or more electric power signals before and/or after the electric power conditioning module. Examples of such one or more electric power signal conditioning operations may include any one or more of adjustment of the magnitude or amplitude of the voltage and/or current of the one or more input electric power signals, modification of the phase of the one or more input electric power signals (e.g., advance or delay), filtering (e.g., low pass filtering, bandpass filtering, high pass filtering, and/or any combination thereof), reduction or removal of one or more effects on the one or more motor drive signals (e.g., noise, interference, undesired harmonics, glitches, etc.).

Alternatively, based on a favorable comparison of the one or more electric power signals (and/or the status and operation of the generator and/or the mechanical energy source) to one or more operational criteria in step 5940, the method 5900 ends or continues such as by looping back and performing the operational step 5910 and continuing to perform the method 5900.

In addition, in certain examples, note that both operation related to directing adaptation (e.g., from the one or more processing modules via the one or more regulator modules) of the generator and/or mechanical energy as well as directing adaptation of the one or more electric power signals may both be performed within an alternative method that not only performs regulation of the operation of the generator and/or mechanical energy but also electric power conditioning of the one or more electric power signals output from the generator.

Figures 60A, 60B:
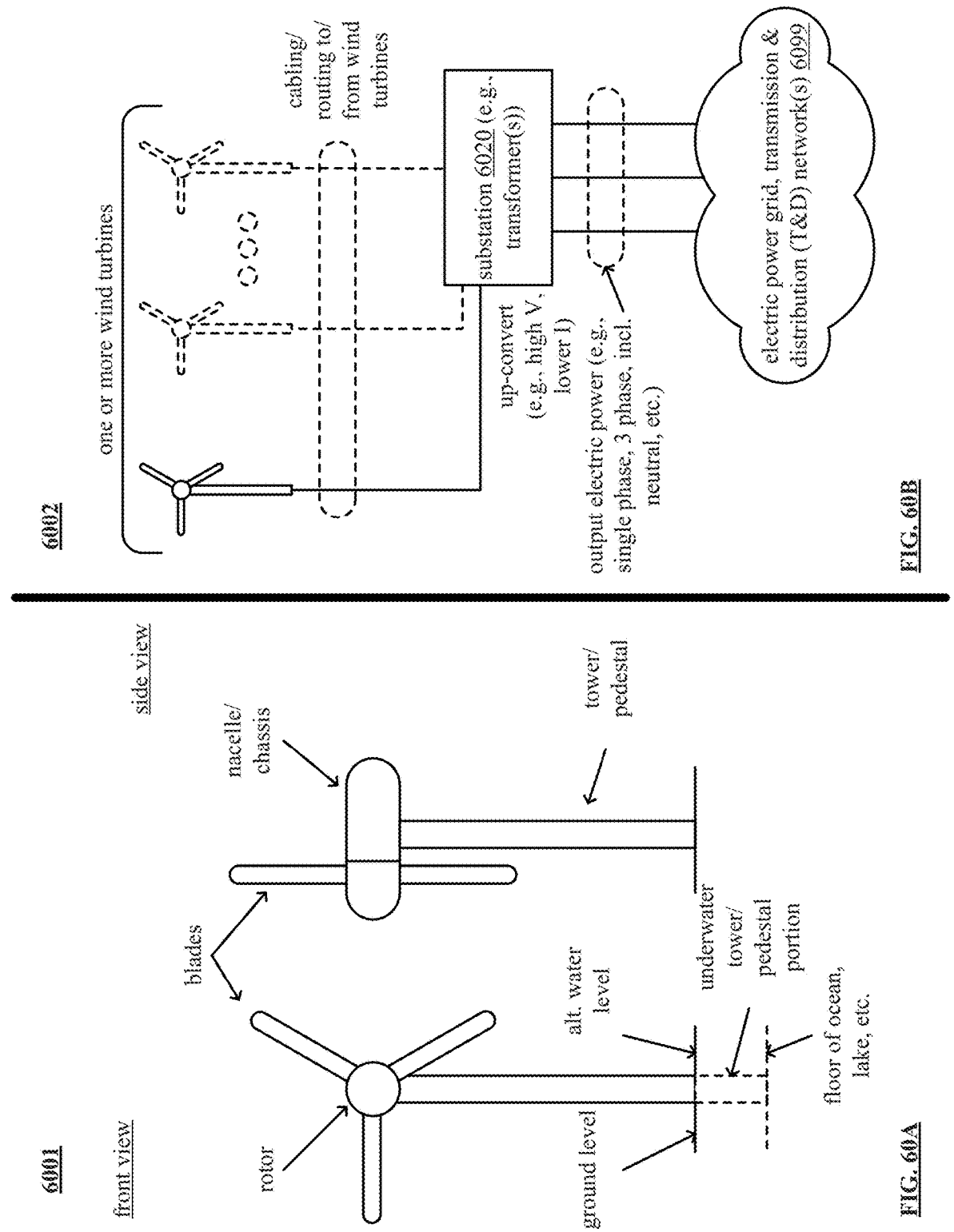
FIG. 60A is a schematic block diagram of an embodiment of a wind turbine operative in accordance with the present invention.
FIG. 60B is a schematic block diagram of an embodiment of one or more wind turbines operative in accordance with the present invention.

FIG. 60A is a schematic block diagram of an embodiment 6001 of a wind turbine operative in accordance with the present invention. Generally speaking, a wind turbine is an electric power generating system in which the mechanical energy source is based on rotating blades attached to the rotor that is used to drive a generator either via a direct connection between the rotor of the wind turbine or via one or more coupling means, such as the gearbox. From certain perspectives, a wind turbine operates in the opposite manner as a fan, in that, as the wind facilitates rotation of the rotor of the wind turbine, that rotating mechanical energy is harnessed to drive the rotor of a generator. As the wind turns the blades of the wind turbine, and as that rotating mechanical energy drives the rotor of the generator, the generator outputs electric power.

Wind turbines may be implemented in a number of different ways and in a number of different locations and installations. For example, some wind turbines are installed on the ground, while others are installed offshore open (e.g., such as installed and mounted on the floor of an ocean, lake, etc.). Generally speaking, wind turbines are installed in locations prone to have a regular amount of wind. In this diagram, and wind turbine is shown as including an number of blades connected to a rotor that is mounted to a nacelle/chassis at the top of the tower/pedestal. Again, note that such a wind turbine maybe mounted at ground level (e.g., in a non-water installation) for mounted to a sea or lake bottom such as in a water installation.

In some examples, the nacelle/chassis located at the top of the tower/pedestal includes a number of components of the wind turbine and generator system. In addition, certain components are also implemented within the tower/pedestal to facilitate operation of the wind turbine. For example, the nacelle/chassis may be implemented to include the generator itself, various other components including directional control of the wind turbine so as to facilitate directing it into the direction from which the wind is coming, adjustment of various parameters such as pitch and yaw of the nacelle/chassis, various environmental sensing components such as wind direction sensors, wind speed sensors, temperature sensors, humidity sensors, etc., one or more gearboxes that facilitate coupling between the rotor of the wind turbine and the rotor of the generator, one or more processing modules to facilitate control of the various components of the wind turbine, etc.

FIG. 60B is a schematic block diagram of an embodiment 6002 of one or more wind turbines operative in accordance with the present invention. This diagram shows one or more wind turbines implemented in a system in which they provide electric power signals to a substation 6020 (e.g., such as including one or more transformers implemented to up convert the output electric power signals from the one or more wind turbines to an appropriate voltage for delivery, transmission, and consumption within an electric power grid that includes one or more transmission and distribution (T&D) networks 6099). Note that any one individual wind turbine may be implemented to output electric power of a particular type such as single phase, 3-phase, single or 3-phase including a neutral, etc. In some examples, three different respective wind turbines are implemented each individually to output single phase electric power, and in combination, those three different respective wind turbines provide 3-phase electric power. In other examples, each individual wind turbine is implemented to output 3-phase electric power.

The tower/pedestal includes appropriate cabling to deliver the one or more output electric power signals from the generator of the wind turbine to the substation 6020. In addition, in some instances, one or more communication lines are included within the tower/pedestal to facilitate communication and control of one or more components of the wind turbine from a remote location. In some instances, a control house that is remotely located from the one or more wind turbines is in communication with the one or more wind turbines and facilitates their control and operation.

Figure 61:
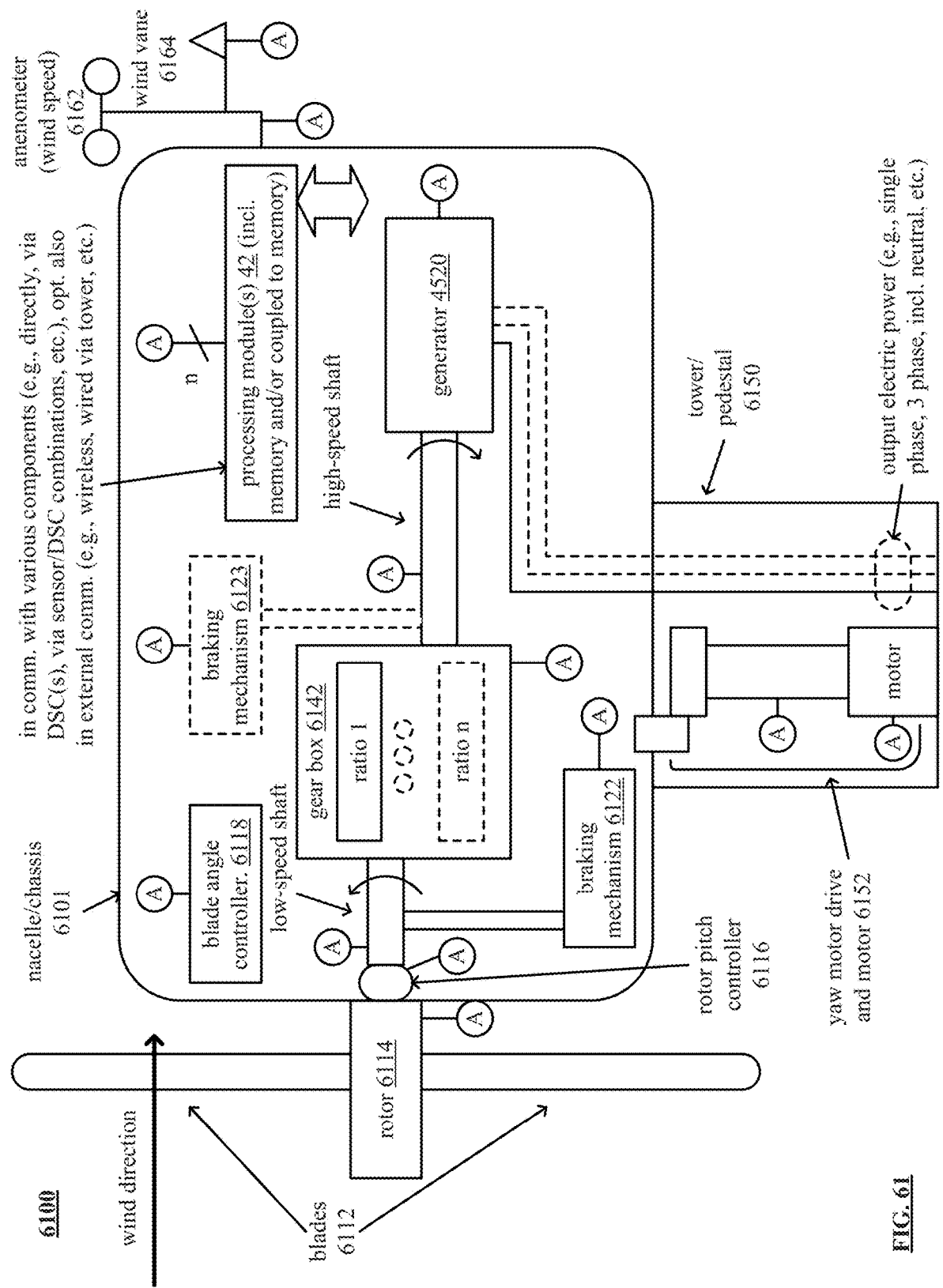
FIG. 61 is a schematic block diagram of an embodiment of wind turbine generation system control feedback and adaptation in accordance with the present invention.

FIG. 61 is a schematic block diagram of an embodiment 6100 of wind turbine generation system control feedback and adaptation in accordance with the present invention. This diagram shows further details of some of the various components that may be implemented within a wind turbine. A nacelle/chassis 6101 is located at the top of the tower/pedestal 6150. The nacelle/chassis 6101 is also coupled to a rotor 6114 having a desired number of blades 6112 attached thereto. In some examples, a wind turbine includes three blades 6112 attached to the rotor 6114. The nacelle/chassis 6101 also includes an anemometer 6162 configured to provide information regarding wind speed and a wind vane 6164 configured to provide information regarding wind direction. The number of additional environmental sensors may also be implemented within or on the nacelle/chassis 6101.

In this diagram, the rotor 6114 is coupled to a rotor pitch controller 6114 and a low-speed shaft that connects to a gearbox 6142. The gearbox 6142 is configured to provide coupling to a high-speed shaft that couples to a rotor of a generator 4520. In some examples, the gearbox 6142 is configurable to effectuate the coupling between the low-speed shaft in a high-speed shaft in any one of a number of desired ratios, shown as ratio 1 through ratio n. Note that some wind turbines operate synchronously such that the rate of rotation of the rotor of the wind turbine is same as the rate of rotation of the rotor of the generator associated therewith. In such instances, the ratio of the gearbox 6142 is 1. In some alternative implementations, the wind turbine does not include a gearbox 6142 and the rotor of the wind turbine is coupled to the rotor of the generator and they operate synchronously with one another such that the rate of rotation of the rotor 6114 is same as the rate of rotation of the rotor of the generator 4520.

Depending on the rate of rotation of the rotor 6114 and the low-speed shaft, the gearbox 6142 maybe control to operate based on a given ratio to ensure appropriate rotational speed of the high-speed shaft that couples to the rotor of the generator 4520. A braking mechanism 6122 is configured to perform braking operations on the low-speed shaft. In some examples, a braking mechanism 6123 is also implemented to perform braking operations on the high-speed shaft. A blade angle controller 6118 is implemented to control the angular position of the blades 6112 as they are attached to the rotor 6114. In addition, within the tower/pedestal 6150, a yaw motor drive and motor 6152 is implemented to control the direction in which the rotor 6114 of the wind turbine is directed (e.g., such as to facilitate directing the rotor 6114 directly into the direction from which the wind is coming).

Also, in this diagram, one or more processing modules 42 is configured to communicate with and interact with one or more drive-sense circuits (DSCs) that are in communication with the various components of the wind turbine. The one or more processing modules 42 is coupled to the one or more DSCs and is operable to provide control to and communication with the one or more DSCs. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In addition, note that the one or more processing modules 42 may be in communication with one or more of the various components of the wind turbine directly (e.g., not via a DSC 28). That is to say, the one or more processing modules 42 may be in communication with one or more of the various components of the wind turbine via one or more DSCs 28 and also be in communication with another one or more of the various components of the wind turbine directly (e.g., not via a DSC 28). In addition, the one or more processing modules 42 may be in communication via one or more DSCs with one or more sensors implemented within the wind turbine to provide information regarding environmental conditions, status of operation of one or more components of the wind turbine, status regarding various electrical and/or electric power signals of the wind turbine including the output electric power signals provided from the generator 4520, etc. Generally speaking, the communication and inter-connectivity between the one or more processing modules 42 and the one or more of the various components of the wind turbine is shown in in the diagram via the one or more connections depicted by "A". Again, in some examples, note that this communication and inter-connectivity may be implemented using one or more DSCs.

For example, the one or more processing modules 42 is configured to communicate with, interact with, receive information from, and/or provide control signaling to the one or more components of the wind turbine. For example, based on information regarding wind speed and/or wind directionality as provided from the anemometer 6162 and/or the wind vane 6164, the one or more processing modules 42 is configured to change the direction of the wind turbine by providing appropriate control signaling to the yaw motor drive and motor 6152 and/or the pitch of the wind turbine by providing appropriate control signaling to the rotor pitch controller 6114. Based on information regarding rotation of the low-speed shaft being greater than a desired rotational rate, the one or more processing modules 42 is configured to facilitate slowing of the low-speed shaft by providing appropriate control signaling the braking mechanism 6122. In general, the communication interfacing between the one or more processing modules 42 in the various components of the wind turbine may be facilitated via one or more DSCs.

In addition, one or more DSCs may be implemented to perform processing, conditioning, sensing, etc. of any of the various electrical signals within the wind turbine including the output electric power signals provided from the generator 4520. Also, in some examples, one or more sensors are implemented on and/or associated one or more components of the wind turbine. The one or more processing modules 42 is configured to receive information from the various sensors and use that information in the control and operation of the wind turbine.

Moreover, with respect to the generator 4520, any of the one or more various examples, embodiments, etc. as described herein directed towards processing, conditioning, etc. of the one or more output electric power signals provided from the generator (e.g., such as with respect to one or more in-line DSCs, one or more sensor implemented DSCs, operation in accordance with an electric power conditioning module, etc.) and/or sensors implemented on and/or associated with the generator 4520 and/or the mechanical energy source 1810, which in this case is the wind turbine, may also be implemented with respect to the wind turbine. The use of one or more appropriately implemented DSCs facilitate the one or more processing modules 42 to improve the efficiency of the wind turbine including appropriately adapting operation of the one or more components thereof (e.g., controlling and adapting as needed the appropriate gear ratio of the gearbox 6142, the directionality of the wind turbine using the yaw motor drive and motor 6152 and/or the rotor pitch controller 6116, controlling the rotational speed of the low-speed shaft and/or the high-speed shaft, etc.).

FIG. 62 is a schematic block diagram of another embodiment 6200 of wind turbine generation system control feedback and adaptation in accordance with the present invention. This diagram shows one or more processing modules 42 in communication with various elements of the wind turbine including the rotor pitch controller 6116, braking mechanism 6122 (and/or braking mechanism 6123), gearbox 6142, blade angle controller 6118, generator controller and one or more sensors 6121, yaw motor drive and motor 6152, wind vane 6164, anemometer 6162 to provide information regarding wind speed, and/or any other components or elements 6199 of the wind turbine 6199.

Also, in this diagram, one or more processing modules 42 is configured to communicate with and interact with one or more drive-sense circuits (DSCs) that are in communication with at least some of the various components of the wind turbine. The one or more processing modules 42 is coupled to the one or more DSCs and is operable to provide control to and communication with the one or more DSCs. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In an example of operation and implementation, sensor information, sensor related information, information from the one or more DSCs, etc. is received by the one or more processing modules 42. The one or more processing modules 42 is configured to perform processing, at adaptation determination, etc. as may be required or desired for any of the one or more components of the wind turbine. Based on the determination to perform adaptation of one or more of the components, the one or more processing modules 42 is configured to communicate with those one or more components of the wind turbine to adapt the operation thereof. In addition, in some examples, the one or more processing modules 42 is also configured to direct one or more components to processing, conditioning, etc. of the one or more output electric power signals provided from the generator 4520.

FIG. 63 is a schematic block diagram of another embodiment of a method 6300 for execution by one or more devices in accordance with the present invention. The method 6300 operates in step 6310 by operating one or more processing modules for directing and controlling operation of one or more components of a wind turbine. In addition, the method 6300 continues in step 6320 by operating the one or more processing modules for communicating with and interacting with one or more DSCs that are in communication with at least some of the various components of the wind turbine. In various examples, the one or more DSCs are implemented to service the control signals being provided to the one or more components of the wind turbine, are implemented to service one or more sensors or transducers that are implemented to provide information regarding the operation and status of one or more components of the wind turbine, etc. In addition, in other examples, note that the one or more processing modules are directly in communication with certain of the components of the wind turbine without being in communication with such components via DSCs.

The method 6300 continues by operating one or more processing modules for receiving information, via one or more DSCs and/or directly from the one or more sensors or one or more components of the wind turbine, corresponding to the operation and status of one or more components of the wind turbine, etc. in step 6330. In some examples, know that the one or more processing modules is configured to determine information based information that is related to a change of an electrical characteristic of a control signal that is provided via a DSC to a particular component of the wind turbine. For example, when a DSC is implemented to facilitate the delivery of a control signal from the one or more processing modules to a particular component of the wind turbine, that particular DSC is configured to provide feedback and information to the one or more processing modules to be used by the one or more processing modules to determine the operation status of that particular component. In addition, when a DSC is implemented to facilitate delivery of information regarding the status or operation of sensor, that particular DSC is configured to provide feedback and information to the one or more processing modules to be used by the one or more processing modules to determine the value of the particular parameter that is being senses by that sensor.

The method 6300 continues in step 6340 by operating one or more processing modules for processing the information provided via the one or more DSCs, provided directly from the one or more sensors, provided directly from the one or more components of the wind turbine, etc. for determining whether any adaptation to the operation any one or more of the components of the wind turbine is needed. Based on an unfavorable comparison of the information received to one or more operational criteria in step 6350, the one or more processing modules operates by directing adaptation of the operation of one or more of the components of the wind turbine in step 6360.

Some examples of unfavorable comparison of the information received to the one or more operational criteria may include any one or more of the wind turbine not being appropriately directed into the direction of the incoming wind, an overspeed or under speed indication of any one or more of a rotor of the wind turbine, a low-speed shaft, a high-speed shaft, the rotor of the generator, etc., an under temperature or over temperature of one of the components of the wind turbine, etc.

Some examples of modification of the operation of the one or more components of the wind turbine may include any one or more of adjusting the rotational speed of the rotor of the generator or the rotational speed of the rotor of the wind turbine, the ratio operative within a gearbox of the wind turbine, adapting the direction, yaw, pitch, and/or yaw of the wind turbine, engaging one or more braking mechanisms to facilitate slowing of one of the rotational components of the wind turbine, adjusting the blade angle of the blades of the wind turbine, etc., facilitating venting, heating, cooling, HVAC, etc. to correct an under temperature or over temperature condition associated with one or more of the components of the wind turbine to bring them within specified or recommended operational range, etc.

Alternatively, based on a favorable comparison of the information received to the one or more operational criteria in step 6350, the method 6300 ends or continues such as by looping back and performing the operational step 6310 and continuing to perform the method 6300.

Hydro turbines and steam turbines are other types of mechanical energy sources that may be used to drive the rotor of a generator. With respect to such hydro turbines and steam turbines, two mechanisms by which they operate include impulse and reaction.

Figure 64B:
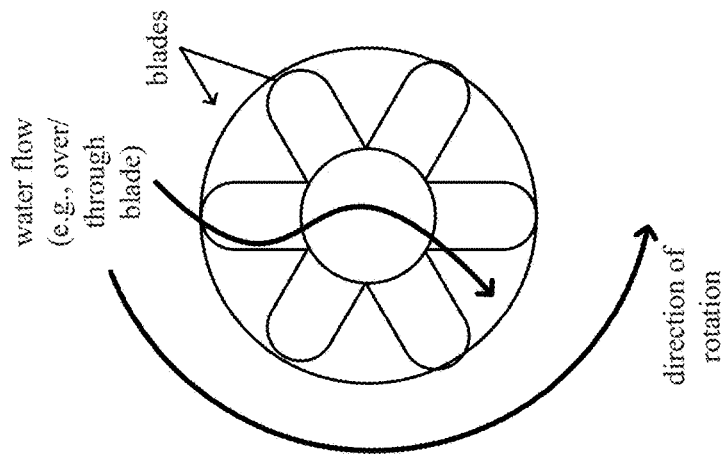
FIG. 64B is a schematic block diagram of an embodiment of blades of a reaction hydro turbine or steam turbine in accordance with the present invention.
Figure 64A:
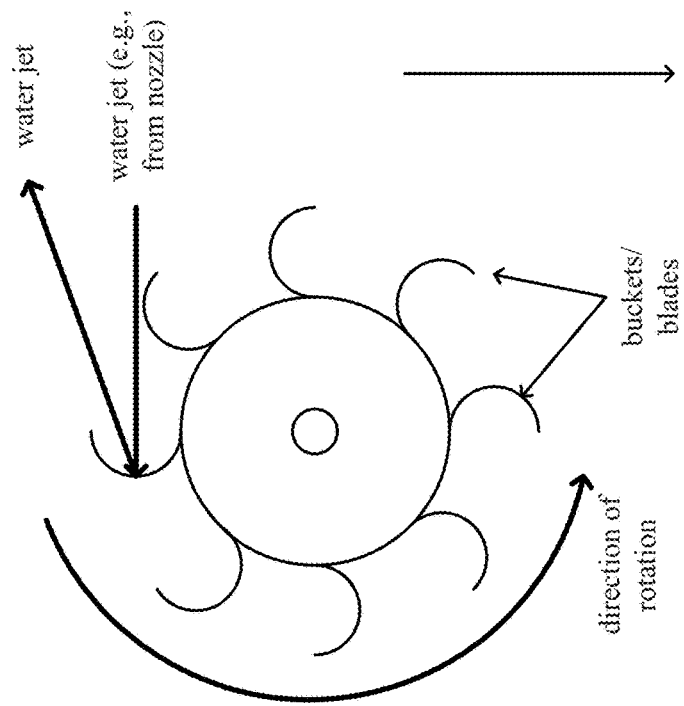
FIG. 64A is a schematic block diagram of an embodiment of blades of an impulse hydro turbine or steam turbine in accordance with the present invention.

FIG. 64A is a schematic block diagram of an embodiment 6401 of blades of an impulse hydro turbine or steam turbine in accordance with the present invention. Within an impulse turbine, a waterjet in the case of an impulse hydro turbine (or a steam jet in the case of a steam turbine), such as from a high-power or high pressure nozzle, is directed towards the buckets/blades of the impulse turbine. This fast-moving fluid, such as water or steam, is directed at the turbine blades and facilitates rotation of the turbine. With respect to an impulse turbine, the blades are often described as bucket-shaped such that they are implemented to harness the energy of the fluid jet to facilitate rotation of the impulse turbine and to deflect the fluid. In some instances, the fluid is deflected away from the impulse turbine. In other instances, the fluid is deflected back in the direction of the nozzle from which it came.

In some examples, an appropriately implemented one or more DSCs that is configured to control the nozzle that operates within such an impulse turbine (e.g., controlling the speed, pressure, etc. of the waterjet that is emitted from a nozzle) and/or that is configured to sense the operation of the nozzle (e.g., since the speed, pressure, etc. of the waterjet that is emitted from the nozzle), such as in an implementation in which the water is deflected back in the direction of the nozzle, the one or more DSCs can generate information regarding the energy transfer from the waterjet to the buckets/blades of the impulse turbine.

FIG. 64B is a schematic block diagram of an embodiment 6402 of blades of a reaction hydro turbine or steam turbine in accordance with the present invention. In a reaction hydro turbine or steam turbine, the water in the case of a reaction hydro turbine (or steam in the case of a steam turbine) passes over or through the blades of the turbine. This water or steam passing over through the blades of the turbine facilitates rotation of the turbine. Note that a reaction hydro turbine or steam turbine does not change the direction of the flow the water or steam. The turbine is rotated as the water or steam passes through it blades.

Figure 65:
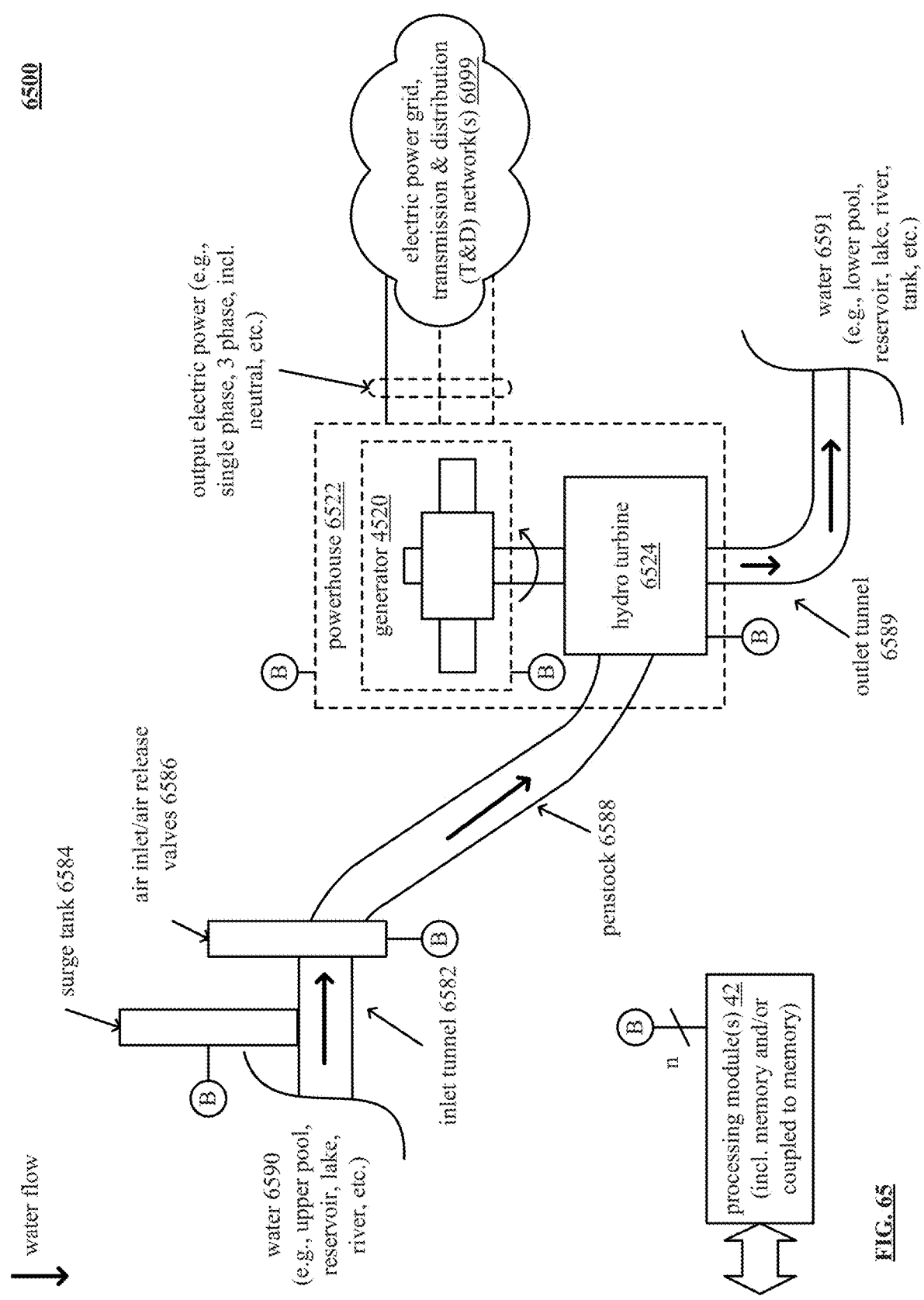
FIG. 65 is a schematic block diagram of an embodiment of a hydro turbine generation system operative in accordance with the present invention.

FIG. 65 is a schematic block diagram of an embodiment 6500 of a hydro turbine generation system operative in accordance with the present invention. Generally speaking, a hydro turbine 6524 may be viewed as a mechanical energy source or prime mover that is configured to harness the kinetic energy of moving water and to transform that kinetic energy into mechanical energy to be used to facilitate rotation of the rotor of a generator 4520. For example, with respect to the amount of mechanical energy provided from descending water, a cubic meter of water descending 1 m can provide approximately 9800 J of mechanical energy. Similarly, a flow of a cubic meter of water per second descending 1 m corresponds to 9800 W of power. The hydro turbine 6524 harnesses the kinetic energy of the moving water and translates that into mechanical energy thereby serving as a mechanical energy source for the generator 4520.

This diagram shows a hydro turbine generation system in which a source of water 6590 provides water that travels through an inlet tunnel 6582 down a penstock 6588 and into the Hydro turbine 6524 and then out via an outlet tunnel 6589 to a collector of water 6591. Generally speaking, the respective source and collector of water 6590 and 6591 may be viewed as an upper pool and a lower pool, and they may be reservoirs, lakes, rivers, holding tanks, etc.

In general, such a hydro turbine generation system may be viewed as having to components that operate in co-option with one another, the hydro system and the electric power generation system. The hydraulic system includes the hydro turbine 6524, the source and collector of water 6590 and 6591, the respective inlet tunnel 6582, the penstock 6588, the outlet, 6589, the surge tank 6584, and the air inlet/air release valves 6586. The electric power generation system components include the generator 4520 that is driven by the hydro turbine 6524.

Effective operation of the hydro turbine generation system is very significantly affected by control of the flow of water from the source of water 6590 to the collector of water 6591. A surge tank 6584 is often used in implementations in which the distance between the source of water 6590 to the collector of water 6591 is quite large. The surge tank 6584 operates to isolate the hydro turbine 6524 from adverse effects of the traveling water such as water hammer, which may be viewed as a high pressure rise in the water by stopping the flow of the water quickly. The surge tank 6584 provides a means by which any undesirable hydraulic oscillations, or traveling waves of pressure in the water, maybe reduced or dampened so as to facilitate effective control of the hydro turbine 6524

In some examples, the hydro turbine 6524 and the generator 4520 are implemented within a powerhouse 6522. The generator 4520 is configured to generate one or more output electric power signals that are provided to an appropriate voltage for delivery, transmission, and consumption within an electric power grid that includes one or more transmission and distribution (T&D) networks 6099. As described elsewhere herein with respect to other examples, embodiments, diagrams, the one or more output electric power signals may be provided to a substation configured to up convert the output electric power signals from the hydro turbine generation system to an appropriate voltage for delivery, transmission, and consumption within an electric power grid that includes one or more transmission and distribution (T&D) networks 6099.

Figure 66:
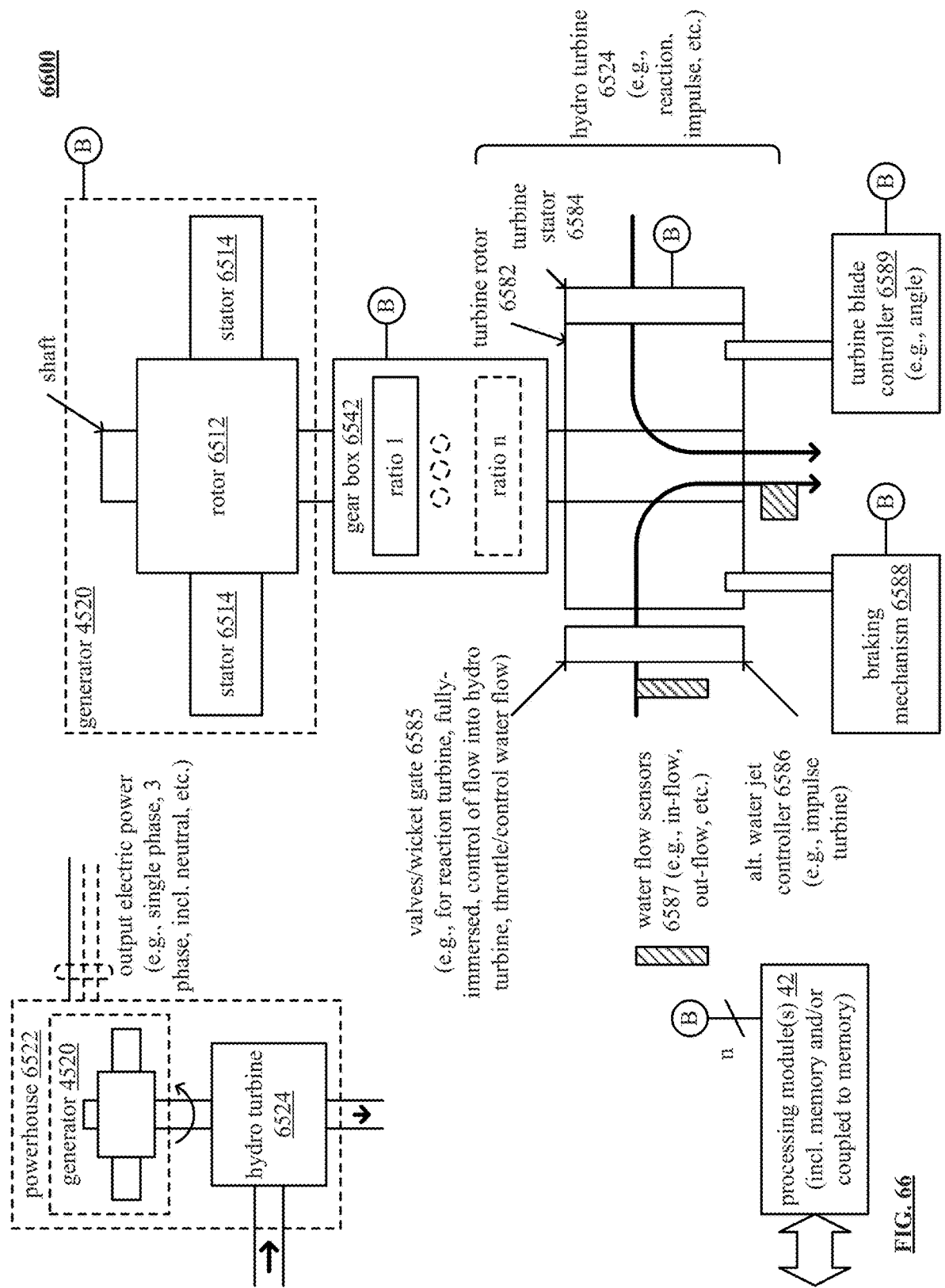
FIG. 66 is a schematic block diagram of an embodiment of hydro turbine generation system control feedback and adaptation in accordance with the present invention.

FIG. 66 is a schematic block diagram of an embodiment 6600 of hydro turbine generation system control feedback and adaptation in accordance with the present invention. This diagram shows additional details regarding a hydro turbine generation system including one or more processing modules 42 that is configured to communicate with and interact with one or more drive-sense circuits (DSCs) that are in communication with at least some of the various components of the hydro turbine generation system. The one or more processing modules 42 is coupled to the one or more DSCs and is operable to provide control to and communication with the one or more DSCs. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In a reaction turbine implementation, one or more valves or wicket gates 6585 is configured to control water flow associated with the hydro turbine 6524. For example, the valves or wicket gates 6585 is configured to control the flow into the hydro turbine 6524 to control the flow of water over her through the blades of the hydro turbine 6524. In an impulse turbine implementation, a waterjet controller 6586 is configured to control the waterjet that is provided to the buckets/blades of the impulse turbine.

The hydro turbine 6524 includes a turbine stator 6584 and a turbine rotor 6582. Generally speaking, the turbine stator 6584 may be viewed as the component or housing in which the turbine rotor 6582 is contained. The turbine rotor 6582 is coupled to a rotor 6512 of the generator 4520. In certain examples, this coupling is the a gearbox 6542 that is configured to provide appropriate mechanical interfacing between the turbine rotor 6582 and the rotor 6512 of the generator 4520. In some examples, the gearbox 6542 is configurable to effectuate the coupling between the turbine rotor 6582 and the rotor 6512 of the generator 4520 in any one of a number of desired ratios, shown as ratio 1 through ratio n. Note that some hydro turbine generation systems operate synchronously such that the rate of rotation of the turbine rotor 6582 is same as the rate of rotation of the rotor 6512 of the generator 4520. In such instances, the ratio of the gearbox 6142 is 1. In some alternative implementations, the hydro turbine generation system does not include a gearbox 6542 and the rotor of the turbine rotor 6582 is coupled to the rotor 6512 of the generator 4520, and they operate synchronously with one another such that the rate of rotation of the turbine rotor 6542 of the hydro turbine 6524 is same as the rate of rotation of the rotor 6512 of the generator 4520. As the turbine rotor 6582 is rotated based on flow of water, the rotor 6512 the generator is 4520 will rotate thereby generating output electric power via the stator 6514 of the generator 4520.

In addition, in some examples, the hydro turbine 6524 includes one or more of a braking mechanism 6588, a turbine blade controller 6589, and one or more water flow sensors 6587. The one or more processing modules 42 is configured to communicate with and control operation of the braking mechanism 6588, the turbine blade controller 6589, and the one or more water flow sensors 6587. For example, in accordance with controlling the rate of rotation of the turbine rotor 6582, the one or more processing modules 42 is configured to receive information from the one or more water flow sensors 6587 that are implemented to monitor for water flow in and/or out of the hydro turbine 6524. As may be needed to slow the rate of rotation of the turbine rotor 6582, the one or more processing modules 42 is configured to utilize the braking mechanism 6588. In addition, in examples in which the angle of the turbine blades is configurable and adjustable, the one or more processing modules 42 is configured to control their angle to facilitate rotational rate control of the turbine rotor 6582 via the turbine played controller 6589. Generally speaking, the one or more processing modules 42 is configured to receive information from any one or more components of the hydro turbine generation system, to process that information, and to determine any control and adaptation that may need to be performed with respect to the various components to facilitate proper operation of the hydro turbine generation system.

In addition, note that the one or more processing modules 42 may be in communication with one or more of the various components of the hydro turbine generation system directly (e.g., not via a DSC 28). That is to say, the one or more processing modules 42 may be in communication with one or more of the various components of the hydro turbine generation system via one or more DSCs 28 and also be in communication with another one or more of the various components of the hydro turbine generation system directly (e.g., not via a DSC 28). In addition, the one or more processing modules 42 may be in communication via one or more DSCs with one or more sensors implemented within the hydro turbine generation system to provide information regarding environmental conditions, status of operation of one or more components of the hydro turbine generation system, status regarding various electrical and/or electric power signals of the hydro turbine generation system including the output electric power signals provided from the generator 4520, etc. Generally speaking, the communication and inter-connectivity between the one or more processing modules 42 and the one or more of the various components of the hydro turbine generation system is shown in in the diagram via the one or more connections depicted by "B". Again, in some examples, note that this communication and inter-connectivity may be implemented using one or more DSCs. Also, in some examples, one or more sensors are implemented on and/or associated one or more components of the hydro turbine generation system. The one or more processing modules 42 is configured to receive information from the various sensors and use that information in the control and operation of the hydro turbine generation system.

Moreover, with respect to the generator 4520, any of the one or more various examples, embodiments, etc. as described herein directed towards processing, conditioning, etc. of the one or more output electric power signals provided from the generator (e.g., such as with respect to one or more in-line DSCs, one or more sensor implemented DSCs, operation in accordance with an electric power conditioning module, etc.) and/or sensors implemented on and/or associated with the generator 4520 and/or the mechanical energy source 1810, which in this case is the hydro turbine 6524, may also be implemented with respect to the hydro turbine generation system. The use of one or more appropriately implemented DSCs facilitate the one or more processing modules 42 to improve the efficiency of the hydro turbine generation system including appropriately adapting operation of the one or more components thereof (e.g., controlling and adapting as needed the appropriate gear ratio of the gearbox 6542, the rate of rotation of the turbine rotor 6582 such as by controlling water flow through the hydro turbine 6524, the angle of the turbine blades via the turbine blade controller 6589, slowing the rate of rotation of the turbine rotor 6582 the of the braking mechanism 6588, etc.).

Figure 67:
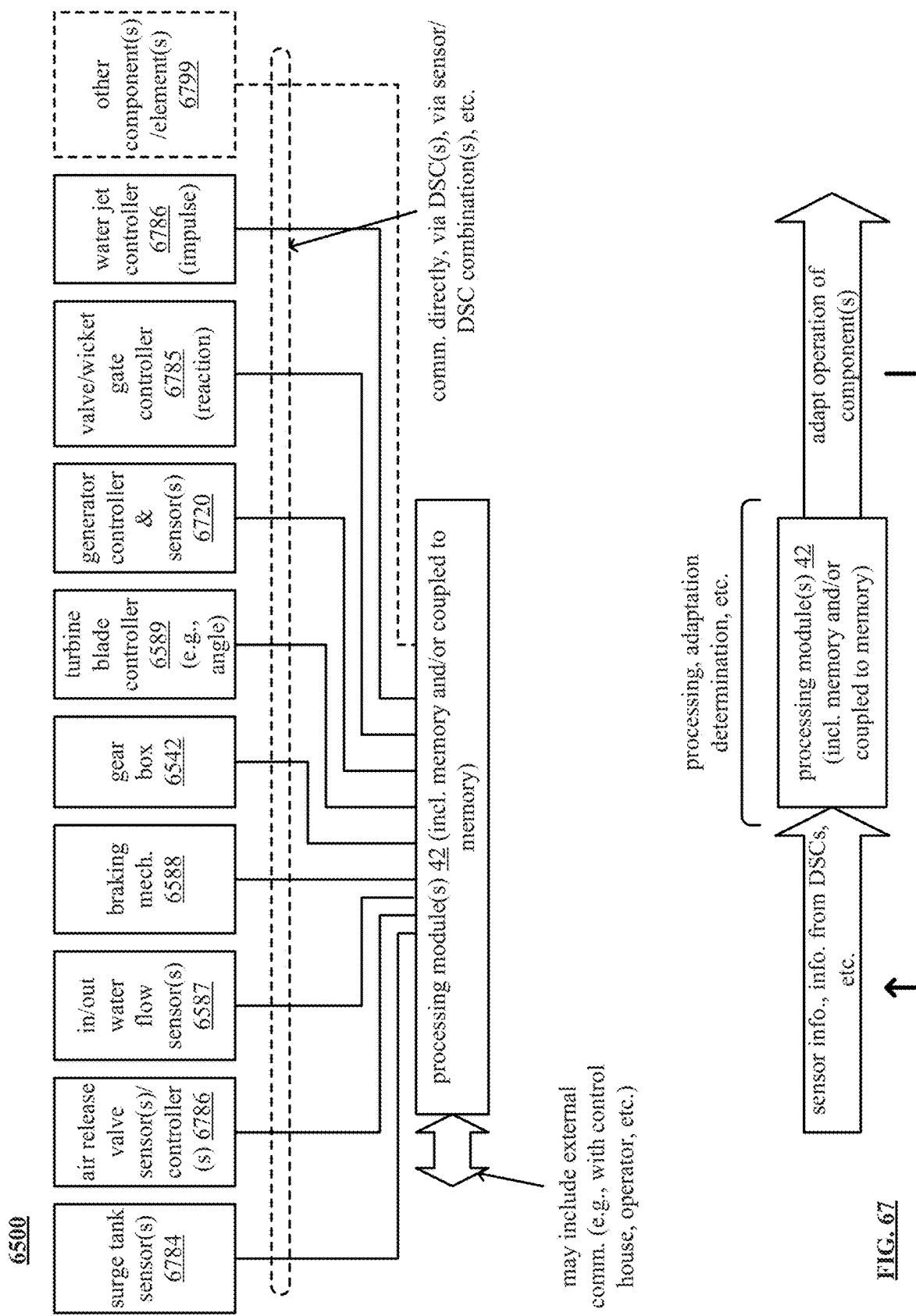
FIG. 67 is a schematic block diagram of another embodiment of hydro turbine generation system control feedback and adaptation in accordance with the present invention.

FIG. 67 is a schematic block diagram of another embodiment 6700 of hydro turbine generation system control feedback and adaptation in accordance with the present invention. This diagram shows one or more processing modules 42 in communication with various elements of the hydro turbine generation system including one or more of one or more surge tank sensors 6784, one or more air release valve sensors and/or controllers 6076, one or more in/out water flow sensors 6587, braking mechanism 6588, gearbox 6542, turbine blade controller 6589, generator controller and one or more associated generator sensors 6720, a valve/wicket gate controller 6785 such as for a reaction turbine, waterjet controller 6786 such as for an impulse turbine, and/or any other components or elements 6799 of the hydro turbine generation system.

Also, in this diagram, one or more processing modules 42 is configured to communicate with and interact with one or more drive-sense circuits (DSCs) that are in communication with at least some of the various components of the hydro turbine generation system. The one or more processing modules 42 is coupled to the one or more DSCs and is operable to provide control to and communication with the one or more DSCs. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In an example of operation and implementation, sensor information, sensor related information, information from the one or more DSCs, etc. is received by the one or more processing modules 42. The one or more processing modules 42 is configured to perform processing, at adaptation determination, etc. as may be required or desired for any of the one or more components of the hydro turbine generation system. Based on the determination to perform adaptation of one or more of the components, the one or more processing modules 42 is configured to communicate with those one or more components of the hydro turbine generation system to adapt the operation thereof. In addition, in some examples, the one or more processing modules 42 is also configured to direct one or more components to processing, conditioning, etc. of the one or more output electric power signals provided from the generator 4520.

Figure 68:
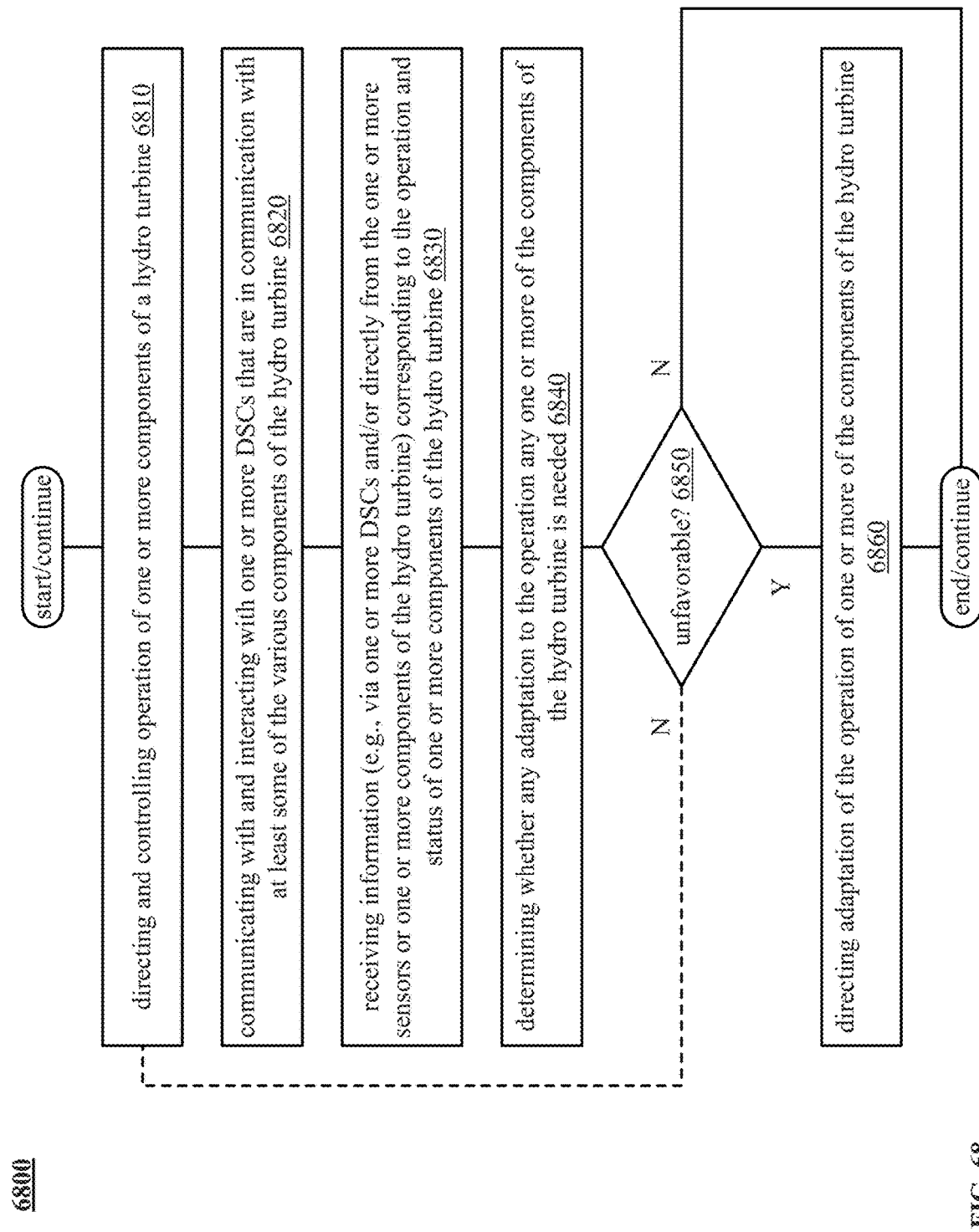
FIG. 68 is a schematic block diagram of another embodiment of a method for execution by one or more devices in accordance with the present invention.

FIG. 68 is a schematic block diagram of another embodiment of a method 6800 for execution by one or more devices in accordance with the present invention. The method 6800 operates in step 6810 by operating one or more processing modules for directing and controlling operation of one or more components of a hydro turbine. In addition, the method 6800 continues in step 6820 by operating the one or more processing modules for communicating with and interacting with one or more DSCs that are in communication with at least some of the various components of the hydro turbine. In various examples, the one or more DSCs are implemented to service the control signals being provided to the one or more components of the hydro turbine, are implemented to service one or more sensors or transducers that are implemented to provide information regarding the operation and status of one or more components of the hydro turbine, etc. In addition, in other examples, note that the one or more processing modules are directly in communication with certain of the components of the hydro turbine without being in communication with such components via DSCs.

The method 6800 continues by operating one or more processing modules for receiving information, via one or more DSCs and/or directly from the one or more sensors or one or more components of the hydro turbine, corresponding to the operation and status of one or more components of the hydro turbine, etc. in step 6830. In some examples, know that the one or more processing modules is configured to determine information based information that is related to a change of an electrical characteristic of a control signal that is provided via a DSC to a particular component of the hydro turbine. For example, when a DSC is implemented to facilitate the delivery of a control signal from the one or more processing modules to a particular component of the hydro turbine, that particular DSC is configured to provide feedback and information to the one or more processing modules to be used by the one or more processing modules to determine the operation status of that particular component. In addition, when a DSC is implemented to facilitate delivery of information regarding the status or operation of sensor, that particular DSC is configured to provide feedback and information to the one or more processing modules to be used by the one or more processing modules to determine the value of the particular parameter that is being senses by that sensor.

The method 6800 continues in step 6840 by operating one or more processing modules for processing the information provided via the one or more DSCs, provided directly from the one or more sensors, provided directly from the one or more components of the hydro turbine, etc. for determining whether any adaptation to the operation any one or more of the components of the hydro turbine is needed. Based on an unfavorable comparison of the information received to one or more operational criteria in step 6850, the one or more processing modules operates by directing adaptation of the operation of one or more of the components of the hydro turbine in step 6860.

Some examples of unfavorable comparison of the information received to the one or more operational criteria may include any one or more of the hydro turbine not having adequate flow of water to facilitate the proper operation of the hydro turbine, an overspeed or under speed indication of any one or more of a rotor of the hydro turbine, the rotor of the generator, etc., an under temperature or over temperature of one of the components of the hydro turbine, etc., water jet pressure being too high or too low in the instance of an impulse hydro turbine, Some examples of modification of the operation of the one or more components of the hydro turbine may include any one or more of adjusting the rotational speed of the rotor of the generator or the rotational speed of the rotor of the hydro turbine, the ratio operative within a gearbox of the hydro turbine, increasing or decreasing the water flow or water jet pressure of the hydro turbine, engaging one or more braking mechanisms to facilitate slowing of one of the rotational components of the hydro turbine, adjusting the blade angle of the blades of the hydro turbine, etc., facilitating venting, heating, cooling, HVAC, etc. to correct an under temperature or over temperature condition associated with one or more of the components of the hydro turbine to bring them within specified or recommended operational range, etc.

Alternatively, based on a favorable comparison of the information received to the one or more operational criteria in step 6850, the method 6800 ends or continues such as by looping back and performing the operational step 6810 and continuing to perform the method 6800.

Figure 69:
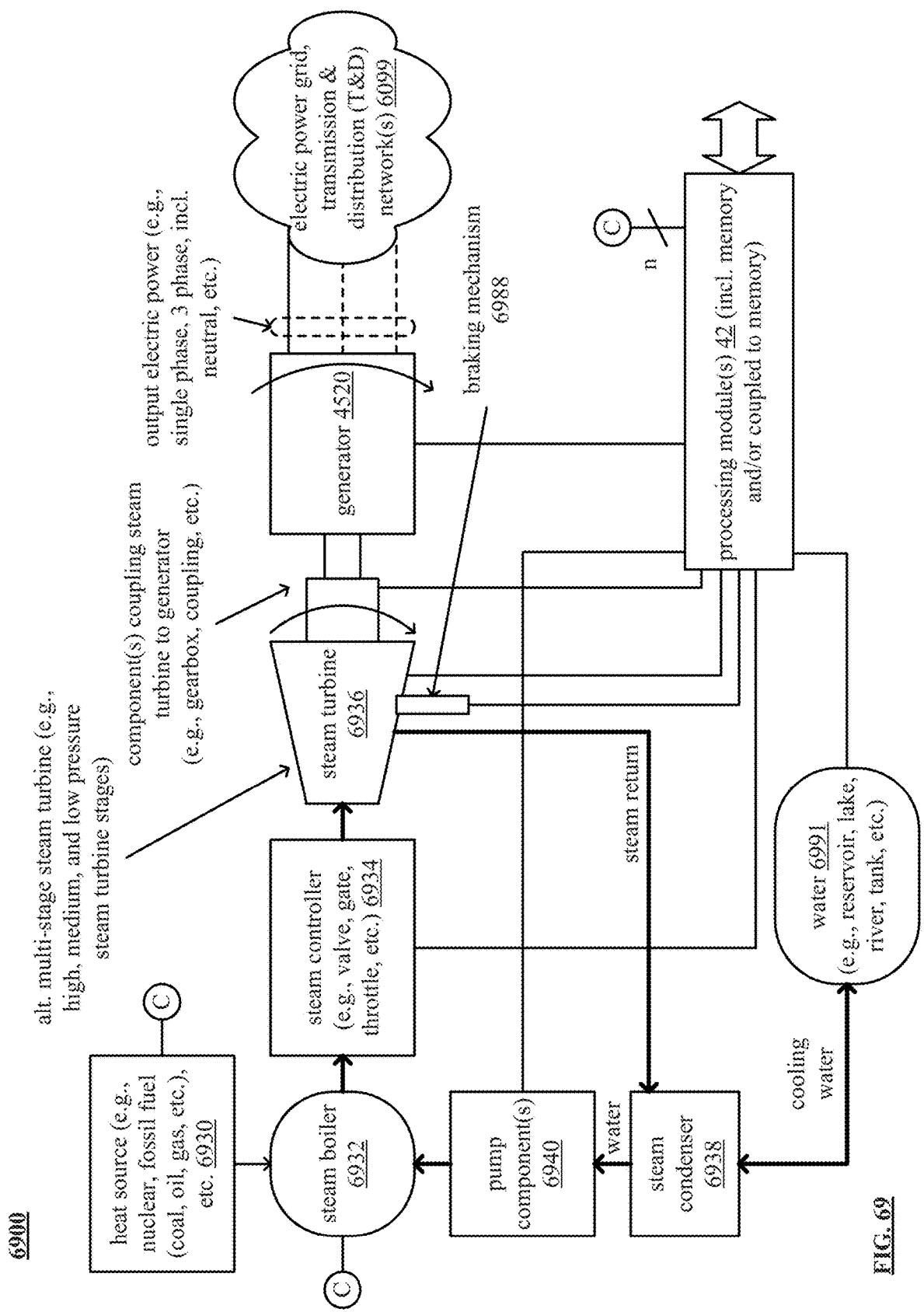
FIG. 69 is a schematic block diagram of an embodiment of steam turbine generation system control feedback and adaptation in accordance with the present invention.

FIG. 69 is a schematic block diagram of an embodiment 6900 of steam turbine generation system control feedback and adaptation in accordance with the present invention. In this diagram, the steam turbine generation system includes a mechanical energy source (e.g., prime mover) that is a steam turbine 6936. This steam turbine 6936 is coupled to a generator 4520 via directly or via one or more components, such as one or more couplings, gearbox, etc. In some instances, the steam turbine 6936 operates synchronously with the generator 4520. For example, some steam turbine generation systems operate synchronously such that the rate of rotation of the rotor of the steam turbine 6936 is same as the rate of rotation of the rotor of the generator 4520. In such instances, the ratio of a gearbox, when implemented, is 1. In some alternative implementations, the steam turbine generation system does not include a gearbox and the rotor of the steam turbine 6936 is coupled to the rotor of the generator 4520, and they operate synchronously with one another such that the rate of rotation of the rotor of the steam turbine 6936 is same as the rate of rotation of the rotor of the generator 4520. As the rotor of the steam turbine 6936 is rotated based on flow of water, the rotor the generator is 4520 will rotate thereby generating output electric power via the stator of the generator 4520.

The generator 4520 is configured to generate one or more output electric power signals that are provided to an appropriate voltage for delivery, transmission, and consumption within an electric power grid that includes one or more transmission and distribution (T&D) networks 6099. As described elsewhere herein with respect to other examples, embodiments, diagrams, the one or more output electric power signals may be provided to a substation configured to up convert the output electric power signals from the hydro turbine generation system to an appropriate voltage for delivery, transmission, and consumption within an electric power grid that includes one or more transmission and distribution (T&D) networks 6099.

A number of additional components may be implemented within a steam turbine generation system. For example, water 6991 (e.g., such as may be stored in a pool, reservoir, tank, retrieved from a lake or river, etc.) operates to provide cooling water to a steam condenser 6938. The water/steam loop of the steam turbine generation system travels from a steam condenser 6938 to one or more pump component 6940 to a steam boiler 6932 that is heated using a heat source 6930 to generate steam that is provided in a controlled manner to the steam turbine 6936 via a steam controller 6934. After being provided to the steam turbine 6936 to facilitate rotation of the rotor of the steam turbine 6936, the steam returns to the steam condenser 6938.

The heat source 6930 is implemented to heat the water using some desired means. Examples of different types of heat source 6930 may include a nuclear reactor implemented the heat the water to generate steam, a fossil fuel plants (e.g., such as a coal-fired plant, and oil burning plant, a gas burning plant, a natural gas burning plant, etc.). In some alternative examples, a heat source 6930 operates by burning wood and/or biomass fuels such as may be generated from wood, crops, garbage, renewable biofuels, agricultural waste, etc. In even other alternative examples, geothermal energy may be harnessed from the warm water and/or steam emissions naturally occurring and solar thermal energy may be used to generate steam. Generally speaking, any desired type of heat source 6930 that is operative to heat the water to generate steam within the steam boiler 6932 may be used within such a steam turbine generation system.

A steam controller 6934 is implemented to control the amount of steam that is provided to the steam turbine 6936. For example, the steam controller 6934 may be implemented as one or more of a valve, gate, a throttle, etc. to control the amount of steam that is provided in a controlled manner to the steam turbine 6936. Note that the stream turbine 6936 may be any one of a variety of types of steam turbines. For example, the steam turbine 6936 made include an impulse turbine configuration or a reaction turbine configuration with respect to the implementation of the actual steam turbine 6936 itself and the blades thereof. In addition, the steam turbine 6936 may be a multistage steam turbine such as having more than one stage (e.g., a high, medium, and low pressure steam turbine stages). In addition, one or more additional mechanisms such as a braking mechanism 6988 may be implemented to assist in the control of the rate of rotation of the rotor of the steam turbine 6936.

Also, in this diagram, one or more processing modules 42 is configured to communicate with and interact with one or more drive-sense circuits (DSCs) that are in communication with at least some of the various components of the steam turbine generation system. The one or more processing modules 42 is coupled to the one or more DSCs and is operable to provide control to and communication with the one or more DSCs. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In addition, note that the one or more processing modules 42 may be in communication with one or more of the various components of the steam turbine generation system directly (e.g., not via a DSC 28). That is to say, the one or more processing modules 42 may be in communication with one or more of the various components of the steam turbine generation system via one or more DSCs 28 and also be in communication with another one or more of the various components of the steam turbine generation system directly (e.g., not via a DSC 28). In addition, the one or more processing modules 42 may be in communication via one or more DSCs with one or more sensors implemented within the steam turbine generation system to provide information regarding environmental conditions, status of operation of one or more components of the steam turbine generation system, status regarding various electrical and/or electric power signals of the steam turbine generation system including the output electric power signals provided from the generator 4520, etc. Generally speaking, the communication and inter-connectivity between the one or more processing modules 42 and the one or more of the various components of the steam turbine generation system is shown in in the diagram via the one or more connections depicted by "C". Again, in some examples, note that this communication and inter-connectivity may be implemented using one or more DSCs.

For example, the one or more processing modules 42 is configured to communicate with, interact with, receive information from, and/or provide control signaling to the one or more components of the steam turbine generation system. For example, based on information regarding the temperature, pressure, density, etc. of the steam and/or water involved in the steam/water loop, the one or more processing modules 42 is configured to adapt operation of one or more of the pump components 6940, the steam boiler 6932 the heat source 6930, and/or the steam controller 6934 to facilitate modification of steam and/or water involved in the steam/water loop to operate the steam turbine generation system in a desirable manner.

In another example, based on information regarding rotation of the rotor of the steam turbine 6936 being greater than a desired rotational rate, the one or more processing modules 42 is configured to facilitate slowing of the low-speed shaft by providing appropriate control signaling the braking mechanism 6988 In general, the communication interfacing between the one or more processing modules 42 in the various components of the steam turbine generation system may be facilitated via one or more DSCs.

In addition, one or more DSCs may be implemented to perform processing, conditioning, sensing, etc. of any of the various electrical signals within the steam turbine generation system including the output electric power signals provided from the generator 4520. Also, in some examples, one or more sensors are implemented on and/or associated one or more components of the steam turbine generation system. The one or more processing modules 42 is configured to receive information from the various sensors and use that information in the control and operation of the steam turbine generation system.

Moreover, with respect to the generator 4520, any of the one or more various examples, embodiments, etc. as described herein directed towards processing, conditioning, etc. of the one or more output electric power signals provided from the generator (e.g., such as with respect to one or more in-line DSCs, one or more sensor implemented DSCs, operation in accordance with an electric power conditioning module, etc.) and/or sensors implemented on and/ or associated with the generator 4520 and/or the mechanical energy source 1810, which in this case is the steam turbine 6936, may also be implemented with respect to the steam turbine generation system. The use of one or more appropriately implemented DSCs facilitate the one or more processing modules 42 to improve the efficiency of the steam turbine generation system including appropriately adapting operation of the one or more components thereof (e.g., controlling and adapting as needed the appropriate gear ratio of a gearbox, when implemented, controlling the rotational speed of the rotor of the steam turbine 6936, etc.).

Figure 70:
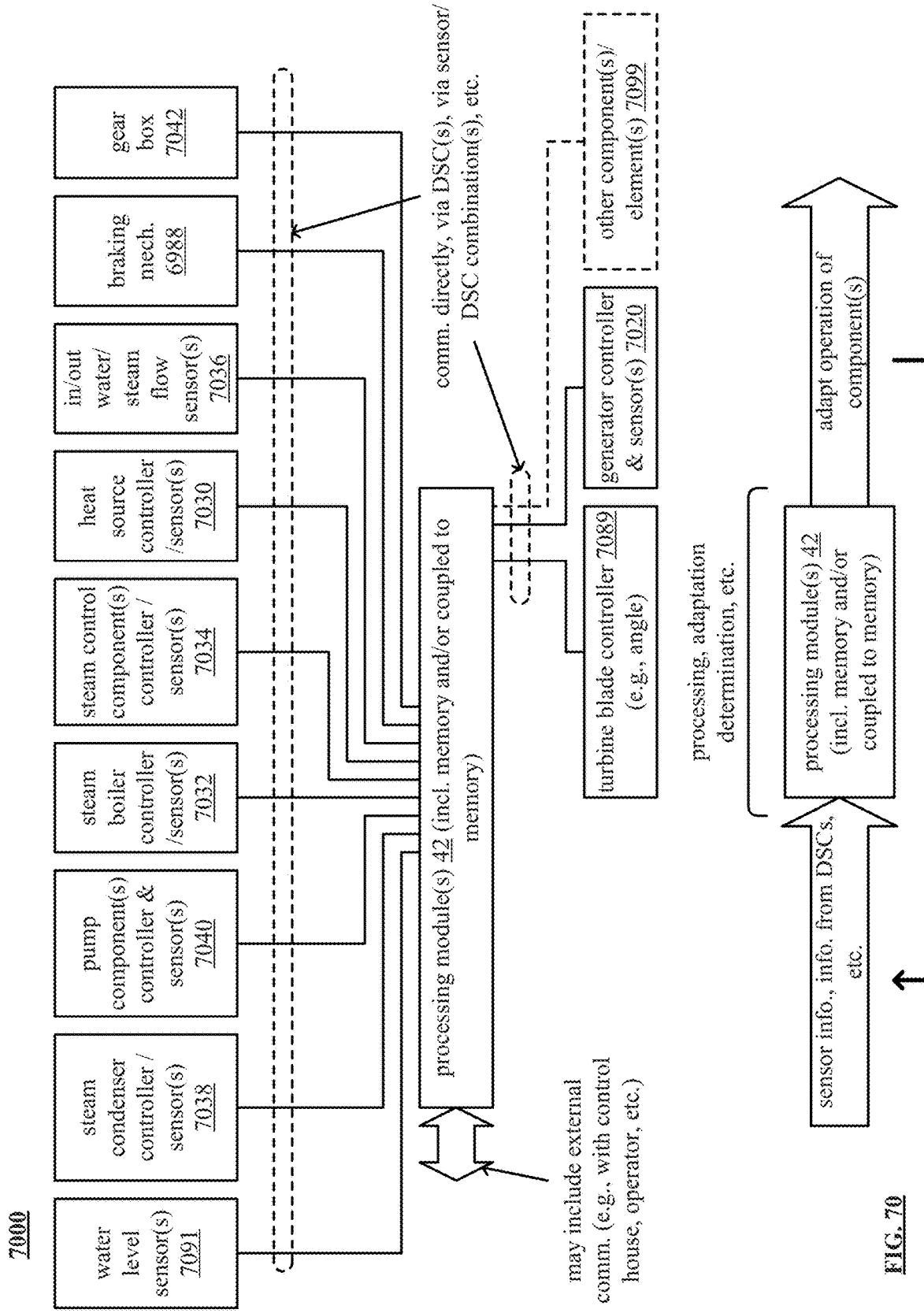
FIG. 70 is a schematic block diagram of another embodiment of steam turbine generation system control feedback and adaptation in accordance with the present invention.

FIG. 70 is a schematic block diagram of another embodiment 7000 of steam turbine generation system control feedback and adaptation in accordance with the present invention. This diagram shows one or more processing modules 42 in communication with various elements of the steam turbine generation system including one or more of one or more water level sensor(s) 7091, steam condenser controller and/or sensor(s) 7038, pump component controller and/or sensor(s) 7040, steam boiler controller and/or sensor(s) 7032, steam control controller and/or sensor(s) 7034, heat source controller and/or sensor(s) 7030, in and/or out water/steam flow sensor(s) 7036, braking mechanism 6988, gearbox 7042 (when implemented), a turbine blade controller 7098 such as may be implemented to control the angle of the blades of the steam turbine 6936, generator controller and/or sensor(s) 7020, and/or any other components or elements 7099 of the steam turbine generation system.

Also, in this diagram, one or more processing modules 42 is configured to communicate with and interact with one or more drive-sense circuits (DSCs) that are in communication with at least some of the various components of the steam turbine generation system. The one or more processing modules 42 is coupled to the one or more DSCs and is operable to provide control to and communication with the one or more DSCs. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In an example of operation and implementation, sensor information, sensor related information, information from the one or more DSCs, etc. is received by the one or more processing modules 42. The one or more processing modules 42 is configured to perform processing, at adaptation determination, etc. as may be required or desired for any of the one or more components of the steam turbine generation system. Based on the determination to perform adaptation of one or more of the components, the one or more processing modules 42 is configured to communicate with those one or more components of the steam turbine generation system to adapt the operation thereof. In addition, in some examples, the one or more processing modules 42 is also configured to direct one or more components to processing, conditioning, etc. of the one or more output electric power signals provided from the generator 4520.

FIG. 71 is a schematic block diagram of another embodiment of a method 7100 for execution by one or more devices in accordance with the present invention. The method 7100 operates in step 7110 by operating one or more processing modules for directing and controlling operation of one or more components of a steam turbine. In addition, the method 7100 continues in step 7120 by operating the one or more processing modules for communicating with and interacting with one or more DSCs that are in communication with at least some of the various components of the steam turbine. In various examples, the one or more DSCs are implemented to service the control signals being provided to the one or more components of the steam turbine, are implemented to service one or more sensors or transducers that are implemented to provide information regarding the operation and status of one or more components of the steam turbine, etc. In addition, in other examples, note that the one or more processing modules are directly in communication with certain of the components of the steam turbine without being in communication with such components via DSCs.

The method 7100 continues by operating one or more processing modules for receiving information, via one or more DSCs and/or directly from the one or more sensors or one or more components of the steam turbine, corresponding to the operation and status of one or more components of the steam turbine, etc. in step 7130. In some examples, know that the one or more processing modules is configured to determine information based information that is related to a change of an electrical characteristic of a control signal that is provided via a DSC to a particular component of the steam turbine. For example, when a DSC is implemented to facilitate the delivery of a control signal from the one or more processing modules to a particular component of the steam turbine, that particular DSC is configured to provide feedback and information to the one or more processing modules to be used by the one or more processing modules to determine the operation status of that particular component. In addition, when a DSC is implemented to facilitate delivery of information regarding the status or operation of sensor, that particular DSC is configured to provide feedback and information to the one or more processing modules to be used by the one or more processing modules to determine the value of the particular parameter that is being senses by that sensor.

The method 7100 continues in step 7140 by operating one or more processing modules for processing the information provided via the one or more DSCs, provided directly from the one or more sensors, provided directly from the one or more components of the steam turbine, etc. for determining whether any adaptation to the operation any one or more of the components of the steam turbine is needed. Based on an unfavorable comparison of the information received to one or more operational criteria in step 7150, the one or more processing modules operates by directing adaptation of the operation of one or more of the components of the steam turbine in step 7160.

Some examples of unfavorable comparison of the information received to the one or more operational criteria may include any one or more of the steam turbine not being provided steam the appropriate characteristics (e.g., temperature, pressure, water content, etc.) to facilitate upper operation of the steam turbine, an overspeed or under speed indication of any one or more of a rotor of the steam turbine, the rotor of the generator, etc., an under temperature or over temperature of one of the components of the steam turbine, etc.

Some examples of modification of the operation of the one or more components of the steam turbine may include any one or more of adjusting the rotational speed of the rotor of the generator or the rotational speed of the rotor of the steam turbine, the ratio operative within a gearbox of the steam turbine, adapting operation of one or more of the components implemented to provide steam having the appropriate characteristics (e.g., temperature, pressure, water content, etc.) to facilitate upper operation of the steam turbine that may include adjusting operation of any one or more of a heat source, a steam boiler, steam controller, a steam condenser, one or more pump components, cooling water flow into or out of a steam condenser, etc., engaging one or more braking mechanisms to facilitate slowing of one of the rotational components of the steam turbine, adjusting the blade angle of the blades of the steam turbine, etc., facilitating venting, heating, cooling, HVAC, etc. to correct an under temperature or over temperature condition associated with one or more of the components of the steam turbine to bring them within specified or recommended operational range, etc.

Alternatively, based on a favorable comparison of the information received to the one or more operational criteria in step 7150, the method 7100 ends or continues such as by looping back and performing the operational step 7110 and continuing to perform the method 7100.

Figure 72B:
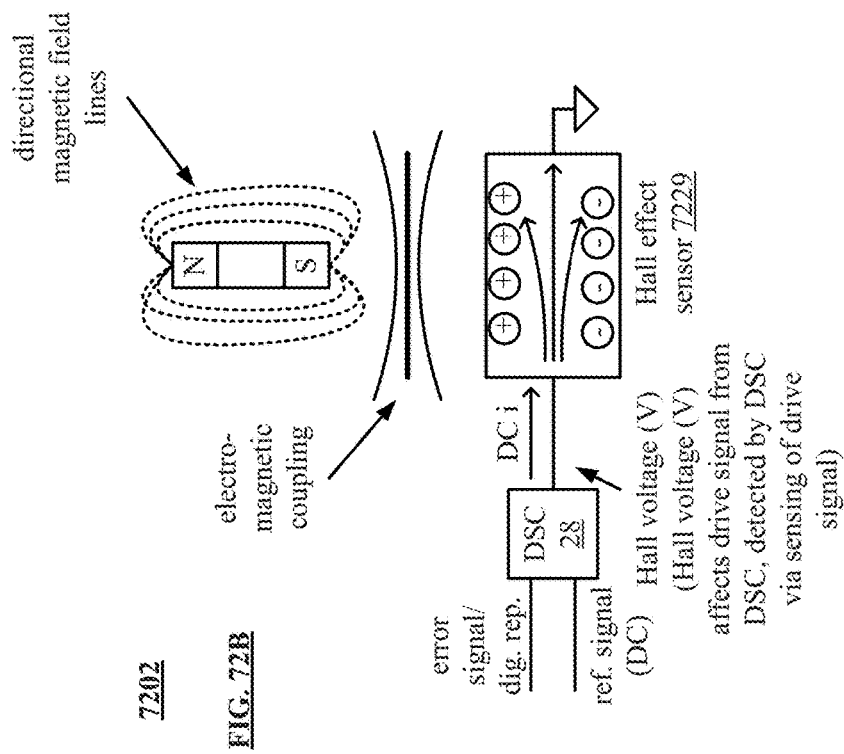
FIG. 72B is a schematic block diagram of an embodiment of single line Hall effect sensor drive and sense in accordance with the present invention.
Figure 72A:
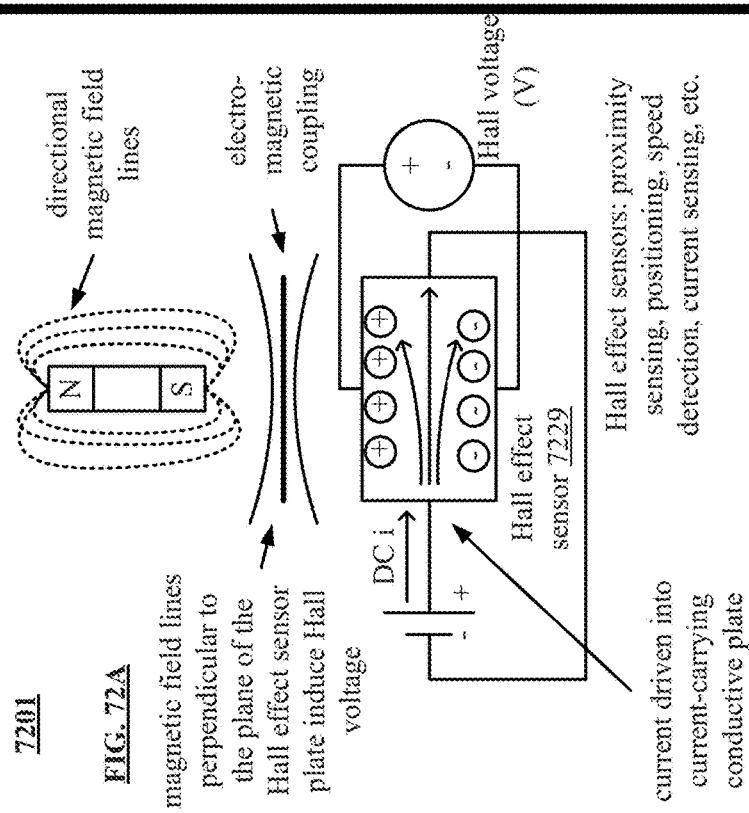
FIG. 72A is a schematic block diagram of an embodiment of a Hall effect sensor.

FIG. 72A is a schematic block diagram of an embodiment 7201 of a Hall effect sensor. The Hall effect corresponds to a voltage potential that develops across the current-carrying conductive plate based on its exposure to a magnetic field. For example, when a magnetic field is aligned such that the directional magnetic field lines are perpendicular to the plane of a Hall effect sensor 7229, a Hall voltage is produced in the current-carrying conductive plate (note that the current-carrying conductive plate may alternatively be referred to as the Hall effect sensor 7229). The physical principle on which the Hall effect is based is the Lorentz force. Generally, the Lorentz force may be expressed as a directional force vector F that is a function of the current passing through the current-carrying conductive plate in a particular direction (q being the electric charge and v being the directional vector of the movement of the electric charge), the magnetic field vector B.

$$F = qv \times B$$

Generally speaking, the three vectors, F, v, and B, are orthogonal to one another. For example, the directional force vector F, sometimes referred to as the Lorentz force, is normal to both the magnetic field vector B and the directional vector v associated with the current flow.

In many operations, a DC current (e.g., shown as DC i) in the diagram is applied to the current-carrying conductive plate, which may be viewed as a Hall effect sensor 7229. As the current travels through the Hall effect sensor 7229, a Hall voltage (V) is generated across the Hall effect sensor 7229 perpendicularly to the direction via which the current flows when the Hall effect sensor 7229 is exposed to a magnetic field. This is based on the Lorentz force that displaces the electrons in the Hall effect sensor 7229 in a curved path along the direction via which the current flows. Because of this displacement of the electrons in the Hall effect sensor 7229, a voltage develops across the current carrying conductive plate perpendicularly to the direction via which the current flows.

The Hall voltage V in volts may be expressed as a function of the Hall effect coefficient Rh of the material Hall effect sensor 7229, the current i flowing through the Hall effect sensor 7229 in amps, the thickness t of the Hall effect sensor 7229 in mm, and the magnetic flux density B in Teslas as follows:

$$V = Rh \times (i/t) \times B$$

Alternatively, the Hall voltage V in volts may be expressed as a function of the current i flowing through the Hall effect sensor 7229 in amps, the magnitude of the charge of the charge carriers q, the number of charge carriers per unit volume pn of the Hall effect sensor 7229, the thickness t of the Hall effect sensor 7229, and the magnetic flux density B in Teslas as follows:

$$V = (i \times B)/(pn \times q \times t)$$

As can be seen, Hall voltage V is proportional to the magnetic field strength that is applied to the Hall effect sensor 7229. The polarity of the Hall voltage V is also determined based on the direction of the magnetic field (e.g., whether North or South). As such, and appropriately implemented Hall effect sensor 7229 may be implemented to operate as a magnetic field sensor based on the electromagnetic coupling between the directional magnetic field lines of the magnetic field and the Hall effect sensor 7229. In certain Hall effect sensors 7229, there is a linear operating region where the output voltage, the Hall voltage V, varies linearly with the magnetic flux density B. In many Hall effect sensors 7229, there is an upper operating limit such that when the magnetic flux density B extends beyond that the output voltage, the Hall voltage V, will saturate (i.e., remain at a particular level even as the magnetic flux density B increases).

Note that Hall effect sensors may be implemented in a number of different implementations for a variety of different applications. In some examples, the Hall effect sensor 7229 includes a single permanent magnet attached to a moving shaft or device in accordance with a head-on detection implementation. In this implementation, the sensing is performed on the magnetic field perpendicular to the Hall effect sensor 7229. Within such a head-on approach, the Hall voltage V corresponds to the strength of the magnetic flux density B as a function of distance away from the Hall effect sensor 7229. For example, the nearer and stronger being the magnetic flux density, then a greater Hall voltage V is produced. Similarly, the further away and weaker being the magnetic flux density, then a smaller Hall voltage V is produced.

In other examples, sideways detection is performed such that a magnet across the face of the Hall effect sensor 7229 is configured to move in a sideways motion such that the presence of a magnetic field across the face of the Hall effect sensor 7229 generates a Hall voltage V in the Hall effect sensor 7229.

Generally speaking, a Hall effect sensor 7229 may be implemented within any application in which detection of the magnetic field is desired. Some examples of applications for Hall effect sensors 7229 may include proximity sensors, environmental detection sensors for conditions such as vibrations, acoustic waves, etc. Given their applicability to detecting magnetic fields, they may be implemented as current sensors detecting the generated magnetic field around a current-carrying conductor. For example, with respect to current sensor applications, and appropriately designed and implemented Hall effect sensor 7229 may be implemented to detect currents as few as milliamps and/or up to 1000s of amps. In addition, a Hall effect sensor 7229 may be adapted such as by using a known permanent magnet placed appropriately near or behind the active area of the Hall effect sensor 7229 such that, changes of magnetic field are detected based on and around the biased magnetic field generated by the known permanent magnets. In some examples, very low sensitivity such as in the mV/G range may be detected.

In the context of motor and/or generator related applications, Hall effect sensors 7229 may be implemented for any of a variety of applications including detection of magnetic field, detection of rotation of the rotor within a motor and/or generator, position of the rotor relative to the stator, rotational rate of the rotor (e.g., such as by counting the number of passes of Hall effect sensor magnets attached to a shaft or rotor of a motor and/or generator over a particular period of time), etc. Given the very large amount of electromagnetic coupling and magnetic fields that are generated within motor and/or generator applications, Hall effect sensors 7229 may be used for a variety of applications.

FIG. 72B is a schematic block diagram of an embodiment 7202 of single line Hall effect sensor drive and sense in accordance with the present invention. In this diagram, a DSC 28 is configured to provide the current that is transmitted into the Hall effect sensor 7229. In this particular diagram, a DC reference signal is provided to the DSC 28 and an output DC current, DC i, is driven into the Hall effect sensor 7229. The output of the Hall effect sensor 7229 that might be used to return the current is grounded in this example. The DSC 28 is configured to generate an error signal such as a digital representation of a change in an electrical characteristic of the Hall effect sensor 7229 such as may be generated by the Hall effect sensor 7229 being within sufficient proximity of a magnetic field such that electromagnetic coupling is provided thereto thereby changing the electrical characteristics of the Hall effect sensor 7229.

In this diagram, the DSC 28 is configured to perform driving of the current signal into the Hall effect sensor 7229 and simultaneously to detect that current signal including any changes thereof. The high sensitivity of a DSC 28 allows for detection of a change in the electrical characteristic of the Hall effect sensor 7229. In one example, this change of an electrical characteristic of the Hall effect sensor 7229 is the displacement of the electrons in the Hall effect sensor 7229 due to exposure to a magnetic field. This diagram shows an example by which the Hall V induced by the Hall effect sensor 7229 being exposed to a magnetic field may be detected and realized by a DSC via the sensing of the drive current signal that is provided to the Hall effect sensor 7229.

FIG. 73 is a schematic block diagram of another embodiment 7300 of single line Hall effect sensor drive and sense in accordance with the present invention. The top of this diagram shows a similar configuration as described in the previous diagram (e.g., a DSC 28 that is in communication with a Hall effect sensor 7329), and the bottom of this diagram shows another implementation by which a Hall effect sensor may be implemented in conjunction with a DSC.

In this diagram, one or more processing modules 42 is configured to communicate with and interact with a drive-sense circuit (DSC) 7328-1. The one or more processing modules 42 is coupled to a DSC 7328-1 and is operable to provide control to and communication with the DSC 7328-1.

Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, the one or more processing module 42 is configured to provide a drive signal, which may be viewed as a reference signal, to one of the inputs of a comparator 7315. Note that the comparator 7315 may alternatively be implemented as an operational amplifier in certain embodiments. The other input of the comparator 7315 is coupled to provide a drive signal (e.g., a DC current signal, shown as DC i) directly from the DSC 7328-1 to the Hall effect sensor 7329. The DSC 7328-1 is configured to provide the drive signal to the Hall effect sensor 7329 and also simultaneously to sense the drive signal and to detect any effect on the drive signal. For example, when the Hall effect sensor 7329 is exposed to a magnetic field and electromagnetic coupling is made from that magnetic field to the Hall effect sensor 7329, there will be displacement of the electrons in the Hall effect sensor 7229 due to exposure to the magnetic field. The DSC 7328-1 is configured to detect the change of at least one electrical characteristic of the drive signal this provided to the Hall effect sensor 7329.

The output of the comparator 7315 is provided to an analog to digital converter (ADC) 7360 that is configured to generate a digital signal that is representative of the effect on the drive signal that is provided to the Hall effect sensor 7329. In some examples the digital signal is output from the ADC 7360 and is fed back via a digital to analog converter (DAC) 7362 to generate the drive signal is provided to the Hall effect sensor 7329. In other examples that do not include DAC 7362, the input to the ADC 7360 is fed back directly to generate the drive signal is provided to the Hall effect sensor 7329. In addition, the digital signal that is representative of the effect on the drive signal is also provided to the one or more processing modules 42. The one or more processing modules 42 is configured to provide control to and be in communication with the DSC 7328-1 including to adapt the drive signal is provided to the comparator 7315 therein as desired to direct and control operation of the Hall effect sensor 7329 via the drive signal. The one or more processing modules 42 is configured to interpret the digital signal that is representative of the effect on the drive signal to determine a Hall voltage induced within the Hall effect sensor 7329 based on its exposure to the magnetic field.

Figure 74:
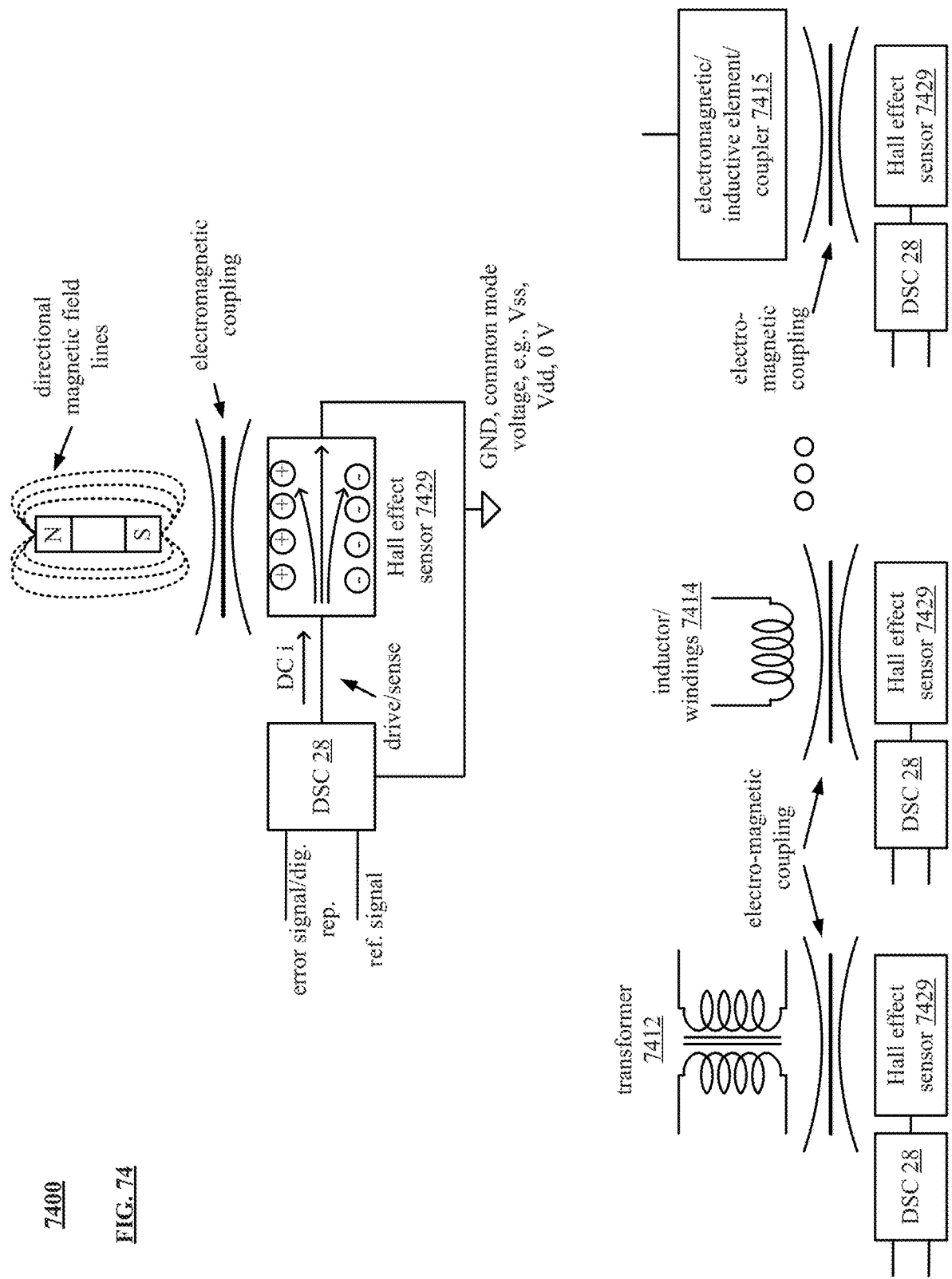
FIG. 74 is a schematic block diagram of another embodiment of single line Hall effect sensor drive and sense in accordance with the present invention.

FIG. 74 is a schematic block diagram of another embodiment 7400 of single line Hall effect sensor drive and sense in accordance with the present invention. In this diagram, a DSC 28 is in communication with a Hall effect sensor 7429. The DSC 28 is configured to generate a drive signal to be provided to the Hall effect sensor 7429 based on a reference signal and to generate an error signal such as a digital representation of any change of electrical characteristic of the drive signal that is provided to the Hall effect sensor 7429. In this implementation, the return path from the Hall effect sensor is connected to a common mode voltage, such as a ground, or some other common mode voltage such as Vss, Vdd, 0 V, etc. that is also a voltage reference for the DSC 28. Both the DSC 28 and the Hall effect sensor 7429 have a same voltage reference connection (e.g., such as ground, Vss, Vdd, 0 V, etc.).

The bottom of this diagram shows some of the many possible applications in which a Hall effect sensor 7429 may be implemented and operated in conjunction with the DSC 28. As mentioned above, generally speaking, in the context of motor and/or generator applications, a number of different magnetic fields are generated and may be sensed by an appropriately implemented Hall effect sensor 7429 and DSC 28. For example, the one or more magnetic fields generated by a transformer 7412 that operates via electromagnetic coupling from a first set of coils or windings to a second set of coils or windings may be detected and sensed. Also, the magnetic field generated by an inductor or a set of coils or windings 7414 may be detected and sensed. Generally speaking, the magnetic field generated via any electromagnetic/inductive element/coupler 7415 may be detected and sensed by such a configuration. Generally speaking, the electromagnetic/inductive element/coupler 7415 may be any element capable of providing electromagnetic coupling to the Hall effect sensor 7429 such that the Hall effect sensor 7429 can detect magnetic field generated thereby. In addition, other configurations and implementations by which one or more DSCs 28 may be implemented to facilitate operation of a Hall effect sensor are also of described herein.

In an example of operation and implementation, such a Hall effect sensor system includes a Hall effect sensor and a drive-sense circuit (DSC). The Hall effect sensor includes an input port to receive a DC (direct current) current signal. When enabled, the Hall effect sensor is configured to generate a Hall voltage based on exposure to a magnetic field. The DSC is operably coupled to the Hall effect sensor via a single line. When enabled, the DSC operably coupled and configured to generate the DC current signal based on a reference signal and to drive the DC current signal via the single line that operably couples the DSC to the Hall effect sensor and simultaneously to sense the DC current signal via the single line. The DSC is configured to detect an effect on the DC current signal corresponding to the Hall voltage that is generated across the Hall effect sensor based on exposure of the Hall effect sensor to the magnetic field and to generate a digital signal representative of the Hall voltage.

In certain examples, the Hall effect sensor system also includes memory that stores operational instructions, and one or more processing modules operably coupled to the DSC. When enabled, the one or more processing modules is configured to execute the operational instructions to receive the digital signal representative of the Hall voltage and process the digital signal to determine the Hall voltage.

In other examples, the DSC further includes a comparator configured to receive a reference signal from the one or more processing modules at a first comparator input and to drive the DC current signal from a comparator output that is coupled to a second comparator input. The DSC also includes an analog to digital converter (ADC) operably coupled to the comparator output, wherein, when enabled, the ADC operably coupled and configured to process the DC current signal to generate the digital signal representative of the Hall voltage.

Moreover, in some examples, an output port of the Hall effect sensor coupled to a common mode voltage reference of the DSC. Note that a magnetic field that is sensed by the Hall effect sensor system may be generated by any of a variety of sources including a magnet, a transformer, an inductor, a set of coils or windings, and/or stator windings of a motor or generator.

Also, in certain examples, the Hall effect sensor system includes a plurality of Hall effect sensors including the Hall effect sensor that are implemented within a stator around a rotor of a rotating equipment or a shaft coupled to the rotor of the rotating equipment and configured to detect rotation of the rotor based on magnetic fields generated by Hall effect sensor magnets, wherein each Hall effect sensor of the plurality of Hall effect sensors including a respective input port to receive a respective DC current signal. Also, the Hall effect sensor system includes a plurality of DSC including the DSC. When enabled, the plurality of DSCs operably coupled and configured to service the plurality of Hall effect sensors via a plurality of single lines such that each DSC of the plurality of DSC is operably coupled to a respective one Hall effect sensor of the plurality of Hall effect sensors to generate a plurality of digital signals representative of a plurality of Hall voltages based on exposure of the plurality of Hall effect sensors to magnetic fields. The Hall effect sensor system also includes one or more processing modules operably coupled to the DSC. When enabled, the one or more processing modules configured to receive the plurality of digital signals representative of the Hall voltages, process the plurality of digital signals to determine the Hall voltages, and process the Hall voltages to determine at least one of rotation of the rotor of the rotating equipment, position of the rotor of the rotating equipment to the stator, and/or a rotational rate of the rotor of the rotating equipment.

In some specific examples, the DSC further includes a power source circuit operably coupled to the single line. When enabled, the power source circuit is configured to provide the DC current signal via the single line coupling the DSC to the Hall effect sensor. The DSC also includes a power source change detection circuit operably coupled to the power source circuit. When enabled, the power source change detection circuit is configured to detect the effect on the DC current signal that is based on the effect on the DC current signal corresponding to the Hall voltage and generate the digital signal representative of the Hall voltage.

In some instances of such an implementation of a DSC, the power source circuit includes a power source to source the DC current signal via the single line coupling the DSC to the Hall effect sensor. Also, the power source change detection circuit includes a power source reference circuit configured to provide at least one of a voltage reference or a current reference, and a comparator configured to compare the DC current signal provided to the Hall effect sensor to the at least one of the voltage reference and the current reference to produce the DC current signal.

Figure 75:
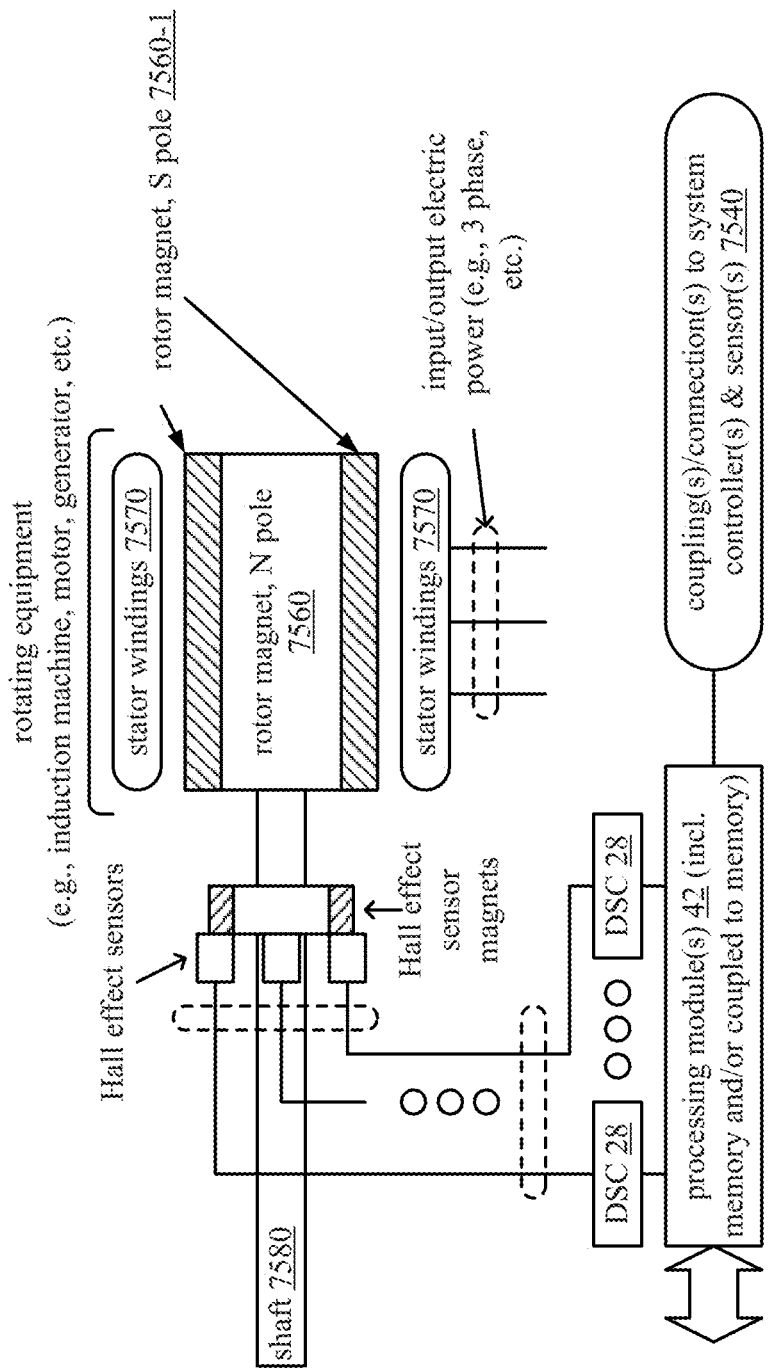
FIG. 75 is a schematic block diagram of an embodiment of multiple Hall effect sensors operative in accordance with the present invention.

FIG. 75 is a schematic block diagram of an embodiment 7500 of multiple Hall effect sensors operative in accordance with the present invention. In this diagram, a rotating equipment such as an induction machine, motor, generator, includes a rotor and a stator such that the rotor is implemented as including a rotor magnet that includes a North Pole 7560 and the South Pole 7560-1. As the rotor of the rotating equipment rotates along the axis of the shaft 7580, electromagnetic coupling is effectuated between windings of the rotor and the stator windings 7570. Depending on the particular application, the rotating equipment may be implemented to operate as a motor such that input electric power is provided to the stator windings 7570 to facilitate rotation of the rotor of the rotating equipment in a motoring application, or the rotating equipment may be implemented operated generator such that as the rotor of the rotating equipment is rotated by some mechanical energy source providing rotational energy via the shaft 7580, output electric power is provided from the stator windings 7570.

In this diagram, one or more Hall effect sensors are implemented appropriately around the shaft 7580 and in communication with one or more processing modules 42 via one or more DSCs 28. In addition, one or more corresponding Hall effect sensor magnets are also implemented within sufficient and appropriate proximity to the Hall effect sensors such that as they pass the Hall effect sensors, the magnetic field provided by the Hall effect sensor magnets may be detected by the Hall effect sensors.

The one or more processing modules 42 is configured to communicate with and interact with the one or more DSCs 28 that are in communication with the Hall effect sensors. The one or more processing modules 42 is coupled to the one or more DSCs and is operable to provide control to and communication with the one or more DSCs. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

As the rotor of the rotating equipment rotates, and as the Hall effect sensor magnets pass the Hall effect sensors, the one or more DSCs 28 are configured to provide information to the one or more processing modules 42 and interpreted to determine the location of the rotor of the rotating equipment (e.g., such as the location of the windings of the rotor relative to the stator windings 7570). The one or processing modules 42 is configured to use this information to control and adapt operation of a system that includes the rotating equipment. In certain examples, one or more couplings and/or connections to one or more system controllers and/or sensors 7540 are also provided to the one or more processing modules 42. Some of those couplings and/or connections may be implemented via one or more DSCs 28. The one or more processing modules 42 is also configured to determine the rotational rate of the rotor of the rotating equipment based on information provided from the one or more Hall effect sensors via the one or more DSCs 28. This diagram shows the specific example by which one or more appropriately implemented DSCs 28 communicate with and interact with one or more Hall effect sensors to determine information regarding the operation of the rotating equipment.

Figure 76:
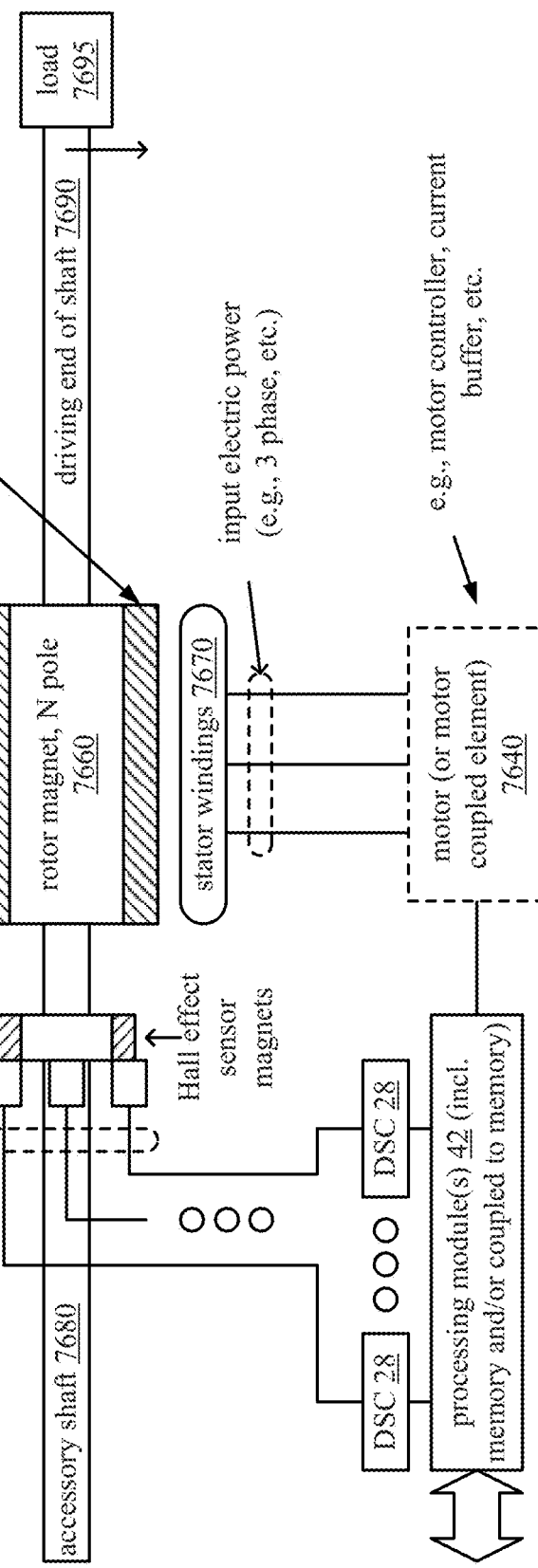
FIG. 76 is a schematic block diagram of another embodiment of multiple Hall effect sensors operative in accordance with the present invention.

FIG. 76 is a schematic block diagram of another embodiment 7600 of multiple Hall effect sensors operative in accordance with the present invention. This diagram has some similarities to the previous diagram. For example, one or more processing modules 42 is configured to communicate with and interact with the one or more DSCs 28 that are in communication with the Hall effect sensors. The one or more processing modules 42 is coupled to the one or more DSCs and is operable to provide control to and communication with the one or more DSCs. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

Also, this diagram, rotating equipment (e.g., which may be any of a number of different types of rotating equipment such as a motor, a DC motor, an AC/induction motor, a brushless DC motor (BLDC), etc.) includes on one end of its rotor an accessory shaft 7680 includes one or more Hall sensors and magnets mounted thereon that are in communication with the one or more processing modules 42 via one or more DSCs 28. In this diagram, the rotating equipment includes a rotor and a stator such that the rotor is implemented as including a rotor magnet that includes a North Pole 7660 and the South Pole 7660-1. As the rotor of the rotating equipment rotates along the axis of the shaft 7680, electromagnetic coupling is effectuated between windings of the rotor and the stator windings 7670. In this diagram, the rotating equipment is implemented to operate as a motor such that input electric power is provided to the stator windings 7670 to facilitate rotation of the rotor of the rotating equipment in a motoring application thereby facilitating the driving and of shaft 7690 to engage and operate on a load 7695. The load 7695 may be any type of load that may be serviced by a motor (e.g., such as a generator, a pump, compressor, and industrial equipment being serviced by a motor, the drive mechanism of a vehicle such as a car, train, etc. and/or any other load 7695 that may be serviced by a motor).

The one or more processing modules 42 is configured to process information provided via the one or more DSCs 28 from the Hall effect sensors to determine information regarding the operation of the motor. For example, this may involve determining the location of the rotor of the rotating equipment (e.g., such as the location of the windings of the rotor relative to the stator windings 7670), the rate of rotation of the rotor of the motor, the slip of the motor, the torque of the motor, and/or any other corresponding information.

The one or more processing modules 42 is configured to control and adapt operation of the motor via a coupling to the motor for the motor coupled element 7640. For example, in some instances, the one or more processing modules 42 is configured to interface and communicate with the stator windings 7670 of the motor via one or more motor coupled elements, such as a motor controller, a current buffer, etc. and other examples, the one or more processing modules 42 is configured to interface and communicate with the stator windings 7670 directly.

Figure 77:
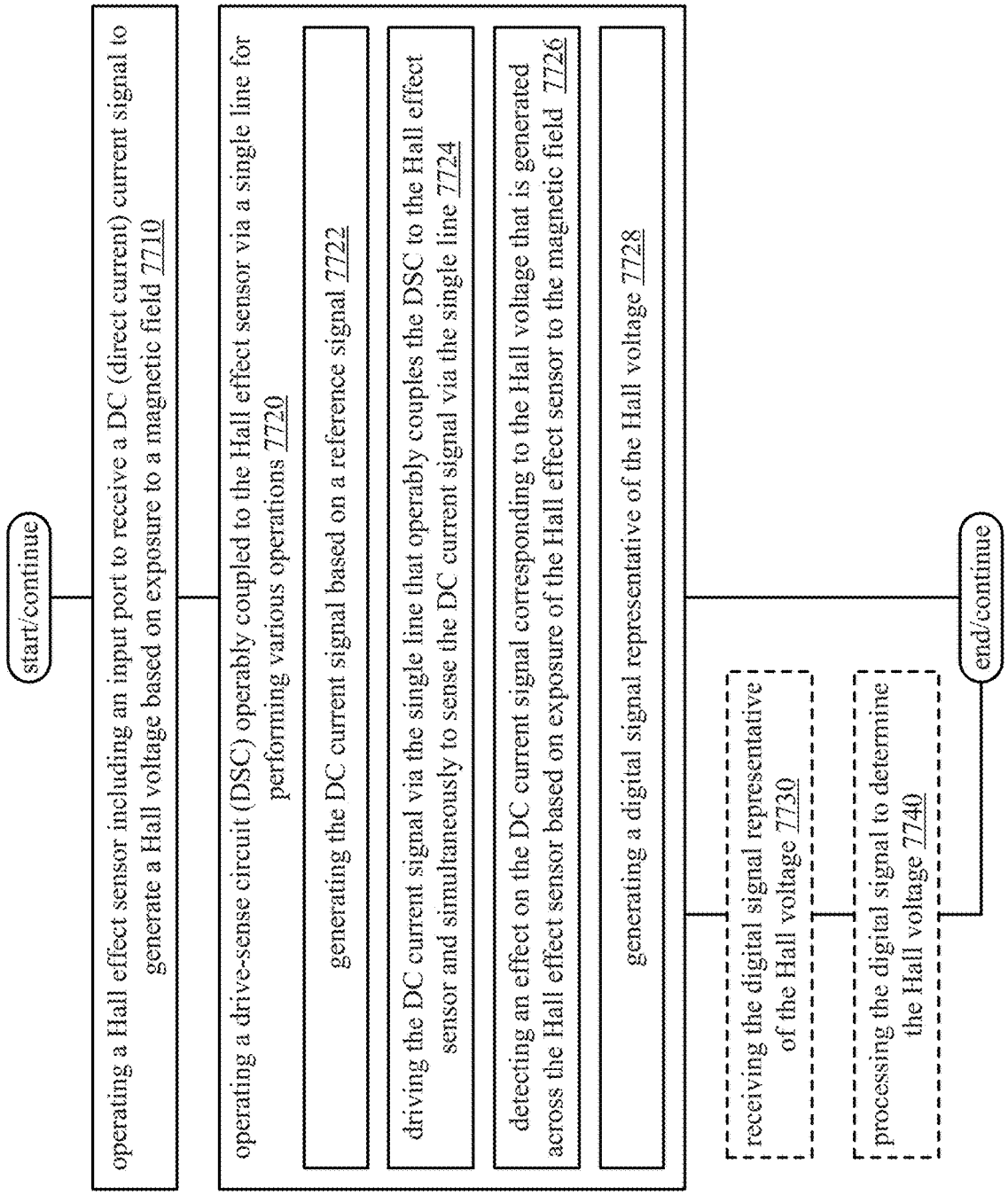
FIG. 77 is a schematic block diagram of another embodiment of a method for execution by one or more devices in accordance with the present invention.

FIG. 77 is a schematic block diagram of another embodiment of a method 7700 for execution by one or more devices in accordance with the present invention. This method 770 may be viewed as being a method for execution by a Hall effect sensor system. The method 7700 operates in step 7710 by operating a Hall effect sensor including an input port to receive a DC (direct current) current signal to generate a Hall voltage based on exposure to a magnetic field. The method 7700 continues in step 7720 by operating a drive-sense circuit (DSC) operably coupled to the Hall effect sensor via a single line for performing various operations.

The method 7700 operates in step 7722 by generating the DC current signal based on a reference signal and, in step 7724, driving the DC current signal via the single line that operably couples the DSC to the Hall effect sensor and simultaneously to sense the DC current signal via the single line. The method 7700 continues in step 7726 by detecting an effect on the DC current signal corresponding to the Hall voltage that is generated across the Hall effect sensor based on exposure of the Hall effect sensor to the magnetic field and, in step 7728, generating a digital signal representative of the Hall voltage.

In some alternative examples, a variant of the method 7700 also operates in step 7730 by receiving the digital signal representative of the Hall voltage (e.g., by one or more processing modules), and, in step 7740, processing the digital signal to determine the Hall voltage.

Alternative variants of the method 7700 may also involve operating a plurality of Hall effect sensors including the Hall effect sensor that are implemented within a stator around a rotor of a rotating equipment or a shaft coupled to the rotor of the rotating equipment and configured to detect rotation of the rotor based on magnetic fields generated by Hall effect sensor magnets, wherein each Hall effect sensor of the plurality of Hall effect sensors including a respective input port to receive a respective DC current signal. Such variants of the method 7700 may also involve operating a plurality of DSC including the DSC to service the plurality of Hall effect sensors via a plurality of single lines such that each DSC of the plurality of DSC is operably coupled to a respective one Hall effect sensor of the plurality of Hall effect sensors to generate a plurality of digital signals representative of a plurality of Hall voltages based on exposure of the plurality of Hall effect sensors to magnetic fields. Such variants of the method 7700 may also involve (e.g., by one or more processing modules) the operational steps if receiving the plurality of digital signals representative of the Hall voltages, processing the plurality of digital signals to determine the Hall voltages, and processing the Hall voltages to determine at least one of rotation of the rotor of the rotating equipment, position of the rotor of the rotating equipment to the stator, or a rotational rate of the rotor of the rotating equipment.

Figure 78:
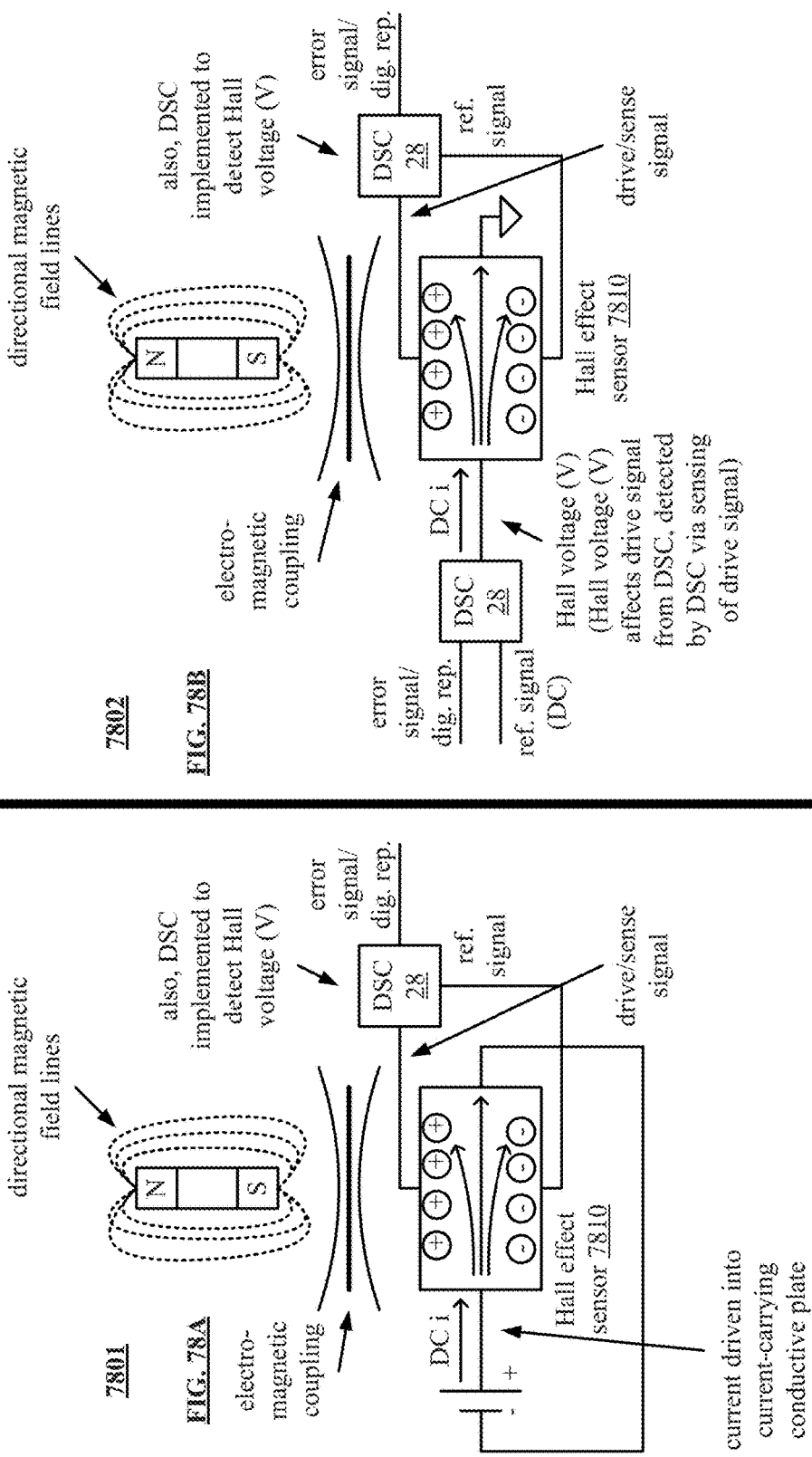
FIG. 78A is a schematic block diagram of an embodiment of a Hall voltage sensor in accordance with the present invention.
FIG. 78B is a schematic block diagram of another embodiment of a Hall voltage sensor in accordance with the present invention.

FIG. 78A is a schematic block diagram of an embodiment 7801 of a Hall voltage sensor in accordance with the present invention. As also described above, the Hall effect corresponds to a voltage potential that develops across the current-carrying conductive plate (e.g., alternatively referred to as a Hall effect sensor 7810) based on its exposure to a magnetic field. For example, when a magnetic field is aligned such that the directional magnetic field lines are perpendicular to the plane of a Hall effect sensor 7810, a Hall voltage V is produced in the current-carrying conductive plate (note that the current-carrying conductive plate may alternatively be referred to as the Hall effect sensor 7810).

In this diagram, a DSC 28 is implemented to detect the Hall voltage V. In this example, a DC source provides a DC current (DC i) across the Hall effect sensor 7810, and a DSC 28 is configured to be connected to a first of the locations at which the Hall voltage V may be measured on the Hall effect sensor 7810 via a drive/sense signal and connected a second of the locations at which the Hall voltage V may be measured on the Hall effect sensor 7810 via the reference signal input to the DSC 28. The DSC 28 is configured to generate an error signal, such as being a digital representation of the difference between the reference signal input and the drive/sense signal input to the DSC 28. This diagram shows another example by which a DSC 28 may be implemented to provide improved sensitivity, efficiency, and performance of the operation of the DSC 28. Such an appropriately implemented DSC 28 is configured to detect the Hall voltage V with extremely high sensitivity based on detecting the difference between the voltage on the two sides of the Hall effect sensor 7810.

FIG. 78B is a schematic block diagram of another embodiment 7802 of a Hall voltage sensor in accordance with the present invention. This diagram has some similarities to certain of the previous diagrams. In this diagram, a first DSC 28 is configured to provide the current that is transmitted into the Hall effect sensor 7810. In this particular diagram, a DC reference signal is provided to the first DSC 28 and an output DC current, DC i, is driven into the Hall effect sensor 7810. The output of the Hall effect sensor 7810 that might be used to return the current is grounded in this example. The first DSC 28 is configured to generate an error signal such as a digital representation of a change in an electrical characteristic of the Hall effect sensor 7810 such as may be generated by the Hall effect sensor 7810 being within sufficient proximity of a magnetic field such that electromagnetic coupling is provided thereto thereby changing the electrical characteristics of the Hall effect sensor 7810.

Also, in this diagram, a second DSC 28 is implemented to detect the Hall voltage V. In this example, a DC source provides a DC current (DC i) across the Hall effect sensor 7810, and a second DSC 28 is configured to be connected to a first of the locations at which the Hall voltage V may be measured on the Hall effect sensor 7810 via a drive/sense signal and connected a second of the locations at which the Hall voltage V may be measured on the Hall effect sensor 7810 via the reference signal input to the second DSC 28. The second DSC 28 is configured to generate an error signal, such as being a digital representation of the difference between the reference signal input and the drive/sense signal input to the second DSC 28.

This diagram shows an example by which more than one appropriately implemented DSCs 28 is configured to facilitate improved operation of a Hall effect sensor 7810. Not only is the first DSC 28 implemented to operate as the current source that is provided to the Hall effect sensor 7810, but one or more other DSCs 28 is implemented to detect the Hall voltage V that is generated as the Hall effect sensor 7810 is exposed to a magnetic field.

Figure 79:
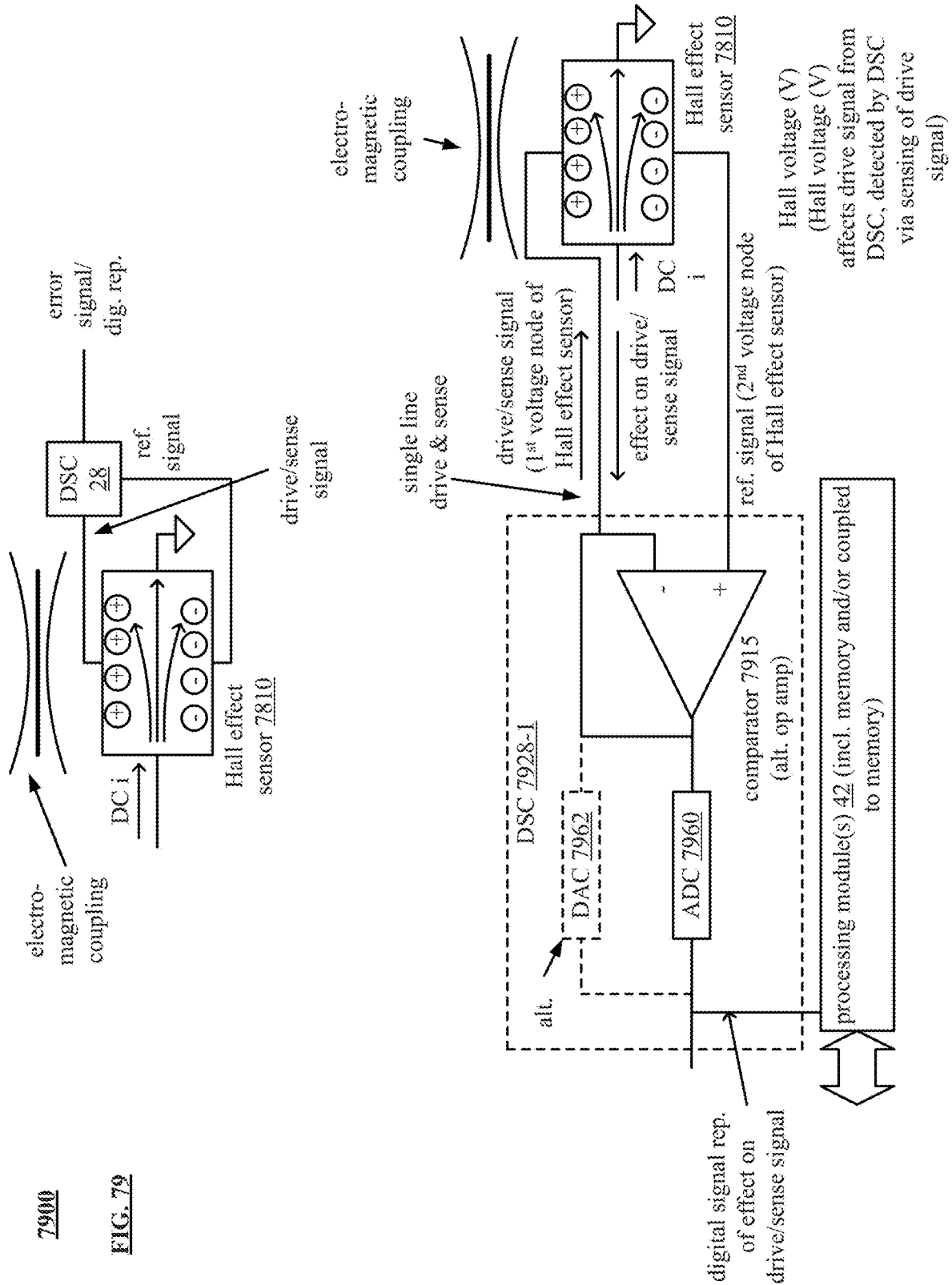
FIG. 79 is a schematic block diagram of another embodiment of a Hall voltage sensor in accordance with the present invention.

FIG. 79 is a schematic block diagram of another embodiment 7900 of a Hall voltage sensor in accordance with the present invention. The top of this diagram shows a similar configuration as described in the previous diagram (e.g., a DSC 28 that is in communication with a Hall effect sensor 7810 to detect Hall voltage V; note that the drive current provided to the Hall effect sensor 7810 may be provided by another DSC or via some other means), and the bottom of this diagram shows another implementation by which a Hall effect sensor may be implemented in conjunction with a DSC particularly for sensing Hall voltage V.

In this diagram, one or more processing modules 42 is configured to communicate with and interact with a drive-sense circuit (DSC) 7928-1. The one or more processing modules 42 is coupled to a DSC 7928-1 and is operable to provide control to and communication with the DSC 7928-1. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, a first of the locations at which the Hall voltage V may be measured on the Hall effect sensor 7810 is connected to one of the inputs of a comparator 7915. A second of the locations at which the Hall voltage V may be measured on the Hall effect sensor 7810 is connected to the other of the inputs of a comparator 7915 (e.g., where a reference signal input may be provided to a DSC as shown in other examples, embodiments, diagrams, etc.).

Note that the comparator 7915 may alternatively be implemented as an operational amplifier in certain embodiments. Note that both inputs of the comparator 7915 are coupled directly from the DSC 7928-1 to the Hall effect sensor 7810. The DSC 7928-1 is configured to detect the difference between a first voltage node and a second voltage node of the Hall effect sensor 7810. When the Hall effect sensor 7810 is exposed to a magnetic field and electromagnetic coupling is made from that magnetic field to the Hall effect sensor 7810, there will be displacement of the electrons in the Hall effect sensor 7229 due to exposure to the magnetic field. The DSC 7928-1 is configured to detect any change of voltage, particularly the Hall voltage V, based on the voltage difference between the two sides of the Hall effect sensor 7810.

The output of the comparator 7915 is provided to an analog to digital converter (ADC) 7960 that is configured to generate a digital signal that is representative of the effect on the drive signal that is provided to the Hall effect sensor 7810. In some examples the digital signal is output from the ADC 7960 and is fed back via a digital to analog converter (DAC) 7962 to generate the drive signal is provided to the Hall effect sensor 7810. In other examples that do not include DAC 7962, the input to the ADC 7960 is fed back directly to the connection to the first voltage node of the Hall effect sensor 7810. In addition, the digital signal that is representative of the effect on the drive signal is also provided to the one or more processing modules 42. The one or more processing modules 42 is configured to provide control to and be in communication with the DSC 7928-1. The one or more processing modules 42 is configured to interpret the digital signal that is representative of the effect on the drive signal to determine a Hall voltage V induced within the Hall effect sensor 7810 based on its exposure to the magnetic field and particularly based on the potential difference generated across the Hall effect sensor 7810.

Figure 80:
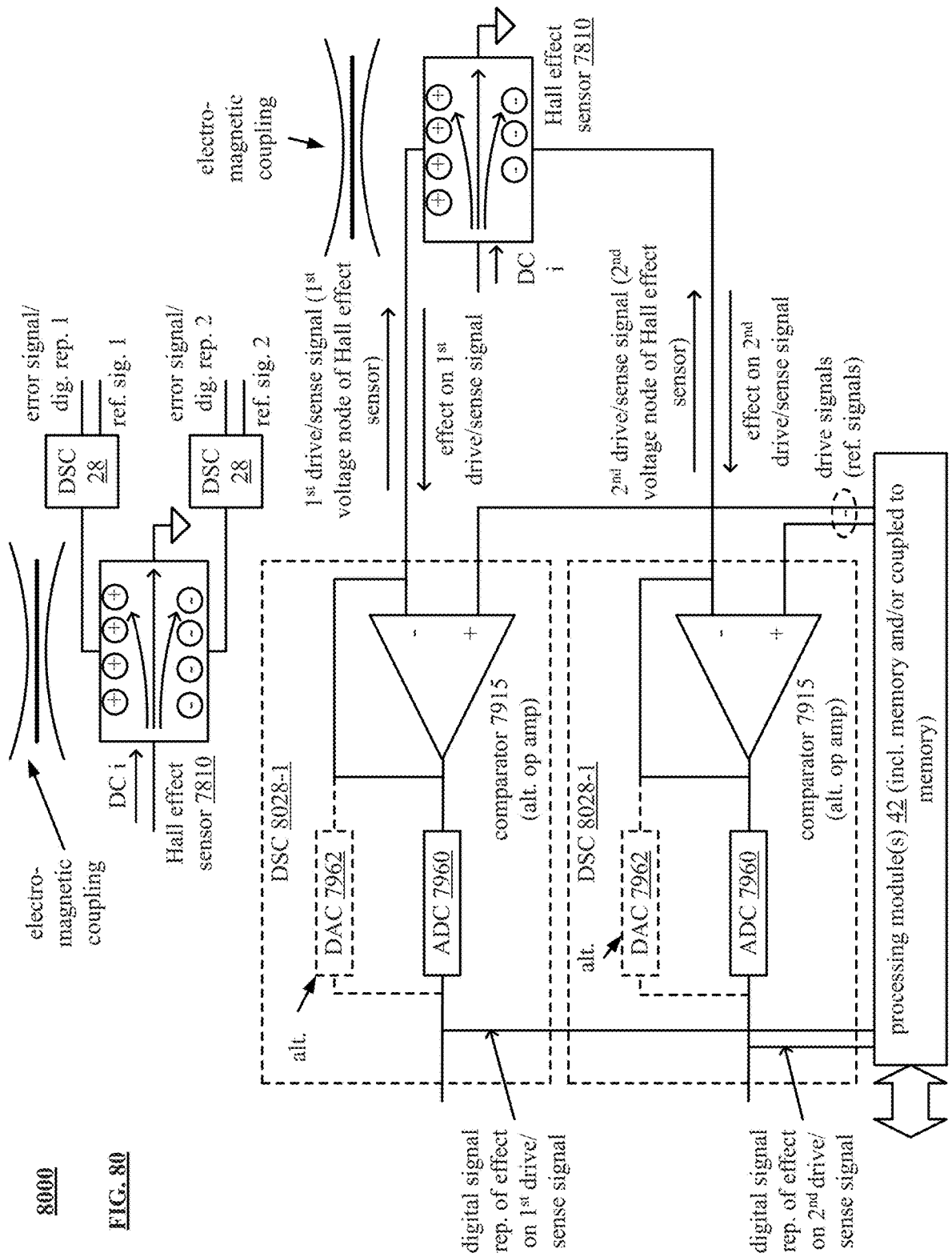
FIG. 80 is a schematic block diagram of another embodiment of a Hall voltage sensor in accordance with the present invention.

FIG. 80 is a schematic block diagram of another embodiment 8000 of a Hall voltage sensor in accordance with the present invention. This diagram has some similarities to certain of the previous diagrams. Note that the drive current provided to the Hall effect sensor 7810 may be provided by a DSC or via some other means. However, as can be seen, two separately implemented DSCs 28 are configured to provide information to be used by one or more processing modules 42 to determine Hall voltage V. A first and second DSC 8028-1 are configured to sense a first voltage associated with a first voltage node and a second voltage node, respectively, of the Hall effect sensor 7810.

In this diagram, one or more processing modules 42 is configured to communicate with and interact with a drive-sense circuits (DSCs) 8028-1. The one or more processing modules 42 is coupled to the DSCs 8028-1 and is operable to provide control to and communication with the DSCs 8028-1. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, the one or more processing module 42 is configured to provide a first drive signal, which may be viewed as a first reference signal, to one of the inputs of a comparator 7915 of the first DSC 8028-1 and also a second drive signal, which may be viewed as a second reference signal, to one of the inputs of a comparator 7915 of the second DSC 8028-1. Note that the comparators 7915 of the DSCs 8028-1 may alternatively be implemented as an operational amplifier in certain embodiments.

Each of the other inputs of the comparators 7915 of the DSCs 8028-1 is respectively coupled to provide a respective drive signal to one of the voltage nodes of the Hall effect sensor 7810 by which the Hall voltage V may be detected. Each of the DSCs 8028-1 is configured to provide a respective drive signal to the Hall effect sensor 7810 and also simultaneously to sense the drive signal and to detect any effect on the drive signal. For example, when the Hall effect sensor 7810 is exposed to a magnetic field and electromagnetic coupling is made from that magnetic field to the Hall effect sensor 7810, there will be displacement of the electrons in the Hall effect sensor 7810 due to exposure to the magnetic field. Each of the two DSCs 8028-1 is configured to detect the change of at least one electrical characteristic of its respective drive signals that is provided to the Hall effect sensor 7810.

In some examples, the reference signals that are provided from the one or more processing modules 42 to the appropriate inputs of the comparators 7915 of the DSCs 8028-1 is a DC signal, such as a known or predetermined voltage, ground, etc. In addition, in some examples, the two reference signals are of a common value and type. Generally speaking, the reference signals that are provided from the one or more processing modules 42 may be of any desired type. Considering an example in which the reference signals are ground (e.g., DC signals having a voltage of 0 V), then as a Hall voltage V is generated within the Hall effect sensor 7810, the two DSCs 8028-1 will respectively detect voltage on the voltage nodes of the Hall effect sensor 7810. The difference between those two voltages that are detected by the two DSCs 8028-1 corresponds to the Hall voltage V.

The two DSCs 8028-1 are cooperatively configured to detect the difference between a first voltage node and a second voltage node of the Hall effect sensor 7810. When the Hall effect sensor 7810 is exposed to a magnetic field and electromagnetic coupling is made from that magnetic field to the Hall effect sensor 7810, there will be displacement of the electrons in the Hall effect sensor 7229 due to exposure to the magnetic field. Each of the two DSCs 8028-1 is rep configured to detect any change of voltage, corresponding to one of the respective voltage nodes of the Hall effect sensor 7810. The voltage difference between the two sides of the Hall effect sensor 7810, as detected by the two DSC 8028-1, provides information that may be used to determine the Hall voltage V.

Considering the operation of one of the DSC 8028-1, the output of the comparator 7915 is provided to an analog to digital converter (ADC) 7960 that is configured to generate a digital signal that is representative of the effect on the drive signal that is provided to the Hall effect sensor 7810. In some examples the digital signal is output from the ADC 7960 and is fed back via a digital to analog converter (DAC) 7962 to generate the drive signal is provided to the Hall effect sensor 7810. In other examples that do not include DAC 7962, the input to the ADC 7960 is fed back directly to the connection to the respective voltage node of the Hall effect sensor 7810. In addition, the digital signal that is representative of the effect on the drive signal is also provided to the one or more processing modules 42. The one or more processing modules 42 is configured to provide control to and be in communication with the DSC 8028-1 including to adapt the respective drive signal that is provided to the comparator 7915 therein as desired to facilitate effective sensing operation based on the Hall effect sensor 7810 via the drive signal. The one or more processing modules 42 is configured to interpret the digital signal that is representative of the effect on the drive signal to determine a voltage associated with one of the voltage nodes of the Hall effect sensor 7810 corresponding to the a Hall voltage V induced within the Hall effect sensor 7810 based on its exposure to the magnetic field. The one or more processing modules 42 is configured to employ the respective digital signals provided from the two DSC 8028-1 to determine the potential difference generated across the Hall effect sensor 7810, namely, the Hall voltage V.

FIG. 81A is a schematic block diagram of another embodiment of a method 8101 for execution by one or more devices in accordance with the present invention. The method 8101 operates in step 8110 by providing a first signal to a first voltage node of a Hall effect sensor from a drive/sense port of a DSC. The method 8101 also operates in step 8120 by receiving, at a reference signal input of the DSC, a second signal from a second voltage node of the Hall effect sensor.

The method 8101 continues in step 8130 by monitoring for a change of an electrical characteristic of the first signal and/or the second signal within the DSC. Based on detection of one or more changes of one or more electrical characteristics of the first signal and/or the second signal within the DSC within step 8140, the method 8101 also operates in step 8150 by operating one or more processing modules for processing the one or more changes of the first signal and/or the second signal that is detected within the DSC to determine a Hall voltage that is generated within the Hall effect sensor based on its exposure to a magnetic field.

Alternatively, based on no detection of one or more changes of one or more electrical characteristics of the first signal and/or the second signal within the DSC within step 8140, the method 8101 ends or continues such as by looping back and performing the operational step 8130 and continuing to perform the method 8100.

In some examples, the source that is providing a current signal to the Hall effect sensor is another DSC. In other examples, some other element that is not DSC based operates as the source that provides the current signal to the Hall effect sensor.

FIG. 81B is a schematic block diagram of another embodiment of a method 8102 for execution by one or more devices in accordance with the present invention. The method 8102 operates in step 8111 by providing a first signal to a first voltage node of a Hall effect sensor from a drive/sense port of a first DSC. The method 8102 also operates in step 8121 by providing a second signal to a second voltage node of the Hall effect sensor from a drive/sense port of a second DSC. In some examples, one or more processing modules also operate by providing a reference signal to the first DSC into the second DSC, or alternatively, by providing a first reference signal to the first DSC and a second reference signal to the second DSC.

The method 8102 continues in step 8131 by monitoring for a change of an electrical characteristic of the first signal and/or the second signal within the DSC. Based on detection of one or more changes of one or more electrical characteristics of the first signal and/or the second signal within the DSC within step 8141, the method 8102 also operates in step 8151 by operating one or more processing modules for processing the one or more changes of the first signal and/or the second signal that is detected within the DSC to determine a Hall voltage that is generated within the Hall effect sensor based on its exposure to a magnetic field. Note that this may involve detecting one or more changes of the first signal within the first DSC and also detecting one or more changes of the second signal within the second DSC. Alternatively, this may involve detecting one or more changes of the first signal within the first DSC and no change on the second signal within the second DSC, or vice versa.

Alternatively, based on no detection of one or more changes of one or more electrical characteristics of the first signal and/or the second signal within the DSC within step 8141, the method 8102 ends or continues such as by looping back and performing the operational step 8131 and continuing to perform the method 8102.

In some examples, the source that is providing a current signal to the Hall effect sensor is another DSC. In other examples, some other element that is not DSC based operates as the source that provides the current signal to the Hall effect sensor.

FIG. 82A is a schematic block diagram of an embodiment 8201 of a Hall effect sensor adapted driver circuit in accordance with the present invention. In this diagram, a DSC 28 is implemented to provide a drive/sense current signal (shown as DC i) to a Hall effect sensor 7810. The DSC 28 is configured to generate this drive/sense current signal based on a reference signal and also to generate an error signal, which may be a digital representation of any change of the drive/sense current signal. The output of the Hall effect sensor 7810 is shown as being connected to a winding of a transformer 8212. In this diagram, the other end of the transformer 8212 is grounded. In alternative examples, the other end of the transformer 8212 may alternatively be connected to another element.

This transformer 8212 includes a first one or more sets of windings and a second one or more sets of windings (e.g., a primary and a secondary one or more sets of windings in some examples). In addition, the Hall effect sensor 7810 is implemented such that it is operative to detect electromagnetic coupling from the transformer 8212 itself. This electromagnetic coupling may be from the first one or more sets of windings, the second one or more sets of windings, the electromagnetic coupling between the two sets of windings, and/or any combination thereof. In some examples, the Hall effect sensor 7810 is specifically implemented and emplaced to detect one particular source (e.g., such as being implemented specifically to detect electromagnetic coupling from the first or primary one or more sets of windings, the second or secondary one or more sets of windings, the electromagnetic coupling between any set of windings, etc.). In other examples, the Hall effect sensor 7810 is implemented and emplaced to detect the magnetic field in a particular region, such as that electromagnetic coupling which is provided from the transformer 8212.

This diagram shows an example by which a DSC itself drives the input signal to a transformer 8212 through a Hall effect sensor 7810 that senses the magnetic field to regulate the current signal provided thereto. For example, instead of the transformer 8212 being driven by a merely a current signal, a voltage signal, and/or a power signal, the Hall effect sensor 7810 is implemented specifically to provide regulation of the current signal provided to the transformer 8212 by detecting one or more of the electromagnetic fields generated thereby. This provides, among other things, a means by which real-time feedback of the current signal provided to the transformer 8212.

In addition, in this diagram as well as FIGS. 82B, 83A, and 83B, one or more processing modules 42 is configured to communicate with and interact with the drive-sense circuit (DSC) 28. The one or more processing modules 42 is coupled to the DSCs 28 and is operable to provide control to and communication with the DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

FIG. 82B is a schematic block diagram of another embodiment 8202 of a Hall effect sensor adapted driver circuit in accordance with the present invention. This diagram has some similarities to the previous diagram with at least one difference being that the output of the Hall effect sensor 7810 is connected to the transformer 8210 via a current buffer 8250. In some examples, this current buffer is a high current buffer implemented to deliver sufficient current, voltage, and/or power to the transformer 82122 facilitate appropriate operation thereof. For example, in some implementations in which the current output from a Hall effect sensor 7810 does not have the capability to drive a current signal to the transformer 8210, the current buffer 8250 may be implemented to provide an adequate current signal is appropriate for the transformer 8210.

FIG. 83A is a schematic block diagram of another embodiment 8301 of a Hall effect sensor adapted driver circuit in accordance with the present invention. This diagram has some similarities to the previous diagrams with at least one difference being that the windings shown at the top of the diagram correspond to those of induction machine 8320 having stator windings 8312*a* and rotor windings 8312*b*. The output of the Hall effect sensor 7810, which may optionally be provided via a current buffer 8350, is provided to the stator windings 8312*a*.

In this diagram, the other end of the stator windings 8312*a* is grounded. In alternative examples, the other end of the stator windings 8312*a* may alternatively be connected to another element (e.g., for example, in a multiphase induction machine implementation in which each of the respective phases includes two separate sets of windings, such that the output of first set of windings for one phase is provided as the input to a second set of windings for that same phase).

In addition, in another example, in certain multiphase induction machine applications, a separate instantiation of the DSC 28 and Hall effect sensor 7810 (and optionally current buffer 8350) may be implemented for each of the respective phases of the multiphase induction machine. Considering an example of implementation within a 3-phase induction machine, a first instantiation the DSC 28 and Hall effect sensor 7810 (and optionally current buffer 8350) for the first phase, a second instantiation of the DSC 28 and Hall effect sensor 7810 (and optionally current buffer 8350) for the second phase, and a third instantiation the DSC 28 and Hall effect sensor 7810 (and optionally current buffer 8350) for the third phase. As may be desired, each of these respective instantiations may be in communication with the one or more processing modules 42 such that each respective DSC 28 of each respective instantiation receives its own reference signal and is configured to generate an error signal based on any change of an electrical characteristic of the current signal that is driven to its respective Hall effect sensor 7810. For example, considering a 3-phase induction machine implementation, such as a motor implementation, each of the 3 respective reference signals provided to the 3 respective DSCs of the three separate instantiations may be signals having similar characteristics yet been out of phase with one another by 120° (e.g., the first reference signal having a phase of 0°, the second reference signal having a phase of hundred 20°, and the third reference signal having a phase of 240°).

FIG. 83B is a schematic block diagram of another embodiment 8302 of a Hall effect sensor adapted driver circuit in accordance with the present invention. This diagram also has some similarities to certain of the previous diagrams with at least one difference being that the output of the Hall effect sensor 7810 (or optionally the output of a current buffer 8350) is connected to an inductor or one or more windings 8314. Such an implementation of a DSC 28 and Hall effect sensor 7810 being implemented to provide real-time feedback of the electromagnetic coupling or electromagnetic field generated by an element that is being driven by the output of the DSC 28 implemented Hall effect sensor 7810 (or optionally the output of the current buffer 8350) may generally be provided to any element capable of providing electromagnetic coupling to the Hall effect sensor 7810 such that the Hall effect sensor 7810 can detect magnetic field generated thereby. Generally speaking, the inductor or one or more windings 8314 may alternatively be any electromagnetic/inductive element/coupler 8415 may be any element capable of providing electromagnetic coupling to the Hall effect sensor 7810 such that the Hall effect sensor 7810 can detect magnetic field generated thereby.

FIG. 84 is a schematic block diagram of another embodiment of a method 8400 for execution by one or more devices in accordance with the present invention. The method 8400 operates in step 8410 by providing a drive/sense signal from a DSC to a Hall effect sensor that is implemented to detect electromagnetic coupling from an electromagnetic field generating element that is coupled to the output of the Hall effect sensor. In some examples, this may be viewed as operating a DSC for driving an input signal to the electromagnetic field generating element through the Hall effect sensor that senses the magnetic field to regulate the input signal (e.g., the current signal) provided thereto.

Note that the electromagnetic field generating element may be any element implemented to receive an input signal that generates a magnetic field during operation. Examples of such electromagnetic field generating elements may include any one or more of a transformer, an inductor, a set of windings (e.g., one or more sets of stator windings) such as within a generator and/or motor application.

Also, in some examples, note that the output from the Hall effect sensor that is provided to the input of the electromagnetic field generating element is provided via a current buffer, such as a high current buffer, so as to ensure an adequate amount of current, power, etc. will be delivered to the input of the electromagnetic field generating element to facilitate proper operation thereof.

The method 8400 continues in step 8420 by providing the input signal to the electromagnetic field generating element from the output of the Hall effect sensor. In operation, the method 8400 also operates by regulating the input signal that is provided to the electromagnetic field generating element by detecting the one or more electromagnetic fields generated by the electromagnetic field generating element and adapting the input signal based on the one or more electromagnetic fields generated by the electromagnetic field generating element.

For example, this regulation of the input signal may be viewed as monitoring the one or more electromagnetic fields generated by the electromagnetic field generating element for any change thereof such as shown within step 8430. Based on detection of the change of the one or more electromagnetic fields by the Hall effect sensor in step 8440, the method 8400 also operates in step 8450 by adapting the operation of the Hall effect sensor based on the change of the one or more electromagnetic fields that is detected by the Hall effect sensor. This in turn operates by adapting the input signal to the electromagnetic field generating element in step 8460.

Alternatively, based on no detection of any change of the one or more electromagnetic fields generated by the electromagnetic field generating element within step 8440, the method 8400 ends or continues such as by looping back and performing the operational step 8430 and continuing to perform the method 8400.

Figure 85:
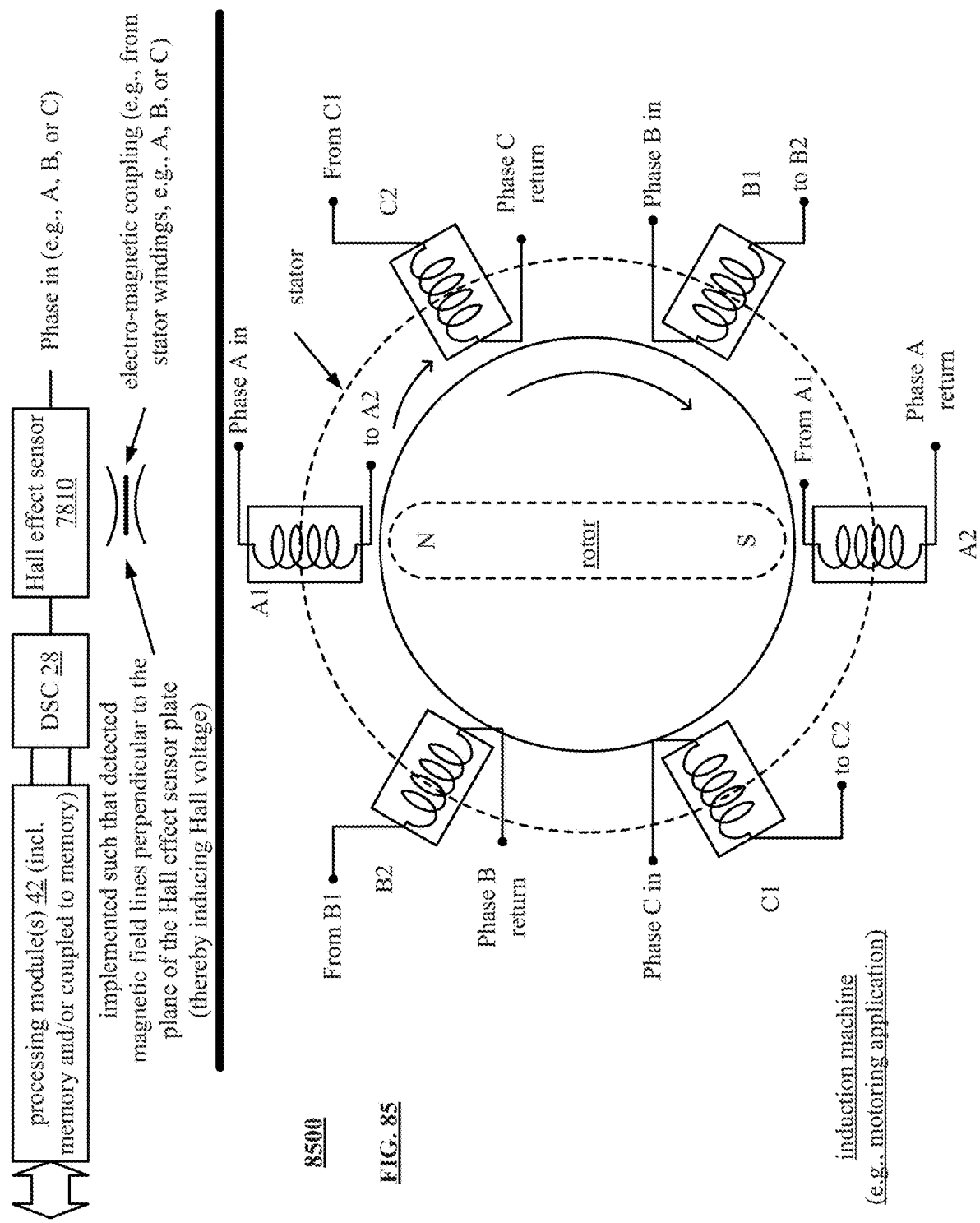
FIG. 85 is a schematic block diagram of an embodiment of induction machine control using Hall effect sensor adapted driver circuit in accordance with the present invention.

FIG. 85 is a schematic block diagram of an embodiment 8500 of induction machine control using Hall effect sensor adapted driver circuit in accordance with the present invention. In this diagram, as well as in FIGS. 86, 87, and 88, one or more processing modules 42 is configured to communicate with and interact with one or more drive-sense circuits (DSCs) 28. The one or more processing modules 42 is coupled to the DSCs 28 and is operable to provide control to and communication with the DSCs 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

For example, the one or more processing modules 42 is configured to provide reference signal to the DSC 28 and to receive an error signal corresponding to any change of an electrical characteristic of the drive/sense signal provided from the DSC 28 to the Hall effect sensor 7810. In this implementation, the Hall effect sensor 7810 is implemented to provide the drive signal to one of the one or more stator windings of a motor and also to detect electromagnetic coupling from that one or more stator windings of the motor.

For example, the bottom of this diagram shows a 3-phase induction machine has three sets of windings, with each phase connected to a different set of windings. Consider three different electric power signals being out of phase with one another by 120°. On the right-hand side of the diagram shows the 3-phase AC power supply such that phase A may be viewed as having a phase of 0°, phase B may be viewed as having a phase of 120°, and phase C may be viewed as having a phase of 240°. The rotor of the induction machine is implemented as having a North Pole and South Pole. By appropriately providing electric power input signals to the stator windings of the induction machine, specifically shown as phase A in, phase B in, and in phase A in, a rotating magnetic field will be induced within the stator windings of the induction machine. In this example, which includes a 2-pole, 3-phase induction machine, each respective phase includes two corresponding sets of windings, as can be seen as an example from the A1 and A2 stator windings associated with phase A, the B1 and B2 stator windings associated with phase B, and the C1 and C2 stator windings associated with phase C. This configuration is similar to that which is described above with reference to FIG. 19 in at least some respects. FIG. 19 and associated written description also provides some additional information regarding the implementation of such a 3-phase induction machine with the detail that this implementation in FIG. 19 is for a motor application (e.g., a 2-pole, 3-phase induction machine and particularly in a motoring application in this diagram).

Each of the respective phase inputs is provided from a respective instantiation of the DSC 28 and a Hall effect sensor 7810 that is configured to perform sensing of the magnetic field generated by that particular phase input to which the drive signal is applied. For example, respective first, second, and third instantiations of the DSC 28 and Hall effect sensor 7810 (and optionally a respective current buffer 8350 in each) for each of the first, second, and third phases are implemented to provide the respective drive signals to the respective stator windings (e.g., Phase A in, Phase B in, and Phase C in).

Figure 86:
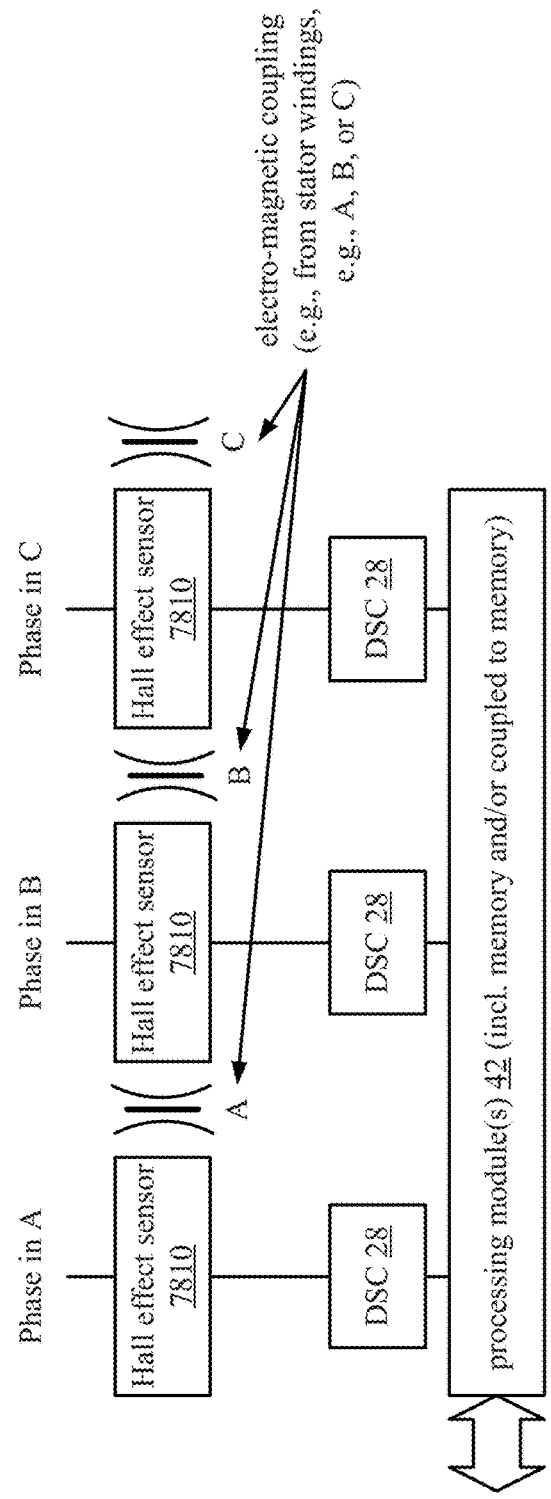
FIG. 86 is a schematic block diagram of another embodiment of induction machine control using Hall effect sensor adapted driver circuit in accordance with the present invention.

FIG. 86 is a schematic block diagram of another embodiment 8600 of induction machine control using Hall effect sensor adapted driver circuit in accordance with the present invention. This diagram shows an implementation in which the one or more processing modules 42 are in communication with three respective DSCs 28 that each respectively provide the drive/sense signals to three respective Hall effect sensors 7810 that each respectively provide the three drive signals to the three respective stator windings of the motor (e.g., Phase A, Phase B, and Phase C). Each respective Hall effect sensors 7810 also monitors and senses the electromagnetic coupling from the stator windings of the motor to which the drive signal is provided. Each of the respective instantiations of a DSC 28 and a corresponding Hall effect sensor 7810 provides a respective one of the three input signals provided to the 3-phase motor windings (e.g., Phase A, Phase B, and Phase C). Note that such an implementation may be implemented within a 3-phase induction machine that includes only one pole per phase (e.g., 3 respective windings, A, B, C).

Note that the respective instantiations of DSCs providing respective drive/sense signals via Hall effect sensors provides regulation of the input signals provided to the respective stator windings of the motor. In addition, not only is regulation of the input signals being performed, but each respective DSC is configured to drive its respective signal to its respective Hall effect sensor and also simultaneously to sense any change to any electrical characteristic associated with its respective signal that is provided to its respective Hall effect sensor. As such, multiple levels of control of the input signals that are provided to the motor are provided in such an imitation. Real-time feedback regarding the efficacy of the input signal being provided to the respective stator windings of the motor is performed based on the sensing of the electromagnetic coupling from the stator windings by each of the respective Hall effect sensors. In addition, each individual DSC is configured simultaneously to perform driving of a signal to its respective Hall effect sensor and sensing of that signal that is driven to its respective Hall effect sensor.

The sensing provided by the Hall effect sensors, and the adaptive regulation of the input signal to the stator windings, provides for improved control of the input signals being provided to the motor. In addition, the use of DSCs allows for simultaneously driving and sensing the signals provided to the Hall effect sensors themselves. Each respective DSC is configured to provide an error signal, which may be in a digital representation, that corresponds to information associated with any change to any electrical characteristic associated with its respective signal that is provided to its respective Hall effect sensor. In some examples, one or more processing modules is in communication with and interacts with the one or more DSCs to adapt their respective operation based on this information. The one or more processing modules is configured to adapt operation of any one or more of the DSCs to facilitate adjustment any desired parameter associated with the input signals that are provided to the stator windings of the motor (e.g., magnitude, phase, frequency, DC offset, etc.) including the relative relationship of any such parameters between two such signals (e.g., the phase between two signals, etc.).

Figure 87:
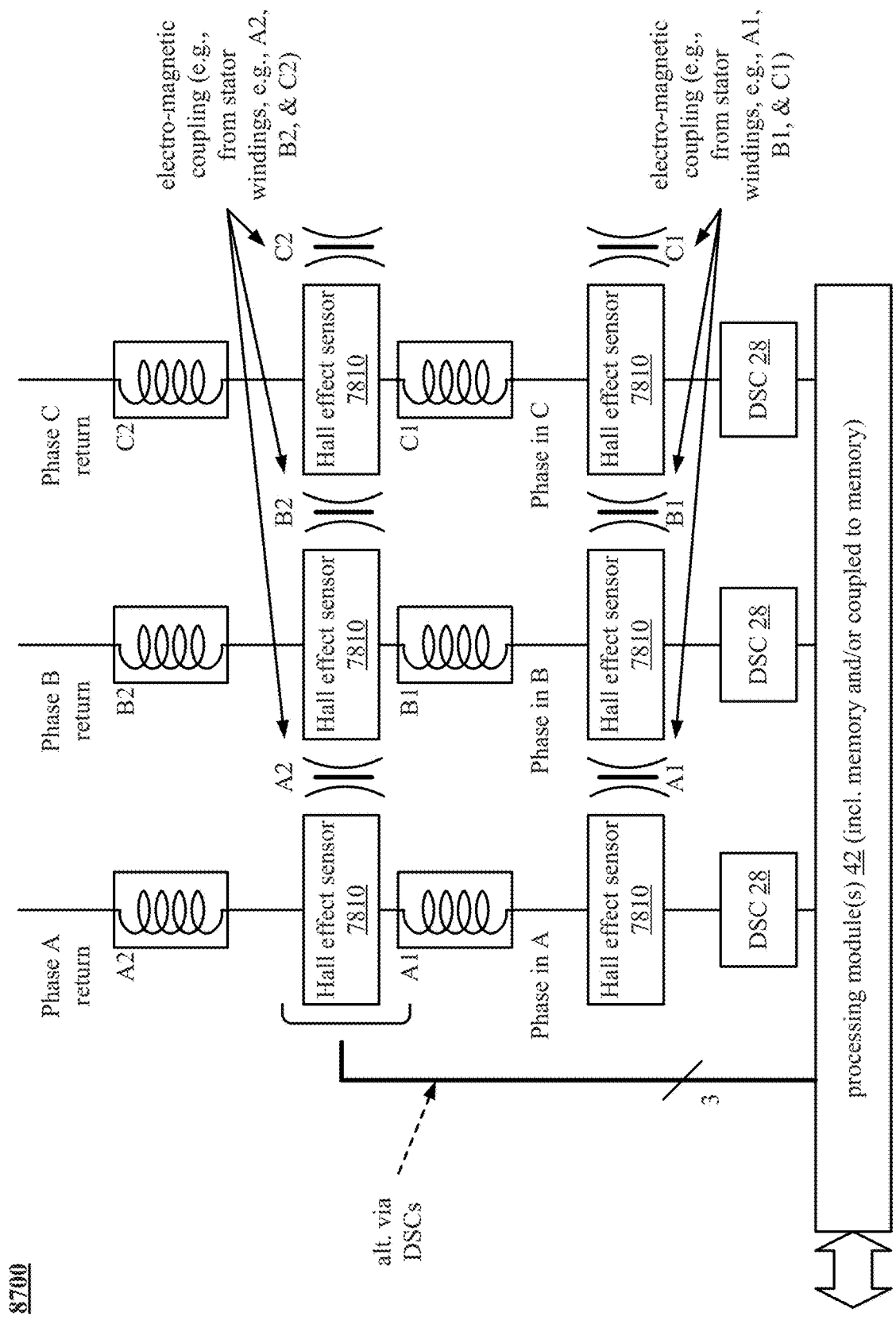
FIG. 87 is a schematic block diagram of another embodiment of induction machine control using Hall effect sensor adapted driver circuit in accordance with the present invention.

FIG. 87 is a schematic block diagram of another embodiment 8700 of induction machine control using Hall effect sensor adapted driver circuit in accordance with the present invention. This diagram shows an implementation in which the one or more processing modules 42 are in communication with three respective DSCs 28 that each respectively provide the drive/sense signals to three respective Hall effect sensors 7810 that each respectively provide the three drive signals to the respective phase in stator windings of the motor (e.g., Phase A1 in, Phase B1 in, and Phase C1 in of a 2-pole, 3-phase induction machine, a motor in this example). Each respective Hall effect sensors 7810 also monitors and senses the electromagnetic coupling from the Phase in stator windings of the motor to which the drive signal is provided. Each of the respective instantiations of a DSC 28 and a corresponding Hall effect sensor 7810 provides a respective one of the three input signals provided to the secondary pole of the 3-phase motor windings (e.g., to A2, to B2, and to C2).

Also, the output from each of the respective input phases is provided to a respective Hall effect sensor 7810 that is configured to monitor and sense the electromagnetic coupling from the windings associated with the secondary pole of the 3-phase motor windings (e.g., to A2, to B2, and to C2) and also to provide the respective drive signal to those respective windings of the motor (e.g., to A2, to B2, and to C2).

This second group of Hall effect sensors 7810 that is configured to monitor and sense the electromagnetic coupling from the windings associated with the secondary pole of the 3-phase motor windings (e.g., to A2, to B2, and to C2) and also to provide the respective drive signal to those respective windings of the motor (e.g., to A2, to B2, and to C2) is also in communication with the one or more processing modules 42. Note that the connectivity and configuration of this second group of Hall effect sensors 7810 may be implemented in any manner as described here and such as via one or more DSCs.

This diagram shows an implementation in which monitoring and sensing and regulation of the drive signals provided to both the first and second poles of a 2-pole, 3-phase induction machine (e.g., a motor in this example) may be performed. In alternative examples, note that one or more DSCs made also be implemented to perform monitoring and sensing of any of the respective electrical signals within the system (e.g., such as the signals coming out of the windings associated with Phase A1 in, Phase B1 in, and Phase C1 in of the 2-pole, 3-phase induction machine (a motor in this example) and being provided to the respective Hall effect sensors 7810, the signals associated with the Phase A2 return, Phase B2 return, and Phase C2 return, and/or any other signals within the system). Such monitoring implemented DSCs may also be implemented Beacon communication with the one or more processing modules 42 to provide additional information to be used by the one or more processing modules 42 in directing and controlling the operation of the 2-pole, 3-phase induction machine (e.g., a motor in this example).

Figure 88:
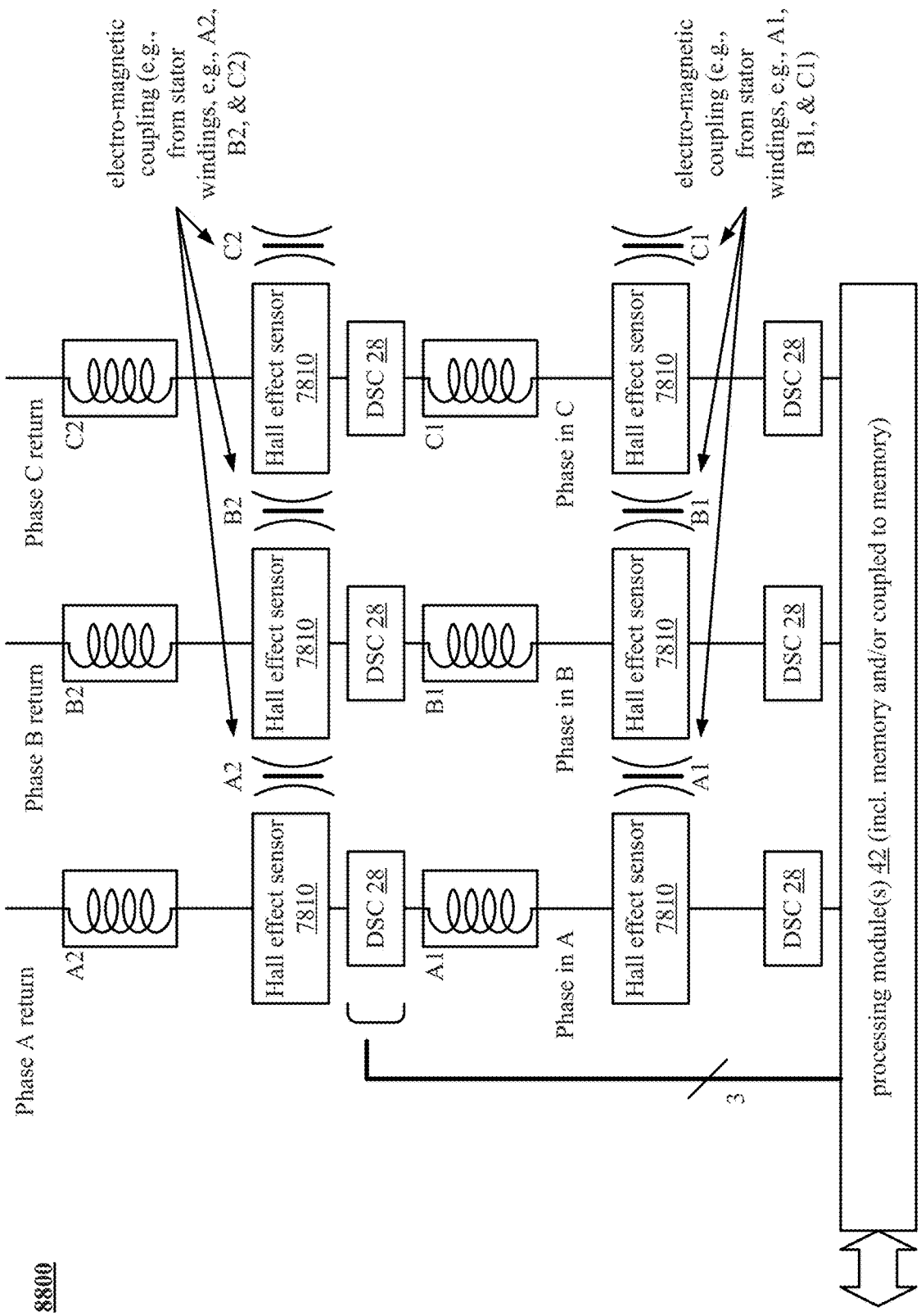
FIG. 88 is a schematic block diagram of another embodiment of induction machine control using Hall effect sensor adapted driver circuit in accordance with the present invention.

FIG. 88 is a schematic block diagram of another embodiment 8800 of induction machine control using Hall effect sensor adapted driver circuit in accordance with the present invention. This diagram has some similarities to the previous diagram with at least one difference being that the output signals from the windings associated with Phase A1 in, Phase B1 in, and Phase C1 in of the 2-pole, 3-phase induction machine (a motor in this example) are provided to a second group of DSCs 28 that are also in communication with the one or more processing modules 42. In some examples, the output signals from these windings are provided to power source circuits of this second group of DSCs 28.

Figure 89:
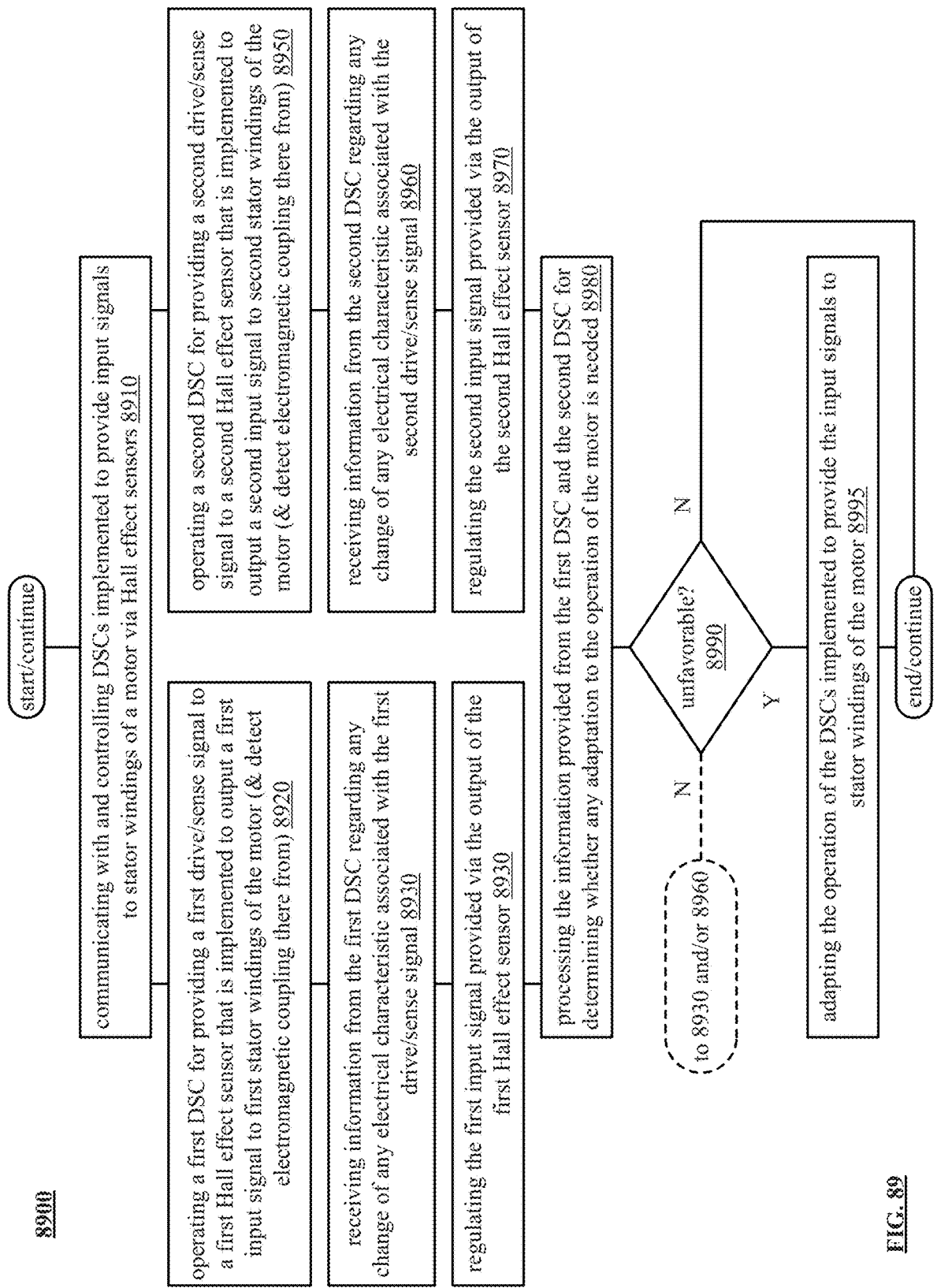
FIG. 89 is a schematic block diagram of another embodiment of a method for execution by one or more devices in accordance with the present invention.

FIG. 89 is a schematic block diagram of another embodiment of a method 8900 for execution by one or more devices in accordance with the present invention. The method 8900 operates in step 8910 by operating one or more processing modules for communicating with and controlling DSCs implemented to provide input signals to stator windings of a motor via Hall effect sensors.

The method 8900 operates in step 8920 by operating a first DSC for providing a first drive/sense signal to a first Hall effect sensor that is implemented to output a first input signal to first stator windings of the motor and that is also implemented to detect electromagnetic coupling from the first stator windings of the motor. The method 8900 also operates in step 8930 by operating by receiving, by the one or more processing modules, information from the first DSC regarding any change of any electrical characteristic associated with the first drive/sense signal. The method 8900 also operates in step 8940 by regulating the first input signal provided via the output of the first Hall effect sensor by monitoring the electromagnetic field generated by the first stator windings of the motor.

Note that the method 8900 will also include one or more additional step of operating one or more additional instantiations of one or more additional DSC providing one or more additional drive/sense signals via one or more additional Hall effect sensor to provide one or more additional input signals for motors having additional stator windings (e.g., three instantiations for a 3-phase motor).

For example, considering a motor having at least second stator windings, the method 8900 operates in step 8950 by operating a second DSC for providing a second drive/sense signal to a second Hall effect sensor that is implemented to output a second input signal to second stator windings of the motor and that is also implemented to detect electromagnetic coupling from the second stator windings of the motor. The method 8900 also operates in step 8960 by operating by receiving, by the one or more processing modules, information from the second DSC regarding any change of any electrical characteristic associated with the second drive/sense signal. The method 8900 also operates in step 8970 by regulating the second input signal provided via the output of the second Hall effect sensor by monitoring the electromagnetic field generated by the second stator windings of the motor.

The method 8900 continues in step 8980 by operating one or more processing modules for processing the information provided from the first DSC and the second DSC for determining whether any adaptation to the operation of the motor is needed. Based on an unfavorable comparison of the information provided from the first DSC and the second DSC to one or more operational criteria in step 8990, the one or more processing modules operates by adapting the operation of the DSCs implemented to provide the input signals to stator windings of the motor in step 8995. Some examples of unfavorable comparison of the information to one or more operational criteria may include any one or more of a differential of phase between two of the input signals being provided to the motor being outside of recommended or acceptable range, the Hall voltage detected via one of the drive/sense signals being outside of a recommended or acceptable range to facilitate proper operation of the motor, etc.

Some examples of adapting the operation of the DSCs implemented to provide the input signals to stator windings of the motor may include directing one or more of the DSCs to perform any one or more of adjustment of the magnitude or amplitude of the voltage and/or current of the signals being provided to the one or more Hall effect sensors, modification of the phase of the signals being provided to the one or more Hall effect sensors (e.g., advance or delay), filtering (e.g., low pass filtering, bandpass filtering, high pass filtering, and/or any combination thereof), reduction or removal of one or more effects on the signals being provided to the one or more Hall effect sensors (e.g., noise, interference, undesired harmonics, glitches, etc.).

Alternatively, based on a favorable comparison of the information provided from the first DSC and the second DSC to one or more operational criteria in step 8990, the method 8900 ends or continues such as by looping back and performing the operational steps 8930 and 8960 and continuing to perform the method 8900.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items.

As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "C" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a forma solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A Hall effect sensor system, the system comprising:
a Hall effect sensor including an input port operably coupled to receive a drive signal; and
a drive-sense circuit (DSC) operably coupled to the Hall effect sensor via a single line, wherein, when enabled, the DSC operably coupled and configured to:
provide the drive signal via the single line that operably couples the DSC to the Hall effect sensor and simultaneously to sense the drive signal via the single line;
detect an effect on the drive signal based on exposure of the Hall effect sensor to a magnetic field; and
generate a digital signal representative of the effect on the drive signal.

2. The system of claim 1 further comprising:
memory that stores operational instructions; and
one or more processing modules operably coupled to the DSC, wherein, when enabled, the one or more processing modules configured to execute the operational instructions to:
receive the digital signal representative of the effect on the drive signal; and
process the digital signal representative of the effect on the drive signal to determine a Hall voltage that is generated across the Hall effect sensor based on the exposure of the Hall effect sensor to the magnetic field.

3. The system of claim 2, wherein the one or more processing modules is in communication with one or more other devices via one or more communication links.

4. The system of claim 1, wherein the drive signal is a DC (direct current) current signal.

5. The system of claim 1, wherein an output port of the Hall effect sensor coupled to a common mode voltage reference of the DSC.

6. The system of claim 1, wherein the magnetic field is generated by a magnet, a transformer, an inductor, a set of coils or windings, or stator windings of a motor or a generator.

7. The system of claim 1, wherein the Hall effect sensor is implemented to perform head-on sensing such that the magnetic field is perpendicular to the Hall effect sensor.

8. The system of claim 1, wherein the DSC further comprising:
a comparator operably configured to receive a reference signal at a first comparator input, wherein, when enabled, the comparator operably coupled and configured to drive the drive signal from a second comparator input; and
an analog to digital converter (ADC) operably coupled to a comparator output of the comparator, wherein, when enabled, the ADC operably coupled and configured to generate the digital signal representative of the effect on the drive signal.

9. The system of claim 1, wherein the DSC further comprises:
a power source circuit operably coupled to the single line, wherein, when enabled, the power source circuit is configured to provide the drive signal via the single line coupling the DSC to the Hall effect sensor; and
a power source change detection circuit operably coupled to the power source circuit, wherein, when enabled, the power source change detection circuit is configured to:
detect the effect on the drive signal based on the exposure of the Hall effect sensor to the magnetic field; and
generate the digital signal representative of the effect on the drive signal.

10. The system of claim 9 further comprising:
the power source circuit including a power source to source the drive signal via the single line coupling the DSC to the Hall effect sensor; and
the power source change detection circuit including:
a power source reference circuit configured to provide at least one of a voltage reference or a current reference; and
a comparator configured to compare the drive signal provided to the Hall effect sensor to the at least one of the voltage reference or the current reference in accordance with producing the drive signal.

11. A Hall effect sensor system, the system comprising:
a Hall effect sensor including an input port operably coupled to receive a drive signal;
a drive-sense circuit (DSC) operably coupled to the Hall effect sensor via a single line, wherein, when enabled, the DSC operably coupled and configured to:
provide the drive signal via the single line that operably couples the DSC to the Hall effect sensor and simultaneously to sense the drive signal via the single line;
detect an effect on the drive signal based on exposure of the Hall effect sensor to a magnetic field, wherein the magnetic field is generated by a magnet, a transformer, an inductor, a set of coils or windings, or stator windings of a motor or a generator; and
generate a digital signal representative of the effect on the drive signal;
memory that stores operational instructions; and
one or more processing modules operably coupled to the DSC, wherein, when enabled, the one or more processing modules configured to execute the operational instructions to:
receive the digital signal representative of the effect on the drive signal; and
process the digital signal representative of the effect on the drive signal to determine a Hall voltage that is generated across the Hall effect sensor based on the exposure of the Hall effect sensor to the magnetic field.

12. The system of claim 11, wherein the drive signal is a DC (direct current) current signal.

13. The system of claim 11, wherein an output port of the Hall effect sensor coupled to a common mode voltage reference of the DSC.

14. The system of claim 11, wherein the DSC further comprises:
a power source circuit operably coupled to the single line, wherein, when enabled, the power source circuit is configured to provide the drive signal via the single line coupling the DSC to the Hall effect sensor; and
a power source change detection circuit operably coupled to the power source circuit, wherein, when enabled, the power source change detection circuit is configured to:
detect the effect on the drive signal based on the exposure of the Hall effect sensor to the magnetic field; and
generate the digital signal representative of the effect on the drive signal.

15. The system of claim 14 further comprising:
the power source circuit including a power source to source the drive signal via the single line coupling the DSC to the Hall effect sensor; and
the power source change detection circuit including:
a power source reference circuit configured to provide at least one of a voltage reference or a current reference; and
a comparator configured to compare the drive signal provided to the Hall effect sensor to the at least one of the voltage reference or the current reference in accordance with producing the drive signal.

16. A method for execution by a Hall effect sensor system, the method comprising:
operating a Hall effect sensor that includes an input port operably coupled to receive a drive signal; and
operating a drive-sense circuit (DSC) operably coupled to the Hall effect sensor via a single line, wherein, when enabled, the DSC operably coupled and configured to:
providing the drive signal via the single line that operably couples the DSC to the Hall effect sensor and simultaneously to sense the drive signal via the single line;
detecting an effect on the drive signal based on exposure of the Hall effect sensor to a magnetic field; and
generating a digital signal representative of the effect on the drive signal.

17. The method of claim 16 further comprising:
processing the digital signal representative of the effect on the drive signal to determine a Hall voltage that is generated across the Hall effect sensor based on the exposure of the Hall effect sensor to the magnetic field.

18. The method of claim 16, wherein the magnetic field is generated by a magnet, a transformer, an inductor, a set of coils or windings, or stator windings of a motor or a generator.

19. The method of claim 16, wherein the DSC further comprises:
a power source circuit operably coupled to the single line, wherein, when enabled, the power source circuit is configured to provide the drive signal via the single line coupling the DSC to the Hall effect sensor; and a power source change detection circuit operably coupled to the power source circuit, wherein, when enabled, the power source change detection circuit is configured to:
- detect the effect on the drive signal based on the exposure of the Hall effect sensor to the magnetic field; and
- generate the digital signal representative of the effect on the drive signal.

20. The method of claim 19 further comprising:

the power source circuit including a power source to source the drive signal via the single line coupling the DSC to the Hall effect sensor; and the power source change detection circuit including:
- a power source reference circuit configured to provide at least one of a voltage reference or a current reference; and
- a comparator configured to compare the drive signal provided to the Hall effect sensor to the at least one of the voltage reference or the current reference in accordance with producing the drive signal.

* * * * *